US012454643B2

(12) United States Patent
Kim et al.

(10) Patent No.: US 12,454,643 B2
(45) Date of Patent: Oct. 28, 2025

(54) LIGHT EMITTING DEVICE

(71) Applicant: Samsung Display Co., Ltd., Yongin-si (KR)

(72) Inventors: Taeil Kim, Hwaseong-si (KR); Chanseok Oh, Seoul (KR); Sun Young Pak, Suwon-si (KR); Junha Park, Gwacheon-si (KR); Jang Yeol Baek, Yongin-si (KR); Kyoung Sunwoo, Hwaseong-si (KR); Mun-Ki Sim, Seoul (KR); Minjung Jung, Hongcheon-gun (KR)

(73) Assignee: Samsung Display Co., Ltd., Yongin-si (KR)

( * ) Notice: Subject to any disclaimer, the term of this patent is extended or adjusted under 35 U.S.C. 154(b) by 866 days.

(21) Appl. No.: 17/519,492

(22) Filed: Nov. 4, 2021

(65) Prior Publication Data

US 2022/0140243 A1 May 5, 2022

Related U.S. Application Data

(63) Continuation-in-part of application No. 17/444,335, filed on Aug. 3, 2021, now abandoned.

(30) Foreign Application Priority Data

Nov. 4, 2020 (KR) ........................ 10-2020-0146381

(51) Int. Cl.
*C09K 11/06* (2006.01)
*H10K 50/11* (2023.01)
(Continued)

(52) U.S. Cl.
CPC ............ *C09K 11/06* (2013.01); *H10K 85/322* (2023.02); *H10K 85/658* (2023.02);
(Continued)

(58) Field of Classification Search
CPC ............... H10K 85/322; H10K 85/657; H10K 85/658; C09K 2211/1018
See application file for complete search history.

(56) References Cited

U.S. PATENT DOCUMENTS 10,374,166 B2 8/2019 Hatakeyama et al.
2010/0001301 A1* 1/2010 Karg .................... H10K 59/878 257/40
(Continued)

FOREIGN PATENT DOCUMENTS

KR 10-2016-0119683 A 10/2016
KR 10-2019-0106706 A 9/2019
(Continued)

OTHER PUBLICATIONS

Anton Pershin, et al., Highly emissive excitons with reduced exchange energy in thermally activated delayed fluorescent molecules, Article, 2019, pp. 1-5, vol. 10, No. 597, Nature Communications, Springer Nature Limited.
(Continued)

*Primary Examiner* — Jenna N Chandhok
(74) *Attorney, Agent, or Firm* — Womble Bond Dickinson (US) LLP

(57) ABSTRACT

A light emitting device includes a first electrode, a second electrode, and an emission layer between the first electrode and the second electrode, and the emission layer may include a condensed cyclic compound represented by Formula 1 below, thereby exhibiting high luminous efficiency and improved service life characteristics.
(Continued)

Formula 1

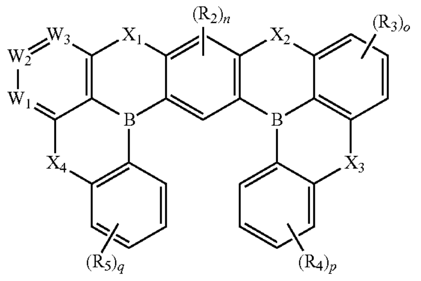

21 Claims, 6 Drawing Sheets

(51) Int. Cl.
*H10K 85/30* (2023.01)
*H10K 85/60* (2023.01)
*H10K 101/10* (2023.01)

(52) U.S. Cl.
CPC ...... *C09K 2211/1018* (2013.01); *H10K 50/11* (2023.02); *H10K 2101/10* (2023.02)

(56) References Cited

U.S. PATENT DOCUMENTS

| | | | |
|---|---|---|---|
| 2019/0280209 | A1 | 9/2019 | Fujita |
| 2020/0006671 | A1 | 1/2020 | Sim et al. |
| 2020/0044159 | A1 | 2/2020 | Yamatani |
| 2020/0176684 | A1 | 6/2020 | Lee et al. |
| 2020/0190115 | A1 | 6/2020 | Hatakeyama et al. |

FOREIGN PATENT DOCUMENTS

| | | | |
|---|---|---|---|
| KR | 10-2020-0001664 | A | 1/2020 |
| KR | 10-2020-0004248 | A | 1/2020 |
| KR | 10-2020-0006965 | A | 1/2020 |
| KR | 10-2020-0014451 | A | 2/2020 |
| KR | 10-2020-0065174 | A | 6/2020 |
| WO | WO 2018/212169 | A1 | 11/2018 |

OTHER PUBLICATIONS

Sanju Hwang, et al., Conformation-dependent degradation of thermally activated delayed fluorescence materials bearing cycloamino donors, Article, 2020, pp. 1-11, vol. 3, No. 53, Communications Chemistry, Springer Nature Limited.

Yasuhiro Kondo, et al., Narrowband deep-blue organic light-emitting diode featuring an organoboron-based emitter, Letters, Jul. 15, 2019, 6 pages, vol. 13, Nature Photonics, Springer Nature Limited.

* cited by examiner

LIGHT EMITTING DEVICE

CROSS-REFERENCE TO RELATED APPLICATION

This application claims priority to and the benefit of Korean Patent Application No. 10-2020-0146381, filed in the Korean Intellectual Property Office on Nov. 4, 2020; this application is also a continuation-in-part of U.S. patent application Ser. No. 17/444,335, filed in the United States Patent and Trademark Office on Aug. 3, 2021, which claims priority to and the benefit of Korean Patent Application No. 10-2020-0146381. The entire contents of all of which are incorporated herein by reference.

BACKGROUND

1. Field

The present disclosure herein relates to a light emitting device, and for example, to a light emitting device including a novel condensed cyclic compound.

2. Description of the Related Art

Recently, the development of an organic electroluminescence display as an image display apparatus is being actively conducted. The organic electroluminescence display includes a so-called self-luminescent light emitting device in which holes and electrons injected from a first electrode and a second electrode recombine in an emission layer, and thus a luminescent material of the emission layer emits light to implement display (e.g., to display an image).

In the application of a light emitting device to a display apparatus, there is a desire (e.g., a demand) for a light emitting device to have a low driving voltage, a high luminous efficiency, and a long service life, and the development of materials for a light emitting device capable of stably attaining such characteristics is being continuously conducted.

In recent years, particularly in order to implement a highly efficient light emitting device, technologies pertaining to phosphorescence emission utilizing triplet state energy or delayed fluorescence utilizing triplet-triplet annihilation (TTA) in which singlet excitons are generated by collision of triplet excitons are being developed, and thermally activated delayed fluorescence (TADF) materials utilizing delayed fluorescence phenomenon are being developed.

SUMMARY

Aspects according to embodiments of the present disclosure are directed toward a light emitting device exhibiting an excellent (e.g., high) luminous efficiency and long service life characteristic(s).

An embodiment of the present disclosure provides a light emitting device including: a first electrode; a second electrode on the first electrode; and an emission layer between the first electrode and the second electrode and including a condensed cyclic compound represented by Formula 1 below, wherein each of the first electrode and the second electrode independently includes Ag, Mg, Cu, Al, Pt, Pd, Au, Ni, Nd, Ir, Cr, Li, Ca, LiF/Ca, LiF/Al, Mo, Ti, W, In, Sn, Zn, a compound of two or more thereof, a mixture of two or more thereof, or an oxide thereof.

Formula 1

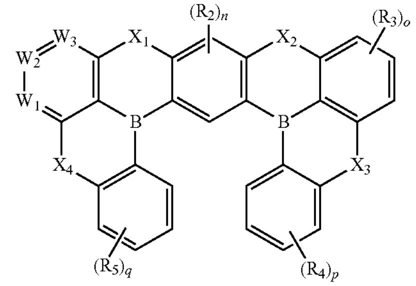

In Formula 1, $X_1$ to $X_4$ are each independently O, S, Se, $CR_6R_7$, or $NR_8$; a substituent represented by Formula 2 is connected to adjacent two groups selected from among $W_1$, $W_2$, and $W_3$, the adjacent two groups selected from among $W_1$, $W_2$, and $W_3$ are each a carbon atom, and a remaining group thereof is $CR_1$; and $R_1$ to $R_8$ are each independently a hydrogen atom, an oxygen atom, a sulfur atom, a selenium atom, a deuterium atom, a halogen atom, a cyano group, a nitro group, a substituted or unsubstituted silyl group, a substituted or unsubstituted amine group, a substituted or unsubstituted alkyl group having 1 to 30 carbon atoms, a substituted or unsubstituted aryloxy group having 1 to 30 carbon atoms, a substituted or unsubstituted alkoxy group having 1 to 30 carbon atoms, a substituted or unsubstituted aryl group having 6 to 30 ring-forming carbon atoms, a substituted or unsubstituted heteroaryl group having 2 to 30 ring-forming carbon atoms, or a substituted or unsubstituted aliphatic heterocyclic group having 2 to 30 ring-forming carbon atoms, and/or are bonded to an adjacent group to form a ring; and n is an integer of 0 to 2, o is an integer of 0 to 3, and p and q are each independently an integer of 0 to 4.

Formula 2

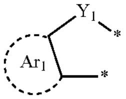

In Formula 2, $Y_1$ is O, S, Se, $CR_{1a}R_{2a}$, or $NR_{3a}$; An is a substituted or unsubstituted aromatic hydrocarbon ring having 6 to 30 ring-forming carbon atoms, or a substituted or unsubstituted aromatic heterocyclic ring having 2 to 30 ring-forming carbon atoms, $R_{1a}$, $R_{2a}$, and $R_{3a}$ are each independently a hydrogen atom, an oxygen atom, a sulfur atom, a selenium atom, a deuterium atom, a halogen atom, a cyano group, a nitro group, a substituted or unsubstituted silyl group, a substituted or unsubstituted amine group, a substituted or unsubstituted alkyl group having 1 to 30 carbon atoms, a substituted or unsubstituted alkoxy group having 1 to 30, a substituted or unsubstituted aryl group having 6 to 30 ring-forming carbon atoms, or a substituted or unsubstituted heteroaryl group having 2 to 30 ring-forming carbon atoms, and/or are bonded to an adjacent group to form a ring; and —* is a position connected to the adjacent two groups selected from among $W_1$ to $W_3$ in Formula 1.

In an embodiment, the condensed cyclic compound represented by Formula 1 may be represented by Formula 3a or Formula 3b:

Formula 3a

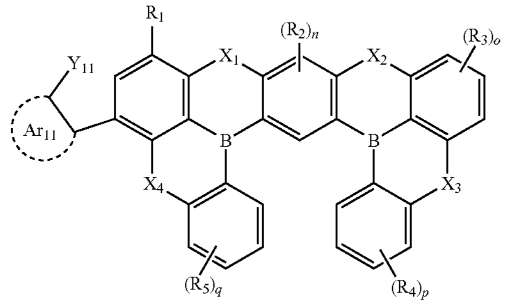

Formula 3b

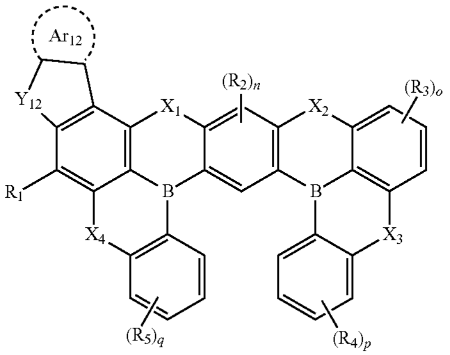

In Formula 3a and Formula 3b, $Y_{11}$ and $Y_{12}$ are each independently O, S, Se, $CR_{1b}R_{2b}$, or $NR_{3b}$; $Ar_{11}$ and $Ar_{12}$ are each independently a substituted or unsubstituted aromatic hydrocarbon ring having 6 to 30 ring-forming carbon atoms, or a substituted or unsubstituted aromatic heterocyclic ring having 2 to 30 ring-forming carbon atoms; $R_{1b}$ to $R_{3b}$ are each independently a hydrogen atom, an oxygen atom, a sulfur atom, a selenium atom, a deuterium atom, a halogen atom, a cyano group, a nitro group, a substituted or unsubstituted silyl group, a substituted or unsubstituted amine group, a substituted or unsubstituted alkyl group having 1 to 30 carbon atoms, a substituted or unsubstituted alkoxy group having 1 to 30 carbon atoms, a substituted or unsubstituted aryl group having 6 to 30 ring-forming carbon atoms, or a substituted or unsubstituted heteroaryl group having 2 to 30 ring-forming carbon atoms, and/or are bonded to an adjacent group to form a ring; and $X_1$ to $X_4$, $R_1$ to $R_5$ and n to q are the same as defined in connection with Formula 1 and Formula 2.

In an embodiment, the condensed cyclic compound represented by Formula 1 may be represented by Formula 4a or Formula 4b:

Formula 4a

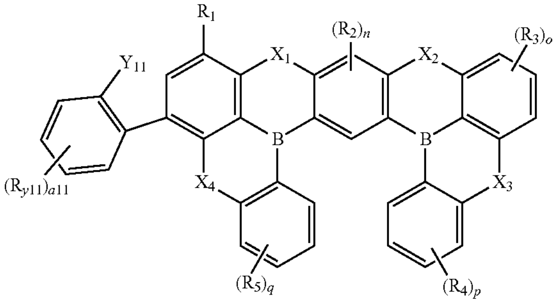

-continued

Formula 4b

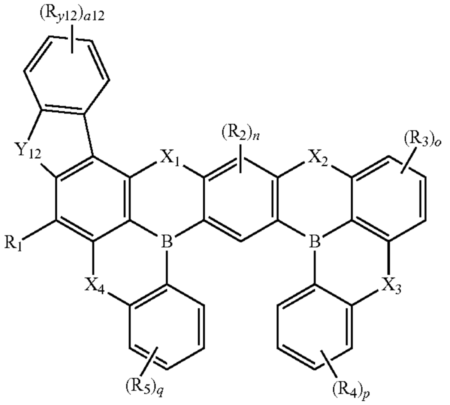

In Formula 4a and Formula 4b, $R_{y11}$ and $R_{y12}$ are each independently a hydrogen atom, a deuterium atom, a halogen atom, a cyano group, a nitro group, a substituted or unsubstituted silyl group, a substituted or unsubstituted amine group, a substituted or unsubstituted alkyl group having 1 to 30 carbon atoms, a substituted or unsubstituted alkoxy group having 1 to 30 carbon atoms, a substituted or unsubstituted aryloxy group having 1 to 30 carbon atoms, a substituted or unsubstituted aryl group having 6 to 30 ring-forming carbon atoms, or a substituted or unsubstituted heteroaryl group having 2 to 30 ring-forming carbon atoms, and/or are bonded to an adjacent group to form a ring; and $X_1$ to $X_4$, $Y_{11}$, $Y_{12}$, $R_1$ to $R_5$, and n to q are the same as defined in connection with Formula 1, Formula 2, Formula 3a, and Formula 3b.

In an embodiment, the condensed cyclic compound represented by Formula 1 may be represented by Formula 5:

Formula 5

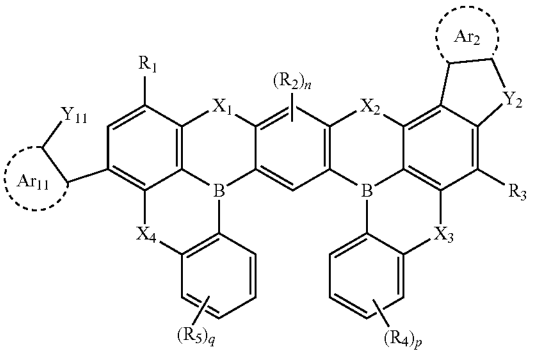

In Formula 5, $Ar_2$ is a substituted or unsubstituted aromatic hydrocarbon ring having 6 to 30 ring-forming carbon atoms, or a substituted or unsubstituted aromatic heterocyclic ring having 2 to 30 ring-forming carbon atoms; $Y_2$ is O, S, Se, $CR_{12}R_{13}$, or $NR_{14}$; $R_{12}$ to $R_{14}$ are each independently a hydrogen atom, a deuterium atom, a halogen atom, a cyano group, a nitro group, a substituted or unsubstituted silyl group, a substituted or unsubstituted amine group, a substituted or unsubstituted alkyl group having 1 to 30 carbon atoms, a substituted or unsubstituted alkoxy group having 1 to 30 carbon atoms, a substituted or unsubstituted aryl group having 6 to 30 ring-forming carbon atoms, or a substituted or unsubstituted heteroaryl group having 2 to 30 ring-forming carbon atoms, and/or are bonded to an adjacent group to form a ring; and $Y_{11}$, $Ar_{11}$, $X_1$ to $X_4$, $R_1$ to $R_5$, n, p, and q are the same as defined in connection with Formula 1, Formula 2, Formula 3a, and Formula 3b.

In an embodiment, $Ar_2$ may be an unsubstituted benzene ring.

In an embodiment, the condensed cyclic compound represented by Formula 1 may be represented by Formula 6a or Formula 6b:

Formula 6a

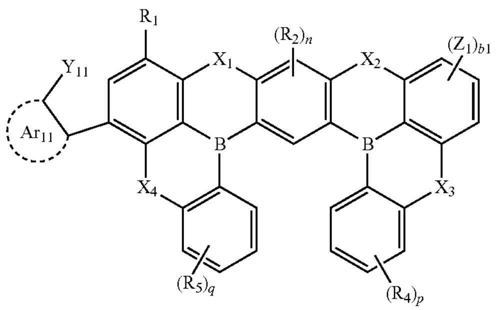

Formula 6b

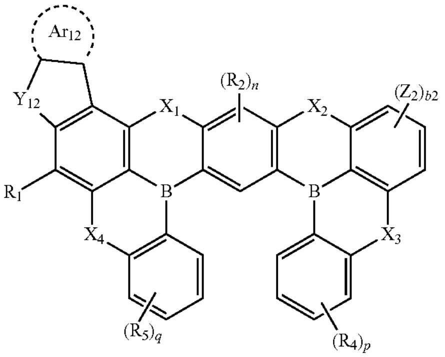

In Formula 6a and Formula 6b, $Z_1$ and $Z_2$ are each independently a hydrogen atom, a deuterium atom, a halogen atom, a cyano group, a nitro group, a substituted or unsubstituted silyl group, a substituted or unsubstituted amine group, a substituted or unsubstituted alkyl group having 1 to 30 carbon atoms, a substituted or unsubstituted alkoxy group having 1 to 30 carbon atoms, a substituted or unsubstituted aryloxy group having 1 to 30 carbon atoms, a substituted or unsubstituted aryl group having 6 to 30 ring-forming carbon atoms, a substituted or unsubstituted heteroaryl group having 2 to 30 ring-forming carbon atoms, or a substituted or unsubstituted aliphatic heterocyclic group having 2 to 30 ring-forming carbon atoms; $b_1$ and $b_2$ are each independently an integer of 0 to 3; and $X_1$ to $X_4$, $Y_{11}$, $Y_{12}$, $R_1$, $R_2$, $R_4$, $R_5$, $Ar_{11}$, $Ar_{12}$, n, p, and q are the same as defined in connection with Formula 1, Formula 2, Formula 3a, and Formula 3b.

In an embodiment, at least one of $Ar_{11}$ or $Ar_{12}$ may be a substituted or unsubstituted benzene ring.

In an embodiment, $R_2$ may be a hydrogen atom.

In an embodiment, the emission layer may emit thermally activated delayed fluorescence.

In an embodiment, the emission layer may include a host and a dopant, and the dopant may include the condensed cyclic compound.

In an embodiment, the light emitting device may further include a capping layer on the second electrode, wherein the capping layer may have a refractive index of about 1.6 or more.

In an embodiment, the emission layer may emit blue light having a center wavelength of about 450 nm to about 470 nm.

In an embodiment of the present disclosure, a light emitting device includes a first electrode, a second electrode on the first electrode, and a plurality of organic layers between the first electrode and the second electrode, wherein at least one organic layer selected from among the plurality of organic layers includes a condensed cyclic compound represented by Formula A, Formula B, or Formula C:

Formula A

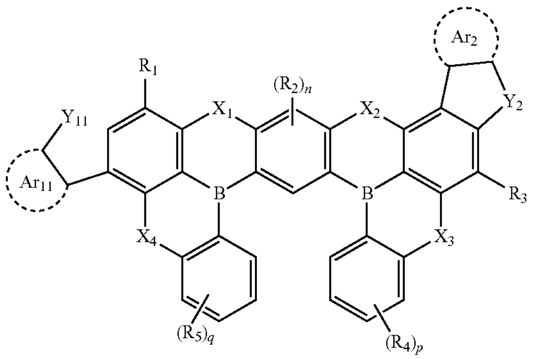

Formula B

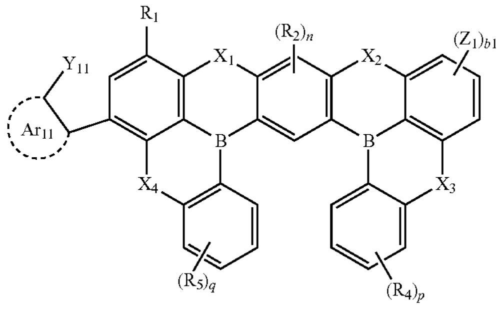

Formula C

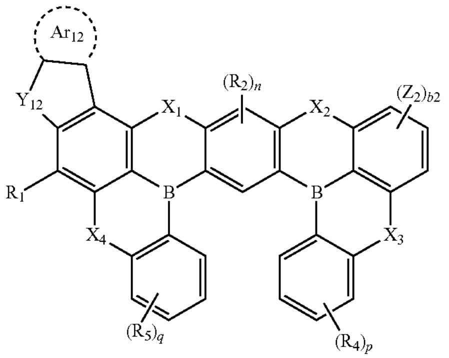

In Formula A, Formula B, and Formula C, $X_1$ to $X_4$ are each independently O, S, Se, $CR_6R_7$, or $NR_8$; $Y_{11}$ and $Y_{12}$ are each independently O, S, Se, $CR_{1b}R_{2b}$, or $NR_{3b}$; $Ar_{11}$ and $Ar_{12}$ are each independently a substituted or unsubstituted aromatic hydrocarbon ring having 6 to 30 ring-forming carbon atoms, or a substituted or unsubstituted aromatic heterocyclic ring having 2 to 30 ring-forming carbon atoms;

$R_1$ to $R_8$, $R_{1b}$, $R_{2b}$, and $R_{3b}$ are each independently a hydrogen atom, a deuterium atom, a halogen atom, a cyano group, a nitro group, a substituted or unsubstituted silyl group, a substituted or unsubstituted amine group, a substituted or unsubstituted alkyl group having 1 to 30 carbon atoms, a substituted or unsubstituted alkoxy group having 1 to 30 carbon atoms, a substituted or unsubstituted aryl group having 6 to 30 ring-forming carbon atoms, or a substituted or unsubstituted heteroaryl group having 2 to 30 ring-forming carbon atoms, and/or are bonded to an adjacent group to form a ring; n is an integer of 0 to 2, p and q are each independently an integer of 0 to 4; $Z_1$ and $Z_2$ are each independently a hydrogen atom, a deuterium atom, a halogen atom, a cyano group, a nitro group, a substituted or unsubstituted silyl group, a substituted or unsubstituted amine group, a substituted or unsubstituted alkyl group having 1 to 30 carbon atoms, a substituted or unsubstituted alkoxy group having 1 to 30 carbon atoms, a substituted or unsubstituted aryloxy group having 1 to 30 carbon atoms, a substituted or unsubstituted aryl group having 6 to 30 ring-forming carbon atoms, a substituted or unsubstituted heteroaryl group having 2 to 30 ring-forming carbon atoms, or a substituted or unsubstituted aliphatic heterocyclic group having 2 to 30 ring-forming carbon atoms; and $b_1$ and $b_2$ are each independently an integer of 0 to 3.

In an embodiment, $Ar_{11}$ may be a substituted or unsubstituted benzene ring.

In an embodiment, $Ar_{12}$ may be an unsubstituted naphthalene ring or an unsubstituted benzene ring.

In an embodiment, $R_2$ to $R_5$ may each independently be a hydrogen atom.

In an embodiment, the plurality of organic layers may include a hole transport region, an emission layer, and an electron transport region, sequentially stacked on the first electrode, and the emission layer may include the condensed cyclic compound represented by Formula A, Formula B, or Formula C.

In an embodiment, the emission layer may include a host and a dopant, and the dopant may include the condensed cyclic compound represented by Formula A, Formula B, or Formula C.

BRIEF DESCRIPTION OF THE DRAWINGS

The accompanying drawings are included to provide a further understanding of the subject matter of the present disclosure, and are incorporated in and constitute a part of this specification. The drawings illustrate example embodiments of the present disclosure and, together with the description, serve to explain principles of the present disclosure. In the drawings.

DETAILED DESCRIPTION

Figure 1:
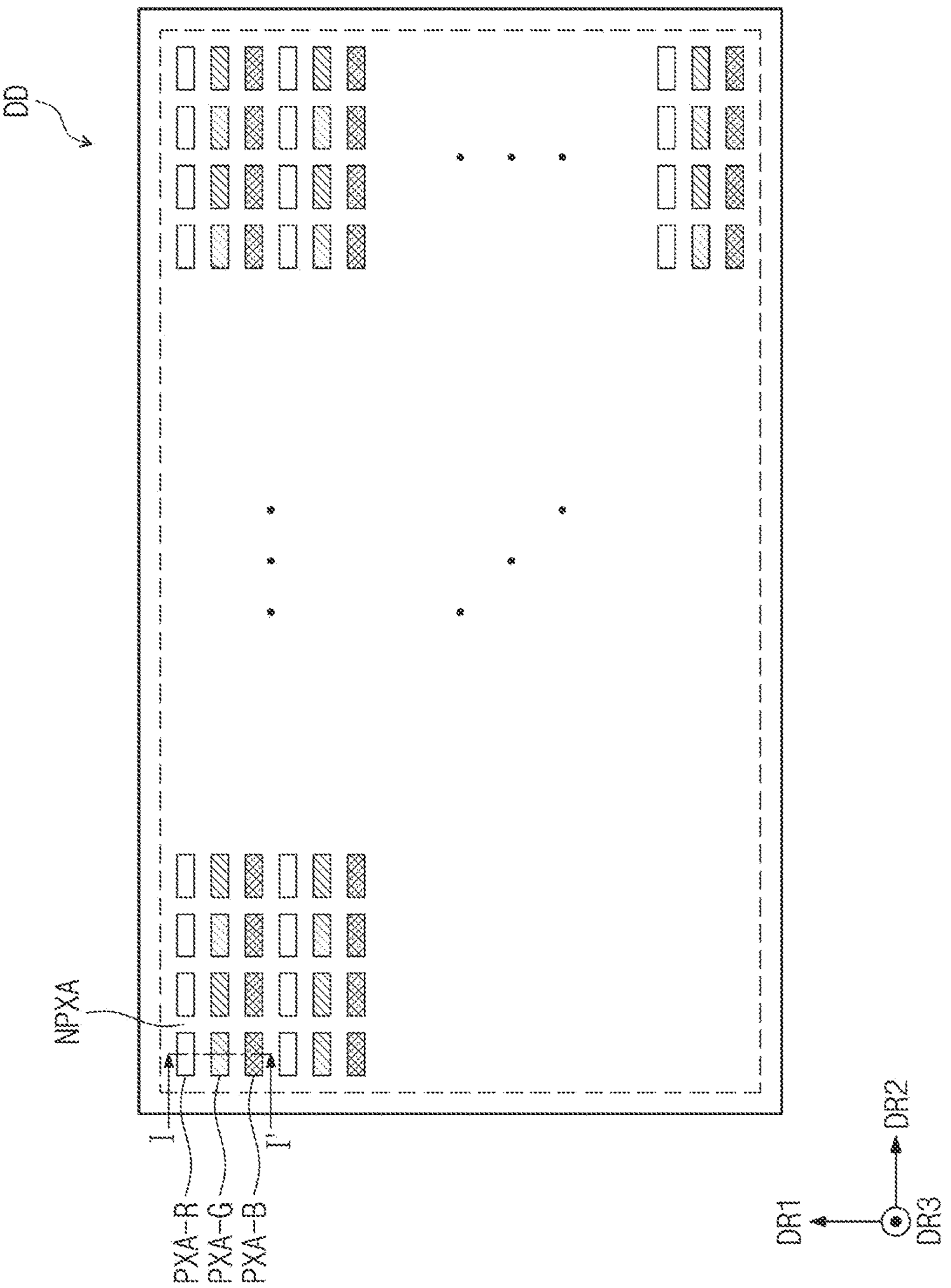
FIG. 1 is a plan view illustrating a display apparatus according to an embodiment of the present disclosure.

The subject matter of the present disclosure may be modified in many alternate forms, and thus specific embodiments will be shown in the drawings and described in more detail. It should be understood, however, that it is not intended to limit the present disclosure to the particular forms disclosed, but rather, is intended to cover all modifications, equivalents, and alternatives falling within the spirit and scope of the present disclosure.

When explaining each of the drawings, like reference numbers are used for referring to like elements. In the accompanying drawings, the dimensions of each structure may be exaggeratingly illustrated for clarity of the present disclosure. It will be understood that, although the terms “first,” “second,” etc. may be used herein to describe various elements, these elements should not be limited by these terms. These terms are only used to distinguish one element from another. For example, a first element may be referred to as a second element, and, similarly, the second element may be referred to as the first element, without departing from the scope of the present disclosure. The terms of a singular form may include plural forms unless the context clearly indicates otherwise.

In the present application, it will be understood that terms such as “comprise” or “have” specifies the presence of a feature, a fixed number, a step, a process, an element, a component, or a combination thereof disclosed in the specification, but does not exclude the possibility of presence or addition of one or more other features, fixed numbers, steps, processes, elements, components, or combination thereof.

In the present application, when a layer, a film, a region, or a plate is referred to as being “above” or“in an upper portion” of another layer, film, region, or plate, it can be not only directly on the layer, film, region, or plate, but intervening layers, films, regions, or plates may also be present. On the contrary to this, when a layer, a film, a region, or a plate is referred to as being “below,” “in a lower portion of” another layer, film, region, or plate, it can be not only directly under the layer, film, region, or plate, but intervening layers, films, regions, or plates may also be present. In addition, it will be understood that when a layer, a film, a region, or a plate is referred to as being “on” another layer, film, region, or plate, it can be not only placed on the layer, film, region, or plate, but also under the layer, film, region, or plate.

In the specification, the term “substituted or unsubstituted” may refer to substituted or unsubstituted with at least one substituent selected from the group consisting of a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkynyl group, an alkoxy group, a hydrocarbon ring group, an aryl group, and a heterocyclic group. In addition, each of the substituents described above may be substituted or unsubstituted. For example, a biphenyl group may be interpreted as an aryl group or a phenyl group substituted with a phenyl group.

In the specification, the phrase “bonded to an adjacent group to form a ring” may indicate that the group is bonded to an adjacent group to form a substituted or unsubstituted hydrocarbon ring, or a substituted or unsubstituted heterocycle. The hydrocarbon ring includes an aliphatic hydrocarbon ring and an aromatic hydrocarbon ring. The heterocycle includes an aliphatic heterocycle and an aromatic heterocycle. The hydrocarbon ring and the heterocycle may be monocyclic or polycyclic. In addition, the rings formed through adjacent groups being bonded to each other may be connected to another ring to form a spiro structure.

In the specification, the term "adjacent group" may refer to a substituent substituted at an atom which is directly connected to an atom substituted with a corresponding substituent, another substituent substituted for an atom which is substituted with a corresponding substituent, or a substituent sterically positioned at the nearest position to a corresponding substituent. For example, two methyl groups in 1,2-dimethylbenzene may be interpreted as "adjacent groups" to each other and two ethyl groups in 1,1-diethylcyclopentane may be interpreted as "adjacent groups" to each other. In addition, two methyl groups in 4,5-dimethylphenanthrene may be interpreted as "adjacent groups" to each other.

In the specification, examples of the halogen atom may include a fluorine atom, a chlorine atom, a bromine atom, or an iodine atom.

In the specification, the alkyl group may be a linear, branched or cyclic type (e.g., a linear alkyl group, a branched alkyl group, or a cyclic alkyl group). The number of carbon atoms in the alkyl group is 1 to 50, 1 to 30, 1 to 20, 1 to 10, or 1 to 6. Examples of the alkyl group may include a methyl group, an ethyl group, an n-propyl group, an isopropyl group, an n-butyl group, an s-butyl group, a t-butyl group, an i-butyl group, a 2-ethylbutyl group, a 3,3-dimethylbutyl group, an n-pentyl group, an i-pentyl group, a neopentyl group, a t-pentyl group, a cyclopentyl group, a 1-methylpentyl group, a 3-methylpentyl group, a 2-ethylpentyl group, a 4-methyl-2-pentyl group, an n-hexyl group, a 1-methylhexyl group, a 2-ethylhexyl group, a 2-butylhexyl group, a cyclohexyl group, a 4-methylcyclohexyl group, a 4-t-butylcyclohexyl group, an n-heptyl group, a 1-methylheptyl group, a 2,2-dimethylheptyl group, a 2-ethylheptyl group, a 2-butylheptyl group, an n-octyl group, a t-octyl group, a 2-ethyloctyl group, a 2-butyloctyl group, a 2-hexyloctyl group, a 3,7-dimethyloctyl group, a cyclooctyl group, an n-nonyl group, an n-decyl group, an adamantyl group, a 2-ethyldecyl group, a 2-butyldecyl group, a 2-hexyldecyl group, a 2-octyldecyl group, an n-undecyl group, an n-dodecyl group, a 2-ethyldodecyl group, a 2-butyldodecyl group, a 2-hexyldocecyl group, a 2-octyldodecyl group, an n-tridecyl group, an n-tetradecyl group, an n-pentadecyl group, an n-hexadecyl group, a 2-ethylhexadecyl group, a 2-butylhexadecyl group, a 2-hexylhexadecyl group, a 2-octylhexadecyl group, an n-heptadecyl group, an n-octadecyl group, an n-nonadecyl group, an n-eicosyl group, a 2-ethyleicosyl group, a 2-butyleicosyl group, a 2-hexyleicosyl group, a 2-octyleicosyl group, an n-henicosyl group, an n-docosyl group, an n-tricosyl group, an n-tetracosyl group, an n-pentacosyl group, an n-hexacosyl group, an n-heptacosyl group, an n-octacosyl group, an n-nonacosyl group, an n-triacontyl group, etc., but embodiments of the present disclosure are not limited thereto.

The term "hydrocarbon ring group" as used herein may refer to any functional group or substituent derived from an aliphatic hydrocarbon ring. The hydrocarbon ring group may be a saturated hydrocarbon ring group having 5 to 20 ring-forming carbon atoms.

The term "aryl group" as used herein may refer to any functional group or substituent derived from an aromatic hydrocarbon ring. The aryl group may be a monocyclic aryl group or a polycyclic aryl group. The number of ring-forming carbon atoms in the aryl group may be 6 to 30, 6 to 20, or 6 to 15. Examples of the aryl group may include a phenyl group, a naphthyl group, a fluorenyl group, an anthracenyl group, a phenanthryl group, a biphenyl group, a terphenyl group, a quaterphenyl group, a quinquephenyl group, a sexiphenyl group, a triphenylenyl group, a pyrenyl group, a benzofluoranthenyl group, a chrysenyl group, etc., but embodiments of the present disclosure are not limited thereto.

In the specification, the fluorenyl group may be substituted, and two substituents may be combined with each other to form a spiro structure. Examples of cases where the fluorenyl group is substituted are as follows. However, embodiments of the present disclosure are not limited thereto.

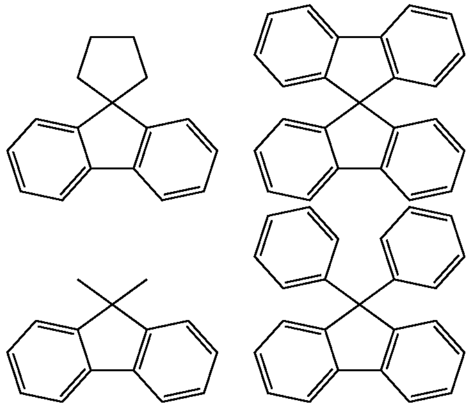

In the specification, the term "heterocyclic group" as used herein may refer to any functional group or substituent derived a ring including at least one of B, O, N, P, Si, or Se as a heteroatom. The heterocyclic group includes an aliphatic heterocyclic group and an aromatic heterocyclic group. The aromatic heterocyclic group may be a heteroaryl group. The aliphatic heterocycle and the aromatic heterocycle may be monocyclic or polycyclic.

In the specification, the heterocyclic group may include at least one of B, O, N, P, Si, S or Se as a heteroatom. If the heterocyclic group includes two or more heteroatoms, the two or more heteroatoms may be the same as or different from each other. The heterocyclic group may be a monocyclic heterocyclic group or a polycyclic heterocyclic group and has the concept including a heteroaryl group. The ring-forming carbon number of the heterocyclic group may be 2 to 30, 2 to 20, or 2 to 10.

In the specification, the aliphatic heterocyclic group may include one or more selected from among B, O, N, P, Si, or S as a heteroatom. The number of ring-forming carbon atoms of the aliphatic heterocyclic group may be 2 to 30, 2 to 20, or 2 to 10.

Examples of the aliphatic heterocyclic group may include an oxirane group, a thiirane group, a pyrrolidine group, a piperidine group, a tetrahydrofuran group, a tetrahydrothiophene group, a thiane group, a tetrahydropyran group, a 1,4-dioxane group, etc., but embodiments of the present disclosure are not limited thereto.

The term "heteroaryl group" as used herein may include at least one of B, O, N, P, Si, or S as a heteroatom. When the heteroaryl group contains two or more heteroatoms, the two or more heteroatoms may be the same as or different from each other. The heteroaryl group may be a monocyclic heteroaryl group or polycyclic heteroaryl group. The number of ring-forming carbon atoms in the heteroaryl group may be 2 to 30, 2 to 20, or 2 to 10. Examples of the heteroaryl group may include a thiophene group, a furan group, a pyrrole group, an imidazole group, a triazole group, a pyridine group, a bipyridine group, a pyrimidine group, a triazine group, a triazole group, an acridyl group, a pyridazine group, a pyrazinyl group, a quinoline group, a quinazoline group, a quinoxaline group, a phenoxazine group, a phthalazine group, a pyrido pyrimidine group, a pyrido pyrazine group, a pyrazino pyrazine group, an isoquinoline group, an indole group, a carbazole group, an N-arylcarbazole group, an N-heteroarylcarbazole group, an N-alkylcarbazole group, a benzoxazole group, a benzoimidazole group, a benzothiazole group, a benzocarbazole group, a benzothiophene group, a dibenzothiophene group, a thienothiophene group, a benzofuran group, a phenanthroline group, a thiazole group, an isoxazole group, an oxazole group, an oxadiazole group, a thiadiazole group, a phenothiazine group, a dibenzosilole group, a dibenzofuran group, etc., but embodiments of the present disclosure are not limited thereto.

In the specification, the above description with respect to the aryl group may be applied to an arylene group except that the arylene group is a divalent group. The explanation on the aforementioned heteroaryl group may be applied to a heteroarylene group except that the heteroarylene group is a divalent group.

In the specification, the term "silyl group" includes an alkylsilyl group and an arylsilyl group. Examples of the silyl group may include trimethylsilyl, triethylsilyl, t-butyldimethylsilyl, vinyldimethylsilyl, propyldimethylsilyl, triphenylsilyl, diphenylsilyl, phenylsilyl, etc. However, an embodiment of the present disclosure is not limited thereto.

In the specification, the number of carbon atoms in an amino group is not specifically limited, but may be 1 to 30. The amino group may include an alkyl amino group, an aryl amino group, or a heteroaryl amino group. Examples of the amino group include a methylamino group, a dimethylamino group, a phenylamino group, a diphenylamino group, a naphthylamino group, a 9-methyl-anthracenylamino group, a triphenylamino group, etc., but embodiments of the present disclosure are not limited thereto.

In the specification, the number of ring-forming carbon atoms in a carbonyl group may be 1 to 40, 1 to 30, or 1 to 20. For example, the carbonyl group may have the following structures, but embodiments of the present disclosure are not limited thereto.

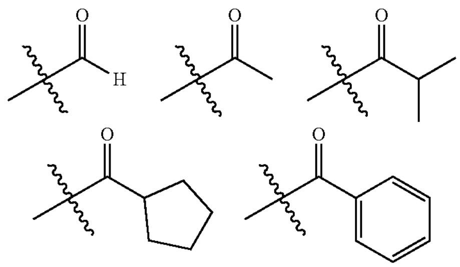

In the specification, the number of carbon atoms in a sulfinyl group and a sulfonyl group is not particularly limited, but may be 1 to 30. The sulfinyl group may include an alkyl sulfinyl group and an aryl sulfinyl group. The sulfonyl group may include an alkyl sulfonyl group and an aryl sulfonyl group.

In the specification, a thiol group may include an alkylthio group and an arylthio group. The thiol group may refer to that a sulfur atom is bonded to the alkyl group or the aryl group as defined above. Examples of the thiol group may include a methylthio group, an ethylthio group, a propylthio group, a pentylthio group, a hexylthio group, an octylthio group, a dodecylthio group, a cyclopentylthio group, a cyclohexylthio group, a phenylthio group, a naphthylthio group, etc., but embodiments of the present disclosure are not limited thereto.

The term "oxy group" as used herein may refer to that an oxygen atom is bonded to the alkyl group or the aryl group as defined above. The oxy group may include an alkoxy group and an aryloxy group. The alkoxy group may be a linear chain, a branched chain or a ring chain. The number of carbon atoms in the alkoxy group is not specifically limited, but may be, for example, 1 to 20 or 1 to 10. Non-limiting examples of the oxy group may include methoxy, ethoxy, n-propoxy, isopropoxy, butoxy, pentyloxy, hexyloxy, octyloxy, nonyloxy, decyloxy, benzyloxy, etc.

The term "boron group" as used herein may refer to that a boron atom is bonded to the alkyl group or the aryl group as defined above. The boron group may include an alkyl boron group and an aryl boron group. Examples of the boron group may include a trimethylboron group, a triethylboron group, a t-butyldimethylboron group, a triphenylboron group, a diphenylboron group, a phenylboron group, etc., but embodiments of the present disclosure are not limited thereto.

In the specification, an alkenyl group may be linear or branched. The number of carbon atoms in the alkenyl group is not specifically limited, but may be 2 to 30, 2 to 20, or 2 to 10. Examples of the alkenyl group include a vinyl group, a 1-butenyl group, a 1-pentenyl group, a 1,3-butadienyl aryl group, a styrenyl group, a styryl vinyl group, etc., but embodiments of the present disclosure are not limited thereto.

In the specification, the number of carbon atoms in an amine group is not specifically limited, but may be 1 to 30. The amine group may include an alkyl amine group and an aryl amine group. Examples of the amine group may include a methylamine group, a dimethylamine group, a phenylamine group, a diphenylamine group, a naphthylamine group, a 9-methyl-anthracenylamine group, a triphenylamine group, etc., but embodiments of the present disclosure are not limited thereto.

In the specification, the alkyl group in each of the alkylthio group, the alkylsulfoxy group, the alkylaryl group, the alkylamino group, the alkyl boron group, the alkyl silyl group, and the alkyl amine group is the same as the examples of the alkyl group described above.

In the specification, the aryl group in each of the aryloxy group, the arylthio group, the arylsulfoxy group, the arylamino group, the arylboron group, the arylsilyl group, and the arylamine group is the same as the examples of the aryl group described above.

The term "a direct linkage" as used herein may refer to a single bond (e.g., a single covalent bond).

In the specification,

"  "

or "—*" as used herein each represents a position to be connected.

Hereinafter, embodiments of the present disclosure will be described with reference to the accompanying drawings.

FIG. 1 is a plan view illustrating an embodiment of a display apparatus DD.

Figure 2:
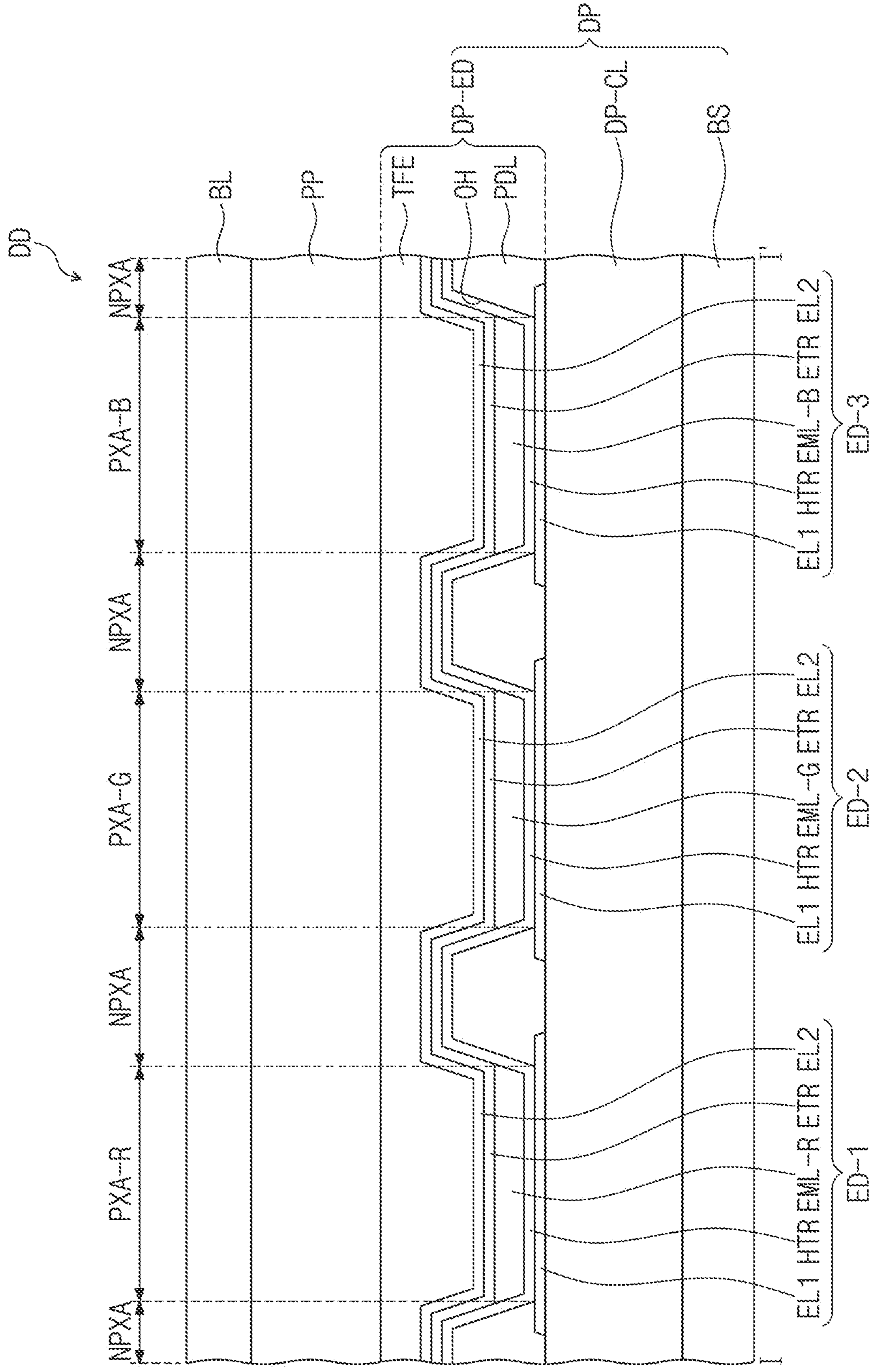
FIG. 2 is a cross-sectional view of a display apparatus according to an embodiment of the present disclosure.

FIG. 2 is a cross-sectional view of the display apparatus DD of the embodiment. FIG. 2 is a cross-sectional view illustrating a part taken along the line I-I' of FIG. 1.

The display apparatus DD may include a display panel DP and an optical layer PP on the display panel DP. The display panel DP includes luminescence devices (e.g., light emitting devices) ED-1, ED-2, and ED-3. The display apparatus DD may include a plurality of luminescence devices ED-1, ED-2, and ED-3. The optical layer PP may be on the display panel DP and control reflected light in the display panel DP due to external light. The optical layer PP may include, for example, a polarization layer and/or a color filter layer. In one or more embodiments, unlike the view illustrated in the drawing, the optical layer PP may be omitted from the display apparatus DD of an embodiment.

A base substrate BL may be on the optical layer PP. The base substrate BL may be a member which provides a base surface on which the optical layer PP is located. The base substrate BL may be a glass substrate, a metal substrate, a plastic substrate, etc. However, embodiments of the present disclosure are not limited thereto, and the base substrate BL may be an inorganic layer, an organic layer, or a composite material layer (e.g., a composite material layer including an inorganic material and an organic material). Also, in an embodiment, the base substrate BL may be omitted.

The display apparatus DD according to an embodiment may further include a filling layer. The filling layer may be between a display device layer DP-ED and the base substrate BL. The filling layer may be an organic material layer. The filling layer may include at least one of an acrylic-based resin, a silicone-based resin, or an epoxy-based resin.

The display panel DP may include a base layer BS, a circuit layer DP-CL provided on the base layer BS, and a display device layer DP-ED. The display device layer DP-ED may include a pixel defining film PDL, the light emitting devices ED-1, ED-2, and ED-3 between portions of the pixel defining film PDL, and an encapsulation layer TFE on the light emitting devices ED-1, ED-2, and ED-3.

The base layer BS may be a member which provides a base surface on which the display device layer DP-ED is located. The base layer BS may be a glass substrate, a metal substrate, a plastic substrate, etc. However, embodiments of the present disclosure are not limited thereto, and the base layer BS may be an inorganic layer, an organic layer, or a composite material layer.

In an embodiment, the circuit layer DP-CL is located on the base layer BS, and the circuit layer DP-CL may include a plurality of transistors. Each of the transistors may include a control electrode, an input electrode, and an output electrode. For example, the circuit layer DP-CL may include a switching transistor and a driving transistor in order to drive the light emitting devices ED-1, ED-2, and ED-3 of the display device layer DP-ED.

Each of the light emitting devices ED-1, ED-2, and ED-3 may have a structure of a light emitting device ED of an embodiment according to FIGS. 3 to 6, which will be described in more detail later. Each of the light emitting devices ED-1, ED-2 and ED-3 may include a first electrode EL1, a hole transport region HTR, emission layers EML (EML-R, EML-G and/or EML-B (e.g., one selected from emission layer EML-R, emission layer EML-G, or emission layer EML-B)), an electron transport region ETR, and a second electrode EL2.

FIG. 2 illustrates an embodiment in which the emission layers EML-R, EML-G, and EML-B of the light emitting devices ED-1, ED-2, and ED-3 are in the openings OH defined in the pixel defining film PDL, and the hole transport region HTR, the electron transport region ETR, and the second electrode EL2 are provided as a common layer in the entire light emitting devices ED-1, ED-2, and ED-3. However, embodiments of the present disclosure are not limited thereto, and unlike the feature illustrated in FIG. 2, the hole transport region HTR and the electron transport region ETR in an embodiment may be provided by being patterned inside the opening hole OH defined in the pixel defining film PDL. For example, the hole transport region HTR, the emission layers EML-R, EML-G, and EML-B, and the electron transport region ETR in an embodiment may be patterned (e.g., provided into one or more patterns) utilizing an inkjet printing method.

The encapsulation layer TFE may cover the light emitting devices ED-1, ED-2 and ED-3. The encapsulation layer TFE may seal the display device layer DP-ED. The encapsulation layer TFE may be a thin film encapsulation layer. The encapsulation layer TFE may be formed by laminating one layer or a plurality of layers. The encapsulation layer TFE may include at least one insulation layer. The encapsulation layer TFE according to an embodiment may include at least one inorganic film (hereinafter, an encapsulation-inorganic film). The encapsulation layer TFE according to an embodiment may also include at least one organic film (hereinafter, an encapsulation-organic film) and at least one encapsulation-inorganic film.

The encapsulation-inorganic film protects the display device layer DP-ED from moisture/oxygen, and the encapsulation-organic film protects the display device layer DP-ED from foreign substances such as dust particles. The encapsulation-inorganic film may include silicon nitride, silicon oxynitride, silicon oxide, titanium oxide, aluminum oxide, and/or the like, but embodiments of the present disclosure are not particularly limited thereto. The encapsulation-organic film may include an acrylic-based compound, an epoxy-based compound, and/or the like. The encapsulation-organic film may include a photopolymerizable organic material, but embodiments of the present disclosure are not particularly limited thereto.

The encapsulation layer TFE may be disposed on the second electrode EL2 and may fill the opening hole OH.

Referring to FIGS. 1 and 2, the display apparatus DD may include a non-light emitting region NPXA and light emitting regions PXA-R, PXA-G and PXA-B. The light emitting regions PXA-R, PXA-G and PXA-B each may be a region which emits light generated from the light emitting devices ED-1, ED-2 and ED-3, respectively. The light emitting regions PXA-R, PXA-G, and PXA-B may be spaced apart from each other in a plane.

Each of the light emitting regions PXA-R, PXA-G, and PXA-B may be a region divided by pixel defining film PDL. The non-light emitting regions NPXA may be regions between the adjacent light emitting regions PXA-R, PXA-G, and PXA-B, which correspond to portions of the pixel defining film PDL. In one or more embodiments, in the specification, each of the light emitting regions PXA-R, PXA-G, and PXA-B may correspond to a pixel. The pixel defining film PDL may separate the light emitting devices ED-1, ED-2, and ED-3. The emission layers EML-R, EML-G and EML-B of the light emitting devices ED-1, ED-2 and ED-3 may be disposed in openings OH defined by the pixel defining film PDL and separated from each other.

The light emitting regions PXA-R, PXA-G and PXA-B may be divided into a plurality of groups according to the color of light generated from the plurality of light emitting devices ED-1, ED-2 and ED-3. In the display apparatus DD of an embodiment shown in FIGS. 1 and 2, three light emitting regions PXA-R, PXA-G, and PXA-B which emit red light, green light, and blue light, respectively, are illustrated as examples. For example, the display apparatus DD of an embodiment may include the red light emitting region PXA-R, the green light emitting region PXA-G, and the blue light emitting region PXA-B, which are different from one another.

In the display apparatus DD according to an embodiment, the plurality of light emitting devices ED-1, ED-2 and ED-3 may emit light in different wavelength regions. For example, in an embodiment, the display apparatus DD may include the first light emitting device ED-1 that emits red light, the second light emitting device ED-2 that emits green light, and the third light emitting device ED-3 that emits blue light. That is, the red light emitting region PXA-R, the green light emitting region PXA-G, and the blue light emitting region PXA-B of the display apparatus DD may correspond to the first light emitting device ED-1, the second light emitting device ED-2, and the third light emitting device ED-3, respectively.

However, embodiments of the present disclosure are not limited thereto, and the first to the third light emitting devices ED-1, ED-2, and ED-3 may emit light in the same wavelength range or at least one light emitting device may emit light in a wavelength range different from the others. For example, the first to third light emitting devices ED-1, ED-2, and ED-3 may all emit blue light.

The light emitting regions PXA-R, PXA-G, and PXA-B in the display apparatus DD according to an embodiment may be arranged in a stripe form. Referring to FIG. 1, the plurality of red light emitting regions PXA-R, the plurality of green light emitting regions PXA-G, and the plurality of blue light emitting regions PXA-B each may be arranged along a second directional axis DR2. In addition, the red light emitting region PXA-R, the green light emitting region PXA-G, and the blue light emitting region PXA-B may be alternately arranged in this order along a first directional axis DR1.

FIGS. 1 and 2 illustrate that all the light emitting regions PXA-R, PXA-G, and PXA-B have similar area, but embodiments of the present disclosure are not limited thereto, and the light emitting regions PXA-R, PXA-G, and PXA-B may have different areas from each other according to a wavelength range of the emitted light. In one or more embodiments, the areas of the light emitting regions PXA-R, PXA-G, and PXA-B may refer to areas in a plan view (e.g., when viewed in or on a plane defined by the first directional axis DR1 and the second directional axis DR2).

In one or more embodiments, the arrangement form of the light emitting regions PXA-R, PXA-G, and PXA-B is not limited to the feature illustrated in FIG. 1, and the order in which the red light emitting region PXA-R, the green light emitting region PXA-G, and the blue light emitting region PXA-B are arranged may be variously combined and provided according to characteristics of a display quality required in the display apparatus DD. For example, the arrangement form of the light emitting regions PXA-R, PXA-G, and PXA-B may be a PENTILE® arrangement form (e.g., an RGBG matrix, RGBG structure, or RGBG matrix structure) or a diamond arrangement form, but the present disclosure is not limited thereto. PENTILE® is a duly registered trademark of Samsung Display Co., Ltd.

In addition, the areas of the light emitting regions PXA-R, PXA-G, and PXA-B may be different from each other. For example, in an embodiment, the area of the green light emitting region PXA-G may be smaller than that of the blue light emitting region PXA-B, but embodiments of the present disclosure are not limited thereto.

Hereinafter, FIGS. 3 to 6 are cross-sectional views schematically illustrating light emitting devices according to an embodiment. The light emitting devices ED according to embodiments each may include a first electrode EL1, a second electrode EL2 facing the first electrode EL1, and at least one functional layer between the first electrode EL1 and the second electrode EL2. The at least one functional layer may include a hole transport region HTR, an emission layer EML, and an electron transport region ETR that are sequentially stacked. For example, each of the light emitting devices ED of embodiments may include the first electrode EL1, the hole transport region HTR, the emission layer EML, the electron transport region ETR, and the second electrode EL2 that are sequentially stacked.

Figure 3:
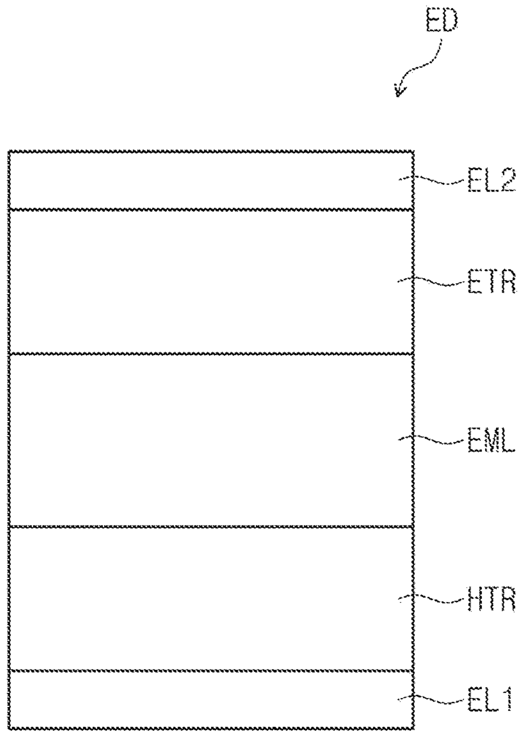
FIG. 3 is a cross-sectional view schematically illustrating a light emitting device according to an embodiment of the present disclosure.
Figure 4:
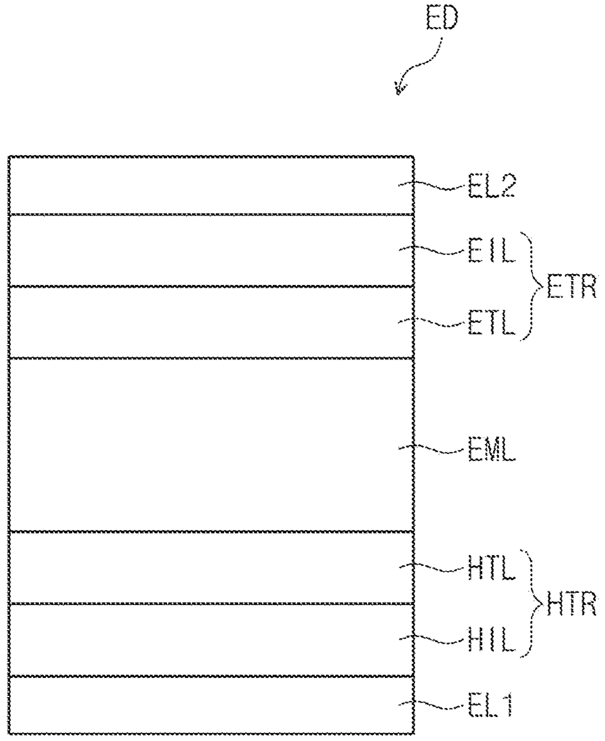
FIG. 4 is a cross-sectional view schematically illustrating a light emitting device according to an embodiment of the present disclosure.
Figure 5:
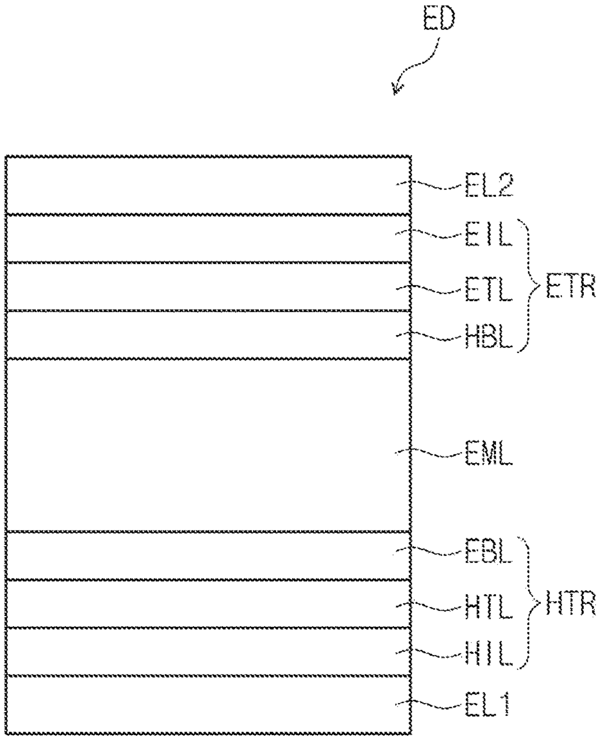
FIG. 5 is a cross-sectional view schematically illustrating a light emitting device according to an embodiment of the present disclosure.
Figure 6:
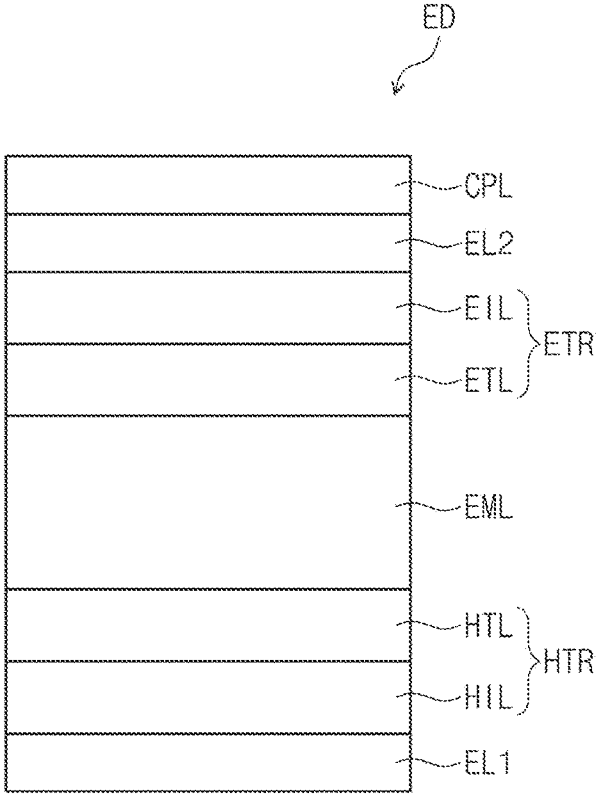
FIG. 6 is a cross-sectional view schematically illustrating a light emitting device according to an embodiment of the present disclosure.

Compared to FIG. 3, FIG. 4 illustrates a cross-sectional view of a light emitting device ED of an embodiment, in which a hole transport region HTR includes a hole injection layer HIL and a hole transport layer HTL, and an electron transport region ETR includes an electron injection layer EIL and an electron transport layer ETL. In addition, compared to FIG. 3, FIG. 5 illustrates a cross-sectional view of a light emitting device ED of an embodiment, in which a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL. Compared to FIG. 4, FIG. 6 illustrates a cross-sectional view of a light emitting device ED of an embodiment including a capping layer CPL on a second electrode EL2.

The light emitting device ED of an embodiment may include a condensed cyclic compound of an embodiment, which will be described in more detail below, in the emission layer EML. However, embodiments of the present disclosure are not limited thereto, and the light emitting device ED of an embodiment may include a condensed cyclic compound according to an embodiment, which will be described in more detail below, in the hole transport region HTR or the electron transport region ETR, which is one of the plurality of functional layers between the first electrode EL1 and the second electrode EL2, as well as in the emission layer EML.

In the light emitting device ED according to an embodiment, the first electrode EL1 has conductivity (e.g., electrical conductivity). The first electrode EL1 may be formed of a metal material, a metal alloy, and/or a conductive compound. The first electrode EL1 may be an anode or a cathode. However, embodiments of the present disclosure are not limited thereto. In addition, the first electrode EL1 may be a pixel electrode. The first electrode EL1 may be a transmissive electrode, a transflective electrode, or a reflective electrode. The first electrode EL1 may include Ag, Mg, Cu, Al, Pt, Pd, Au, Ni, Nd, Ir, Cr, Li, Ca, LiF/Ca, LiF/Al, Mo, Ti, W, In, Sn, Zn, a compound of two or more thereof, a mixture of two or more thereof, or an oxide thereof.

When the first electrode EL1 is the transmissive electrode, the first electrode EL1 may include a transparent metal oxide such as indium tin oxide (ITO), indium zinc oxide (IZO), zinc oxide (ZnO), and/or indium tin zinc oxide (ITZO). If the first electrode EL1 is the transflective electrode or the reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, W, a compound thereof, or a mixture thereof (e.g., a mixture of Ag and Mg). In one or more embodiments, the first electrode EL1 may have a multilayer structure including a reflective film or a transflective film formed of the above-described materials, and a transparent conductive film formed of ITO, IZO, ZnO, ITZO, etc. For example, the first electrode EL1 may have a three-layer structure of ITO/Ag/ITO, but embodiments of the present disclosure are not limited thereto. In addition, embodiments of the present disclosure are not limited thereto, and the first electrode EL1 may include the above-described metal materials, combinations of at least two metal materials of the above-described metal materials, oxides of the above-described metal materials, and/or the like. The thickness of the first electrode EL1 may be from about 700 Å to about 10,000 Å. For example, the thickness of the first electrode EL1 may be from about 1,000 Å to about 3,000 Å.

The hole transport region HTR is provided on the first electrode EL1. The hole transport region HTR may include at least one of a hole injection layer HIL, a hole transport layer HTL, a buffer layer, an emission-auxiliary layer, or an electron blocking layer EBL. The thickness of the hole transport region HTR may be, for example, from about 50 Å to about 15,000 Å.

The hole transport region HTR may have a single layer formed of a single material, a single layer formed of a plurality of different materials, or a multilayer structure including a plurality of layers formed of a plurality of different materials.

For example, the hole transport region HTR may have a single layer structure of the hole injection layer HIL or the hole transport layer HTL, and may have a single layer structure formed of a hole injection material and a hole transport material. In addition, the hole transport region HTR may have a single layer structure formed of a plurality of different materials, or a structure in which a hole injection layer HIL/hole transport layer HTL, a hole injection layer HIL/hole transport layer HTL/buffer layer, a hole injection layer HIL/buffer layer, a hole transport layer HTL/buffer layer, or a hole injection layer HIL/hole transport layer HTL/electron blocking layer EBL are stacked in order from the first electrode EL1, but embodiments of the present disclosure are not limited thereto.

The hole transport region HTR may be formed utilizing various suitable methods such as a vacuum deposition method, a spin coating method, a cast method, a Langmuir-Blodgett (LB) method, an inkjet printing method, a laser printing method, and/or a laser induced thermal imaging (LITI) method.

The hole transport region HTR may include a compound represented by Formula H-1 below:

Formula H-1

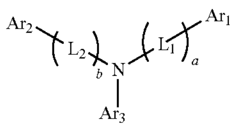

In Formula H-1 above, $L_1$ and $L_2$ may be each independently a direct linkage, a substituted or unsubstituted arylene group having 6 to 30 ring-forming carbon atoms, or a substituted or unsubstituted heteroarylene group having 2 to 30 ring-forming carbon atoms. a and b may be each independently an integer of 0 to 10. In one or more embodiments, when a or b is an integer of 2 or greater, a plurality of $L_1$'s and $L_2$'s may be each independently a substituted or unsubstituted arylene group having 6 to 30 ring-forming carbon atoms, or a substituted or unsubstituted heteroarylene group having 2 to 30 ring-forming carbon atoms.

In Formula H-1, $Ar_1$ and $Ar_2$ may be each independently a substituted or unsubstituted aryl group having 6 to 30 ring-forming carbon atoms, or a substituted or unsubstituted heteroaryl group having 2 to 30 ring-forming carbon atoms. In addition, in Formula H-1, $Ar_3$ may be a substituted or unsubstituted aryl group having 6 to 30 ring-forming carbon atoms.

The compound represented by Formula H-1 above may be a monoamine compound. In one or more embodiments, the compound represented by Formula H-1 above may be a diamine compound in which at least one selected from among $Ar_1$ to $Ar_3$ includes an amine group as a substituent. In addition, the compound represented by Formula H-1 above may be a carbazole-based compound including a substituted or unsubstituted carbazole group in at least one of $Ar_1$ or $Ar_2$, or a fluorene-based compound including a substituted or unsubstituted fluorene group in at least one of $Ar_1$ or $Ar_2$.

The compound represented by Formula H-1 may be represented by any one of the compounds of Compound Group H below. However, the compounds listed in Compound Group H below are examples, and the compounds represented by Formula H-1 are not limited to those represented by Compound Group H below:

Compound Group H

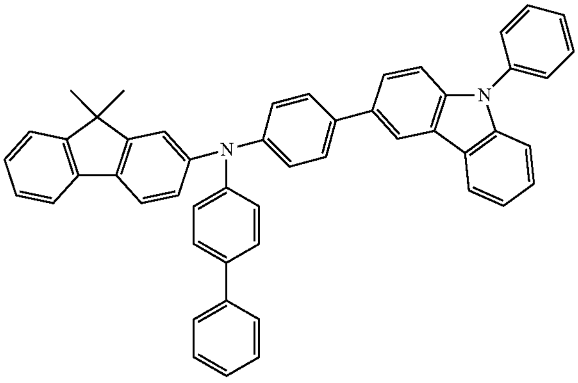

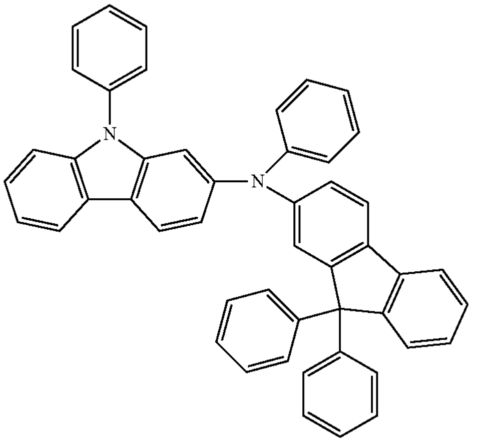

-continued
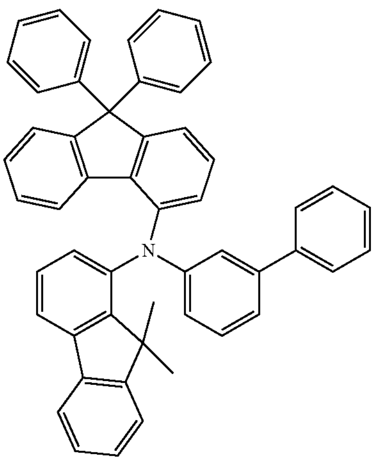
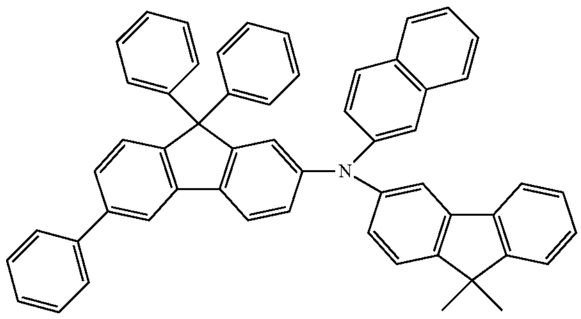
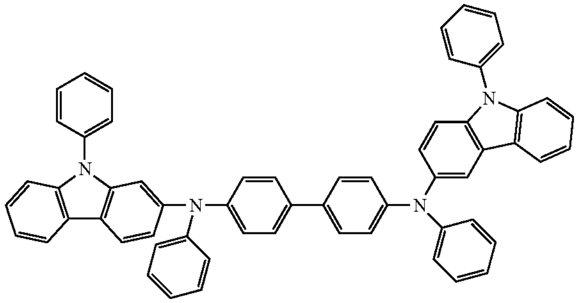
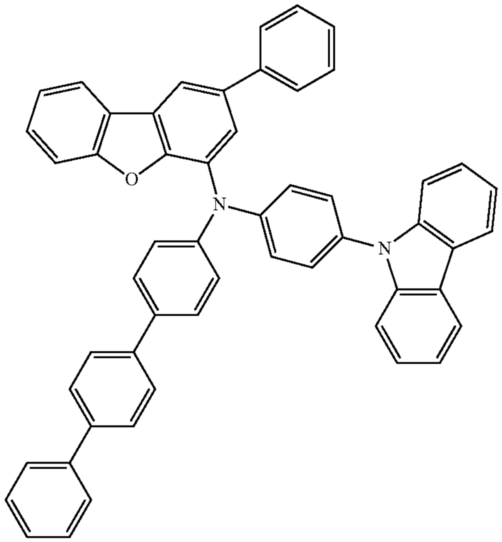
-continued
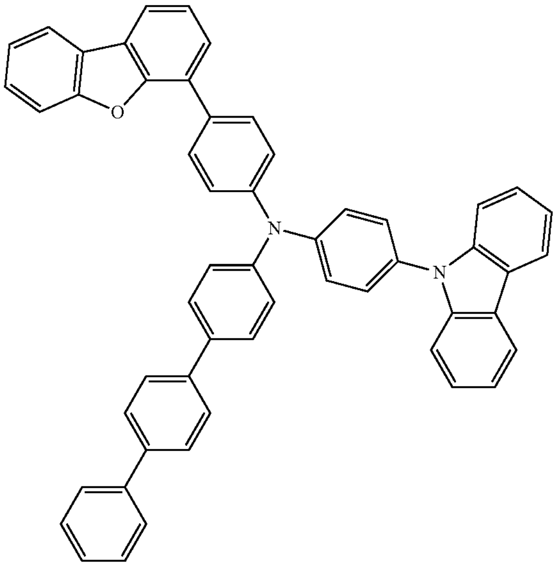
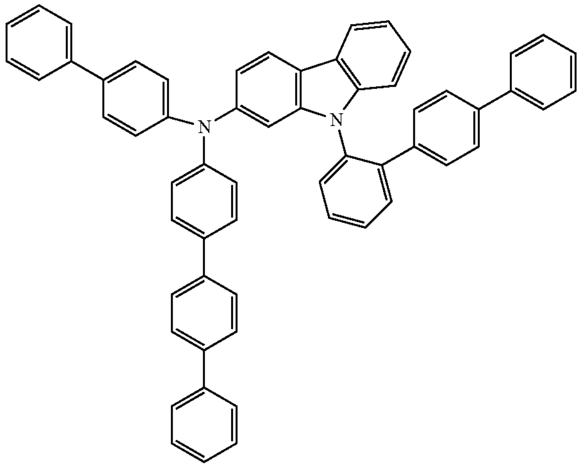
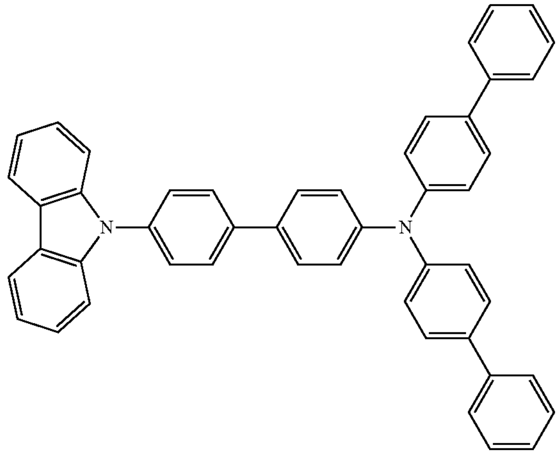

-continued
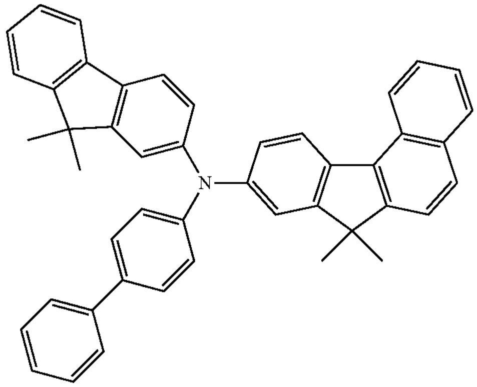
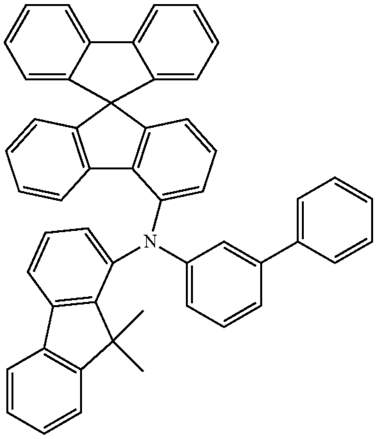
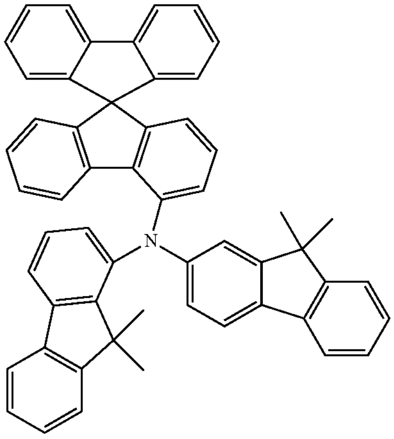
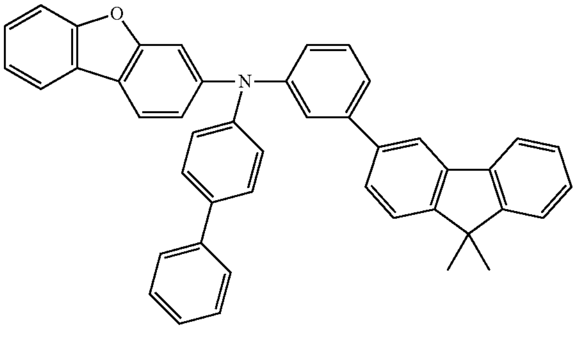
-continued
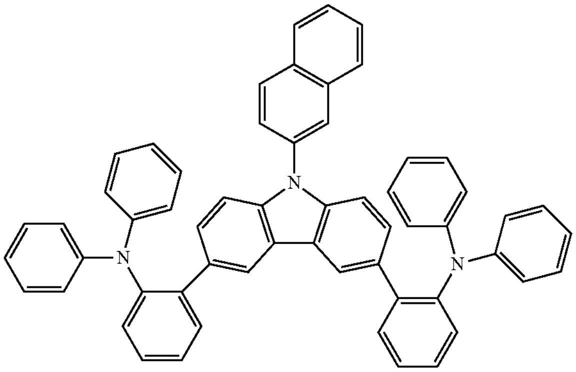
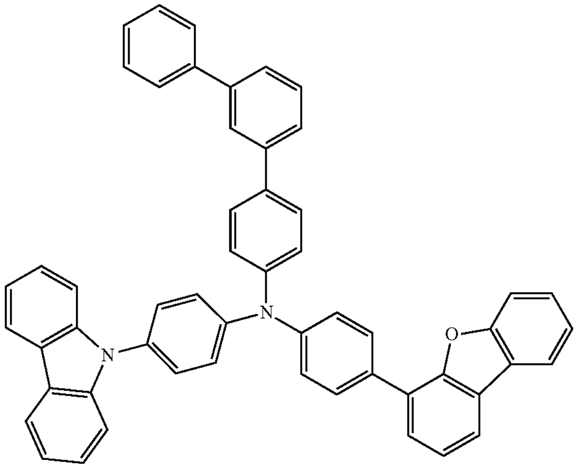
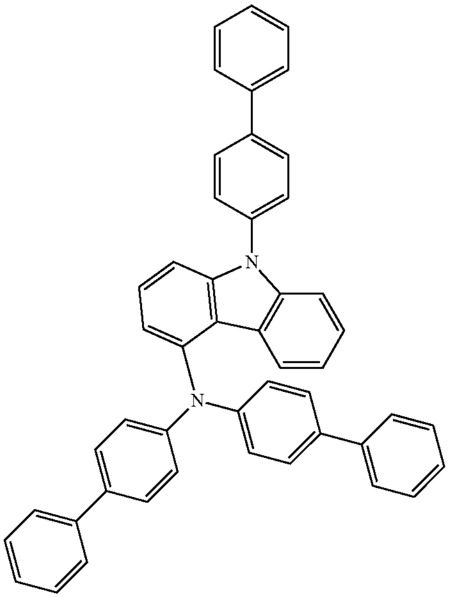

-continued

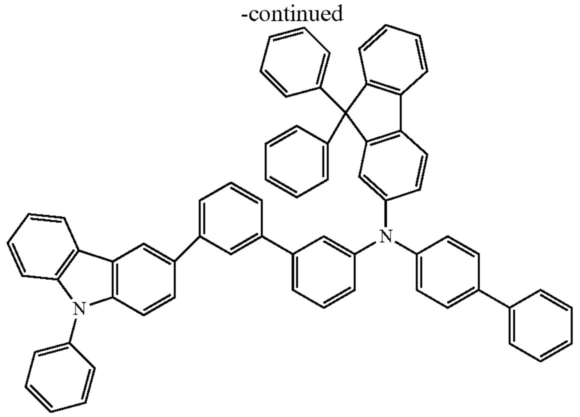

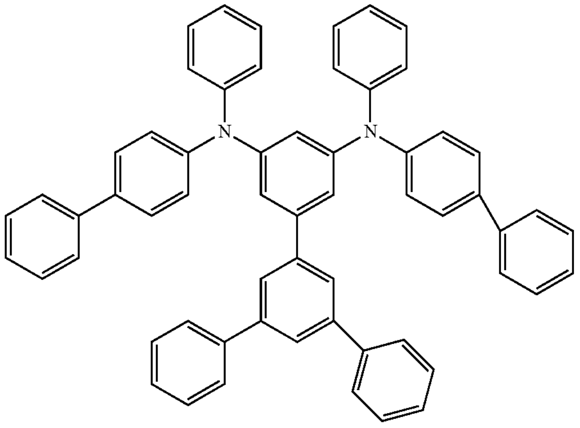 [SMILES: c1ccc(-c2ccc(N(c3ccccc3)c3cc(-c4cc(-c5ccccc5)cc(-c5ccccc5)c4)cc(N(c4ccccc4)c4ccc(-c5ccccc5)cc4)c3)cc2)cc1]

The hole transport region HTR may include a phthalocyanine compound (such as copper phthalocyanine), $N^1$,$N^{1'}$-([1,1'-biphenyl]-4,4'-diyl)bis($N^1$-phenyl-$N^4$,$N^4$-di-m-tolyl-benzene-1,4-diamine) (DNTPD), 4,4',4"-[tris(3-methylphenyl)phenylamino] triphenylamine (m-MTDATA), 4,4'4"-tris(N,N-diphenylamino)triphenylamine (TDATA), 4,4',4"-tris[N(2-naphthyl)-N-phenylamino]-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalene-1-yl)-N,N'-diphenyl-benzidine (NPB), triphenylamine-containing polyetherketone (TPAPEK), 4-isopropyl-4'-methyldiphenyliodonium [tetrakis(pentafluorophenyl)borate], dipyrazino[2,3-f: 2',3'-h]quinoxaline-2,3,6,7,10,11-hexacarbonitrile (HATCN), etc.

The hole transport region HTR may include carbazole derivatives (such as N-phenyl carbazole and/or polyvinyl carbazole), fluorene derivatives, N,N'-bis(3-methylphenyl)-N,N'-diphenyl-[1,1-biphenyl]-4,4'-diamine (TPD), triphenylamine derivatives (such as 4,4',4"-tris(N-carbazolyl) triphenylamine (TCTA)), N,N'-di(naphthalene-1-yl)-N,N'-diphenyl-benzidine (NPB), 4,4'-cyclohexylidene bis[N,N-bis(4-methylphenyl]benzenamine] (TAPC), 4,4'-bis[N,N'-(3-tolyl)amino]-3,3'-dimethylbiphenyl (HMTPD), 1,3-bis (N-carbazolyl)benzene (mCP), etc.

In addition, the hole transport region HTR may include carbazole derivatives (such as N-phenyl carbazole and/or polyvinyl carbazole), fluorene derivatives, N,N'-bis(3-methylphenyl)-N,N'-diphenyl-[1,1-biphenyl]-4,4'-diamine (TPD), triphenylamine derivatives (such as 4,4',4"-tris(N-carbazolyl)triphenylamine (TCTA)), N,N'-di(naphthalene-1-yl)-N,N'-diplienyl-benzidine (NPB), 4,4'-cyclohexylidene bis[N,N-bis(4-methylphenyl)benzenamine] (TAPC), 4,4'-bis[N,N'-(3-tolyl)amino]-3,3'-dimethylbiphenyl (HMTPD), 9-(4-tert-butylphenyl)-3,6-bis(triphenylsilyl)-9H-carbazole (CzSi), 9-phenyl-9H-3,9'-bicarbazole (CCP), 1,3-bis(N-carbazolyl)benzene (mCP), 1,3-bis(1,8-dimethyl-9H-carbazol-9-yl)benzene (mDCP), etc.

The hole transport region HTR may include the above-described compound of the hole transport region in at least one of a hole injection layer HIL, a hole transport layer HTL, or an electron blocking layer EBL.

The thickness of the hole transport region HTR may be from about 100 Å to about 10,000 Å, for example, from about 100 Å to about 5,000 Å. When the hole transport region HTR includes the hole injection layer HIL, the hole injection layer HIL may have, for example, a thickness of about 30 Å to about 1,000 Å. When the hole transport region HTR includes the hole transport layer HTL, the hole transport layer HTL may have a thickness of about 30 Å to about 1,000 Å. For example, when the hole transport region HTR includes the electron blocking layer EBL, the electron blocking layer EBL may have a thickness of about 10 Å to about 1,000 Å. If the thicknesses of the hole transport region HTR, the hole injection layer HIL, the hole transport layer HTL and the electron blocking layer EBL satisfy the above-described ranges, satisfactory hole transport characteristics may be achieved without a substantial increase in a driving voltage.

The hole transport region HTR may further include a charge generating material in addition to the above-described materials to increase conductivity (e.g., electrical conductivity). The charge generating material may be dispersed uniformly or non-uniformly in the hole transport region HTR. The charge generating material may be, for example, a p-dopant. The p-dopant may include at least one of a halogenated metal compound, a quinone derivative, a metal oxide, or a cyano group-containing compound, but embodiments of the present disclosure are not limited thereto. For example, the p-dopant may include metal halides (such as CuI and/or RbI), quinone derivatives (such as tetracyanoquinodimethane (TCNQ) and/or 2,3,5,6-tetrafluoro-7,7',8,8'-tetracyanoquinodimethane (F4-TCNQ)), metal oxides (such as tungsten oxide and/or molybdenum oxide), dipyrazino[2,3-f: 2',3'-h]quinoxaline-2,3,6,7,10,11-hexacarbonitrile (HATCN), 4-[[2,3-bis[cyano-(4-cyano-2,3,5,6-tetrafluorophenyl)methylidene]cyclopropylidene]-cya nomethyl]-2,3,5,6-tetrafluorobenzonitrle, etc., but embodiments of the present disclosure are not limited thereto.

As described above, the hole transport region HTR may further include at least one of the buffer layer or the electron blocking layer EBL in addition to the hole injection layer HIL and the hole transport layer HTL. The buffer layer may compensate a resonance distance according to the wavelength of light emitted from the emission layer EML and may thus increase light emission efficiency. Materials which may be included in the hole transport region HTR may be utilized as materials to be included in the buffer layer. The electron blocking layer EBL is a layer that serves to prevent or reduce injection of electrons from the electron transport region ETR to the hole transport region HTR.

The emission layer EML is provided on the hole transport region HTR. The emission layer EML may have a thickness of, for example, about 100 Å to about 1,000 Å or about 100 Å to about 300 Å. The emission layer EML may have a single layer formed of a single material, a single layer formed of a plurality of different materials, or a multilayer structure having a plurality of layers formed of a plurality of different materials.

The light emitting device ED of an embodiment may include a condensed cyclic compound according to an embodiment. The condensed cyclic compound of an embodiment may be represented by Formula 1 below:

Formula 1

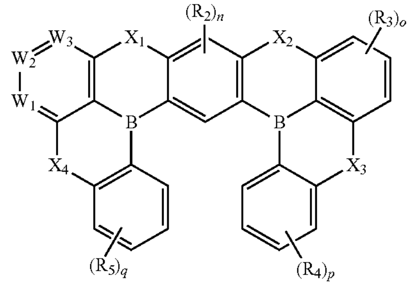

In Formula 1, $X_1$ to $X_4$ are each independently O, S, $CR_6R_7$, or NRs.

A substituent represented by Formula 2 is connected to adjacent two groups selected from among $W_1$, $W_2$, and $W_3$, the adjacent two groups selected from among $W_1$, $W_2$, and $W_3$ are each a carbon atom, and the other one (i.e., the remaining one of $W_1$, $W_2$, and $W_3$) is $CR_1$. For example, Formula 2 may be connected to $W_1$ and $W_2$, and $W_3$ may be $CR_1$. In one or more embodiments, Formula 2 may be connected to $W_2$ and $W_3$, and $W_1$ may be $CR_1$.

$R_1$ to $R_8$ may be each independently a hydrogen atom, an oxygen atom, a sulfur atom, a selenium atom, a deuterium atom, a halogen atom, a cyano group, a nitro group, a substituted or unsubstituted silyl group, a substituted or unsubstituted amine group, a substituted or unsubstituted alkyl group having 1 to 30 carbon atoms, a substituted or unsubstituted alkoxy group having 1 to 30 carbon atoms, a substituted or unsubstituted aryloxy group having 1 to 30 carbon atoms, a substituted or unsubstituted aryl group having 6 to 30 ring-forming carbon atoms, a substituted or unsubstituted heteroaryl group having 2 to 30 ring-forming carbon atoms, or a substituted or unsubstituted aliphatic heterocyclic group having 2 to 30 ring-forming carbon atoms, and/or may be bonded to an adjacent group to form a ring. For example, $R_1$ may be a hydrogen atom, or a substituted or unsubstituted aryl group having 6 to 30 ring-forming carbon atoms. For example, $R_2$, $R_4$, and $R_5$ may each be a hydrogen atom. For example, $R_3$ may be a substituted or unsubstituted alkyl group having 1 to 30 carbon atoms, a substituted or unsubstituted amine group, a substituted or unsubstituted alkoxy group having 1 to 30 carbon atoms. a substituted or unsubstituted heteroaryl group having 2 to 30 ring-forming carbon atoms, or a substituted or unsubstituted aliphatic heterocyclic group having 2 to 30 ring-forming carbon atoms. In one or more embodiments, two or more $R_3$'s may be provided, and two or more $R_3$'s may be bonded to each other to form a condensed ring in a benzene ring to which $R_3$ is substituted. For example, Re may be a substituted or unsubstituted aryl group having 6 to 30 ring-forming carbon atoms. For example, Re may be an unsubstituted phenyl group.

n is an integer of 0 to 2, o is an integer of 0 to 3, and p and q are each independently an integer of 0 to 4. When n is 2, two $R_2$'s may be the same or different f.

In one or more embodiments, when o and p each are an integer of 2 or greater, each of a plurality of $R_3$'s, $R_4$'s, and $R_5$'s may all be the same or at least one may be different from the rest of $R_3$'s, $R_4$'s, and $R_5$'s.

In the condensed cyclic compound of an embodiment, n, p, and q may be 0, and o may be 1 or 2. However, embodiments of the present disclosure are not limited thereto.

In an embodiment, adjacent two among $W_1$, $W_2$, and $W_3$ may be represented by Formula 2.

Formula 2

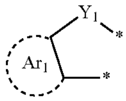

In Formula 2, $Y_1$ is O, S, Se, $CR_{1a}R_{2a}$, or $NR_3$.

$Ar_1$ may be a substituted or unsubstituted aromatic hydrocarbon ring having 6 to 30 ring-forming carbon atoms, or a substituted or unsubstituted aromatic heterocyclic ring having 2 to 30 ring-forming carbon atoms. For example, $Ar_1$ may be a substituted or unsubstituted benzene ring. For example, $Ar_1$ may be a substituted benzene ring or an unsubstituted benzene ring to which at least one selected from among an aryloxy group, a diphenyl amine group, and a phenyl group is substituted. In one or more embodiments, $Ar_1$ may be a substituted or unsubstituted dibenzofuran ring. However, embodiments of the present disclosure are not limited thereto.

$R_{1a}$, $R_{2a}$, and $R_{3a}$ may be each independently a hydrogen atom, an oxygen atom, a sulfur atom, a selenium atom, a deuterium atom, a halogen atom, a cyano group, a nitro group, a substituted or unsubstituted silyl group, a substituted or unsubstituted amine group, a substituted or unsubstituted alkyl group having 1 to 30 carbon atoms, a substituted or unsubstituted alkoxy group having 1 to 30 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring. For example, $R_{3a}$ may be a substituted or unsubstituted aryl group having 6 to 30 ring-forming carbon atoms.

The condensed cyclic compound represented by Formula 1 of an embodiment may be represented by Formula 3a or Formula 3b:

Formula 3a

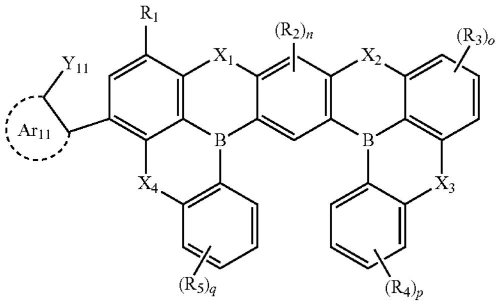

-continued

Formula 3b

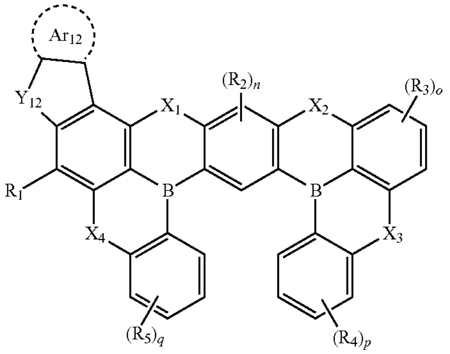

Formula 3a and Formula 3b are those in which $W_1$, $W_2$, and $W_3$ are specified in Formula 1. For example, Formula 3a represents the case in which Formula 2 is connected to $W_1$ and $W_2$ of Formula 1 and $W_3$ is $CR_1$. Formula 3b may represent the case in which Formula 2 is connected to $W_2$ and $W_3$, and $W_1$ is $CR_1$.

$Y_{11}$ and $Y_{12}$ are each independently O, S, Se, $CR_{1b}R_{2b}$, or $NR_{3b}$.

$Ar_{11}$ and $Ar_{12}$ are each independently a substituted or unsubstituted aromatic hydrocarbon ring having 6 to 30 ring-forming carbon atoms, or a substituted or unsubstituted aromatic heterocyclic ring having 2 to 30 ring-forming carbon atoms. For example, $Ar_{11}$ and $Ar_{12}$ may be each independently a substituted or unsubstituted benzene ring. For example, $Ar_{11}$ may be a substituted benzene ring or an unsubstituted benzene ring to which at least one selected from among an aryloxy group, a diphenyl amine group, and a phenyl group is substituted. For example, $Ar_{12}$ may be a substituted or unsubstituted dibenzofuran ring, or an unsubstituted benzene ring. However, embodiments of the present disclosure are not limited thereto.

$R_{1b}$ to $R_{3b}$ may be each independently a hydrogen atom, an oxygen atom, a sulfur atom, a selenium atom, a deuterium atom, a halogen atom, a cyano group, a nitro group, a substituted or unsubstituted silyl group, a substituted or unsubstituted amine group, a substituted or unsubstituted alkyl group having 1 to 30 carbon atoms, a substituted or unsubstituted alkoxy group having 1 to 30 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring. For example, $R_{3b}$ may be a substituted or unsubstituted aryl group having 6 to 30 ring-forming carbon atoms.

$X_1$ to $X_4$, $R_1$ to $R_5$, and n to q are the same as defined in connection with Formula 1 and Formula 2.

The condensed cyclic compound represented by Formula 1 of an embodiment may be represented by Formula 4a or Formula 4b: Formula 4a Formula 4a

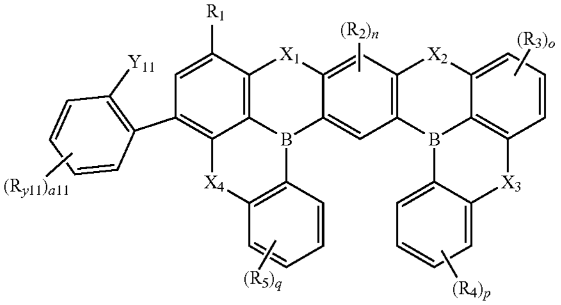

Formula 4b

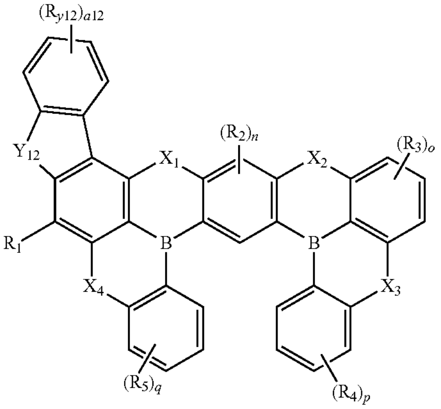

In Formula 4a and Formula 4b, $R_{y11}$ and $R_{y12}$ may be each independently a hydrogen atom, a deuterium atom, a halogen atom, a cyano group, a nitro group, a substituted or unsubstituted silyl group, a substituted or unsubstituted amine group, a substituted or unsubstituted alkyl group having 1 to 30 carbon atoms, a substituted or unsubstituted alkoxy group having 1 to 30 carbon atoms, a substituted or unsubstituted aryloxy group having 1 to 30 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring. For example, $R_{y11}$ may be a hydrogen atom, a substituted or unsubstituted amine group, a substituted or unsubstituted aryloxy group having 1 to 30 carbon atoms, or a substituted or unsubstituted aryl group having 6 to 30 ring-forming carbon atoms. For example, $R_{y11}$ may be a diphenyl amine group, a phenoxy group, or phenyl group. However, embodiments of the present disclosure are not limited thereto, and two or more $R_{y11}$'s may be provided, and two or more $R_{y11}$'s may be bonded to each other to form a condensed ring.

For example, $R_{y12}$ may be a hydrogen atom.

a11 and a12 are each independently an integer of 0 to 4. For example, a11 and a12 may be each independently 0 to 2.

$X_1$ to $X_4$, $Y_{11}$, $Y_{12}$, $R_1$ to $R_5$, and n to q are the same as defined in connection with Formula 1, Formula 2, Formula 3a, and Formula 3b.

The condensed cyclic compound represented by Formula 1 of an embodiment may be represented by Formula 5:

Formula 5

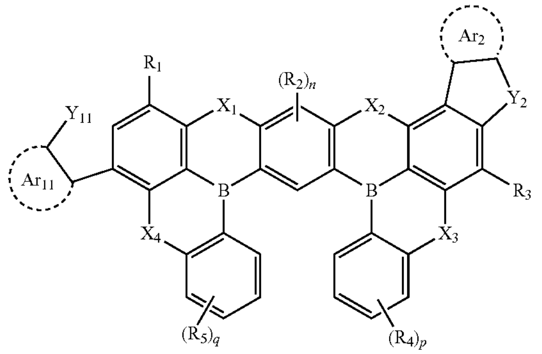

In Formula 5, $Ar_2$ may be a substituted or unsubstituted aromatic hydrocarbon ring having 6 to 30 ring-forming carbon atoms, or a substituted or unsubstituted aromatic heterocyclic ring having 2 to 30 ring-forming carbon atoms. For example, $Ar_2$ may be a substituted or unsubstituted benzene ring. For example, $Ar_2$ may be a substituted or unsubstituted dibenzofuran ring, or an unsubstituted benzene ring. However, embodiments of the present disclosure are not limited thereto.

$Y_2$ is O, S, Se, $CR_{12}R_{13}$, or $NR_{14}$.

$R_{12}$ to $R_{14}$ may be each independently a hydrogen atom, a deuterium atom, a halogen atom, a cyano group, a nitro group, a substituted or unsubstituted silyl group, a substituted or unsubstituted amine group, a substituted or unsubstituted alkyl group having 1 to 30 carbon atoms, a substituted or unsubstituted alkoxy group having 1 to 30 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring. For example, $R_{14}$ may be a substituted or unsubstituted aryl group having 6 to 30 ring-forming carbon atoms.

In Formula 5, $Y_{11}$, $Ar_{11}$, $X_1$ to $X_4$, $R_1$ to $R_5$, and n, p, and q are the same as defined in connection with Formula 1, Formula 2, Formula 3a, and Formula 3b.

The condensed cyclic compound represented by Formula 1 of an embodiment may be represented by Formula 6a or Formula 6b:

Formula 6a

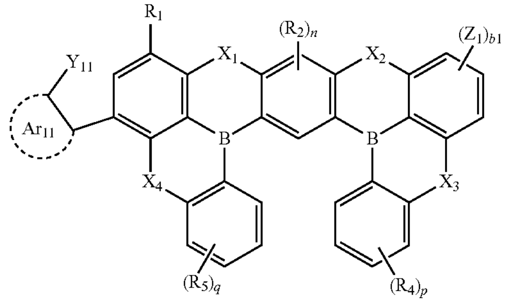

-continued

Formula 6b

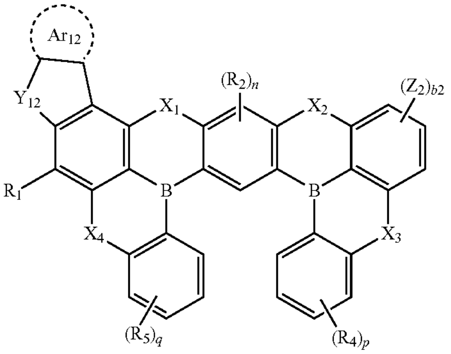

In Formula 6a and Formula 6b, $Z_1$ and $Z_2$ are each independently a hydrogen atom, a deuterium atom, a halogen atom, a cyano group, a nitro group, a substituted or unsubstituted silyl group, a substituted or unsubstituted amine group, a substituted or unsubstituted alkyl group having 1 to 30 carbon atoms, a substituted or unsubstituted alkoxy group having 1 to 30 carbon atoms, a substituted or unsubstituted aryloxy group having 1 to 30 carbon atoms, a substituted or unsubstituted aryl group having 6 to 30 ring-forming carbon atoms, a substituted or unsubstituted heteroaryl group having 2 to 30 ring-forming carbon atoms or a substituted or unsubstituted aliphatic heterocyclic group having 2 to 30 ring-forming carbon atoms. For example, $Z_1$ and $Z_2$ may be each independently a substituted or unsubstituted amine group, a substituted or unsubstituted alkyl group having 1 to 30 carbon atoms, a substituted or unsubstituted alkoxy group having 1 to 30 carbon atoms, a substituted or unsubstituted aryloxy group having 1 to 30 carbon atoms, a substituted or unsubstituted aryl group having 6 to 30 ring-forming carbon atoms, a substituted or unsubstituted heteroaryl group having 2 to 30 ring-forming carbon atoms, or a substituted or unsubstituted aliphatic heterocyclic group having 2 to 30 ring-forming carbon atoms. However, embodiments of the present disclosure are not limited thereto.

$b_1$ and $b_2$ are each independently an integer of 0 to 3. For example, $b_1$ and $b_2$ may be each independently 1. However, embodiments of the present disclosure are not limited thereto.

$X_1$ to $X_4$, $Y_{11}$, $Y_{12}$, $R_1$, $R_2$, $R_4$, $R_5$, $Ar_{11}$, $Ar_{12}$, n, p, and q are the same as defined in connection with Formula 1, Formula 2, Formula 3a, and Formula 3b.

In one or more embodiments, a condensed cyclic compound of an embodiment may be represented by Formula A, Formula B, or Formula C below:

Formula A

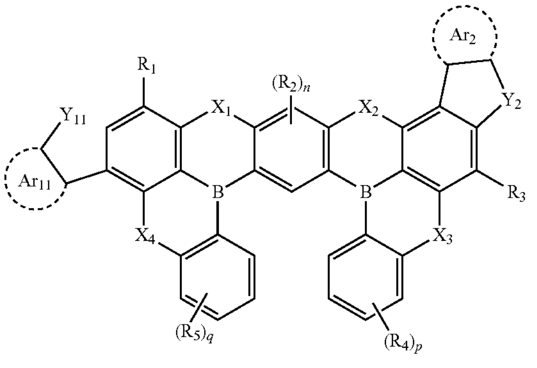

Formula B

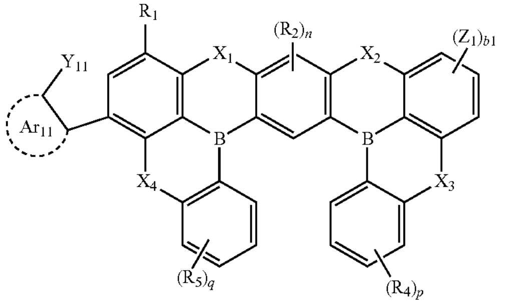

Formula C

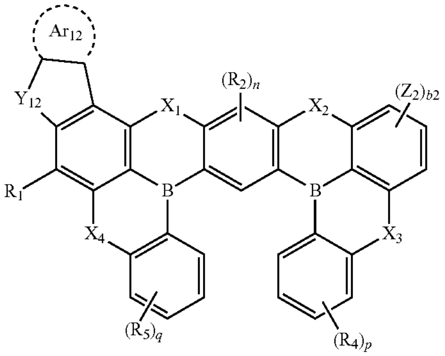

In Formula A, Formula B, and Formula C, $X_1$ to $X_4$ are each independently O, S, Se, $CR_6R_7$, or $NR_8$.

$X_1$ to $X_4$, $Y_{11}$, $Y_{12}$, $Ar_{11}$, $Ar_{12}$, $R_1$ to $R_8$, $Z_1$, $Z_2$, $b_1$, $b_2$, n, p and q are the same as defined in connection with Formula 1, Formula 2, Formula 3a, Formula 3b, Formula 6a, and Formula 6b.

The condensed cyclic compound represented by Formula 1, Formula A, Formula B, or Formula C of an embodiment may be represented by any one of the compounds of Compound Group 1 below. The light emitting device ED of an embodiment may include at least one selected from among the condensed cyclic compounds of Compound Group 1 below in the emission layer EML.

Compound Group 1

1

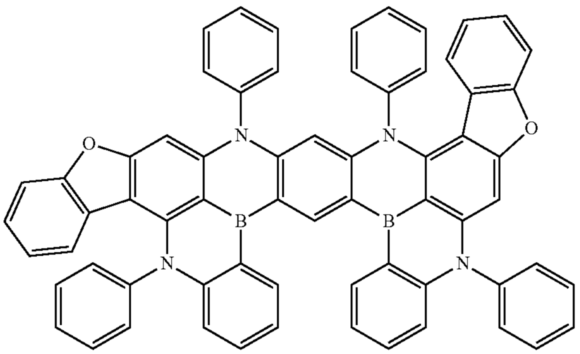

2

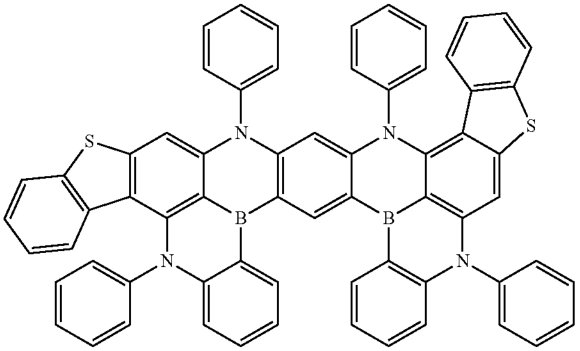

3

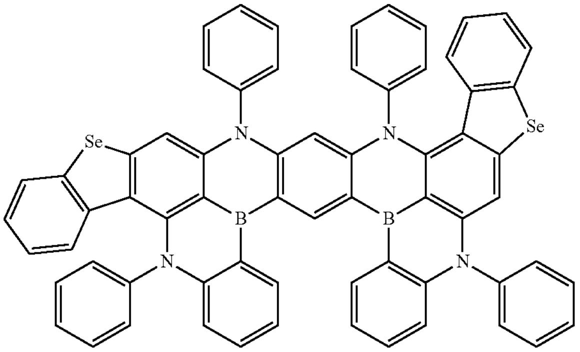

4

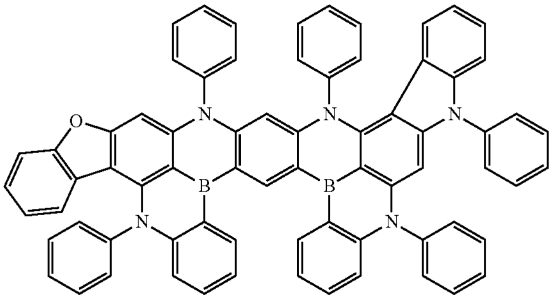

-continued
5
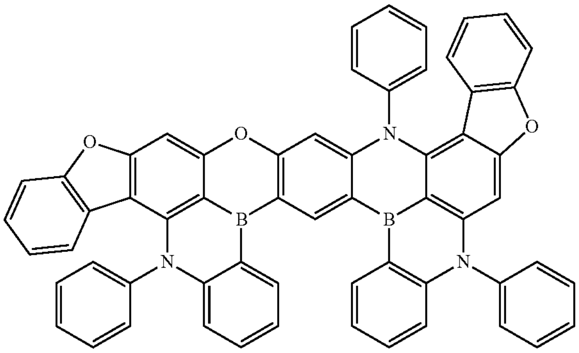
6
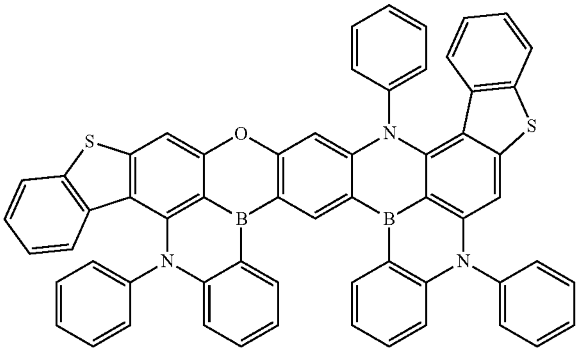
7
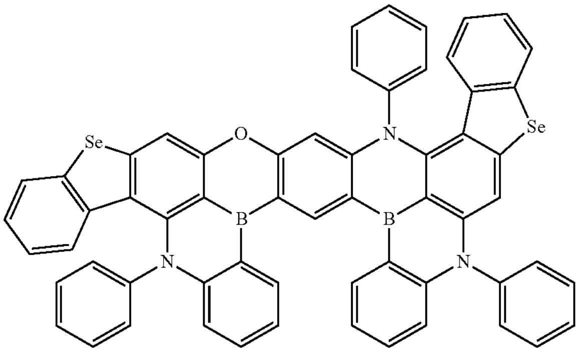
8
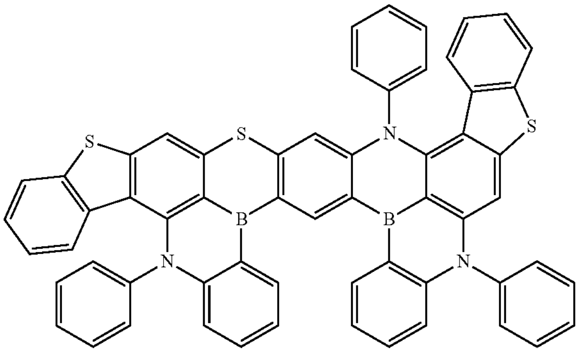
-continued
9
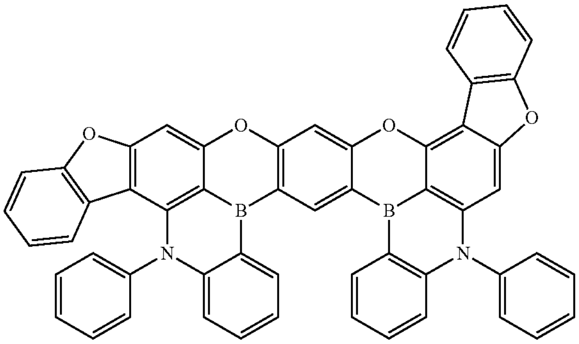
10
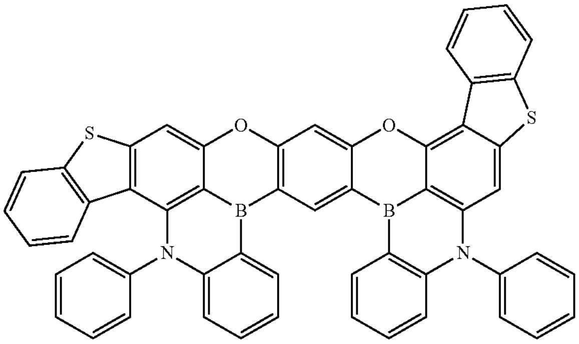
11
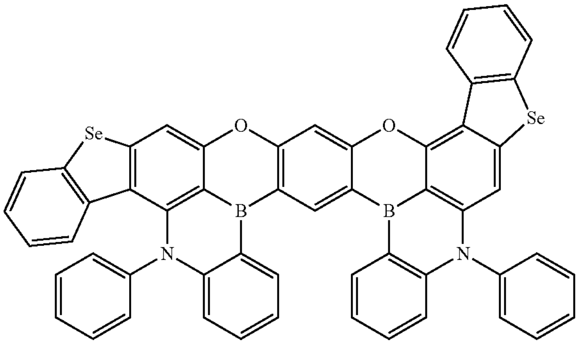
12
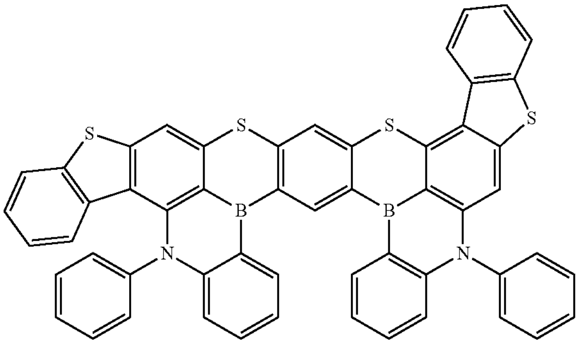

-continued
13
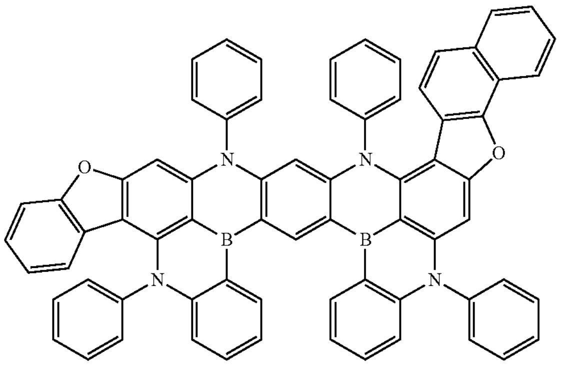
14
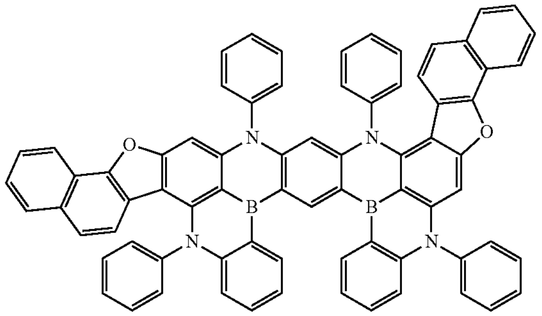
15
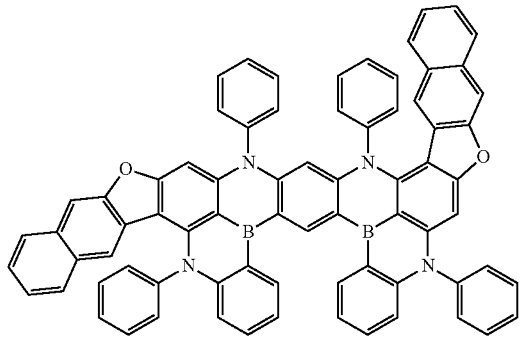
16
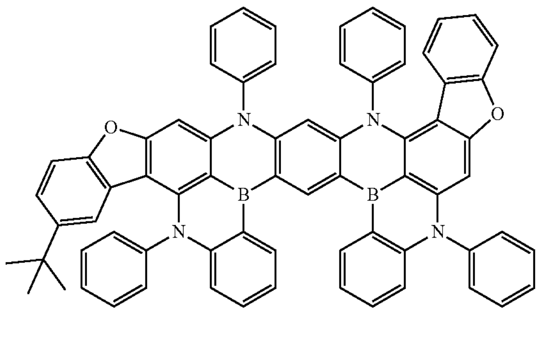
-continued
17
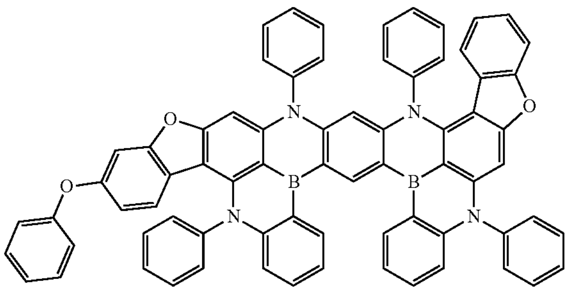
18
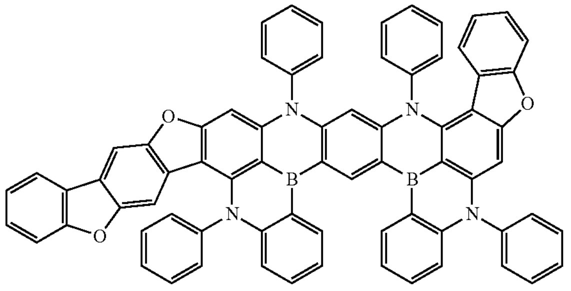
19
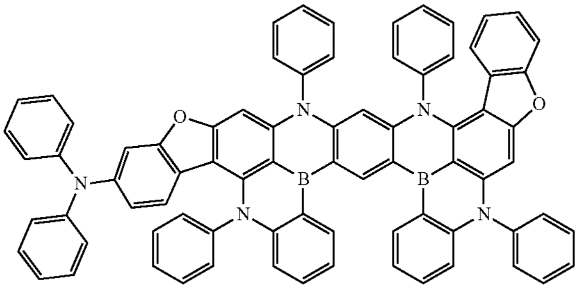
20
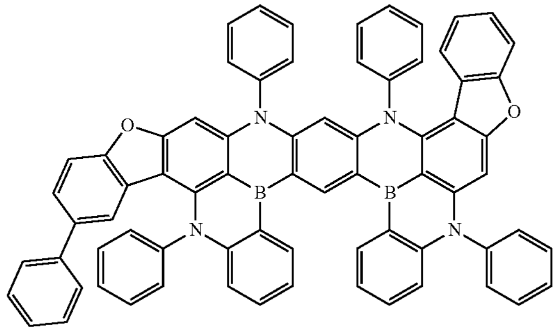

-continued
21
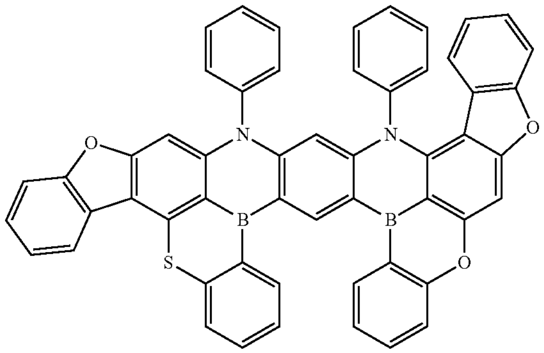
22
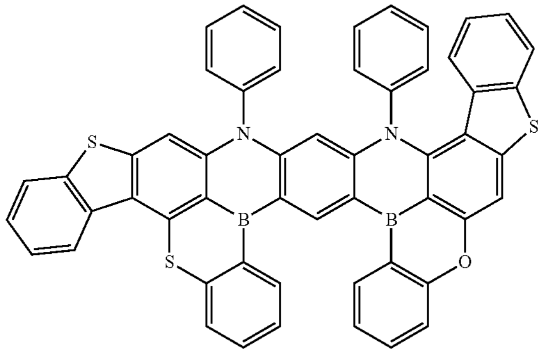
23
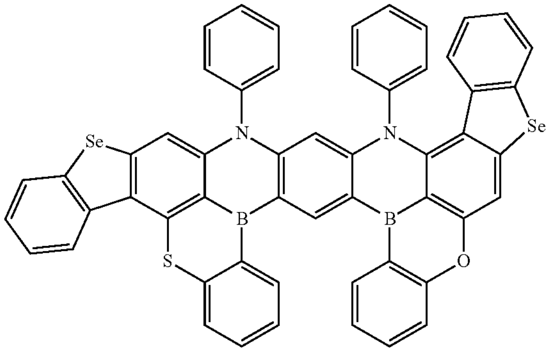
24
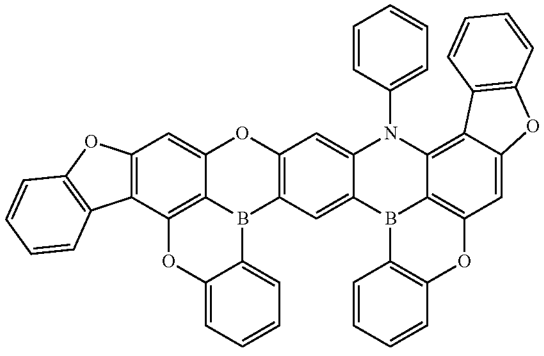
-continued
25
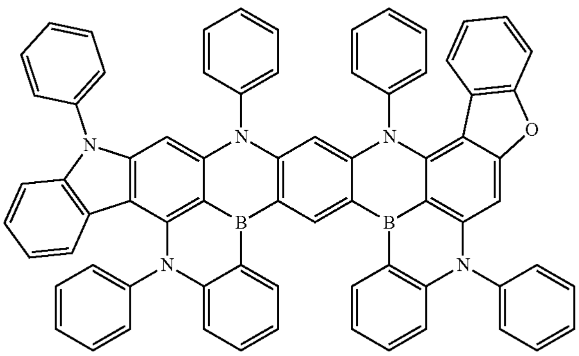
26
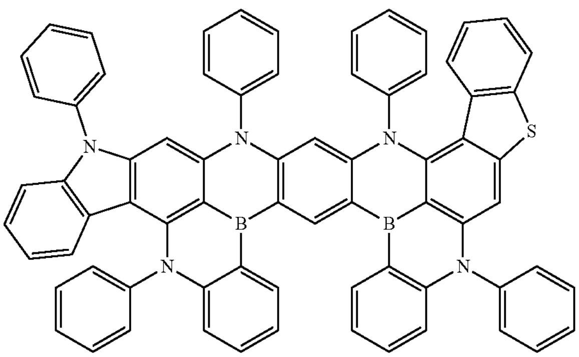
27
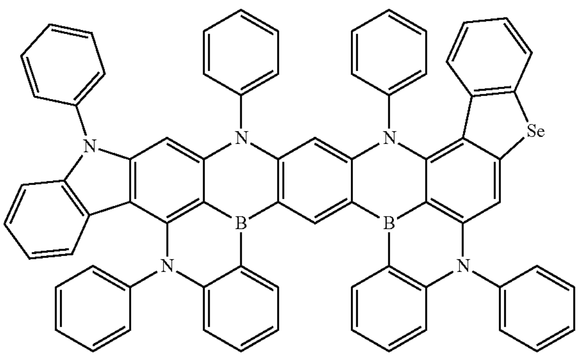
28
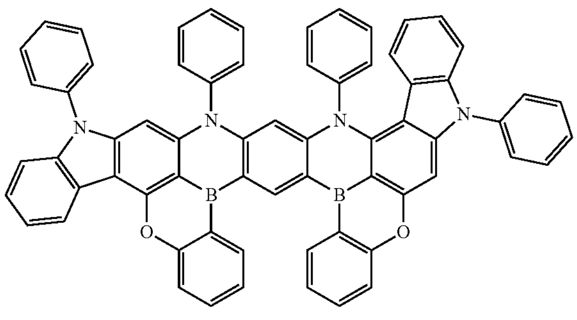

-continued
29
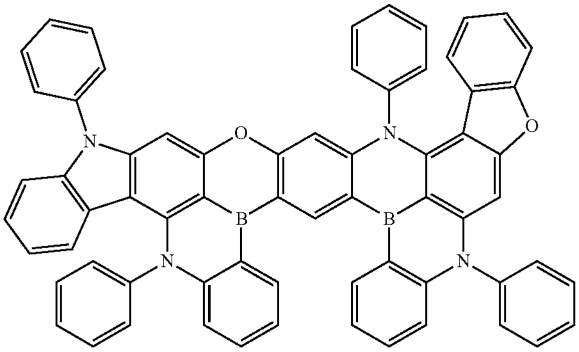
30
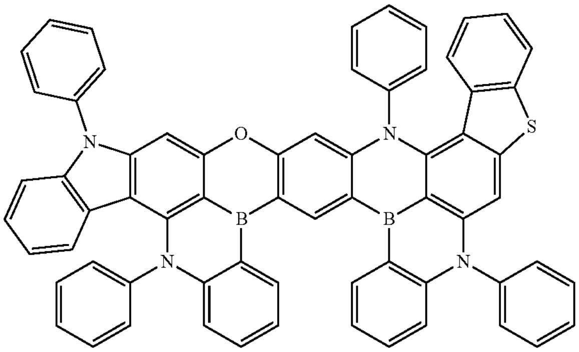
31
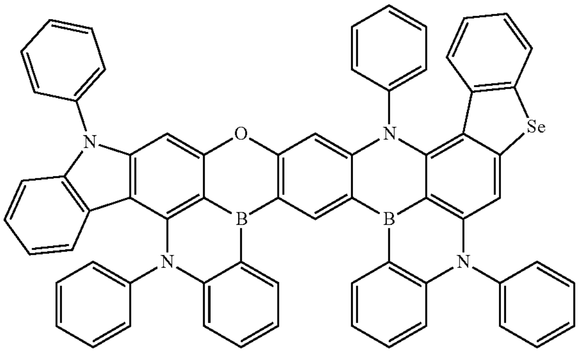
32
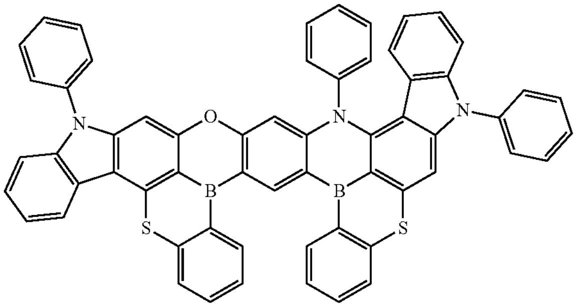
-continued
33
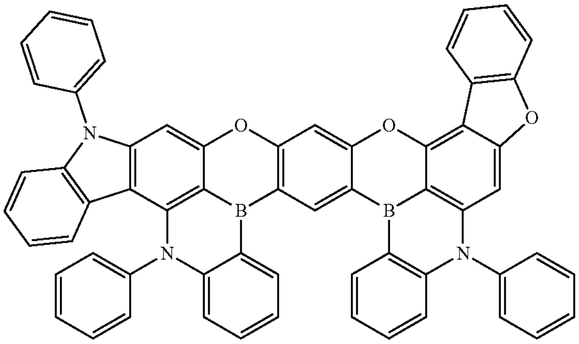
34
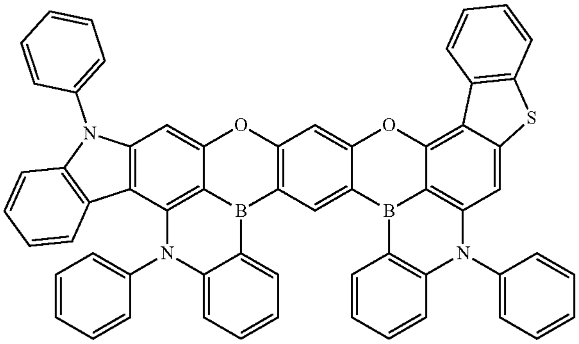
35
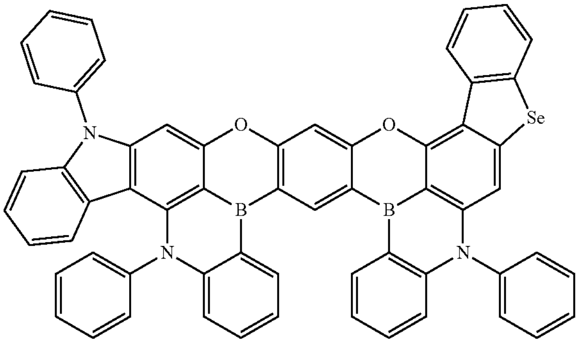
36
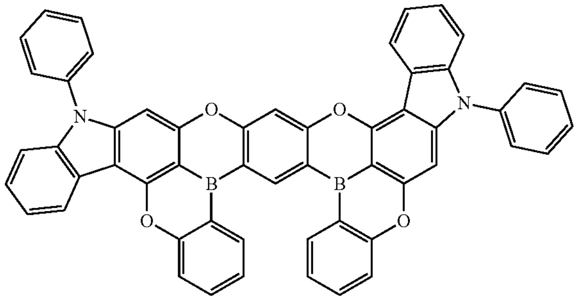

-continued
37
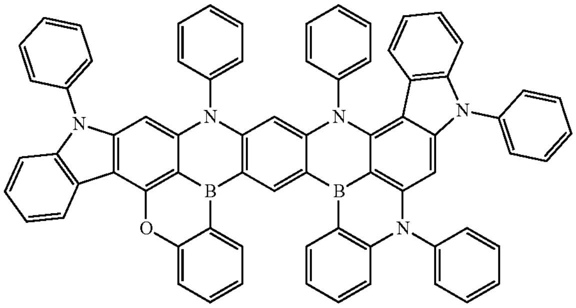
38
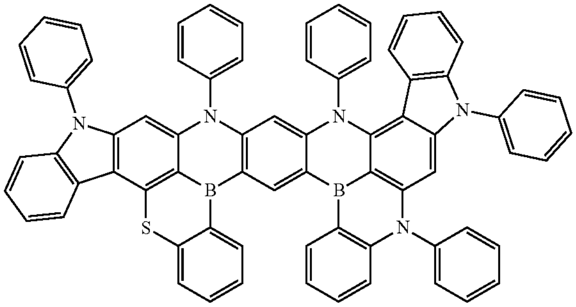
39
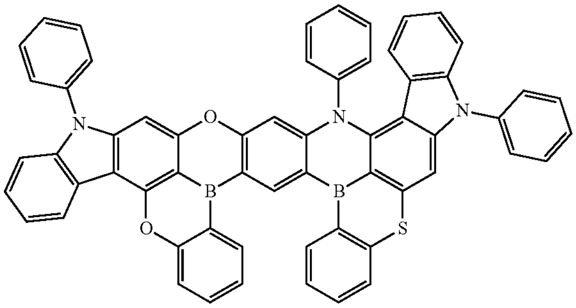
40
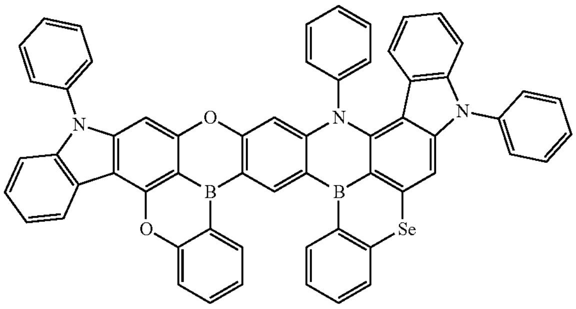
-continued
41
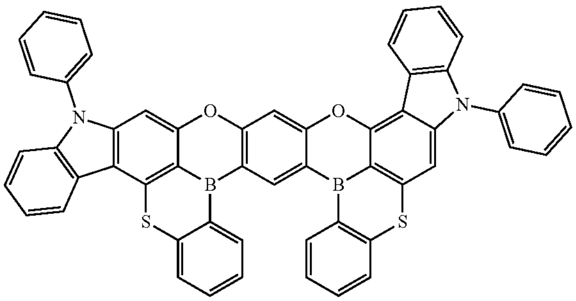
42
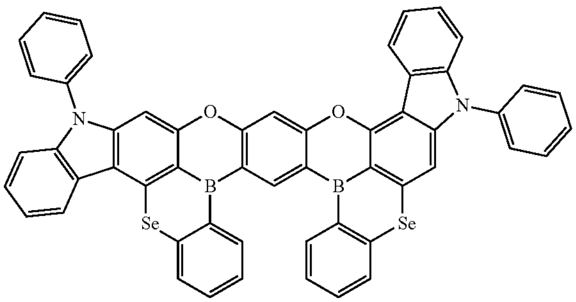
43
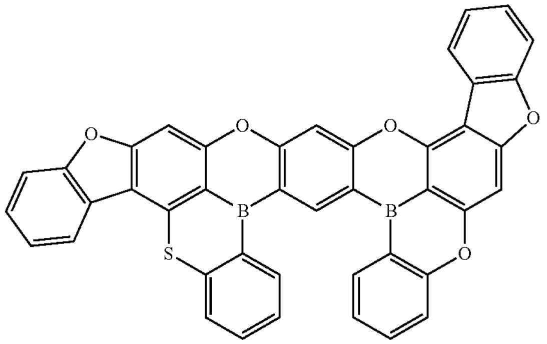
44
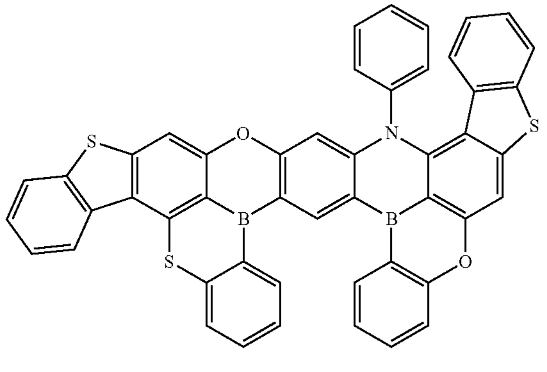

-continued
45
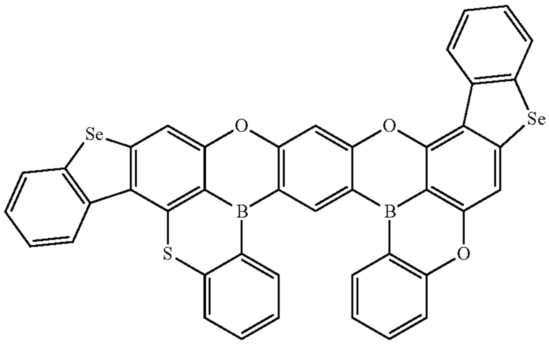
46
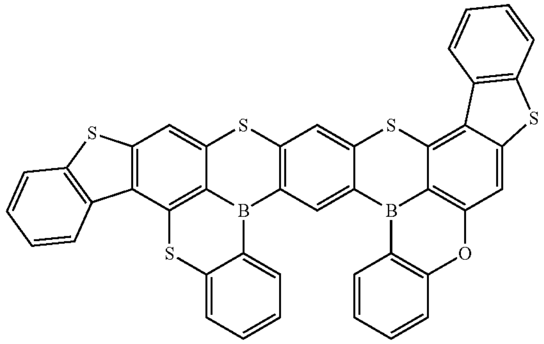
47
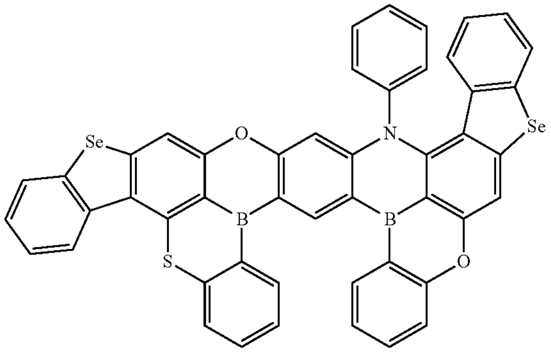
48
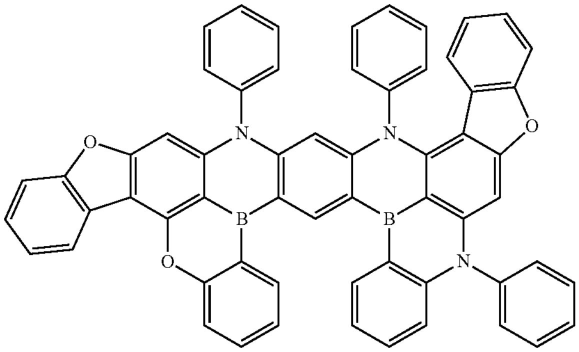
-continued
49
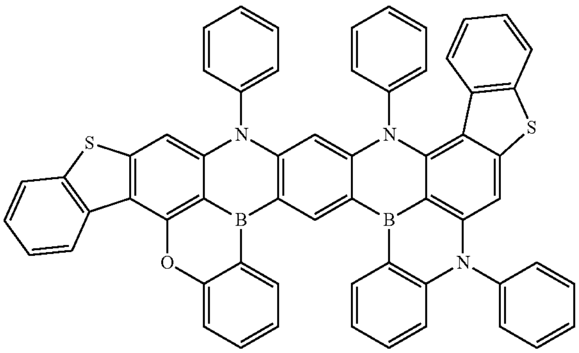
50
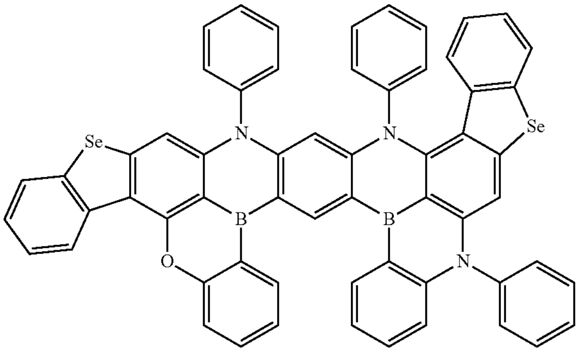
51
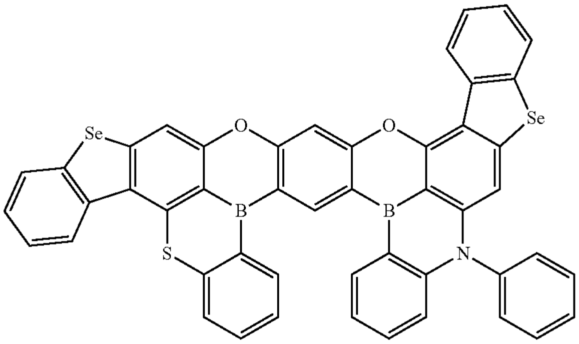
52
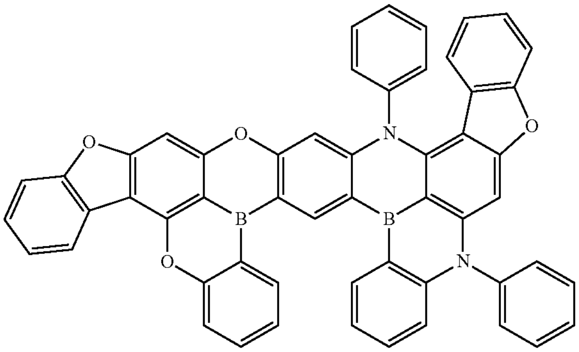

-continued
53
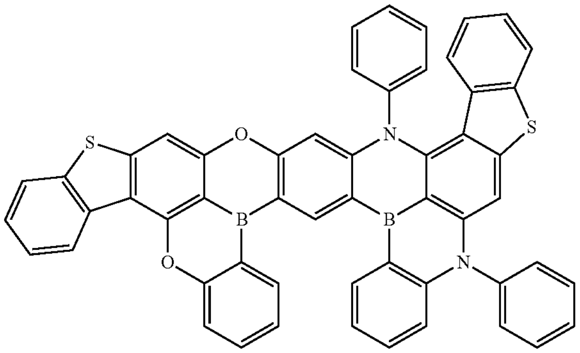
54
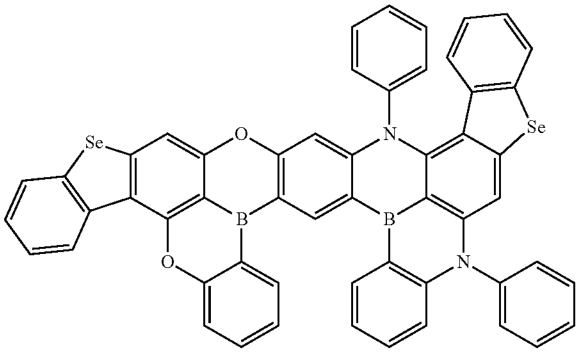
55
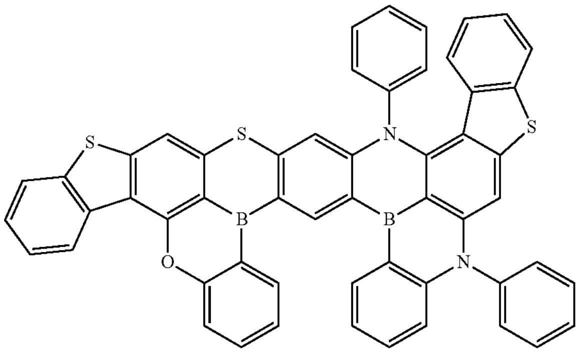
56
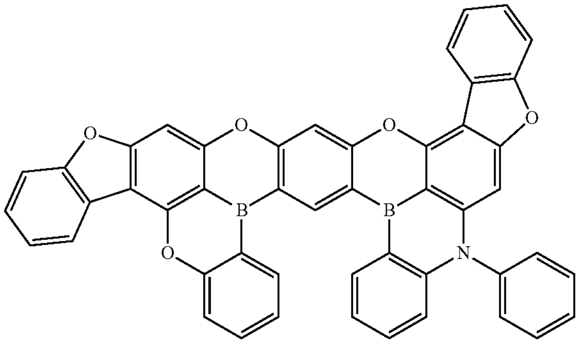
-continued
57
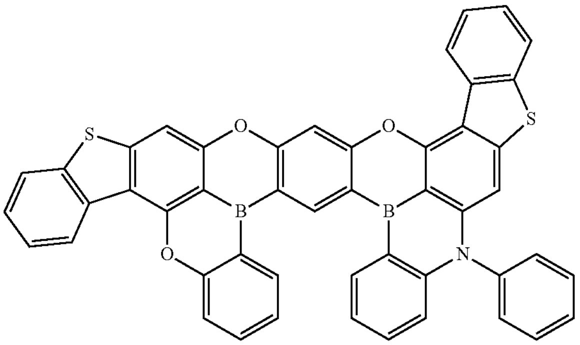
58
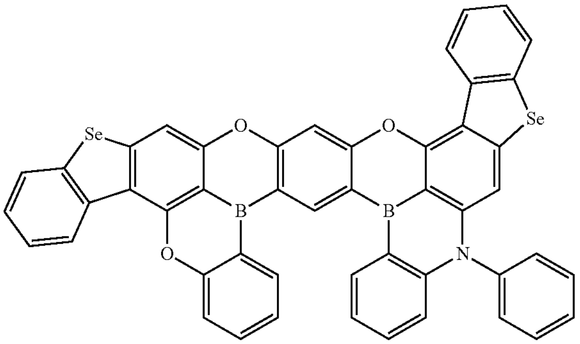
59
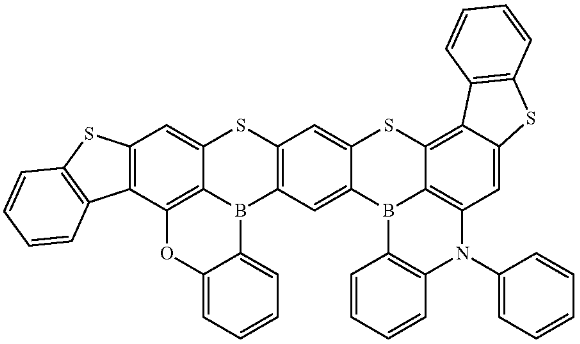
60
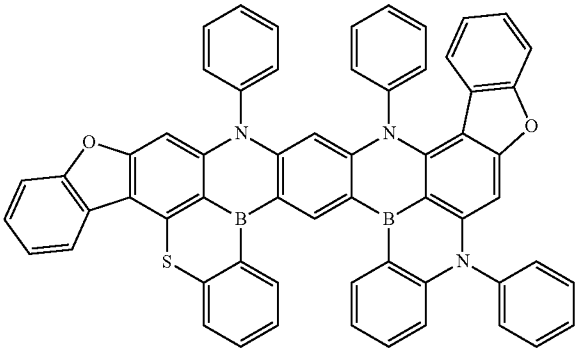

-continued
61
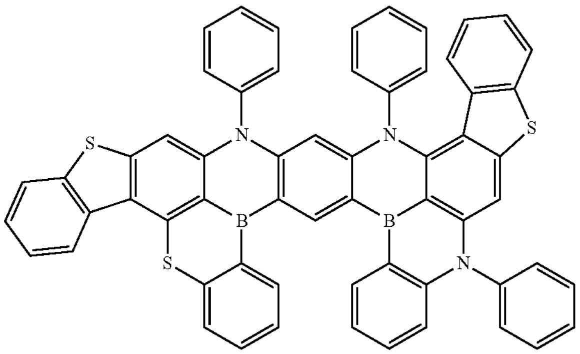
62
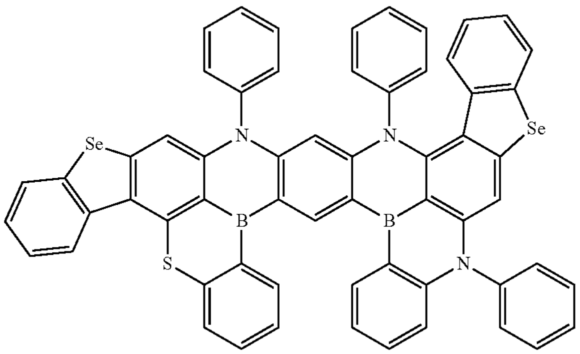
63
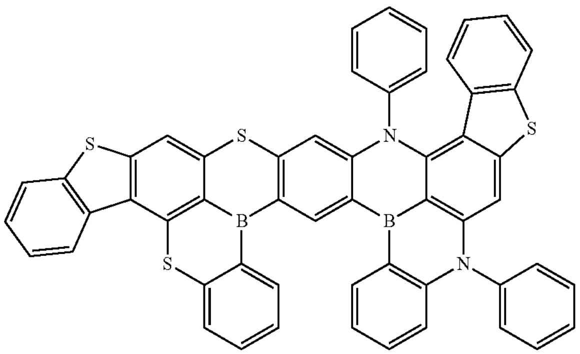
64
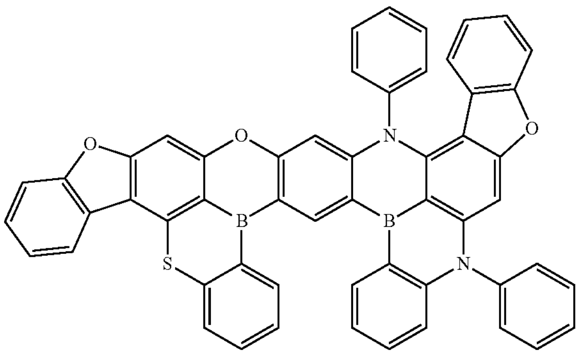
-continued
65
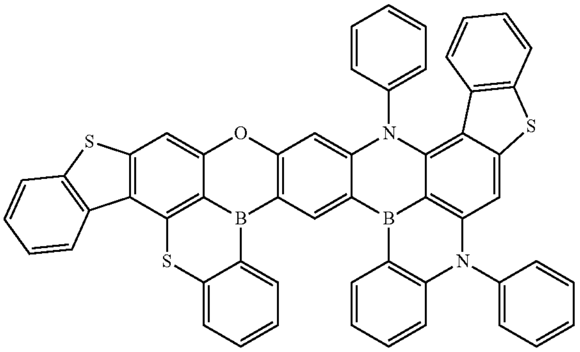
66
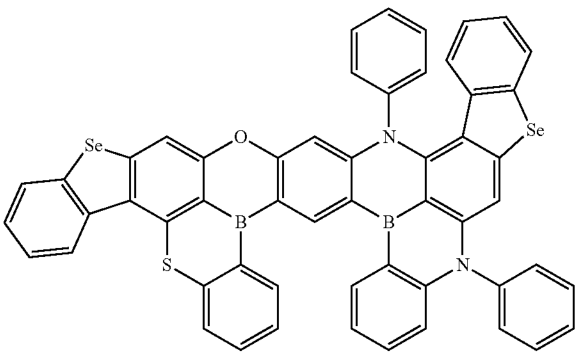
67
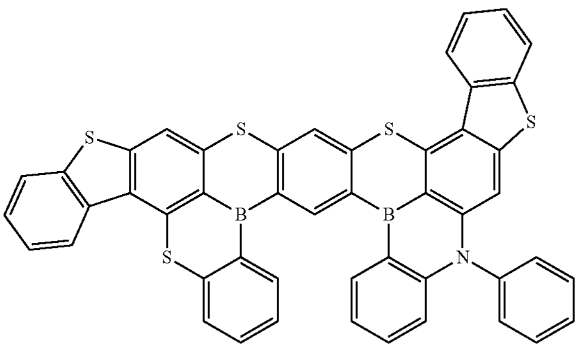
68
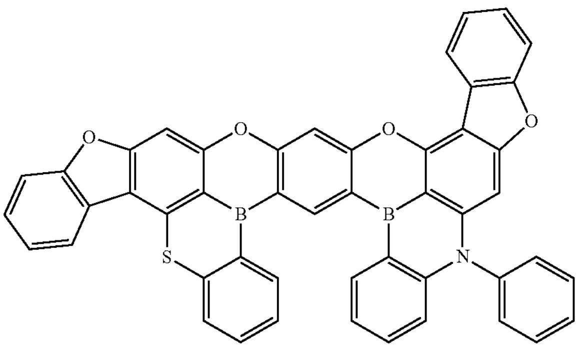

-continued
69
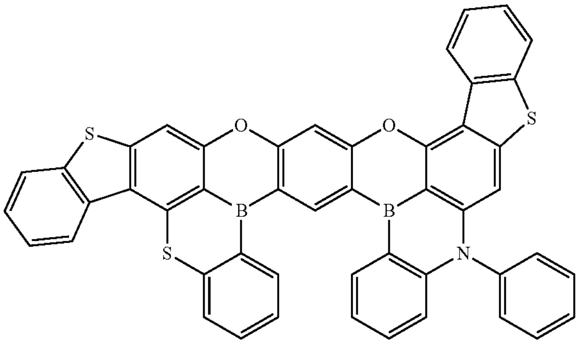
70
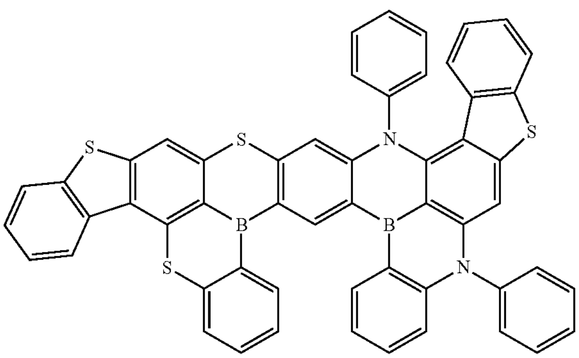
71
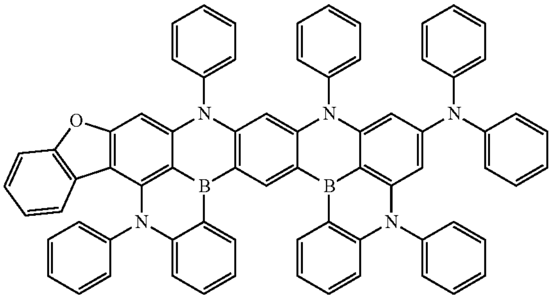
72
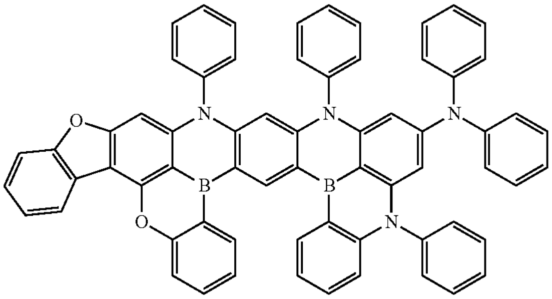
-continued
73
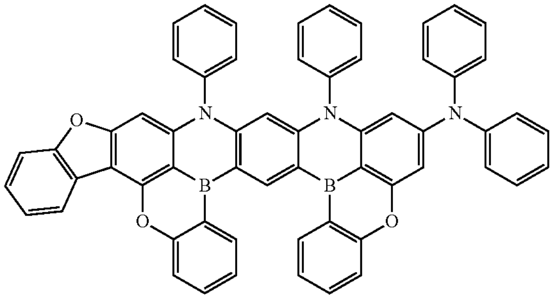
74
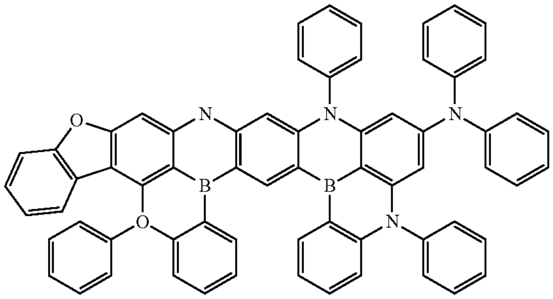
75
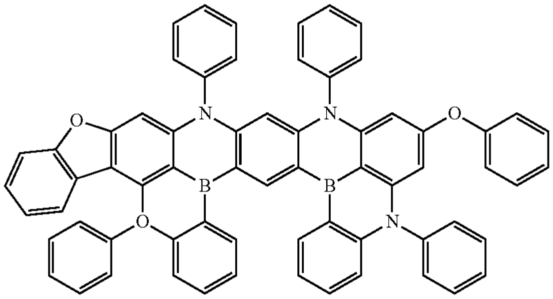
76
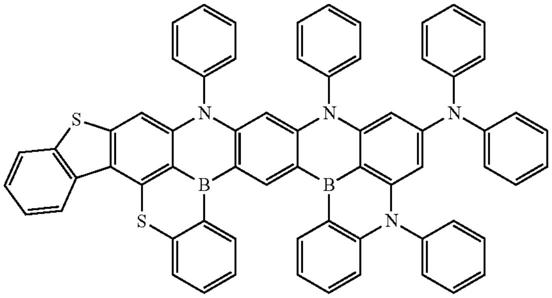
77
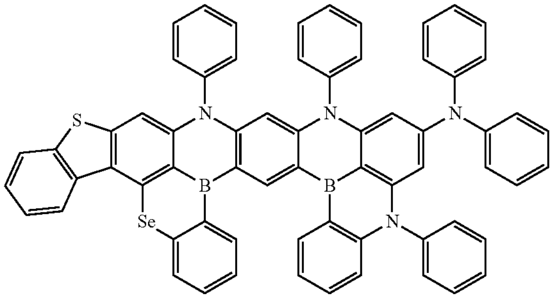

-continued
78
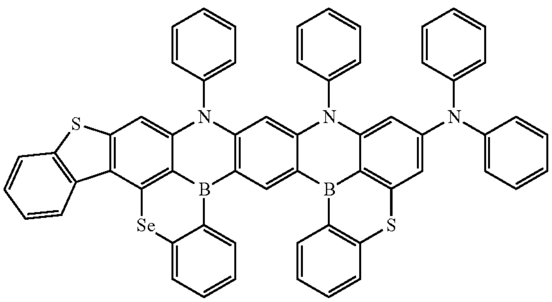
79
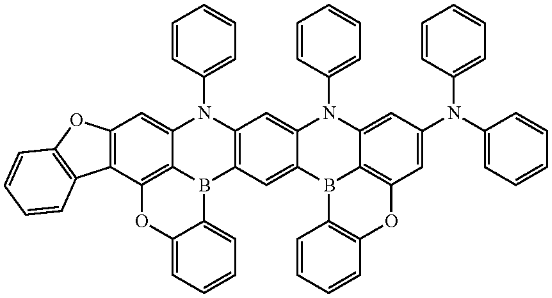
80
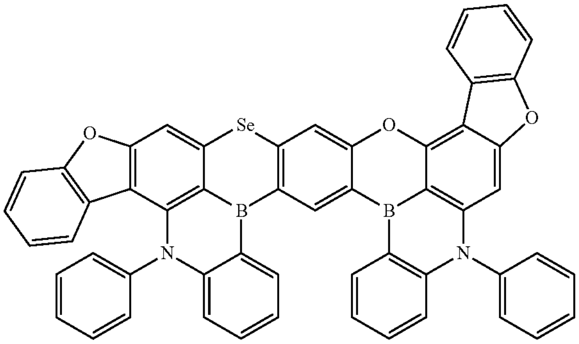
81
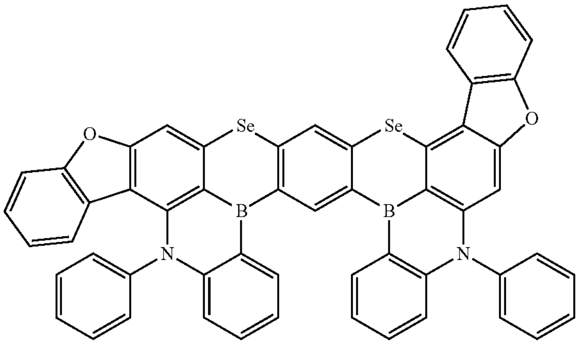
-continued
82
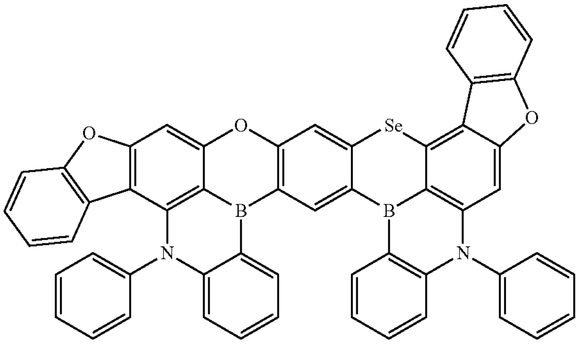
83
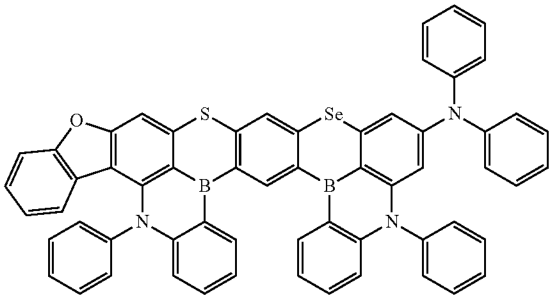
84
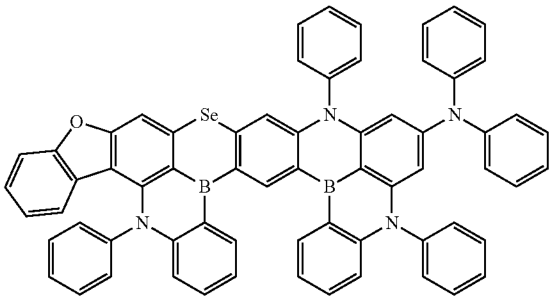
85
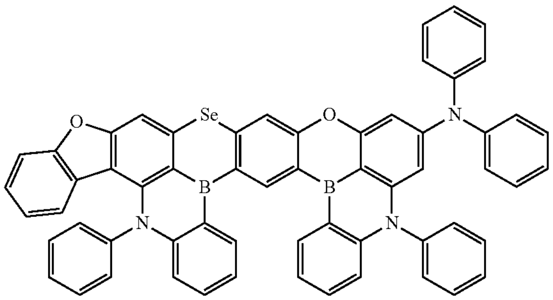

-continued
86
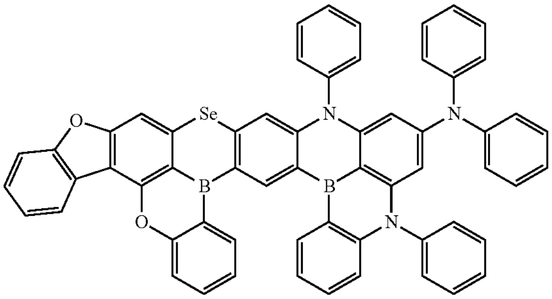
87
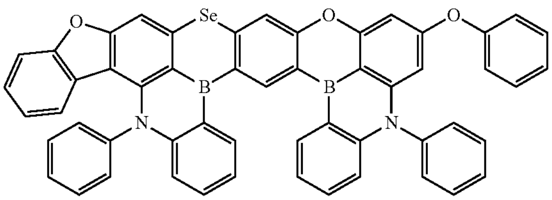
88
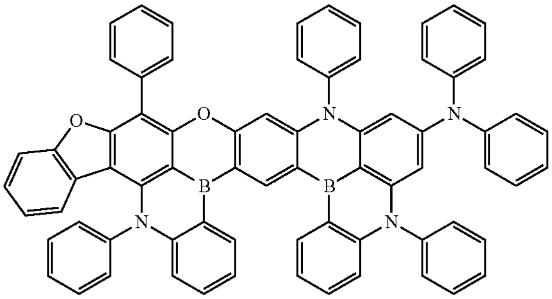
89
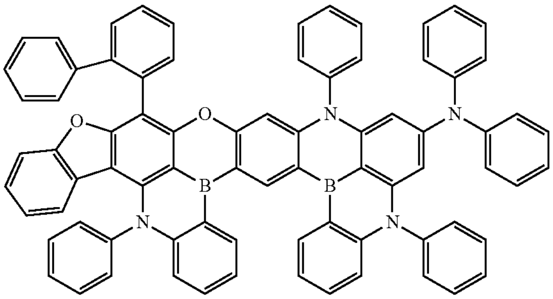
90
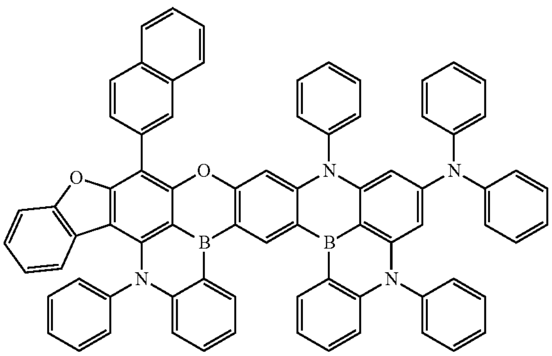
-continued
91
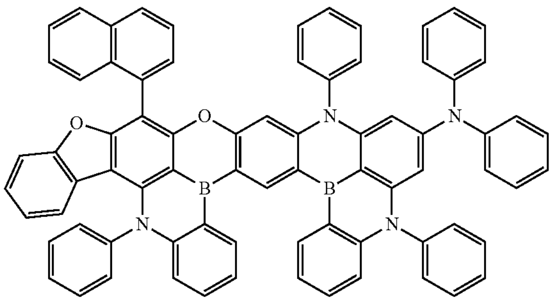
92
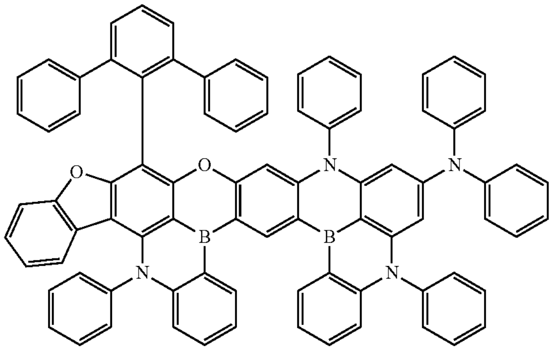
93
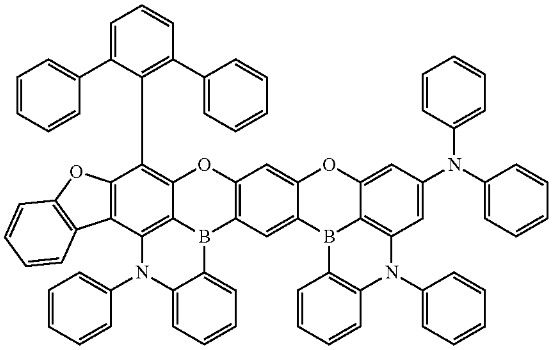
94
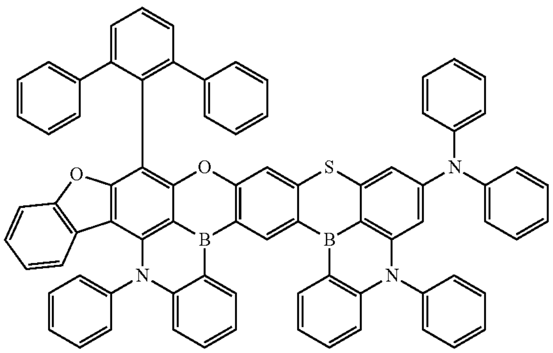

-continued
95
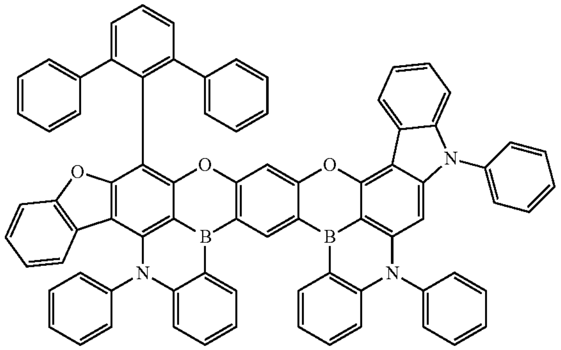
96
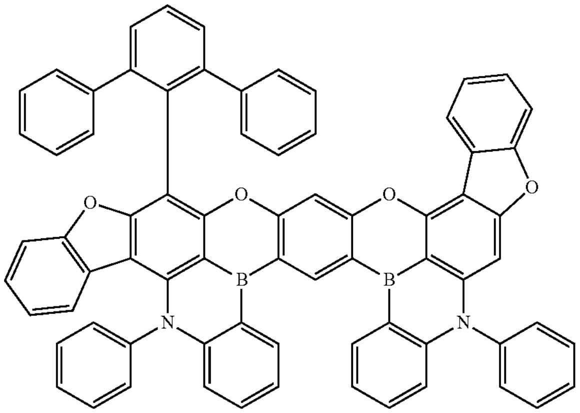
97
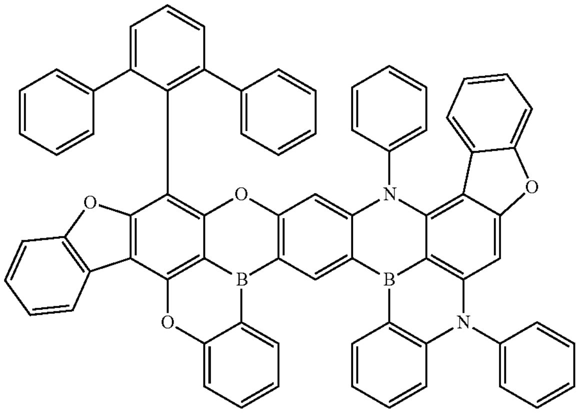
-continued
98
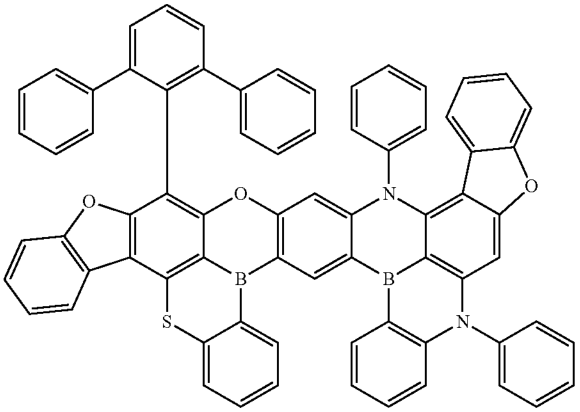
99
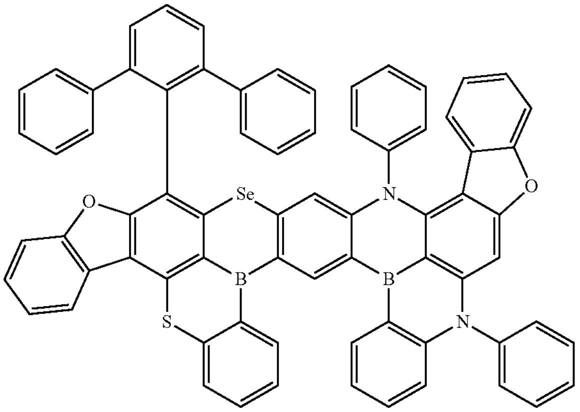
100
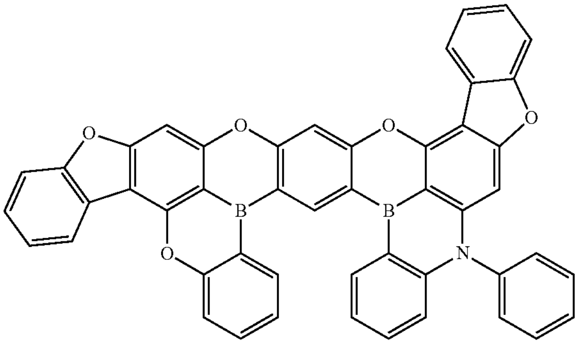
101
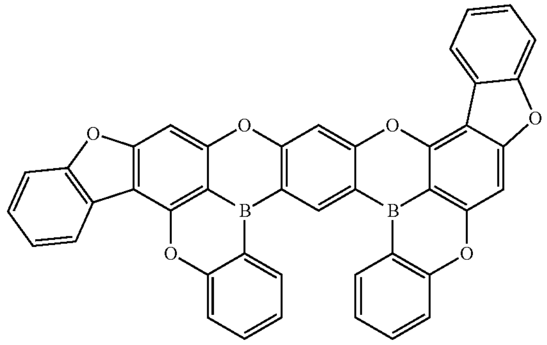

-continued
102
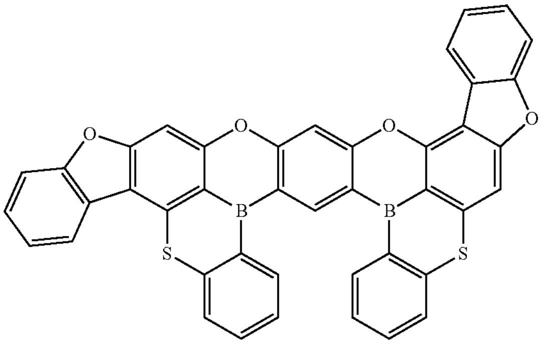
103
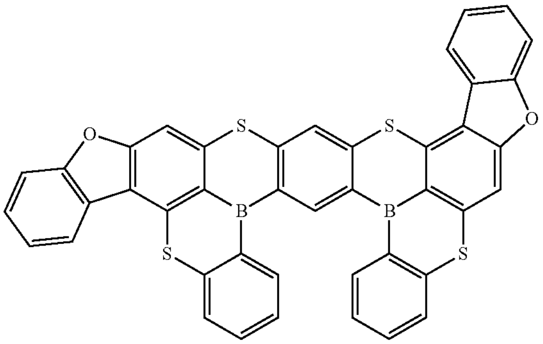
104
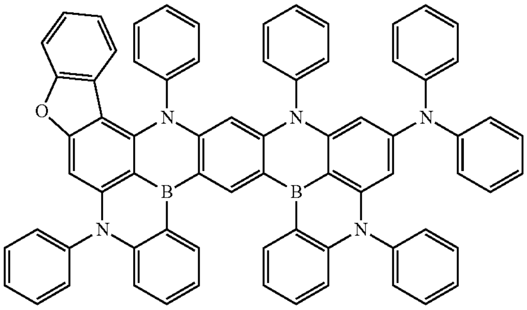
105
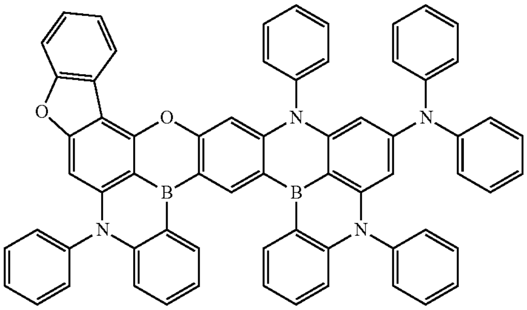
-continued
106
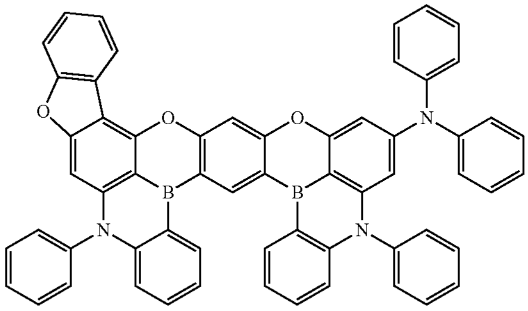
107
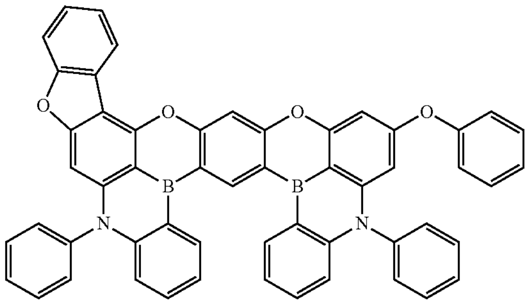
108
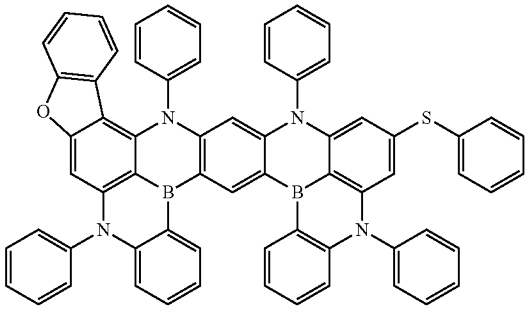
109
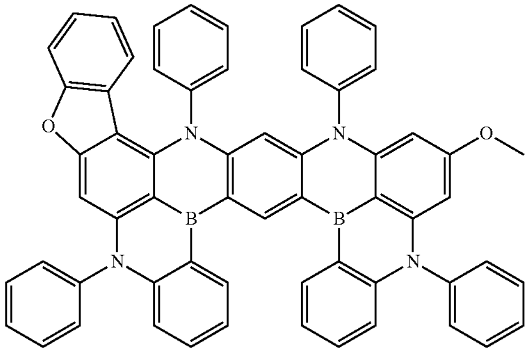

-continued
110
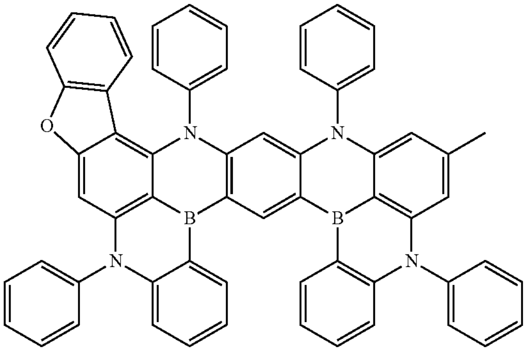
111
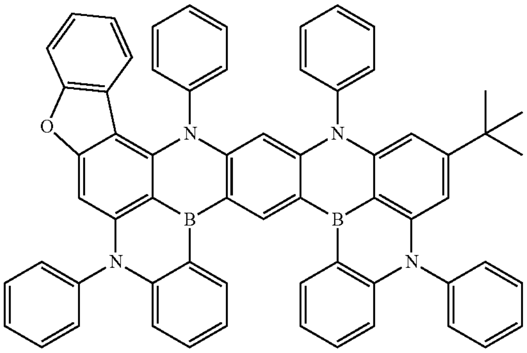
112
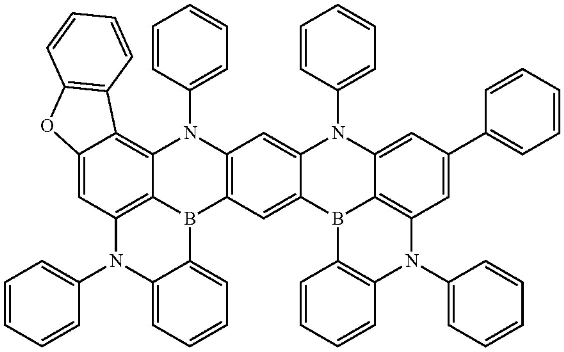
113
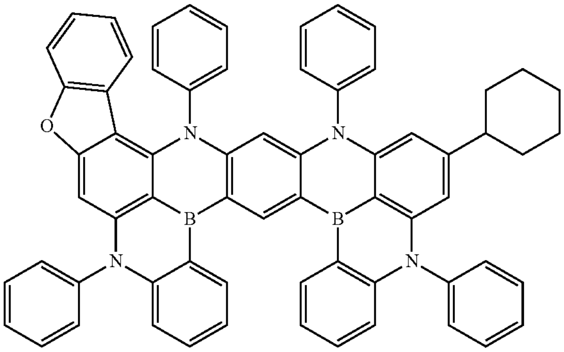
-continued
114
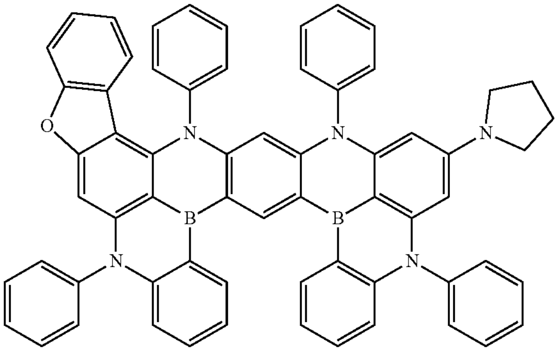
115
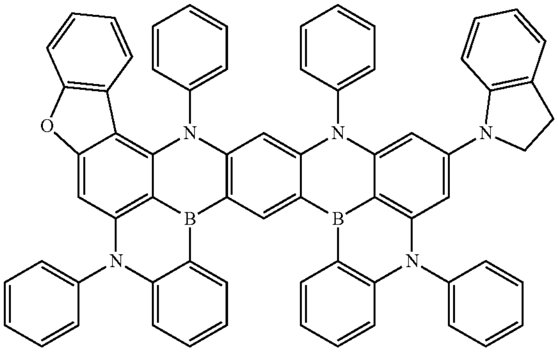
116
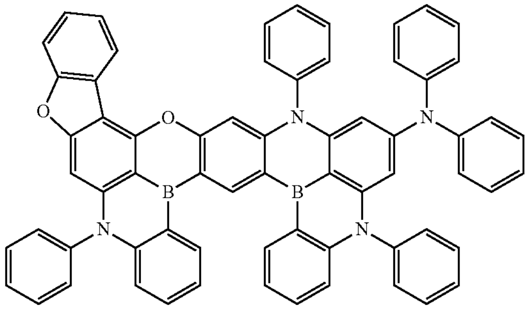
117
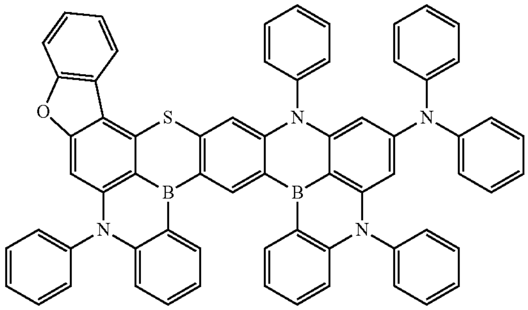

-continued
118
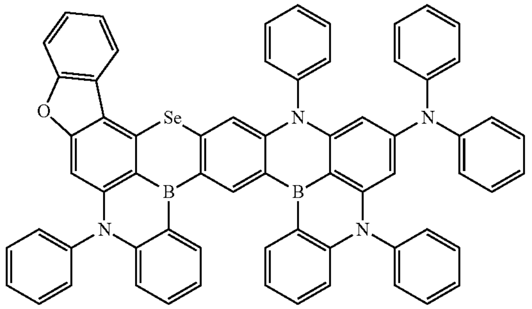
119
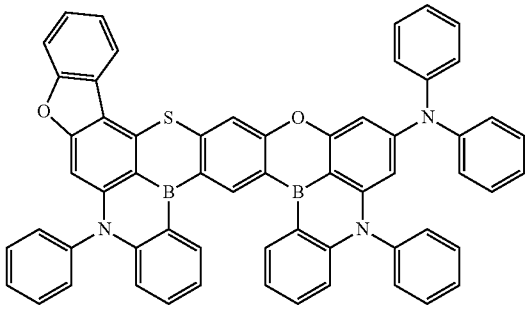
120
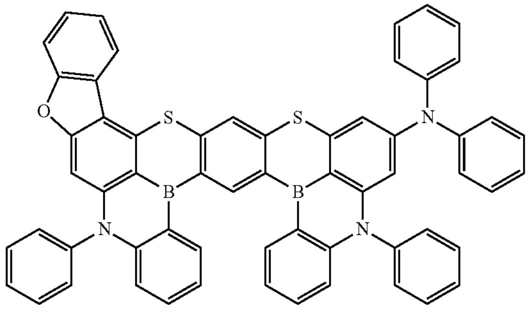
121
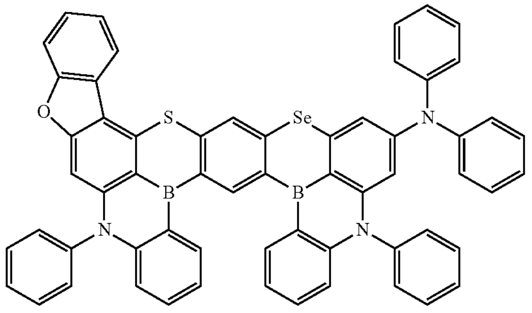
-continued
122
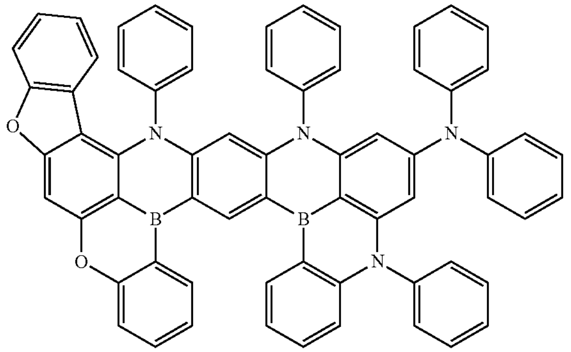
123
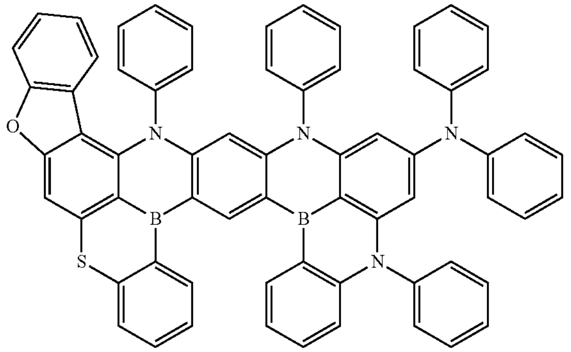
124
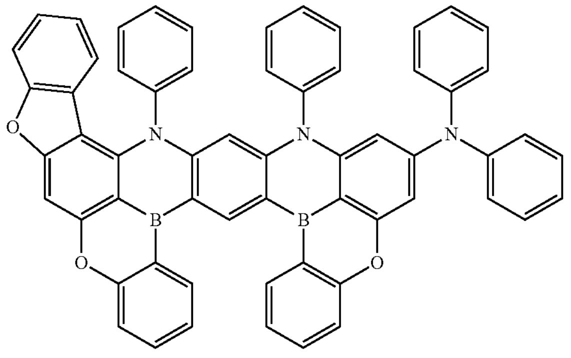
125
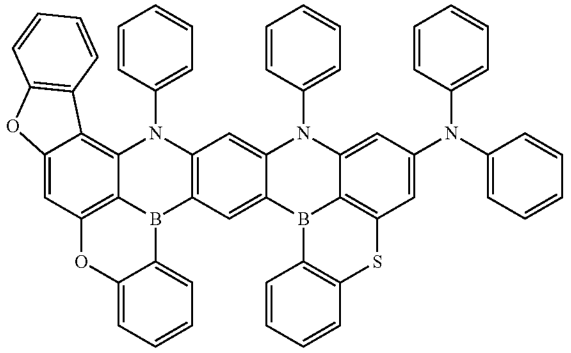

-continued

126

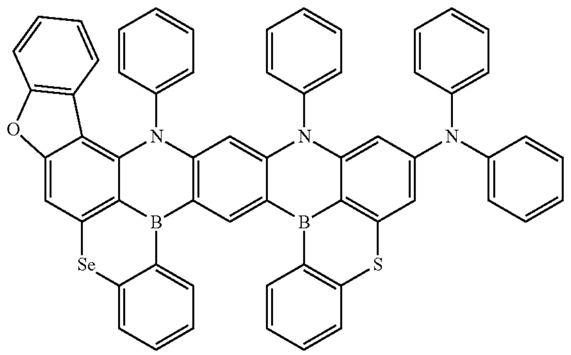

127

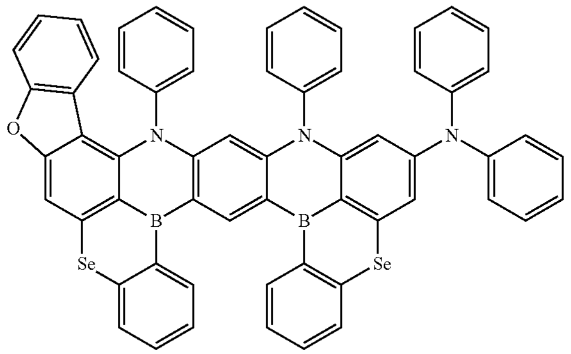

128

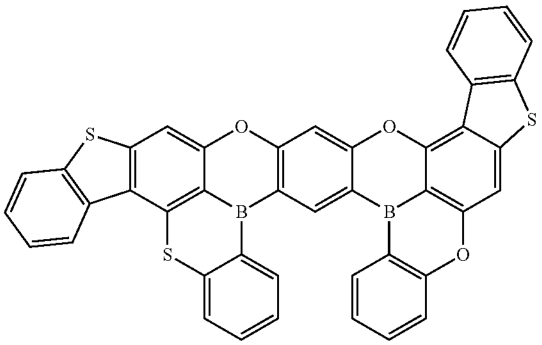

The condensed cyclic compound represented by Formula 1, Formula A, Formula B, or Formula C of an embodiment may be utilized as a fluorescence emitting material or a thermally activated delayed fluorescence (TADF) material. For example, the condensed cyclic compound of an embodiment may be utilized as a fluorescent dopant material or a TADF dopant material emitting blue light. The condensed cyclic compound of an embodiment may be a luminescent material having a luminescence center wavelength (Λmax) in a wavelength region of about 490 nm or less. For example, the condensed cyclic compound represented by Formula 1 or Formula A of an embodiment may be a luminescent material having a luminescence center wavelength in a wavelength region of about 450 nm to about 470 nm. That is, the condensed cyclic compound of an embodiment may be a blue thermally activated delayed fluorescent dopant. However, embodiments of the present disclosure are not limited thereto.

In each light emitting device ED of embodiments illustrated in FIGS. 3 to 6, the emission layer EML may include a host and a dopant, and the emission layer EML may include, as the dopant, the condensed cyclic compound of an embodiment as described above.

The condensed cyclic compound represented by Formula 1 or Formula A of an embodiment may include a di-boron-based condensed cyclic core, and the condensed cyclic core may include at least one dibenzoheterole group to increase the bonding energy of the molecule.

The condensed cyclic compound of an embodiment may include one dibenzoheterole group or at least two dibenzoheterole groups to have an asymmetrical structure. For a related art compound with asymmetrical structure having the planarity, generally strong intermolecular interaction caused by the symmetry may occur, a light emitting wavelength may move to a longer wavelength than a light emitting wavelength in a solution prepared with the same compound, and an excimer, etc., may be formed easily. For example, a related art compound having a symmetrical structure may cause aggregation-caused quenching. Thus, a light emitting device including the related art compound having a symmetrical structure may have reduced color purity and luminous efficiency.

In addition, in the synthetic process of a compound, the symmetrical compound may have a high sublimation temperature, and thus frequently shows degradation behavior during the sublimation purification process, or make the sublimation purification process hard to perform.

Because the compound of an embodiment of the present disclosure has an asymmetrical structure despite having the planarity, the intermolecular interaction may not be strong and may decrease the aggregation-caused quenching phenomena. The light emitting device including the compound of the present disclosure may have improved color purity and luminous efficiency.

In addition, the solubility of the compound in an organic solvent is increased, which is favorable during the purification process in the synthetic process of a compound, and may exhibit an effect of reducing a sublimation purification temperature, thereby obtaining a light emitting compound with high purity. Therefore, the light emitting device ED of an embodiment including the condensed cyclic compound of an embodiment in the emission layer EML may exhibit improved service life characteristics.

In addition, the light emitting device ED of an embodiment including the condensed cyclic compound represented by Formula 1, Formula A, or Formula B of an embodiment in the emission layer EML may emit delayed fluorescence. The light emitting device ED of an embodiment may emit TADF, and the light emitting device ED may exhibit high efficiency characteristics.

The light emitting device ED of an embodiment may further include emission layer materials below in addition to the condensed cyclic compound of an embodiment as described above. In the light emitting device ED of an embodiment, the emission layer EML may include one or more anthracene derivatives, pyrene derivatives, fluoranthene derivatives, chrysene derivatives, dehydrobenzanthracene derivatives, and/or triphenylene derivatives. For example, the emission layer EML may include one or more anthracene derivatives and/or pyrene derivatives.

In each light emitting device ED of embodiments illustrated in FIGS. 3 to 6, the emission layer EML may include a host and a dopant, and the emission layer EML may include a compound represented by Formula E-1 below. The compound represented by Formula E-1 below may be utilized as a fluorescence host material.

Formula E-1

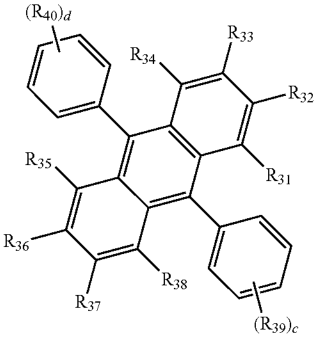

In Formula E-1, $R_{31}$ to $R_{40}$ may be each independently a hydrogen atom, a deuterium atom, a halogen atom, a substituted or unsubstituted silyl group, a substituted or unsubstituted alkyl group having 1 to 10 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring. In one or more embodiments, $R_{31}$ to $R_{40}$ may be bonded to an adjacent group to form a saturated hydrocarbon ring or an unsaturated hydrocarbon ring.

In Formula E-1, c and d may be each independently an integer of 0 to 5.

Formula E-1 may be represented by any one of Compound E1 to Compound E19 below:

E1

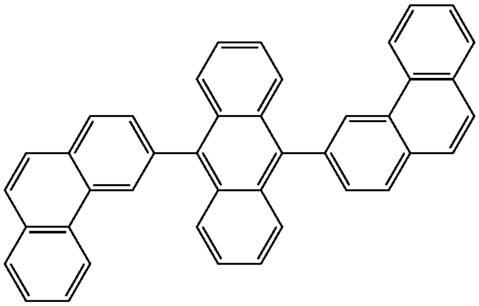

E2

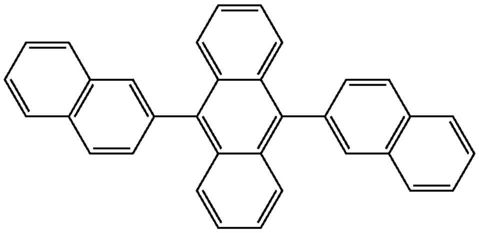

E3

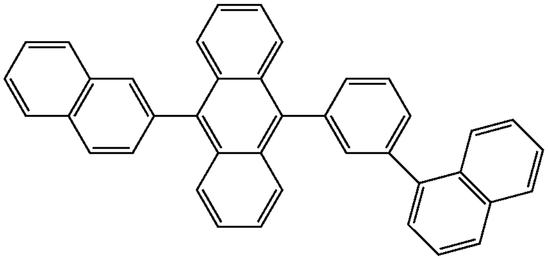

-continued

E4

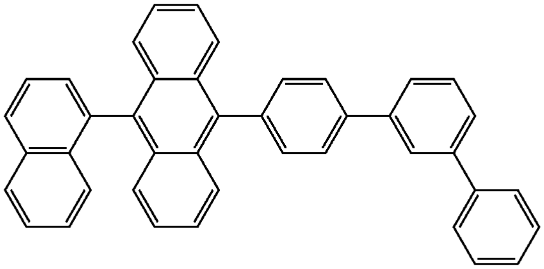

E5

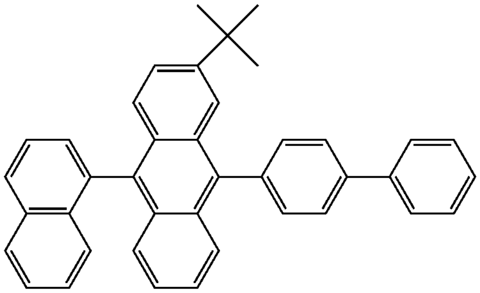

E6

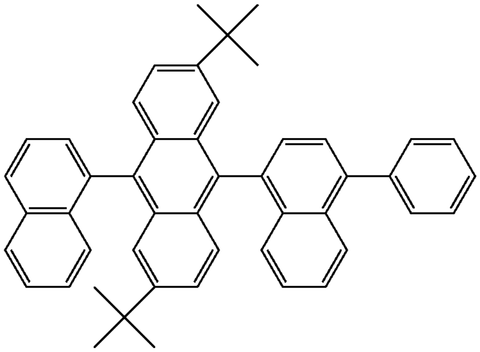

E7

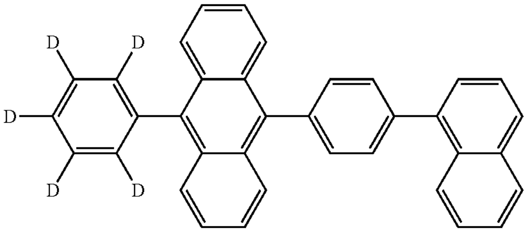

E8

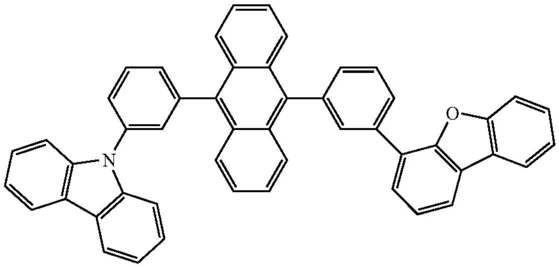

-continued
E9
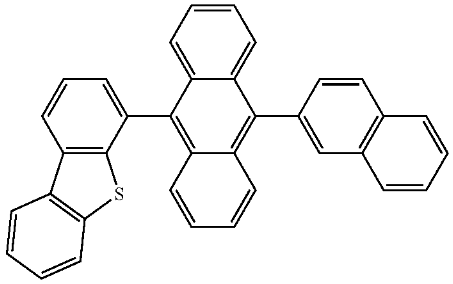
E10
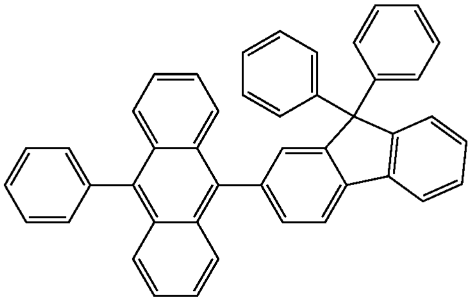
E11
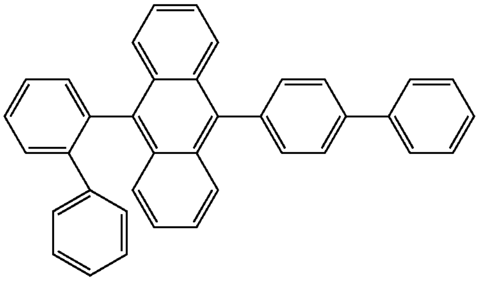
E12
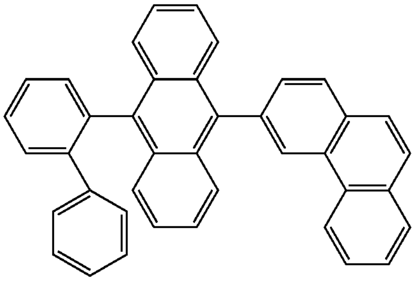
E13
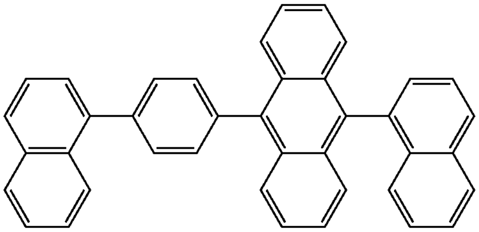
-continued
E14
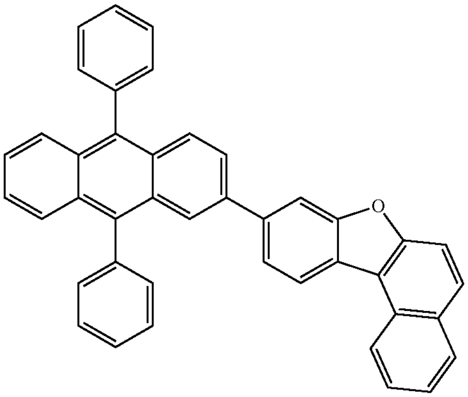
E15
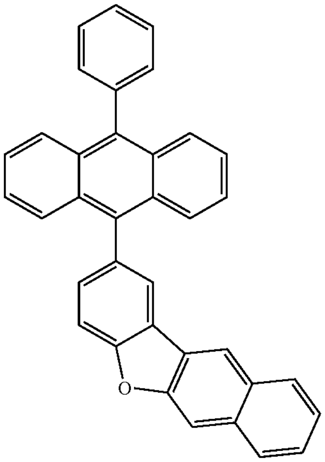
E16
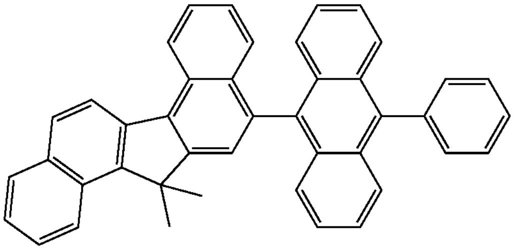
E17
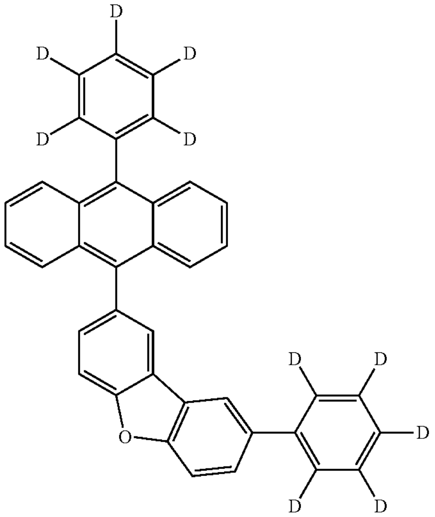

-continued

E18

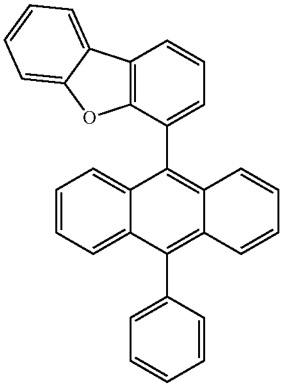

E19

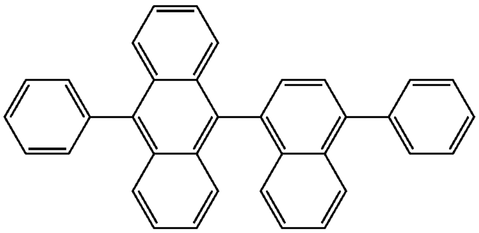

In an embodiment, the emission layer EML may include a compound represented by Formula E-2a or Formula E-2b below. The compound represented by Formula E-2a or Formula E-2b below may be utilized as a phosphorescence host material.

Formula E-2a

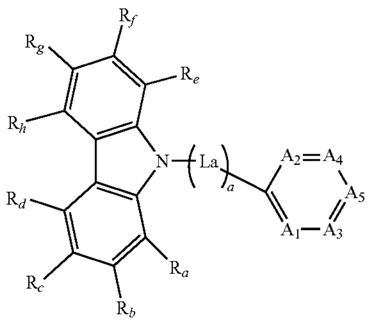

In Formula E-2a, a may be an integer of 0 to 10, $L_a$ may be a direct linkage, a substituted or unsubstituted arylene group having 6 to 30 ring-forming carbon atoms, or a substituted or unsubstituted heteroarylene group having 2 to 30 ring-forming carbon atoms. In one or more embodiments, when a is an integer of 2 or greater, a plurality of $L_a$'s may be each independently a substituted or unsubstituted arylene group having 6 to 30 ring-forming carbon atoms, or a substituted or unsubstituted heteroarylene group having 2 to 30 ring-forming carbon atoms.

In addition, in Formula E-2a, $A_1$ to $A_5$ may be each independently N or $CR_i$. $R_a$ to $R_i$ may be each independently a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring. $R_a$ to $R_i$ may be bonded to an adjacent group to form a hydrocarbon ring or a heterocycle containing N, O, S, etc. as a ring-forming atom.

In one or more embodiments, in Formula E-2a, two or three groups selected from among $A_1$ to $A_5$ may be N, and the rest may be $CR_i$.

Formula E-2b $$(Cbz1)-(L_b)_b-(Cbz2)$$

In Formula E-2b, Cbz1 and Cbz2 may be each independently an unsubstituted carbazole group, or a carbazole group substituted with an aryl group having 6 to 30 ring-forming carbon atoms. Lb is a direct linkage, a substituted or unsubstituted arylene group having 6 to 30 ring-forming carbon atoms, or a substituted or unsubstituted heteroarylene group having 2 to 30 ring-forming carbon atoms. In one or more embodiments, b is an integer of 0 to 10, and when b is an integer of 2 or more, a plurality of Lb's may be each independently a substituted or unsubstituted arylene group having 6 to 30 ring-forming carbon atoms, or a substituted or unsubstituted heteroarylene group having 2 to 30 ring-forming carbon atoms.

The compound represented by Formula E-2a or Formula E-2b may be represented by any one of the compounds of Compound Group E-2 below. However, the compounds listed in Compound Group E-2 below are examples, the compound represented by Formula E-2a or Formula E-2b is not limited to those represented by Compound Group E-2 below.

Compound Groupd E-2

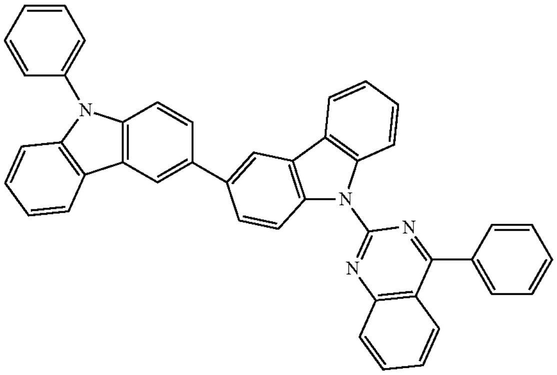

-continued
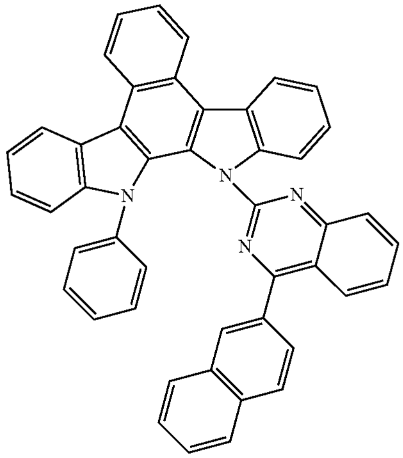
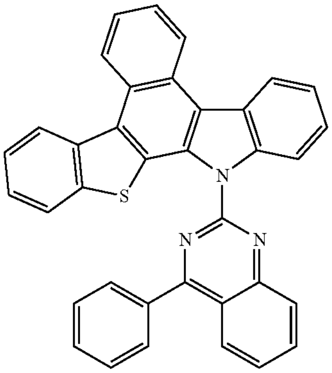
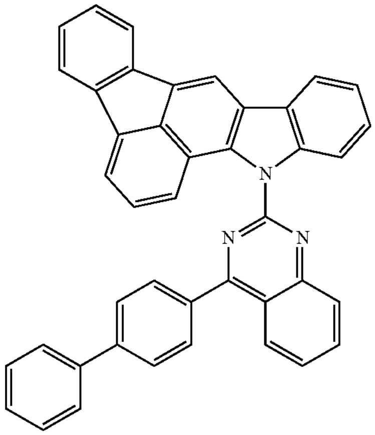
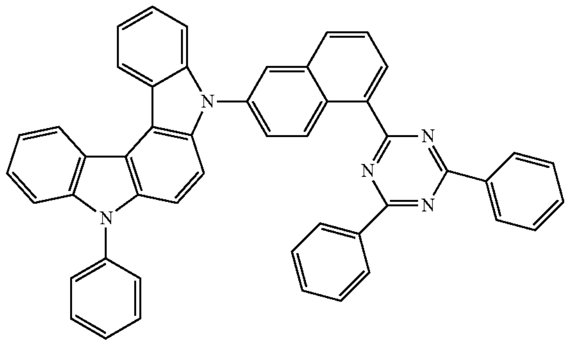
-continued
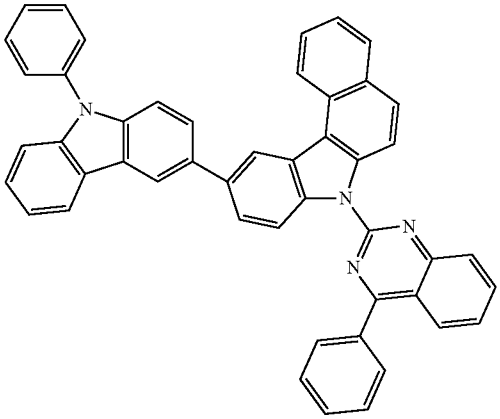
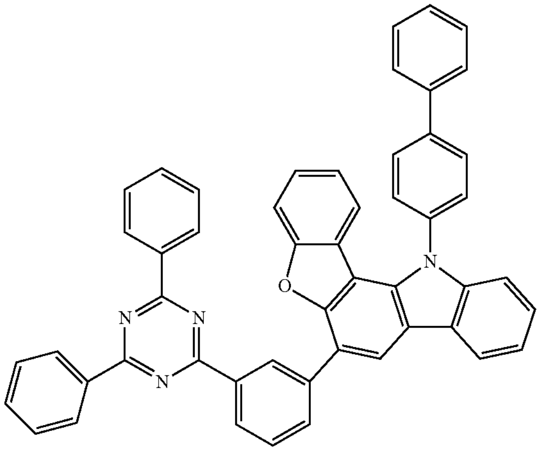
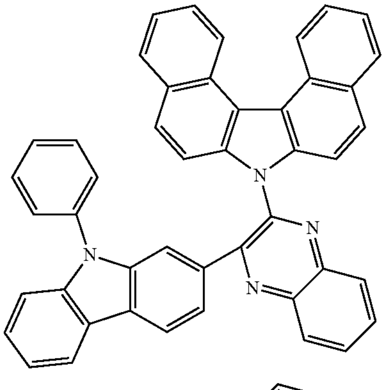
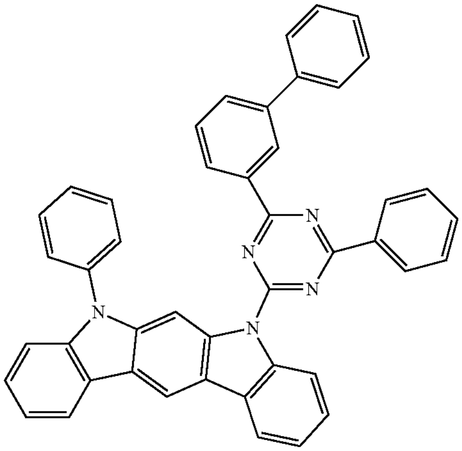

-continued
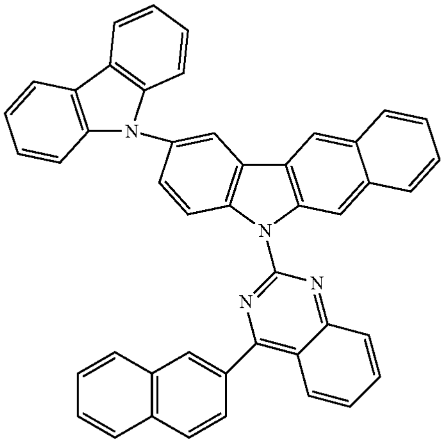
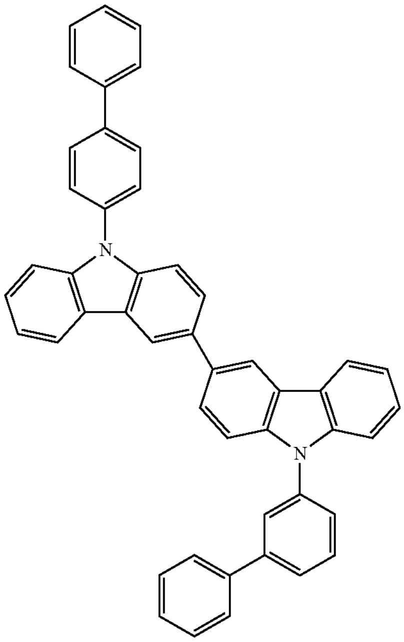
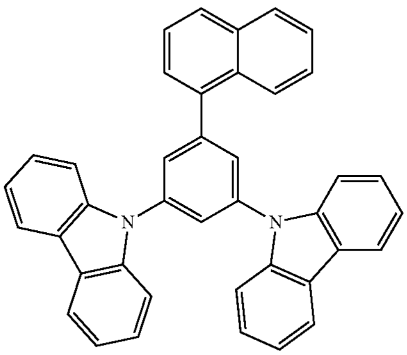
-continued
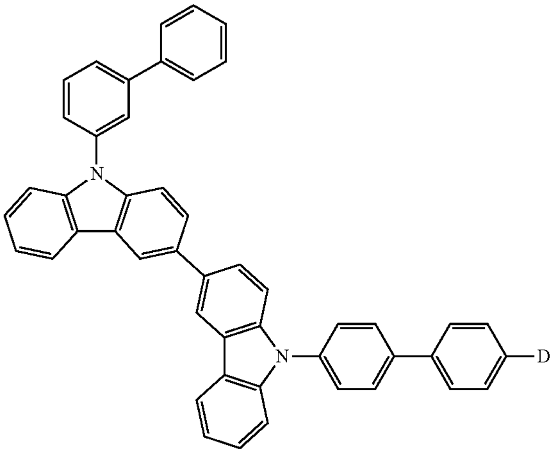
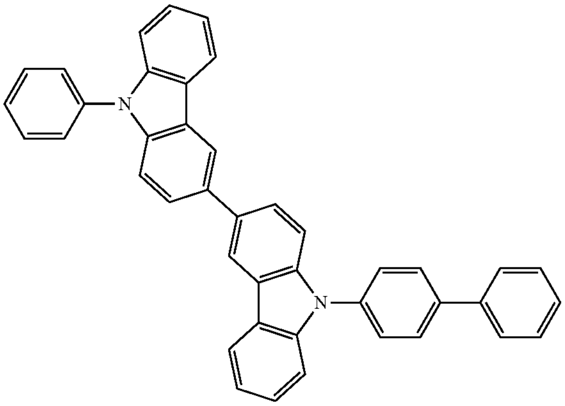
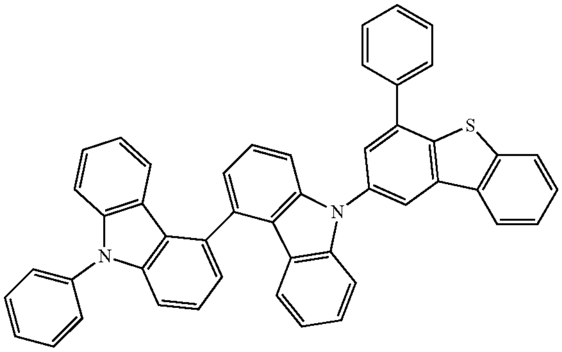
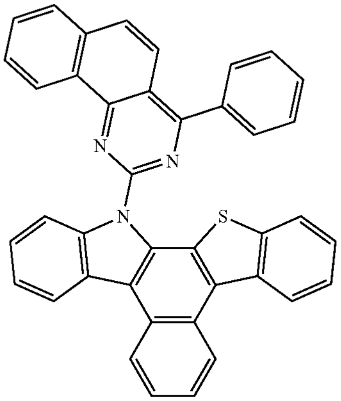

-continued

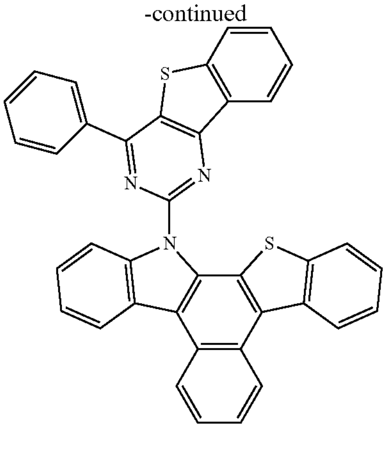

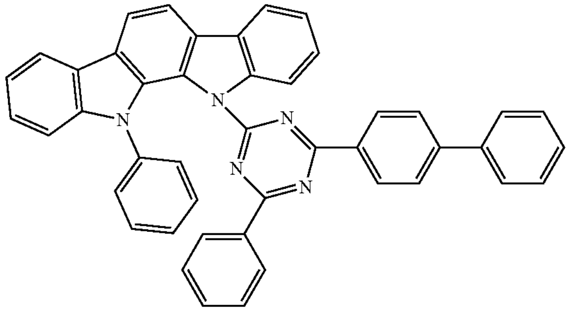

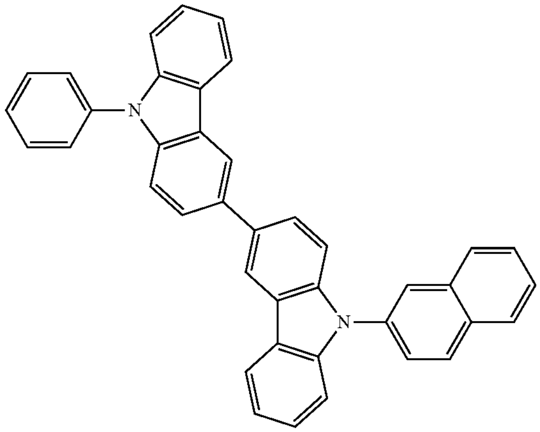

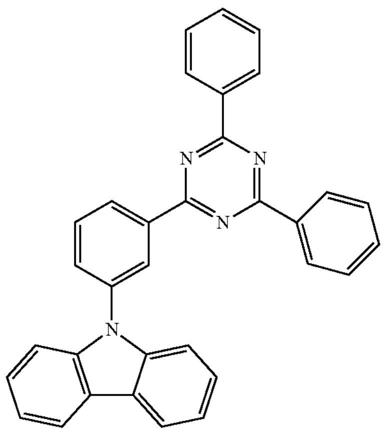

-continued

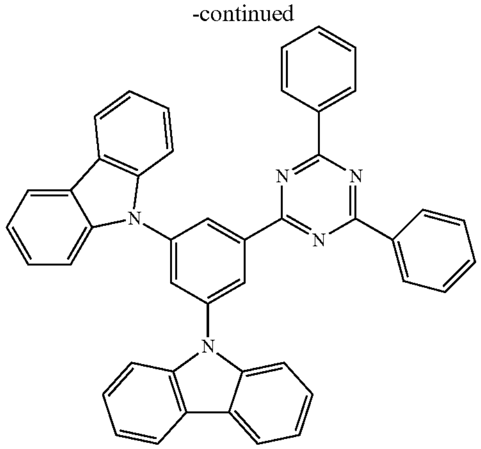

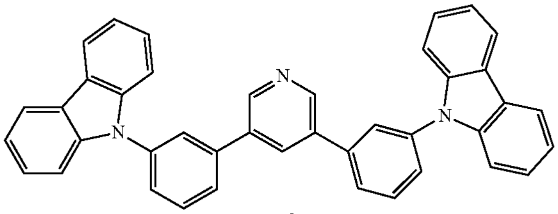

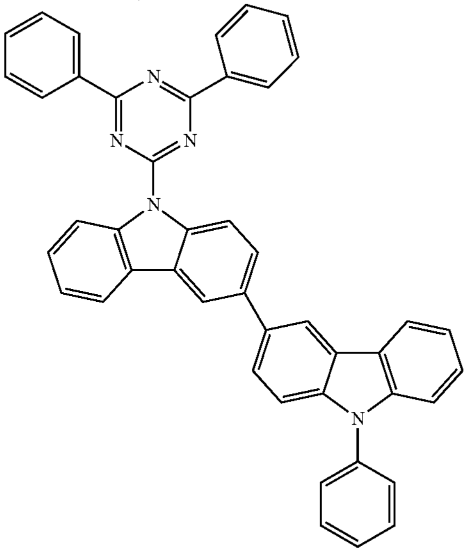

The emission layer EML may further include a general material known in the art as a host material. For example, the emission layer EML may include, as a host material, at least one of bis[2-(diphenylphosphino)phenyl] ether oxide (DPEPO), 4,4'-bis(carbazol-9-yl)biphenyl (CBP), 1,3-bis (carbazol-9-yl)benzene (mCP), 2,8-bis(diphenylphosphoryl) dibenzo[b,d]furan (PPF), 4,4',4"-tris(carbazol-9-yl)-triphenylamine (TCTA), or 1,3,5-tris(1-phenyl-1H-benzo[d] imidazole-2-yl)benzene (TPBi). However, embodiments of the present disclosure are not limited thereto, and for example, tris(8-hydroxyquinolino)aluminum ($Alq_3$), 4,4'-bis (N-carbazolyl)-1,1'-biphenyl (CBP), poly(n-vinylcabazole (PVK), 9,10-di(naphthalene-2-yl)anthracene (ADN), 4,4',4"-tris(carbazol-9-yl)-triphenylamine (TCTA), 1,3,5-tris(N-phenylbenzimidazole-2-yl)benzene (TPBi), 2-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenylcyclotriphosphazene (CP1), 1,4-bis (tiphenylsilyl)benzene (UGH2), hexaphenylcyclotrisiloxane ($DPSiO_3$), octaphenylcyclotetra siloxane ($DPSiO_4$), 2,8-bis (diphenylphosphoryl)dibenzofuran (PPF), etc., may be utilized as a host material.

The emission layer EML may include a compound represented by Formula M-a or Formula M-b below. The compound represented by Formula M-a or Formula M-b below may be utilized as a phosphorescence dopant material.

Formula M-a

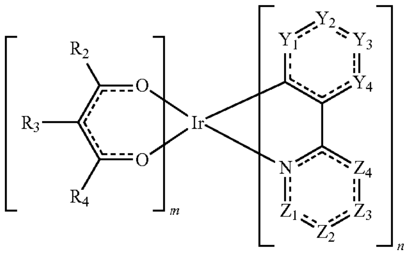

In Formula M-a above, $Y_1$ to $Y_4$ and $Z_1$ to $Z_4$ may be each independently $CR_1$ or N, $R_1$ to $R_4$ may be each independently a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring. In Formula M-a, m is 0 or 1, and n is 2 or 3. In Formula M-a, when m is 0, n is 3, and when m is 1, n is 2.

The compound represented by Formula M-a may be utilized as a red phosphorescence dopant or a green phosphorescence dopant.

The compound represented by Formula M-a may be represented by any one of Compound M-a1 to Compound M-a19 below. However, Compounds M-a1 to M-a19 below are examples, and the compound represented by Formula M-a is not limited to those represented by Compounds M-a1 to M-a19 below.

M-a1

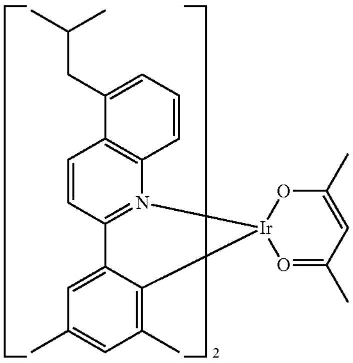

-continued

M-a2

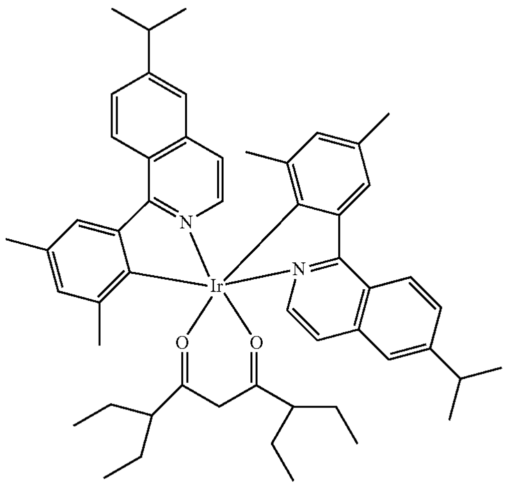

M-a3

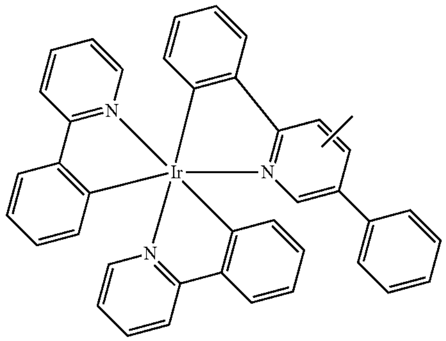

M-a4

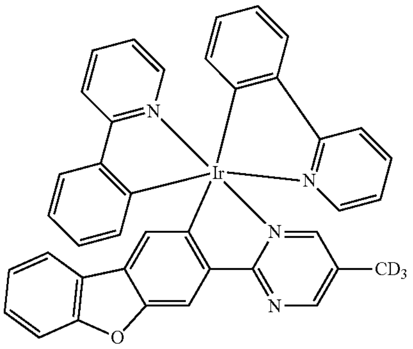

M-a5

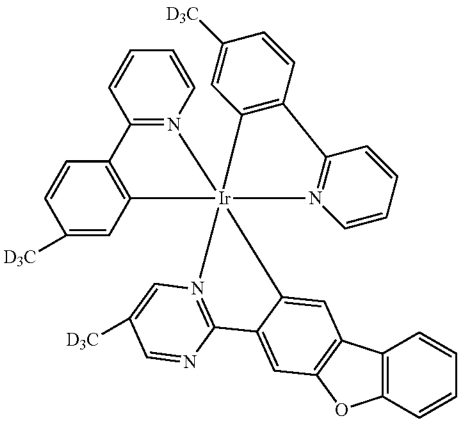

-continued
M-a6
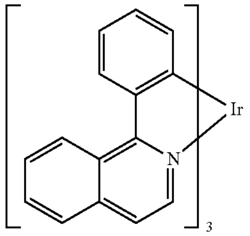
M-a7
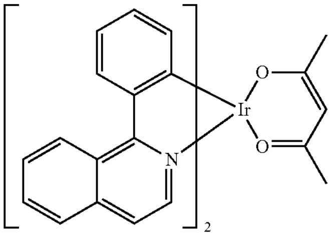
M-a8
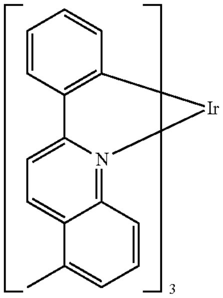
M-a9
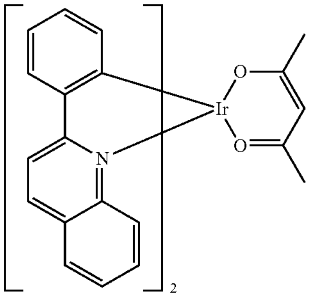
M-a10
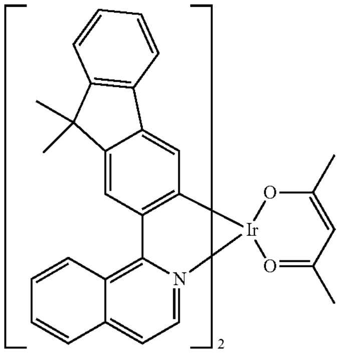
-continued
M-a11
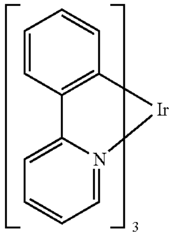
M-a12
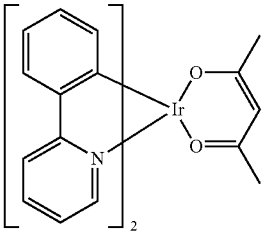
M-a13
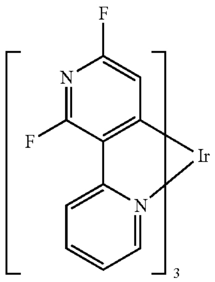
M-a14
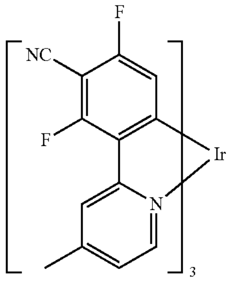
M-a15
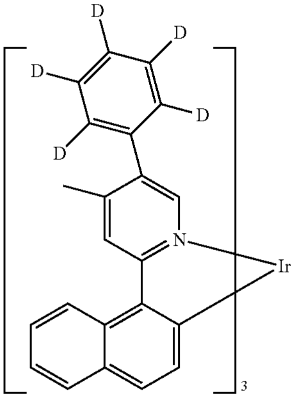

-continued

M-a16

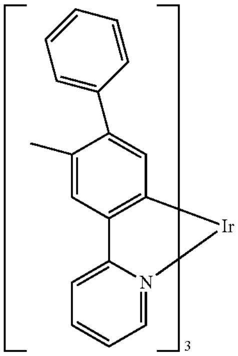

M-a17

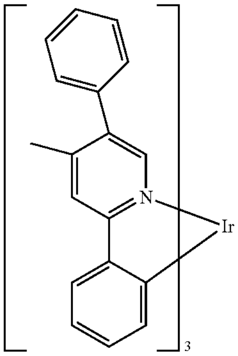

M-a18

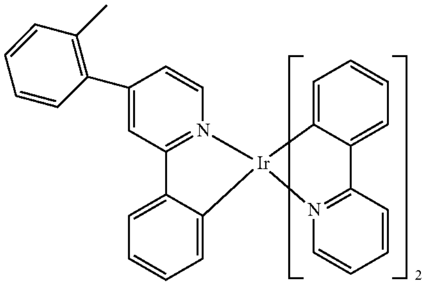

M-a19

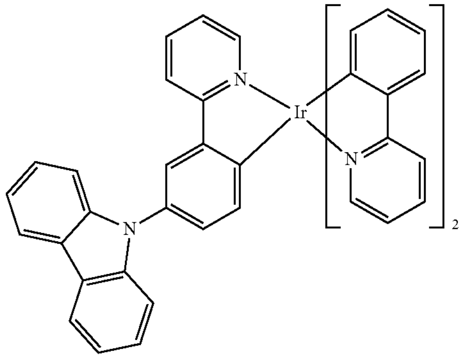

Compound M-a1 and Compound M-a2 may be utilized as a red dopant material, and Compound M-a3 to Compound M-a5 may be utilized as a green dopant material.

Formula M-b

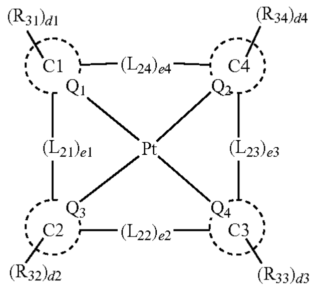

In Formula M-b, $Q_1$ to $Q_4$ are each independently C or N, and $C_1$ to $C_4$ are each independently a substituted or unsubstituted hydrocarbon ring having 5 to 30 ring-forming carbon atoms, or a substituted or unsubstituted heterocycle having 2 to 30 ring-forming carbon atoms.

$L_{21}$ to $L_{24}$ are each independently a direct linkage,

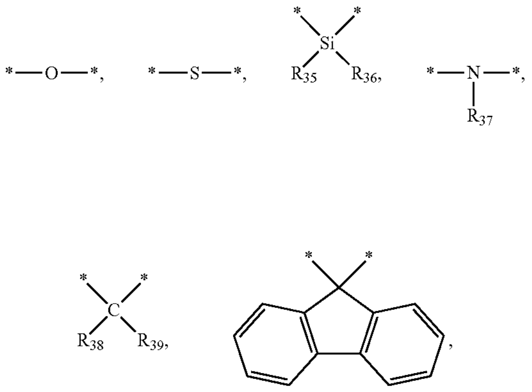

a substituted or unsubstituted divalent alkyl group having 1 to 20 carbon atoms, a substituted or unsubstituted arylene group having 6 to 30 ring-forming carbon atoms, or a substituted or unsubstituted heteroarylene group having 2 to 30 ring-forming carbon atoms, and e1 to e4 are each independently 0 or 1. $R_{31}$ to $R_{39}$ are each independently a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or are bonded to an adjacent group to form a ring, and d1 to d4 are each independently an integer of 0 to 4.

The compound represented by Formula M-b may be utilized as a blue phosphorescence dopant or a green phosphorescence dopant.

The compound represented by Formula M-b may be represented by any one of the compounds below. However, the compounds below are examples, and the compound represented by Formula M-b is not limited to those represented by the compounds below.

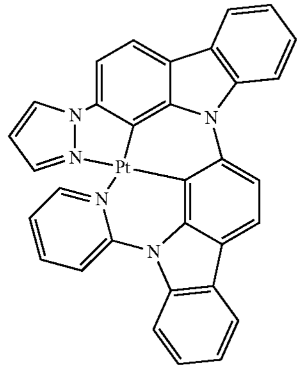
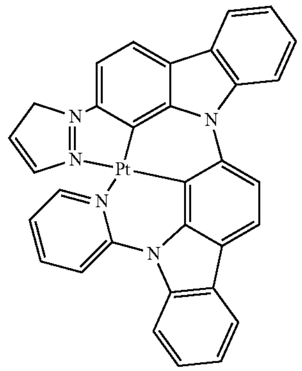
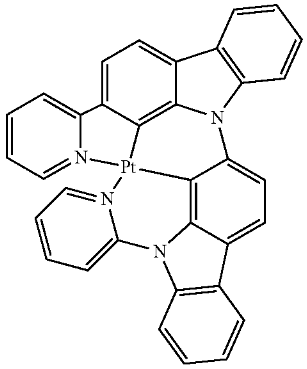
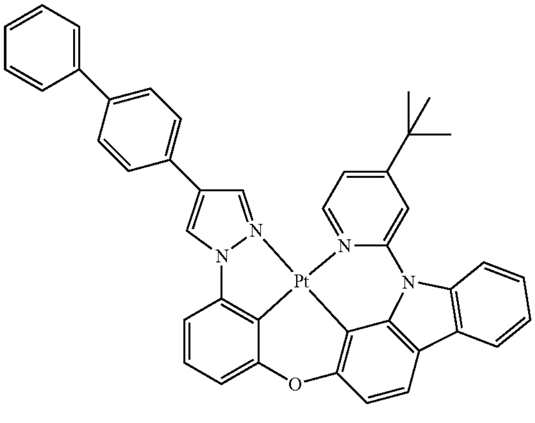
-continued
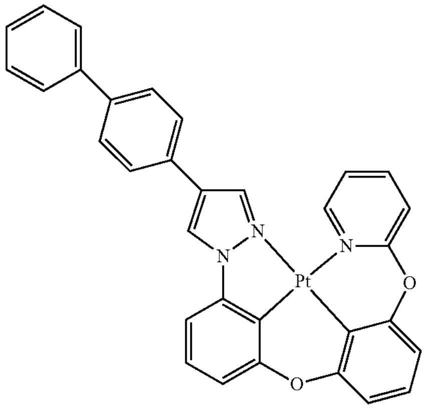
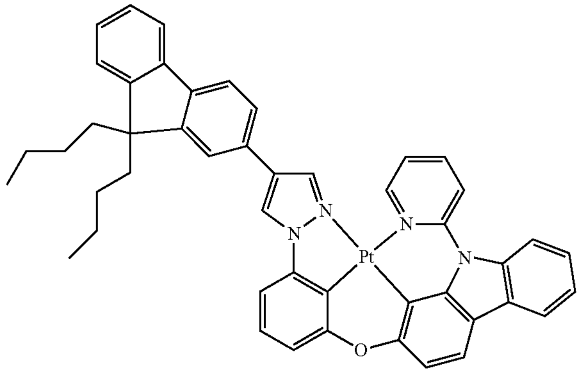
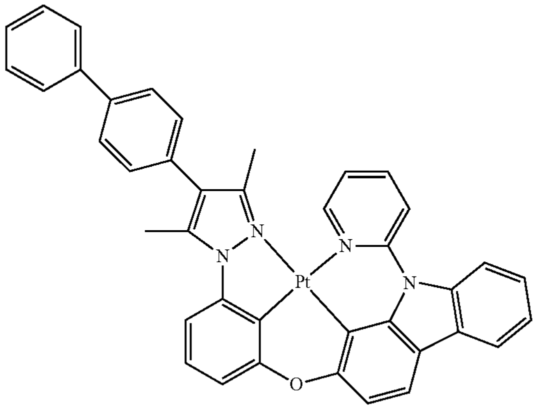
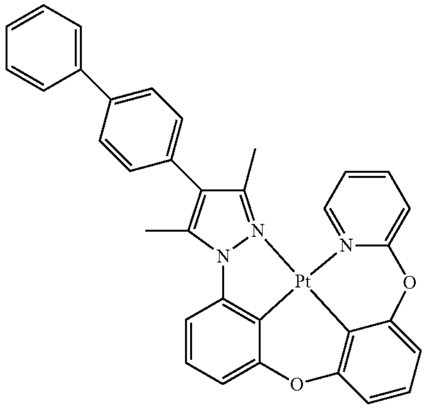

-continued

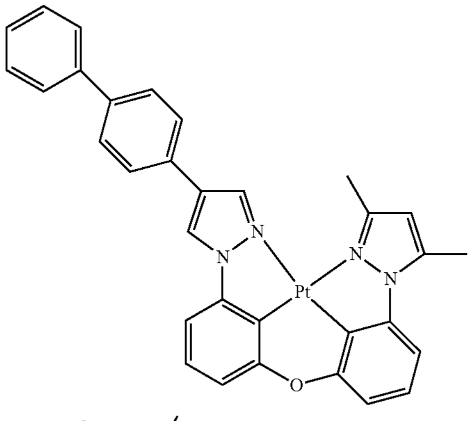

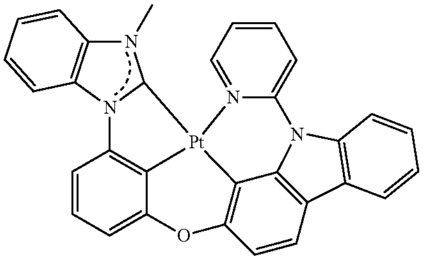

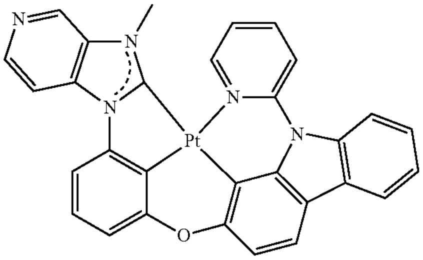

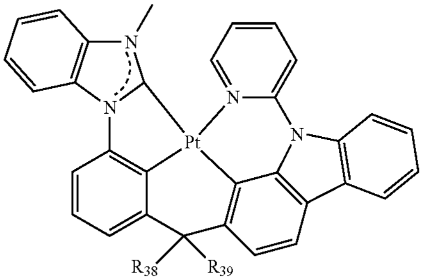

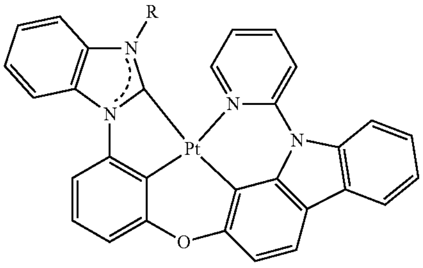

In the compounds above, R, $R_{38}$, and $R_{39}$ may be each independently a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

The emission layer EML may include a compound represented by any one of Formula F-a to Formula F-c below. The compound represented by Formula F-a or Formula F-c below may be utilized as a fluorescence dopant material.

Formula F-a

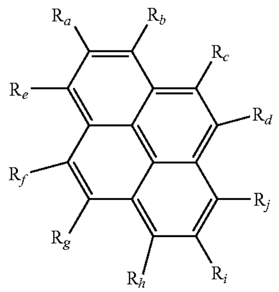

In Formula F-a, two selected from among $R_a$ to $R_j$ may each independently be substituted with $*—NAr_1Ar_2$. The others, which are not substituted with $*—NAr_1Ar_2$, from among $R_a$ to $R_j$ may be each independently a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. In $*—NAr_1Ar_2$, Ar and $Ar_2$ may be each independently a substituted or unsubstituted aryl group having 6 to 30 ring-forming carbon atoms, or a substituted or unsubstituted heteroaryl group having 2 to 30 ring-forming carbon atoms. For example, at least one of $Ar_1$ or $Ar_2$ may be a heteroaryl group containing O or S as a ring-forming atom.

Formula F-b

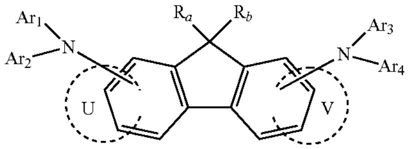

In Formula F-b, $R_a$ and $R_b$ may be each independently a hydrogen atom, a deuterium atom, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring.

In Formula F-b, U and V may be each independently a substituted or unsubstituted hydrocarbon ring having 5 to 30 ring-forming carbon atoms, or a substituted or unsubstituted heterocycle having 2 to 30 ring-forming carbon atoms.

In Formula F-b, the number of rings represented by U and V may be each independently 0 or 1. For example, in Formula F-b, when the number of U or V is 1, it represents that one ring forms a condensed ring at a part described as U or V, and when the number of U or V is 0, a ring described as U or V is not present. For example, when the number of U is 0 and the number of V is 1, or when the number of U is 1 and the number of V is 0, the condensed ring having a fluorene core of Formula F-b may be a four-ring cyclic compound. In addition, when each number of U and V is 0, the condensed ring of Formula F-b may be a three-ring cyclic compound. In addition, when each number of U and V is 1, the condensed ring having a fluorene core of Formula F-b may be a five-ring cyclic compound.

Formula F-c

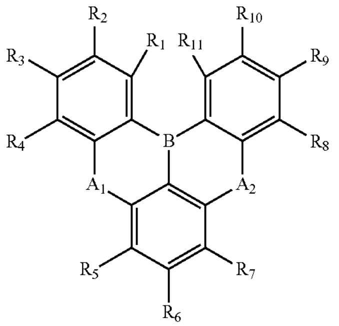

In Formula F-c, $A_1$ and $A_2$ may be each independently O, S, Se, or $NR_m$, and $R_m$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. $R_1$ to $R_{11}$ are each independently a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or are bonded to an adjacent group to form a ring.

In Formula F-c, $A_1$ and $A_2$ may each independently be bonded to substituents of an adjacent ring to form a condensed ring. For example, when $A_1$ and $A_2$ are each independently $NR_m$, $A_1$ may be bonded to $R_4$ or $R_5$ to form a ring. In addition, $A_2$ may be bonded to $R_7$ or $R_8$ to form a ring.

In an embodiment, the emission layer EML may include, as a generally available dopant material, styryl derivatives (e.g., 1,4-bis[2-(3-N-ethylcarbazoryl)vinyl]benzene (BCzVB), 4-(di-p-tolylamino)-4'-[(di-p-tolylamino)styryl] stilbene (DPAVB), and/or N-(4-((E)-2-(6-((E)-4-(diphenylamino)styryl)naphthalen-2-yl)vinyl)phenyl)-N-phenylbenz enamine (N-BDAVBi)), 4,4'-bis[2-(4-(N,N-diphenylamino)phenyl)vinyl]biphenyl(DPAVBi), perylene and the derivatives thereof (e.g., 2,5,8,11-tetra-t-butylperylene (TBP)), pyrene and the derivatives thereof (e.g., 1,1-dipyrene, 1,4-dipyrenylbenzene, and/or 1,4-bis(N,N-diphenylamino)pyrene), etc.

The emission layer EML may include any suitable phosphorescence dopant material utilized in the art. For example, a metal complex including iridium (Ir), platinum (Pt), osmium (Os), aurum (Au), titanium (Ti), zirconium (Zr), hafnium (Hf), europium (Eu), terbium (Tb), or thulium (Tm) may be utilized as a phosphorescence dopant. For example, iridium (III) bis(4,6-difluorophenylpyridinato-N,C2')-picolinate (Flrpic), bis(2,4-difluorophenylpyridinato)-tetrakis(1-pyrazolyl)borate iridium (III) (Fir6), and/or platinum octaethyl porphyrin (PtOEP) may be utilized as a phosphorescence dopant. However, embodiments of the present disclosure are not limited thereto.

The emission layer EML may include a quantum dot material. The core of the quantum dot may be selected from among a Group II-VI compound, a Group III-VI compound, a Group I-III-VI compound, a Group III-V compound, a Group III-II-V compound, a Group IV-VI compound, a Group IV element, a Group IV compound, and a combination thereof.

A Group II-VI compound may be selected from the group consisting of a binary compound selected from the group consisting of CdSe, CdTe, CdS, ZnS, ZnSe, ZnTe, ZnO, HgS, HgSe, HgTe, MgSe, MgS, and a mixture thereof, a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof, and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The Group III-VI compound may include a binary compound such as $In_2S_3$ and/or $In_2Se_3$, a ternary compound such as $InGaS_3$ and/or $InGaSe_3$, or any combination thereof.

A Group I-III-VI compound may be selected from a ternary compound selected from the group consisting of AgInS, $AgInS_2$, CuInS, $CuInS_2$, $AgGaS_2$, $CuGaS_2$ $CuGaO_2$, $AgGaO_2$, $AgAlO_2$, and a mixture thereof, and/or a quaternary compound such as $AgInGaS_2$ and/or $CuInGaS_2$.

The Group III-V compound may be selected from the group consisting of a binary compound selected from the group consisting of GaN, GaP, GaAs, GaSb, AlN, AlP, AlAs, AlSb, InN, InP, InAs, InSb, and a mixture thereof, a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a mixture thereof, and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. In one or more embodiments, the Group III-V compound may further include a Group II metal. For example, InZnP, etc., may be selected as a Group III-II-V compound.

The Group IV-VI compound may be selected from the group consisting of a binary compound selected from the group consisting of SnS, SnSe, SnTe, PbS, PbSe, PbTe, and a mixture thereof, a ternary compound selected from the group consisting of SnSeS, SnSeTe, SnSTe, PbSeS, PbSeTe, PbSTe, SnPbS, SnPbSe, SnPbTe, and a mixture thereof, and a quaternary compound selected from the group consisting of SnPbSSe, SnPbSeTe, SnPbSTe, and a mixture thereof. The Group IV element may be selected from the group consisting of Si, Ge, and a mixture thereof. The Group IV compound may be a binary compound selected from the group consisting of SiC, SiGe, and a mixture thereof.

In one or more embodiments, the binary compound, the ternary compound, and/or the quaternary compound may be present in particles in a uniform (e.g., substantially uniform) concentration distribution, or may be present in the same particle in a partially different concentration distribution. In addition, the quantum dot may have a core/shell structure in which one quantum dot surrounds another quantum dot. In a core/shell structure, the interface of the shell may have a concentration gradient in which the concentration of an element present in the shell becomes lower towards the core. For example, in a core/shell structure, a concentration gradient may be present in which the concentration of an element present in the shell becomes lower towards the center of the core.

In some embodiments, a quantum dot may have the above-described core-shell structure including a core containing nanocrystals and a shell surrounding the core. The shell of the quantum dot may serve as a protection layer to prevent or reduce the chemical deformation of the core so as to maintain semiconductor properties, and/or a charging layer to impart electrophoresis properties to the quantum dot. The shell may be a single layer or a multilayer. An example of the shell of the quantum dot may include a metal oxide, a non-metal oxide, a semiconductor compound, or a combination thereof.

For example, the metal oxide and/or non-metal oxide may be a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and/or NiO, and/or a ternary compound such as $MgAl_2O_4$, $CoFe_2O_4$, $NiFe_2O_4$, and/or $CoMn_2O_4$, but the present disclosure is not limited thereto.

Also, the semiconductor compound may be, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AIAs, AlP, AlSb, etc., but embodiments of the present disclosure are not limited thereto.

The quantum dot may have a full width of half maximum (FWHM) of a light emission wavelength spectrum of about 45 nm or less, about 40 nm or less, and for example, about 30 nm or less, and color purity or color reproducibility may be improved in the above ranges. In addition, light emitted through such a quantum dot is emitted in all directions, and thus a wide viewing angle may be improved.

In addition, although the form of a quantum dot is not particularly limited as long as it is a form commonly utilized in the art, for example, a quantum dot in the form of spherical, pyramidal, multi-arm, and/or cubic nanoparticles, nanotubes, nanowires, nanofibers, nanoparticles, etc., may be utilized.

The quantum dot may control the color of emitted light according to the particle size thereof. Accordingly, the quantum dot may have various suitable light emission colors such as blue, red, and/or green.

In each light emitting device ED of embodiments illustrated in FIGS. 3 to 6, the electron transport region ETR is provided on the emission layer EML. The electron transport region ETR may include at least one of the hole blocking layer HBL, the electron transport layer ETL, or the electron injection layer EIL, but embodiments of the present disclosure are not limited thereto.

The electron transport region ETR may have a single layer formed of a single material, a single layer formed of a plurality of different materials, or a multilayer structure including a plurality of layers formed of a plurality of different materials.

For example, the electron transport region ETR may have a single layer structure of the electron injection layer EIL or the electron transport layer ETL, and may have a single layer structure formed of an electron injection material and an electron transport material. In addition, the electron transport region ETR may have a single layer structure formed of a plurality of different materials, or may have a structure in which an electron transport layer ETL/electron injection layer EIL, a hole blocking layer HBL/electron transport layer ETL/electron injection layer EIL, an electron transport layer ETL/buffer layer (not shown)/electron injection layer EIL are stacked in the respective stated order from the emission layer EML, but embodiments of the present disclosure are not limited thereto. The electron transport region ETR may have a thickness, for example, from about 1,000 Å to about 1,500 Å.

The electron transport region ETR may be formed by utilizing various suitable methods such as a vacuum deposition method, a spin coating method, a cast method, a Langmuir-Blodgett (LB) method, an inkjet printing method, a laser printing method, a laser induced thermal imaging (LITI) method, etc.

The electron transport region ETR may include a compound represented by Formula ET-1 below:

Formula ET-1

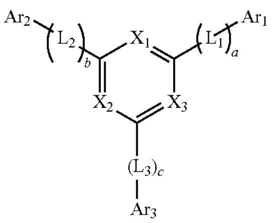

In Formula ET-1, at least one selected from among $X_1$ to $X_3$ is N, and the rest are $CR_a$. $R_a$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. $Ar_1$ to $Ar_3$ may be each independently a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula ET-1, a to c may be each independently an integer of 0 to 10. In Formula ET-1, $L_1$ to $L_3$ may be each independently a direct linkage, a substituted or unsubstituted arylene group having 6 to 30 ring-forming carbon atoms, or a substituted or unsubstituted heteroarylene group having 2 to 30 ring-forming carbon atoms. In one or more embodiments, when a to c are each an integer of 2 or more, $L_1$ to $L_3$ may be each independently a substituted or unsubstituted arylene group having 6 to 30 ring-forming carbon atoms, or a substituted or unsubstituted heteroarylene group having 2 to 30 ring-forming carbon atoms.

The electron transport region ETR may include an anthracene-based compound. However, embodiments of the present disclosure are not limited thereto, and the electron transport region ETR may include, for example, tis(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazol-1-yl)phenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-$N^1$,$O^8$)-(1,1'-biphenyl-4-olato) aluminum (BAlq), berylliumbis(benzoquinolin-10-olate ($Bebq_2$), 9,10-di(naphthalene-2-yl)anthracene (ADN), 1,3-bis[3,5-di(pyridin-3-yl)phenyl]benzene (BmPyPhB), diphenyl(4-(tiphenylsilyl)phenyl)phosphine oxide (TSPO1), or a mixture thereof.

In addition, the electron transport regions ETR may include a metal halide such as LiF, NaCl, CsF, RbCl, Rbl, Cul, and/or Kl, a lanthanide metal such as Yb, and/or a co-deposited material of the metal halide and the lanthanide metal. For example, the electron transport region ETR may include Kl:Yb, Rbl:Yb, etc., as a co-deposited material. In one or more embodiments, the electron transport region ETR may be formed utilizing a metal oxide such as $Li_2O$ and/or BaO, and/or 8-hydroxyl-lithium quinolate (Liq), etc., but embodiments of the present disclosure are not limited thereto.

The electron transport region ETR may also be formed of a mixture material of an electron transport material and an insulating organometallic salt. The organometallic salt may be a material having an energy band gap of about 4 eV or more. For example, the organometallic salt may include, for example, metal acetates, metal benzoates, metal acetoacetates, metal acetylacetonates, and/or metal stearates.

The electron transport region ETR may further include 2,9-dimethyl-4,7-diphenyl-1,10-phenanthroline (BCP), and/or 4,7-diphenyl-1,10-phenanthroline (Bphen) in addition to the above-described materials, but embodiments of the present disclosure are not limited thereto.

The electron transport region ETR may include the above-described compounds of the hole transport region in at least one of the electron injection layer EIL, the electron transport layer ETL, or the hole blocking layer HBL.

When the electron transport region ETR includes the electron transport layer ETL, the electron transport layer ETL may have a thickness of about 100 Å to about 1,000 Å, for example, about 150 Å to about 500 Å. If the thickness of the electron transport layer ETL satisfies the aforementioned ranges, satisfactory electron transport characteristics may be obtained without a substantial increase in driving voltage. When the electron transport region ETR includes the electron injection layer EIL, the electron injection layer EIL may have a thickness of about 1 Å to about 100 Å, for example, about 3 Å to about 90 Å. If the thickness of the electron injection layer EIL satisfies the above-described ranges, satisfactory electron injection characteristics may be obtained without a substantial increase in driving voltage.

The second electrode EL2 is provided on the electron transport region ETR. The second electrode EL2 may be a common electrode. The second electrode EL2 may be a cathode or an anode, but embodiments of the present disclosure are not limited thereto. For example, when the first electrode EL1 is an anode, the second electrode EL2 may be a cathode, and when the first electrode EL1 is a cathode, the second electrode EL2 may be an anode. The second electrode EL2 may include Ag, Mg, Cu, Al, Pt, Pd, Au, Ni, Nd, Ir, Cr, Li, Ca, LiF/Ca, LiF/Al, Mo, Ti, W, In, Sn, Zn, a compound of two or more thereof, a mixture of two or more thereof, or an oxide thereof.

The second electrode EL2 may be a transmissive electrode, a transflective electrode, or a reflective electrode. When the second electrode EL2 is the transmissive electrode, the second electrode EL2 may be formed of a transparent metal oxide, for example, indium tin oxide (ITO), indium zinc oxide (IZO), zinc oxide (ZnO), indium tin zinc oxide (ITZO), etc.

When the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, W, a compound thereof, or a mixture thereof (e.g., AgMg, AgYb, and/or MgAg). In one or more embodiments, the second electrode EL2 may have a multilayer structure including a reflective film or a transflective film formed of the above-described materials, and a transparent conductive film formed of ITO, IZO, ZnO, ITZO, etc. For example, the second electrode EL2 may include the above-described metal materials, combinations of at least two metal materials of the above-described metal materials, oxides of the above-described metal materials, and/or the like.

In one or more embodiments, the second electrode EL2 may be connected with an auxiliary electrode. If the second electrode EL2 is connected with the auxiliary electrode, the resistance of the second electrode EL2 may be decreased.

In one or more embodiments, a capping layer CPL may further be on the second electrode EL2 of the light emitting device ED of an embodiment. The capping layer CPL may include a multilayer or a single layer.

In an embodiment, the capping layer CPL may be an organic layer or an inorganic layer. For example, when the capping layer CPL includes an inorganic material, the inorganic material may include an alkaline metal compound such as LiF, an alkaline earth metal compound such as $MgF_2$, SiON, SiNx, and/or SiOy, etc.

For example, when the capping layer CPL includes an organic material, the organic material may include α-NPD, NPB, TPD, m-MTDATA, $Alq_3$, CuPc, N4,N4,N4',N4'-tetra (biphenyl-4-yl)biphenyl-4,4'-diamine (TPD15), 4,4',4"-tris (carbazol sol-9-yl)tdphenylamine (TCTA), etc., an epoxy resin, and/or acrylate such as methacrylate. However, embodiments of the present disclosure are not limited thereto, and the capping layer CPL may include at least one selected from among Compounds P1 to P5 below:

P1

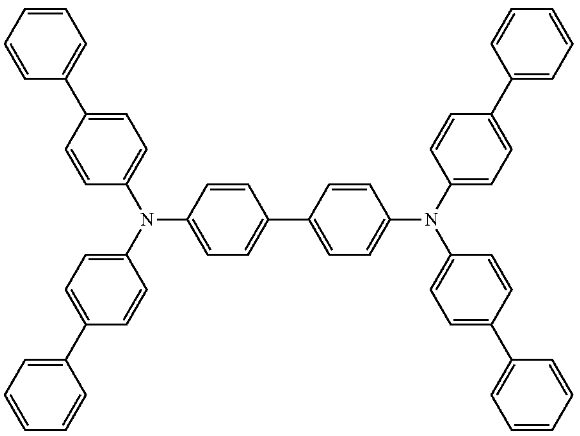

P2

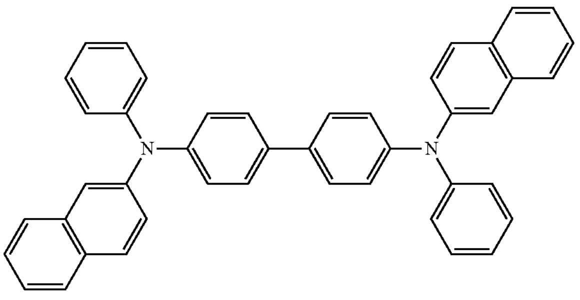

-continued

P3

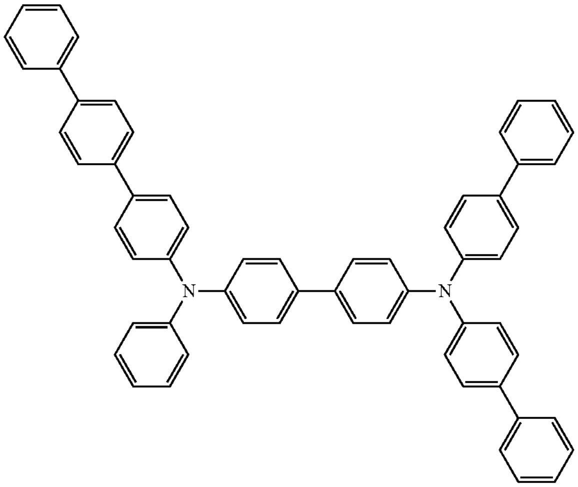

P4

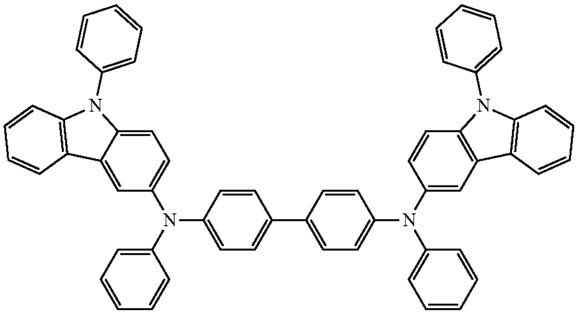

P5

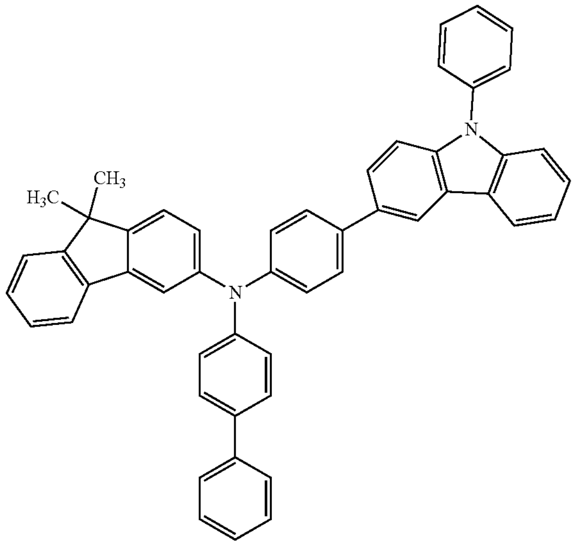

In one or more embodiments, the refractive index of the capping layer CPL may be about 1.6 or more. For example, the refractive index of the capping layer CPL may be about 1.6 or more with respect to light in a wavelength range of about 550 nm to about 660 nm.

Figure 7:
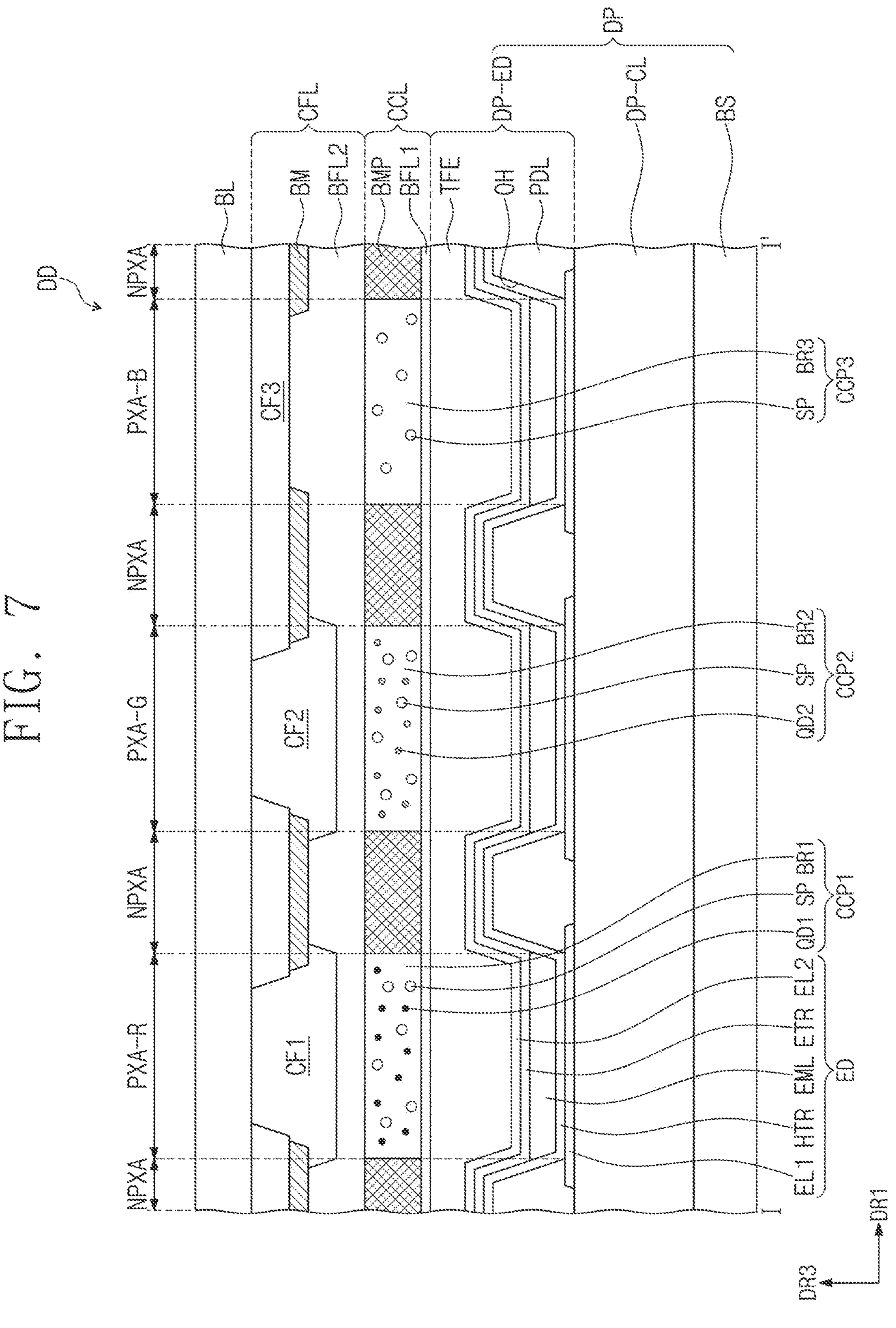
FIG. 7 is a cross-sectional view of a display apparatus according to an embodiment of the present disclosure.
Figure 8:
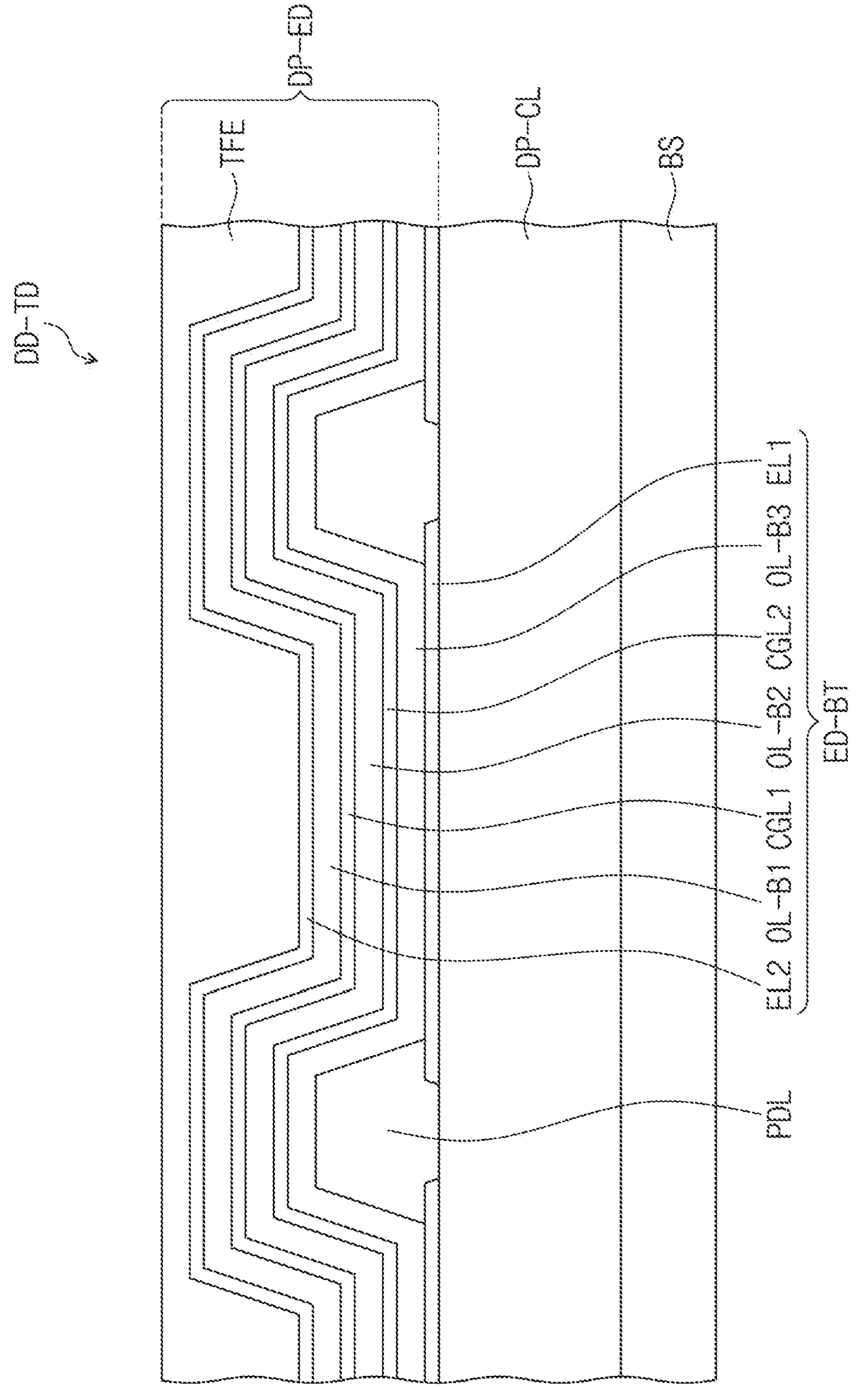
FIG. 8 is a cross-sectional view of a display apparatus according to an embodiment of the present disclosure.

FIGS. 7 and 8 each are a cross-sectional view of a display apparatus according to an embodiment. Hereinafter, in describing the display apparatus of an embodiment with reference to FIGS. 7 and 8, the duplicated features which have been described with respect to FIGS. 1 to 6 are not described again, but their differences will be mainly described.

Referring to FIG. 7, the display apparatus DD according to an embodiment may include a display panel DP including a display device layer DP-ED, a light control layer CCL on the display panel DP, and a color filter layer CFL.

In an embodiment illustrated in FIG. 7, the display panel DP may include a base layer BS, a circuit layer DP-CL provided on the base layer BS, and the display device layer DP-ED, and the display device layer DP-ED may include a light emitting device ED.

The light emitting device ED may include a first electrode EL1, a hole transport region HTR on the first electrode EL1, an emission layer EML on the hole transport region HTR, an electron transport region ETR on the emission layer EML, and a second electrode EL2 on the electron transport region ETR. In one or more embodiments, the structures of the light emitting devices of FIGS. 4 to 6 as described above may be equally applied to the structure of the light emitting device ED shown in FIG. 7.

Referring to FIG. 7, the emission layer EML may be in an opening OH defined in a pixel defining film PDL. For example, the emission layer EML which is divided by the pixel defining film PDL and is provided corresponding to each light emitting regions PXA-R, PXA-G, and PXA-B may emit light in the same wavelength range. In the display apparatus DD of an embodiment, the emission layer EML may emit blue light. In one or more embodiments, the emission layer EML may be provided as a common layer in the entire light emitting regions PXA-R, PXA-G, and PXA-B.

At least one selected from among the emission layers EML provided corresponding to light emitting regions PXA-R, PXA-G, and PXA-B may include the condensed cyclic compound represented by Formula 1 or Formula A of an embodiment as described above. At least one selected from among the emission layers EML provided corresponding to light emitting regions PXA-R, PXA-G, and PXA-B may include the condensed cyclic compound represented by Formula 1 or Formula A of an embodiment as described above, and the rest emission layers EML may include additional suitable fluorescence emitting materials, phosphorescence emitting materials, or quantum dots as described above. However, embodiments of the present disclosure are not limited thereto.

The light control layer CCL may be on the display panel DP. The light control layer CCL may include a light conversion body. The light conversion body may be a quantum dot, a phosphor, and/or the like. The light conversion body may emit light by converting the wavelength of light provided to the light conversion body to light having a different wavelength. That is, the light control layer CCL may include a layer containing the quantum dot and/or a layer containing the phosphor.

The light control layer CCL may include a plurality of light control units CCP1, CCP2 and CCP3. The light control units CCP1, CCP2, and CCP3 may be spaced apart from one another.

Referring to FIG. 7, divided patterns BMP may be between respective ones of the light control units CCP1, CCP2 and CCP3 which are spaced apart from each other, but embodiments of the present disclosure are not limited thereto. FIG. 7 illustrates that the divided patterns BMP do not overlap the light control units CCP1, CCP2 and CCP3, but at least a portion of the edges of the light control units CCP1, CCP2 and CCP3 may overlap the divided patterns BMP.

The light control layer CCL may include a first light control unit CCP1 containing a first quantum dot QD1 which converts a first color light provided from the light emitting device ED into a second color light, a second light control unit CCP2 containing a second quantum dot QD2 which converts the first color light into a third color light, and a third light control unit CCP3 which transmits the first color light.

In an embodiment, the first light control unit CCP1 may provide red light as the second color light, and the second light control unit CCP2 may provide green light as the third color light. The third light control unit CCP3 may provide the first color light by transmitting blue light (that is the first color light provided in the luminescence device ED). For example, the first quantum dot QD1 may be a red quantum dot, and the second quantum dot QD2 may be a green quantum dot. The same as described above may be applied with respect to the quantum dots QD1 and QD2.

In addition, the light control layer CCL may further include a scatterer SP. The first light control unit CCP1 may include the first quantum dot QD1 and the scatterer SP, the second light control unit CCP2 may include the second quantum dot QD2 and the scatterer SP, and the third light control unit CCP3 may not include any quantum dot but include the scatterer SP.

The scatterer SP may be inorganic particles. For example, the scatterer SP may include at least one of $TiO_2$, ZnO, $Al_2O_3$, $SiO_2$, or hollow silica. The scatterer SP may include $TiO_2$, ZnO, $Al_2O_3$, $SiO_2$, or hollow silica, or may be a mixture of at least two materials selected from among $TiO_2$, ZnO, $Al_2O_3$, $SiO_2$, and hollow silica.

The first light control unit CCP1, the second light control unit CCP2, and the third light control unit CCP3 each may include base resins BR1, BR2, and BR3 in which the quantum dots QD1 and QD2 and the scatterer SP are dispersed. In an embodiment, the first light control unit CCP1 may include the first quantum dot QD1 and the scatterer SP dispersed in a first base resin BR1, the second light control unit CCP2 may include the second quantum dot QD2 and the scatterer SP dispersed in a second base resin BR2, and the third light control unit CCP3 may include the scatterer SP dispersed in a third base resin BR3. The base resins BR1, BR2, and BR3 are media in which the quantum dots QD1, QD2, and/or the scatterer SP are dispersed, and may be formed of various suitable resin compositions, which may be generally referred to as a binder. For example, the base resins BR1, BR2, and BR3 may be acrylic-based resins, urethane-based resins, silicone-based resins, epoxy-based resins, etc. The base resins BR1, BR2, and BR3 may be transparent resins. In an embodiment, the first base resin BR1, the second base resin BR2, and the third base resin BR3 each may be the same as or different from each other.

The light control layer CCL may include a barrier layer BFL1. The barrier layer BFL1 may serve to prevent or reduce the penetration of moisture and/or oxygen (hereinafter, referred to as 'moisture/oxygen'). The barrier layer BFL1 may be on the light control units CCP1, CCP2, and CCP3 to block or reduce exposure of the light control units CCP1, CCP2 and CCP3 to moisture/oxygen. In one or more embodiments, the barrier layer BFL1 may cover the light control units CCP1, CCP2, and CCP3. In addition, the barrier layer BFL2 may be provided between the light control units CCP1, CCP2, and CCP3 and the color filter layer CFL.

The barrier layers BFL1 and BFL2 may include at least one inorganic layer. That is, the barrier layers BFL1 and BFL2 may include an inorganic material. For example, the barrier layers BFL1 and BFL2 may include silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, metal thin film which secures a transmittance, etc. In one or more embodiments, the barrier layers BFL1 and BFL2 may further include an organic film. The barrier layers BFL1 and BFL2 may be formed of a single layer or a plurality of layers.

In the display apparatus DD of an embodiment, the color filter layer CFL may be on the light control layer CCL. For example, the color filter layer CFL may be directly on the light control layer CCL. In one or more embodiments, the barrier layer BFL2 may be omitted.

The color filter layer CFL may include a light shielding unit BM and filters CF1, CF2, and CF3. The color filter layer CFL may include a first filter CF1 configured to transmit the second color light, a second filter CF2 configured to transmit the third color light, and a third filter CF3 configured to transmit the first color light. For example, the first filter CF1 may be a red filter, the second filter CF2 may be a green filter, and the third filter CF3 may be a blue filter. The filters CF1, CF2, and CF3 each may include a polymeric photosensitive resin and a pigment and/or dye. The first filter CF1 may include a red pigment and/or dye, the second filter CF2 may include a green pigment and/or dye, and the third filter CF3 may include a blue pigment and/or dye. However, embodiments of the present disclosure are not limited thereto, and the third filter CF3 may not include a pigment and/or dye. The third filter CF3 may include a polymeric photosensitive resin and may not include a pigment or dye. The third filter CF3 may be transparent. The third filter CF3 may be formed of a transparent photosensitive resin.

Furthermore, in an embodiment, the first filter CF1 and the second filter CF2 may each be a yellow filter. The first filter CF1 and the second filter CF2 may not be separated but may be provided as one filter.

The light shielding unit BM may be a black matrix. The light shielding unit BM may include an organic light shielding material and/or an inorganic light shielding material containing a black pigment and/or dye. The light shielding unit BM may prevent or reduce light leakage, and may separate boundaries between the adjacent filters CF1, CF2, and CF3. In addition, in an embodiment, the light shielding unit BM may be formed of a blue filter.

The first to third filters CF1, CF2, and CF3 may correspond to the red light emitting region PXA-R, the green light emitting region PXA-G, and the blue light emitting region PXA-B, respectively.

A base substrate BL may be on the color filter layer CFL. The base substrate BL may be a member which provides a base surface in which the color filter layer CFL, the light control layer CCL, and/or the like are disposed. The base substrate BL may be a glass substrate, a metal substrate, a plastic substrate, etc. However, embodiments of the present disclosure are not limited thereto, and the base substrate BL may be an inorganic layer, an organic layer, or a composite material layer (e.g., a composite material layer including an inorganic material and an organic material). In an embodiment, the base substrate BL may be omitted.

FIG. 8 is a cross-sectional view illustrating a part of a display apparatus according to an embodiment. FIG. 8 illustrates a cross-sectional view of a part corresponding to the display panel DP of FIG. 7. In the display apparatus DD-TD of an embodiment, the light emitting device ED-BT may include a plurality of light emitting structures OL-B1, OL-B2, and OL-B3. The light emitting device ED-BT may include a first electrode EL1 and a second electrode EL2 which face each other, and the plurality of light emitting structures OL-B1, OL-B2, and OL-B3 sequentially stacked in the thickness direction between the first electrode EL1 and the second electrode EL2. The light emitting structures OL-B1, OL-B2, and OL-B3 each may include an emission layer EML (FIG. 7) and a hole transport region HTR and an electron transport region ETR with the emission layer EML (FIG. 7) therebetween.

In one or more embodiments, the light emitting device ED-BT included in the display apparatus DD-TD of an embodiment may be a light emitting device having a tandem structure and including a plurality of emission layers.

In an embodiment illustrated in FIG. 8, light emitted from each of the light emitting structures OL-B1, OL-B2, and OL-B3 may all be blue light. However, embodiments of the present disclosure are not limited thereto, and the light emitted from each of the light emitting structures OL-B1, OL-B2, and OL-B3 may be in a wavelength range different from each other. For example, the light emitting device ED-BT including the plurality of light emitting structures OL-B1, OL-B2, and OL-B3 which emit light in a wavelength range different from each other may emit white light.

A charge generation layer may be between the neighboring light emitting structures OL-B1, OL-B2, and OL-B3. For example, a charge generation layer CGL1 may be between the light emitting structure OL-B1 and the light emitting structure OL-B2, and a charge generation layer CGL2 may be between the light emitting structure OL-B2 and the light emitting structure OL-B3. The charge generation layer may include a p-type charge generation layer and/or an n-type charge generation layer.

At least one of the light emitting structures OL-B1, OL-B2, or OL-B3 included in the display apparatus DD-TD of an embodiment may contain the above-described condensed cyclic compound of an embodiment.

The light emitting device ED according to an embodiment of the present disclosure may include the above-described condensed cyclic compound of an embodiment in at least one emission layer EML between the first electrode EL1 and the second electrode EL2, thereby exhibiting improved luminous efficiency and service life characteristics.

In the above-described condensed cyclic compound of an embodiment, the di-boron-based condensed cyclic ring containing two boron atoms may include at least one dibenzoheterole group, and thus have excellent durability and heat resistance, thereby exhibiting improved service life characteristics. In addition, the condensed cyclic compound of an embodiment may be utilized as a delayed fluorescence emitting material, thereby contributing to high efficiency characteristics of the light emitting device.

Hereinafter, with reference to Examples and Comparative Examples, a condensed cyclic compound according to an embodiment of the present disclosure and a light emitting device of an embodiment of the present disclosure will be described in more detail. In addition, Examples shown below are illustrated only for the understanding of the present disclosure, and the scope of the present disclosure is not limited thereto.

EXAMPLES

1. Synthesis of Condensed Cyclic Compound

First, a synthetic method of a condensed cyclic compound according to the present embodiment will be described in more detail by illustrating the synthetic method of Compounds 1, 2, 3, 9, 21, 37, 47, 61, 71, 74, 81, 84, 111 and 120 of Compound Group 1. In addition, in the following descriptions, a synthetic method of the condensed cyclic compound is provided as an example, but the synthetic method according to an embodiment of the present disclosure is not limited to the following examples.

1. Synthesis of Compound 1

Compound 1 according to an example may be synthesized by, for example, the acts shown in Reaction Scheme 1 below:

Reaction Scheme 1

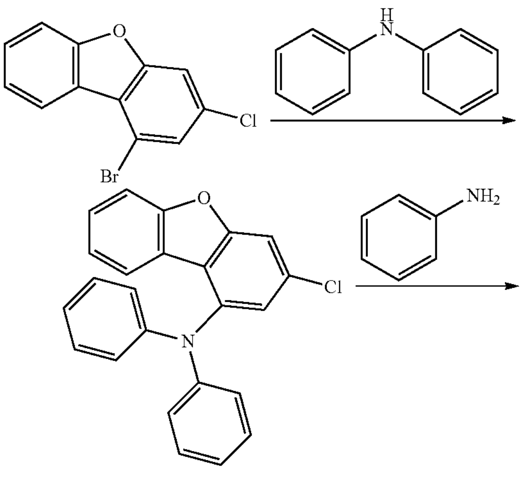

1-a

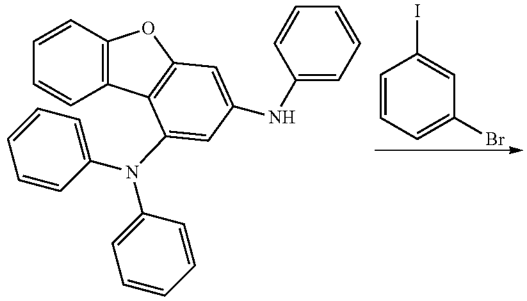

1-b

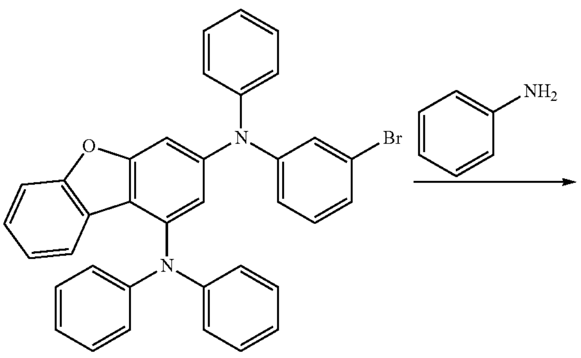

1-c

-continued

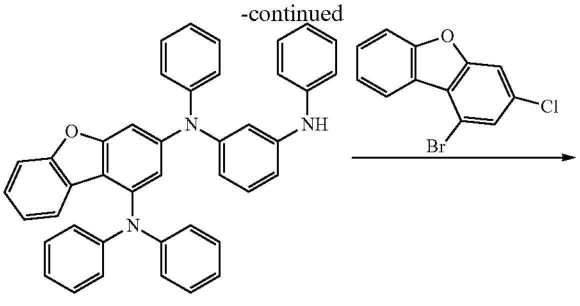

1-d

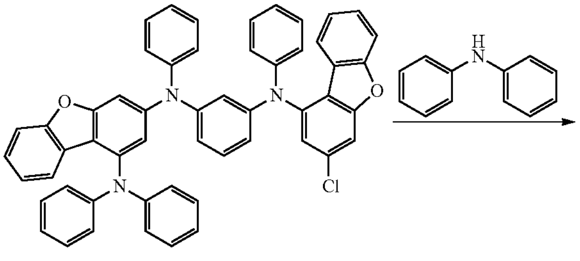

1-e

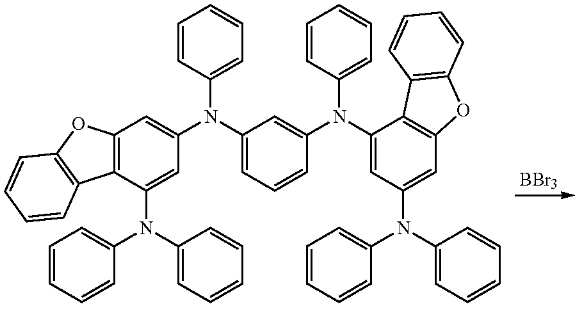

1-f

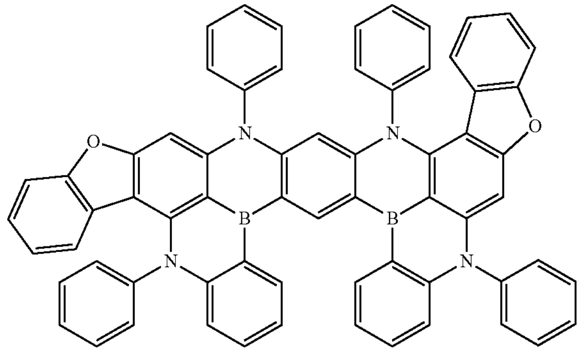

1

1-1. Synthesis of Intermediate Compound 1-a

In an argon atmosphere, in a 2 L flask, 1-bromo-3-chloro-dibenzofuran (50 g, 177 mmol), diphenylamine (30 g, 177 mmol), BINAP (11 g, 17 mmol), and $Pd_2dba_3$ (8 g, 9 mmol) were added and dissolved in 1 L of toluene, and the reaction solution was then stirred at about 85° C. for about 12 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate Compound 1-a (white solid, 46 g, yield: 70%).

ESI-LCMS: $[M]^+$: $C_{24}H_{16}ClNO$. 369.0817.

$^1H$-NMR (400 MHz, $CDCl_3$): 7.99 (d, 1H), 7.54 (d, 1H), 7.38 (t, 1H), 7.31 (t, 1H), 7.24 (m, 4H), 7.11 (m, 5H), 7.00 (t, 2H), 6.90 (s, 1H).

1-2. Synthesis of Intermediate Compound 1-b

In an argon atmosphere, in a 2 L flask, Intermediate Compound 1-a (40 g, 108 mmol), aniline (12 g, 130 mmol), tris-(tert-butyl)phosphine (5 mL, 10 mmol), and $Pd_2dba_3$ (5 g, 5 mmol) were added and dissolved in 600 mL of o-xylene, and the reaction solution was then stirred at about 140° C. for about 3 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate Compound 1-b (white solid, 37 g, yield: 81%).

ESI-LCMS: $[M]^+$: $C_{30}H_{22}N_2O$. 426.1213.

$^1H$-NMR (400 MHz, $CDCl_3$): 8.33 (s, 1H), 7.88 (d, 1H), 7.56 (s, 1H), 7.50 (d, 1H), 7.40 (m, 2H), 7.35 (t, 1H), 7.22 (m, 4H), 7.05 (m, 9H), 6.72 (s, 1H).

1-3. Synthesis of Intermediate Compound 1-c

In an argon atmosphere, in a 2 L flask, Intermediate Compound 1-b (35 g, 82 mmol), 1-bromo-3-iodobenzene (23 g, 82 mmol), BINAP (5.1 g, 8 mmol), and $Pd_2dba_3$ (3.8 g, 4 mmol) were added and dissolved in 500 mL of toluene, and the reaction solution was then stirred at about 85° C. for about 12 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate Compound 1-c (white solid, 29 g, yield: 58%).

ESI-LCMS: $[M]^+$: $C_{36}H_{25}BrN_2O$. 580.0879.

$^1H$-NMR (400 MHz, $CDCl_3$): 8.00 (d, 1H), 7.72 (s, 1H), 7.62 (d, 1H), 7.43 (t, 1H), 7.40 (m, 2H), 7.25 (m, 9H), 7.05 (m, 11H), 6.83 (s, 1H).

1-4. Synthesis of Intermediate Compound 1-d

In an argon atmosphere, in a 1 L flask, Intermediate Compound 1-c (26 g, 43 mmol), aniline (4.8 g, 51 mmol), tris-(tert-butyl)phosphine (2.2 mL, 4.5 mmol), and $Pd_2dba_3$ (2.1 g, 2.2 mmol) were added and dissolved in 300 mL of o-xylene, and the reaction solution was then stirred at about 140° C. for about 5 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate Compound 1-d (white solid, 22 g, yield: 83%).

ESI-LCMS: $[M]^+$: $C_{42}H_{31}N_3O$. 580.0879.

$^1H$-NMR (400 MHz, $CDCl_3$): 8.42 (s, 1H), 8.03 (d, 1H), 7.81 (s, 1H), 7.56 (d, 1H), 7.47 (t, 1H), 7.40 (m, 11H), 7.03 (m, 12H), 6.93 (s, 1H), 6.81 (d, 1H), 6.69 (s, 1H).

1-5. Synthesis of Intermediate Compound 1-e

In an argon atmosphere, in a 1 L flask, Intermediate Compound 1-d (20 g, 34 mmol), 1-bromo-3-chloro-dibenzofuran (9.5 g, 34 mmol), tris-(tert-butyl)phosphine (1.6 mL, 1.6 mmol), and $Pd_2dba_3$ (1.5 g, 1.6 mmol) were added and dissolved in 300 mL of toluene, and the reaction solution was then stirred at about 100° C. for about 5 hours. After cooling, the reaction solution was extracted by adding water (1 L) and ethyl acetate (300 mL) to collect organic layers, and the organic layers were dried over MgSO4 and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate Compound 1-e (white solid, 19 g, yield: 72%).

ESI-LCMS: $[M+H]^+$: $C_{54}H_{37}ClN_3O_2$. 793.2124.

$^1$H-NMR (400 MHz, $CDCl_3$): 7.93 (d, 2H), 7.73 (s, 1H), 7.61 (d, 2H), 7.42 (t, 2H), 7.36 (m, 10H), 7.12 (m, 12H), 7.00 (s, 1H), 6.83 (s, 1H), 6.73 (d, 2H), 6.61 (s, 1H).

1-6. Synthesis of Intermediate Compound 14f

In an argon atmosphere, in a 1 L flask, Intermediate Compound 1-e (18 g, 22 mmol), diphenylamine (3.9 g, 22 mmol), tis-(tert-butyl)phosphine (1.1 mL, 2.2 mmol), and $Pd_2dba_3$ (1.0 g, 1.1 mmol) were added and dissolved in 300 mL of o-xylene, and the reaction solution was then stirred at about 140° C. for about 3 hours. After cooling, the reaction solution was extracted by adding water (1 L) and ethyl acetate (300 mL) to collect organic layers, and the organic layers were dried over MgSO4 and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate Compound 1-f (white solid, 16 g, yield: 76%).

ESI-LCMS: $[M+H]^+$: $C_{66}H_{47}N_4O_2$. 926.1687.

$^1$H-NMR (400 MHz, $CDCl_3$): 8.03 (d, 1H), 7.99 (d, 1H), 7.82 (s, 1H), 7.76 (s, 1H), 7.62 (d, 2H), 7.54 (m, 15H), 7.27 (m, 18H), 6.82 (s, 1H), 6.80 (s, 1H), 6.69 (d, 2H), 6.63 (s, 1H).

1-7. Synthesis of Compound 1

In an argon atmosphere, in a 1 L flask, Intermediate Compound 1-f (16 g, 17 mmol) was dissolved in 500 mL of o-dichlorobenzene and cooled to about 0° C. in an ice water bath. Boron tribromide ($BBr_3$) (1.6 mL, 5 eq) was added dropwise slowly to the reaction solution, and the reaction solution was slowly heated to room temperature and then stirred for about 20 minutes. The reaction solution was heated to about 150° C. and then stirred for about 12 hours. After cooling, triethylamine (5 mL) was slowly added dropwise to stop the reaction, and the solvent was removed under reduced pressure to obtain a solid. The solid thus obtained was washed with MeOH, and then purified and separated by silica gel column chromatography utilizing $CH_2Cl_2$ and hexane as eluent to obtain Compound 1 (yellow solid, 1.6 g, yield: 11%).

ESI-LCMS: $[M+H]^+$: $C_{66}H_{41}B_2N_4O_2$. 942.2137.

$^1$H-NMR (400 MHz, $CDCl_3$): 10.21 (s, 1H), 9.32 (d, 2H), 8.05 (d, 1H), 8.03 (d, 1H), 7.88 (s, 1H), 7.83 (s, 1H), 7.54 (d, 2H), 7.42 (m, 16H), 7.27 (m, 14H), 6.83 (s, 1H).

2. Synthesis of Compound 2

Compound 2 according to an example may be synthesized by, for example, the acts shown in Reaction Scheme 2 below:

Reaction Scheme 2

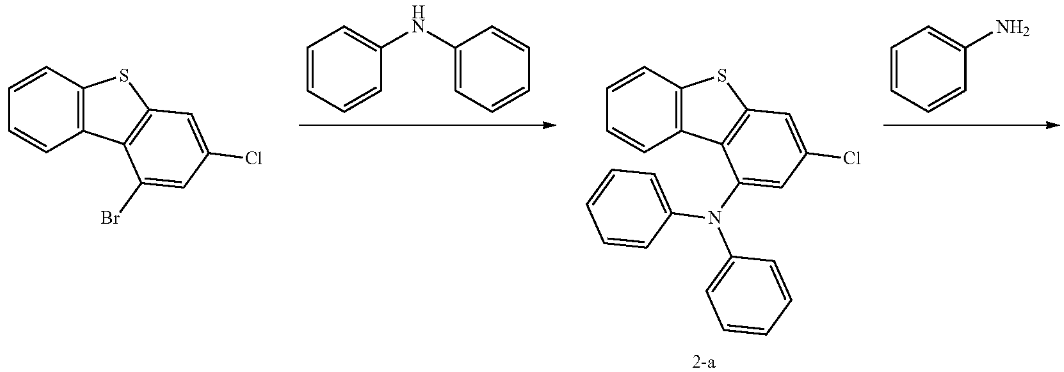

2-a

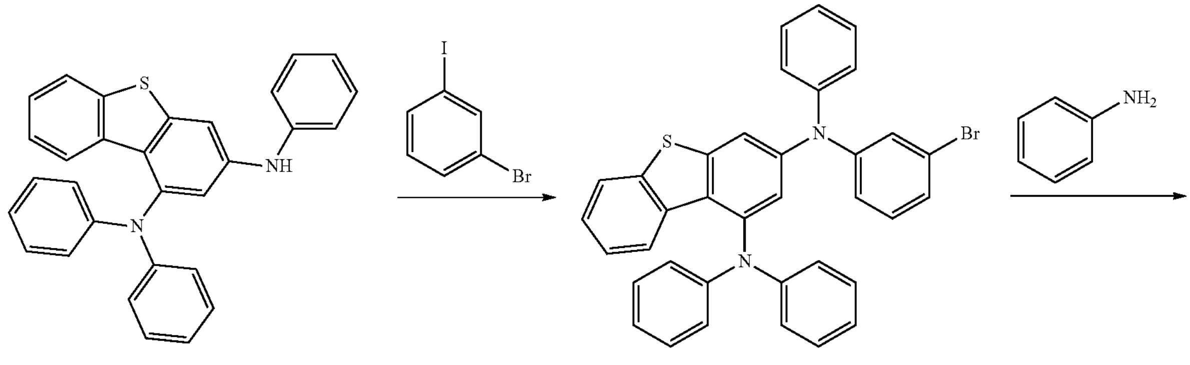

2-b 2-c

-continued
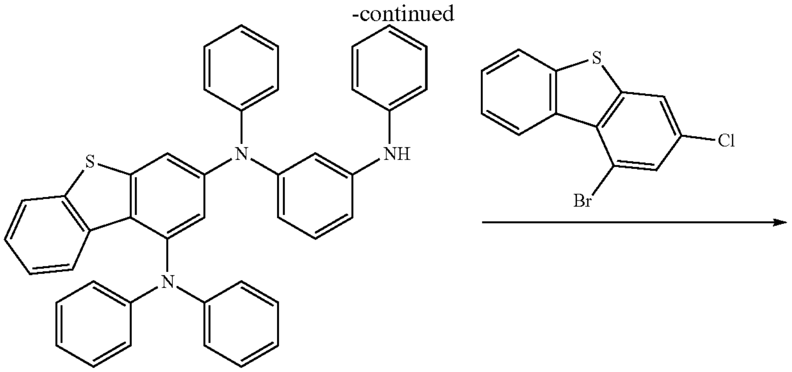
2-d
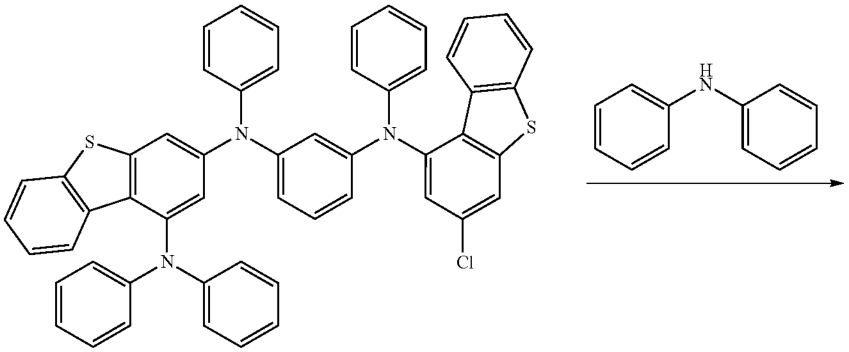
2-e
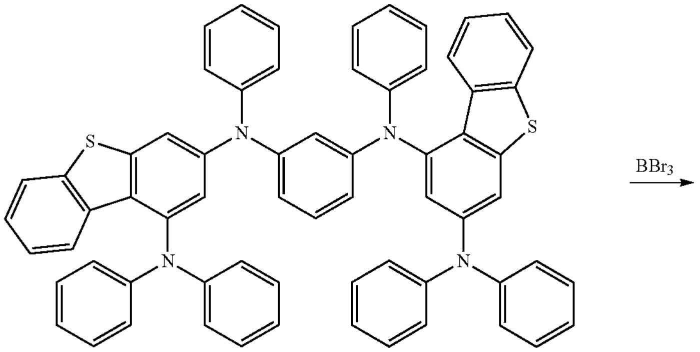
2-f
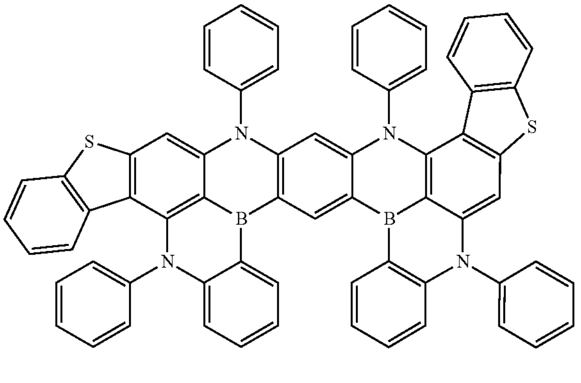
2

2-1. Synthesis of Intermediate Compound 2-a

In an argon atmosphere, in a 2 L flask, 1-bromo-3-chloro-dibenzothiophene (50 g, 170 mmol), diphenylamine (28 g, 170 mmol), BINAP (11 g, 17 mmol), and $Pd_2dba_3$ (8 g, 9 mmol) were added and dissolved in 1 L of toluene, and the reaction solution was then stirred at about 85° C. for about 12 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate Compound 2-a (white solid, 42 g, yield: 65%).

ESI-LCMS: $[M+H]^+$: $C_{24}H_{16}ClNS$. 384.0711.

$^1$H-NMR (400 MHz, $CDCl_3$): 8.45 (d, 1H), 7.93 (d, 1H), 7.80 (s, 1H), 7.56 (t, 2H), 7.24 (m, 4H), 7.08 (m, 4H), 7.03 (m, 2H).

2-2. Synthesis of Intermediate Compound 2-b

In an argon atmosphere, in a 2 L flask, Intermediate Compound 2-a (40 g, 104 mmol), aniline (10 g, 104 mmol), tris-(tert-butyl)phosphine (5 mL, 10 mmol), and $Pd_2dba_3$ (5 g, 5 mmol) were added and dissolved in 600 L of o-xylene, and the reaction solution was then stirred at about 140° C. for about 3 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate Compound 2-b (white solid, 34.5 g, yield: 75%).

ESI-LCMS: $[M+H]^+$: $C_{30}H_{22}N_2S$. 442.1511.

$^1$H-NMR (400 MHz, $CDCl_3$): 8.43 (d, 1H), 8.31 (br, 1H), 7.93 (d, 1H), 7.56 (t, 2H), 7.41 (m, 2H), 7.24 (m, 5H), 7.02 (m, 9H), 6.89 (s, 1H).

2-3. Synthesis of Intermediate Compound 2-c

In an argon atmosphere, in a 2 L flask, Intermediate Compound 2-b (30 g, 68 mmol), 1-bromo-3-iodobenzene (19 g, 68 mmol), BINAP (5.1 g, 8 mmol), and $Pd_2dba_3$ (3.8 g, 4 mmol) were added and dissolved in 500 L of toluene, and the reaction solution was then stirred at about 85° C. for about 12 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate Compound 2-c (white solid, 24 g, yield: 62%).

ESI-LCMS: $[M+H]^+$: $C_{36}H_{25}BrN_2S$. 596.0991.

$^1$H-NMR (400 MHz, $CDCl_3$): 8.46 (d, 1H), 7.93 (d, 1H), 7.49 (m, 2H), 7.24 (m, 9H), 7.08 (m, 11H), 6.79 (s, 1H).

2-4. Synthesis of Intermediate Compound 2-d

In an argon atmosphere, in a 1 L flask, Intermediate Compound 2-c (24 g, 40 mmol), aniline (3.9 g, 40 mmol), tris-(tert-butyl)phosphine (2.2 mL, 4.5 mmol), and $Pd_2dba_3$ (2.1 g, 2.2 mmol) were added and dissolved in 300 L of o-xylene, and the reaction solution was then stirred at about 140° C. for about 5 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate Compound 2-d (white solid, 17 g, yield: 72%).

ESI-LCMS: $[M+H]^+$: $C_{42}H_{31}N_3S$. 609.2219.

$^1$H-NMR (400 MHz, $CDCl_3$): 8.42 (d, 1H), 8.36 (br, 1H), 7.93 (d, 1H), 7.51 (t, 2H), 7.40 (t, 2H), 7.24 (m, 9H), 7.03 (m, 12H), 6.90 (s, 1H), 6.83 (s, 1H), 6.74 (m, 1H).

2-5. Synthesis of Intermediate Compound 2-e

In an argon atmosphere, in a 1 L flask, Intermediate Compound 2-d (17 g, 28 mmol), 1-bromo-3-chloro-dibenzothiophene (8.3 g, 28 mmol), tris-(tert-butyl)phosphine (1.6 mL, 1.6 mmol), and $Pd_2dba_3$ (1.5 g, 1.6 mmol) were added and dissolved in 300 L of toluene, and the reaction solution was then stirred at about 100° C. for about 5 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate Compound 2-e (white solid, 14 g, yield: 61%).

ESI-LCMS: $[M+H]^+$: $C_{54}H_{36}ClN_3S_2$. 825.2020.

$^1$H-NMR (400 MHz, $CDCl_3$): 8.45 (d, 2H), 7.93 (d, 2H), 7.80 (s, 1H), 7.52 (t, 4H), 7.24 (m, 10H), 7.05 (m, 12H), 6.89 (s, 1H), 6.81 (s, 1H), 6.71 (d, 2H).

2-6. Synthesis of Intermediate Compound 2-f

In an argon atmosphere, in a 1 L flask, Intermediate Compound 2-e (14 g, 17 mmol), diphenylamine (2.8 g, 17 mmol), tris-(tert-butyl)phosphine (1.1 mL, 2.2 mmol), and $Pd_2dba_3$ (1.0 g, 1.1 mmol) were added and dissolved in 300 L of o-xylene, and the reaction solution was then stirred at about 140° C. for about 3 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate Compound 2-f (white solid, 11 g, yield: 68%).

ESI-LCMS: $[M+H]^+$: $C_{66}H_{46}N_4S_2$. 958.3219.

$^1$H-NMR (400 MHz, $CDCl_3$): 8.43 (d, 2H), 7.91 (d, 2H), 7.49 (t, 4H), 7.42 (m, 15H), 7.00 (m, 18H), 6.89 (s, 2H), 6.77 (s, 1H), 6.71 (d, 2H).

2-7. Synthesis of Compound 2

In an argon atmosphere, in a 1 L flask, Intermediate Compound 2-f (10 g, 10 mmol) was dissolved in 200 mL of o-dichlorobenzene and cooled to about 0° C. in an ice water bath. $BBr_3$ (2.4 mL, 5 eq) was added dropwise slowly to the reaction solution, and the reaction solution was slowly heated to room temperature and then stirred for about 20 minutes. The reaction solution was heated to about 150° C.

and then stirred for about 12 hours. After cooling, triethylamine (5 mL) was slowly added dropwise to stop the reaction, and the solvent was removed under reduced pressure to obtain a solid. The solid thus obtained was washed with MeOH, and then purified and separated by silica gel column chromatography utilizing $CH_2Cl_2$ and hexane as eluent to obtain Compound 2 (yellow solid, 1.2 g, yield: 12%).

ESI-LCMS: $[M+H]^+$: $C_{66}H_{46}N_4S_2$. 974.2911.

$^1$H-NMR (400 MHz, $CDCl_3$): 10.21 (s, 1H), 9.13 (d, 2H), 7.91 (d, 2H), 7.49 (t, 4H), 7.42 (m, 14H), 7.00 (m, 18H), 6.89 (s, 2H), 6.77 (s, 1H).

3. Synthesis of Compound 3

Compound 3 according to an example may be synthesized by, for example, the acts shown in Reaction Scheme 3 below:

Reaction Scheme 3

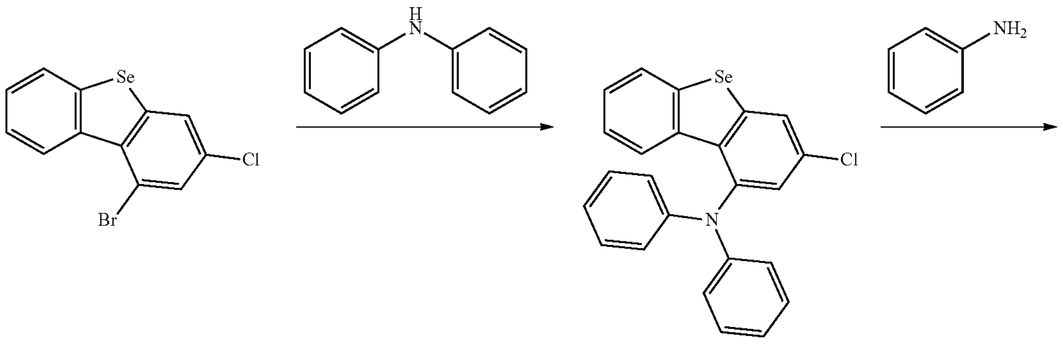

3-a

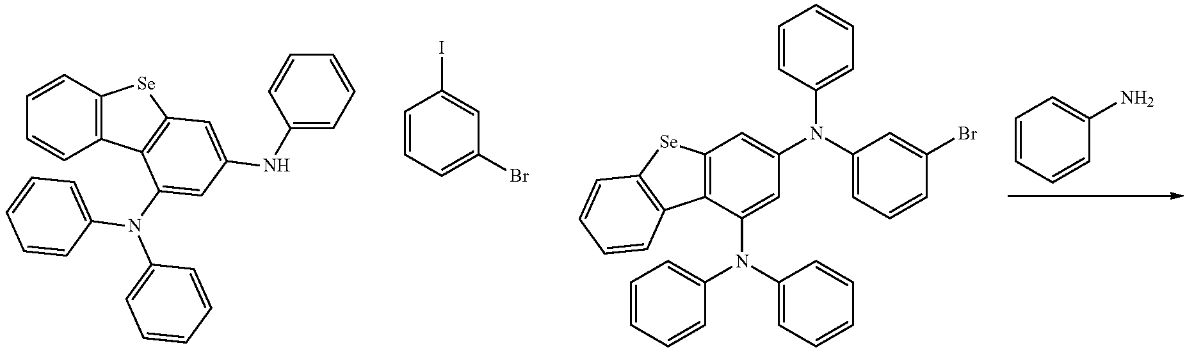

3-b 3-c

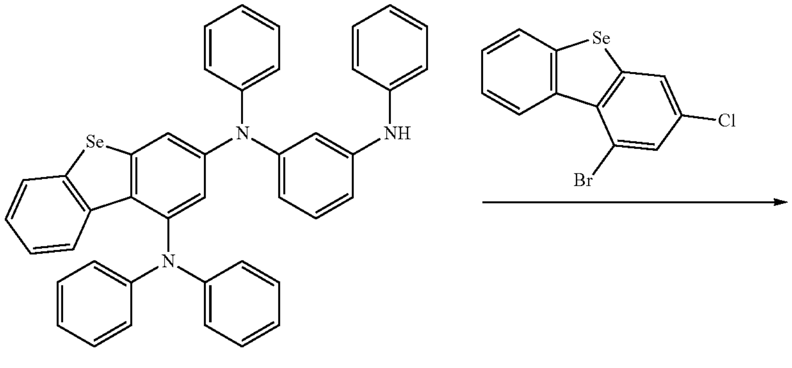

3-d

-continued

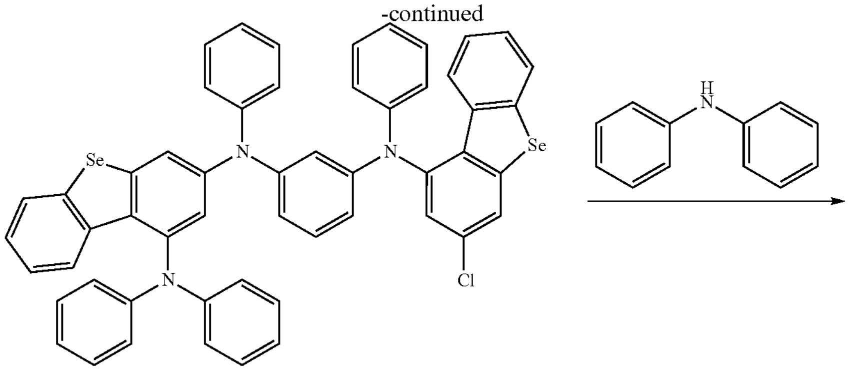

3-e

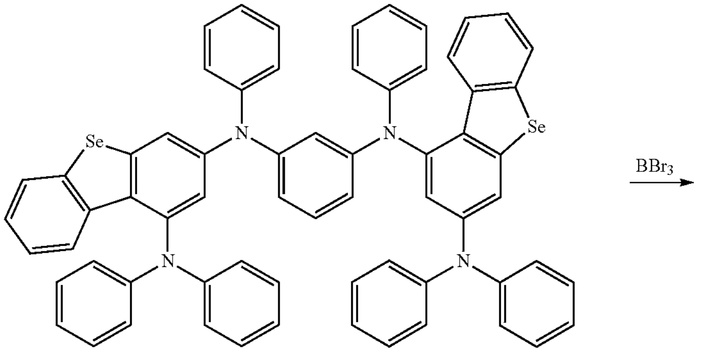

3-f

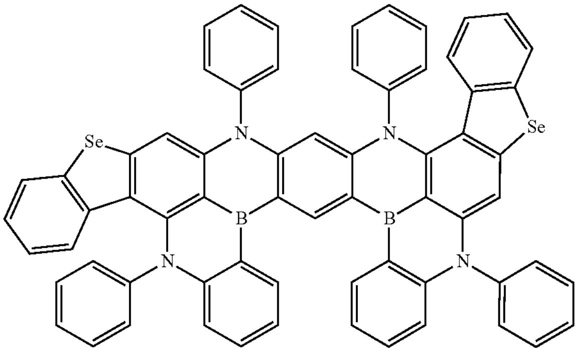

3

3-1. Synthesis of Intermediate Compound 3-a

In an argon atmosphere, in a 2 L flask, 1-bromo-3-chloro-dibenzoselenophene (50 g, 145 mmol), diphenylamine (24 g, 145 mmol), BINAP (11 g, 17 mmol), and $Pd_2dba_3$ (8 g, 9 mmol) were added and dissolved in 1 L of toluene, and the reaction solution was then stirred at about 85° C. for about 12 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate Compound 3-a (white solid, 41 g, yield: 65%).

ESI-LCMS: $[M+H]^+$: $C_{24}H_{16}ClNSe$. 433.0118.

$^1H$-NMR (400 MHz, $CDCl_3$): 7.77 (d, 1H), 7.59 (s, 1H), 7.45 (m, 3H), 7.24 (m, 4H), 7.08 (m, 6H).

3-2. Synthesis of Intermediate 3-b

In an argon atmosphere, in a 2 L flask, Intermediate Compound 3-a (40 g, 93 mmol), aniline (8.8 g, 93 mmol), tris-(tert-butyl)phosphine (5 mL, 10 mmol), and $Pd_2dba_3$ (5 g, 5 mmol) were added and dissolved in 600 mL of o-xylene, and the reaction solution was then stirred at about 140° C. for about 3 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate Compound 3-b (white solid, 32 g, yield: 71%).

ESI-LCMS: $[M+H]^+$: $C_{30}H_{22}N_2Se$. 490.0901

$^1H$-NMR (400 MHz, $CDCl_3$): 8.36 (br, 1H), 7.79 (d, 1H), 7.53 (m, 5H), 7.24 (m, 4H), 7.00 (m, 11H).

3-3. Synthesis of Intermediate Compound 3-c

In an argon atmosphere, in a 2 L flask, Intermediate 3-b (30 g, 61 mmol), 1-bromo-3-iodobenzene (17 g, 61 mmol), BINAP (5.1 g, 8 mmol), and $Pd_2dba_3$ (3.8 g, 4 mmol) were added and dissolved in 500 mL of toluene, and the reaction solution was then stirred at about 85° C. for about 12 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate Compound 3-c (white solid, 22 g, yield: 58%).

ESI-LCMS: $[M+H]^+$: $C_{36}H_{25}BrN_2Se$. 644.0411.

$^1H$-NMR (400 MHz, $CDCl_3$): 7.77 (d, 1H), 7.54 (m, 3H), 7.24 (m, 6H), 7.04 (m, 13H).

3-4. Synthesis of Intermediate Compound 3-d

In an argon atmosphere, in a 1 L flask, Intermediate Compound 3-c (20 g, 31 mmol), aniline (2.9 g, 31 mmol), tris-(tert-butyl)phosphine (2.2 mL, 4.5 mmol), and $Pd_2dba_3$ (2.1 g, 2.2 mmol) were added and dissolved in 300 mL of o-xylene, and the reaction solution was then stirred at about 140° C. for about 5 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate Compound 3-d (white solid, 13 g, yield: 65%).

ESI-LCMS: $[M+H]^+$: $C_{42}H_{31}N_3Se$. 657.1727.

$^1H$-NMR (400 MHz, $CDCl_3$): 8.36 (br, 1H), 7.77 (d, 1H), 7.52 (m, 5H), 7.24 (m, 8H), 7.00 (m, 14H), 6.83 (s, 1H), 6.74 (m, 1H).

3-5. Synthesis of Intermediate Compound 3-e

In an argon atmosphere, in a 1 L flask, Intermediate Compound 3-d (13 g, 20 mmol), 1-bromo-3-chloro-dibenzoselenophene (6.8 g, 20 mmol), tris-(tert-butyl)phosphine (1.6 mL, 1.6 mmol), and $Pd_2dba_3$ (1.5 g, 1.6 mmol) were added and dissolved in 300 mL of toluene, and the reaction solution was then stirred at about 100° C. for about 5 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate Compound 3-e (white solid, 10 g, yield: 55%).

ESI-LCMS: $[M+H]^+$: $C_{54}H_{36}ClN_3Se_2$. 921.0909.

$^1H$-NMR (400 MHz, $CDCl_3$): 7.81 (d, 2H), 7.68 (s, 1H), 7.55 (m, 6H), 7.24 (m, 9H), 7.00 (m, 14H), 6.89 (s, 1H), 6.71 (d, 2H).

3-6. Synthesis of Intermediate Compound 3-f

In an argon atmosphere, in a 1 L flask, Intermediate Compound 3-e (10 g, 11 mmol), diphenylamine (1.8 g, 11 mmol), tris-(tert-butyl)phosphine (1.1 mL, 2.2 mmol), and $Pd_2dba_3$ (1.0 g, 1.1 mmol) were added and dissolved in 300 mL of o-xylene, and the reaction solution was then stirred at about 140° C. for about 3 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate Compound 3-f (white solid, 7.5 g, yield: 65%).

ESI-LCMS: $[M+H]^+$: $C_{66}H_{46}N_4Se_2$. 1054.2137.

$^1H$-NMR (400 MHz, $CDCl_3$): 7.81 (d, 2H), 7.52 (m, 6H), 7.24 (m, 13H), 7.00 (m, 22H), 6.83 (s, 1H), 6.74 (d, 2H).

3-7. Synthesis of Compound 3

In an argon atmosphere, in a 1 L flask, Intermediate Compound 3-f (7 g, 6.6 mmol) was dissolved in 150 mL of o-dichlorobenzene and cooled to about 0° C. in an ice water bath. $BBr_3$ (1.6 mL, 5 eq) was added dropwise slowly to the reaction solution, and the reaction solution was slowly heated to room temperature and then stirred for about 20 minutes. The reaction solution was heated to about 150° C. and then stirred for about 12 hours. After cooling, triethylamine (5 mL) was slowly added dropwise to stop the reaction, and the solvent was removed under reduced pressure to obtain a solid. The solid thus obtained was washed with MeOH, and then purified and separated by silica gel column chromatography utilizing $CH_2Cl_2$ and hexane as eluent to obtain Compound 3 (yellow solid, 0.5 g, yield: 7%).

ESI-LCMS: $[M+H]^+$: $C_{66}H_{40}B_2N_4Se_2$. 1070.1812.

$^1H$-NMR (400 MHz, $CDCl_3$): 10.05 (s, 1H), 7.81 (d, 2H), 7.52 (m, 6H), 7.24 (m, 12H), 7.00 (m, 22H), 6.83 (s, 1H).

4. Synthesis of Compound 9

Compound 9 according to an example may be synthesized by, for example, the acts shown in Reaction Scheme 4 below:

Reaction Scheme 4

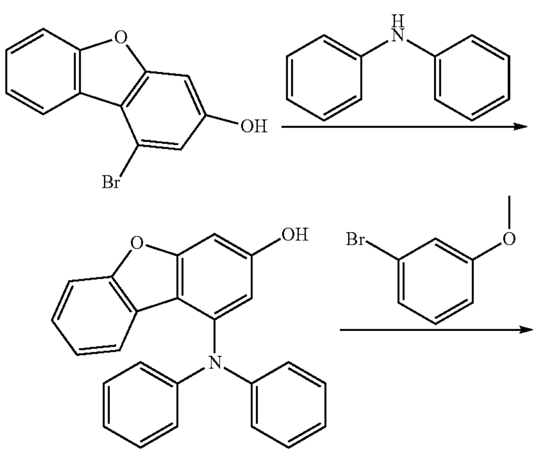

9-a

-continued

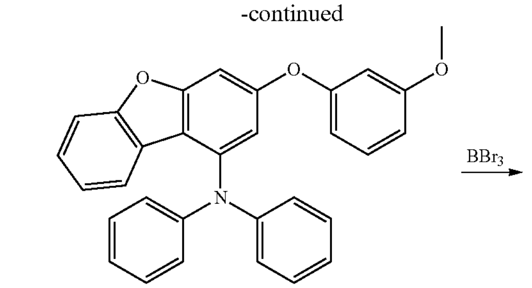

9-b

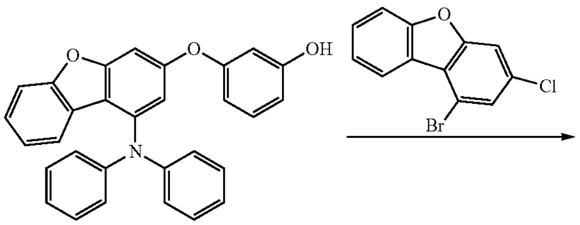

9-c

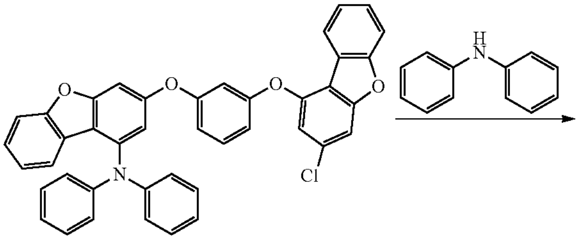

9-d

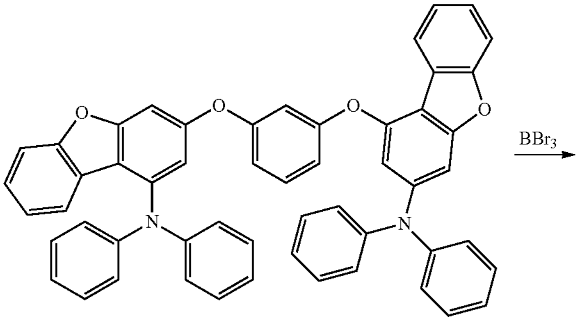

9-e

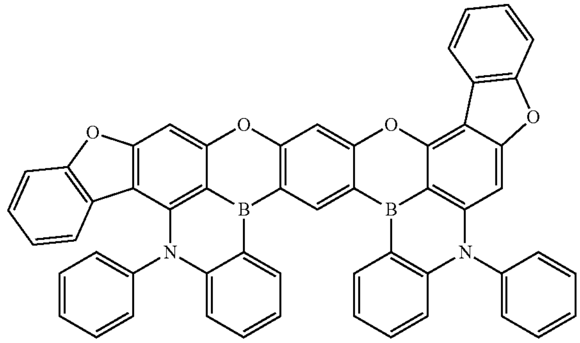

9

4-1. Synthesis of Intermediate Compound 9-a

In an argon atmosphere, in a 2 L flask, 1-bromo-3-hydroxy-dibenzofuran (50 g, 190 mmol), diphenylamine (32 g, 190 mmol), tris-tert-butyl phosphine (9 mL, 17 mmol), and $Pd_2dba_3$ (8.7 g, 9 mmol) were added and dissolved in 1 L of toluene, and the reaction solution was then stirred at about 100° C. for about 6 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate Compound 9-a (white solid, 48 g, yield: 72%).

ESI-LCMS: $[M+H]^+$: $C_{24}H_{18}N_1O_2$. 351.1253.

$^1$H-NMR (400 MHz, $CDCl_3$): 7.99 (d, 1H), 7.54 (d, 1H), 7.38 (t, 1H), 7.31 (m, 5H), 7.24 (m, 6H), 6.38 (s, 1H).

4-2. Synthesis of Intermediate Compound 9-b

In an argon atmosphere, in a 1 L flask, Intermediate Compound 9-a (45 g, 128 mmol), 3-bromo anisole (24 g, 128 mmol), CuI (24 g, 50 mmol), and 1,10-phenanthroline (2.1 g, 5 mmol) were added and dissolved in 700 mL of DMF, and the reaction solution was then stirred at about 180° C. for about 12 hours. After cooling, the reaction solution was poured into water (1 L), and the resulting solid was filtered. The obtained solid was dissolved again with $CH_2Cl_2$ and then washed with water several times to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate Compound 9-b (white solid, 37 g, yield: 63%).

ESI-LCMS: $[M+H]^+$: $C_{31}H_{24}NO_3$. 457.1616.

$^1$H-NMR (400 MHz, $CDCl_3$): 7.99 (d, 1H), 7.56 (d, 1H), 7.43 (t, 1H), 7.41 (t, 1H), 7.32 (m, 6H), 7.12 (m, 6H), 6.71 (d, 1H), 6.66 (s, 1H), 6.52 (d, 2H).

4-3. Synthesis of Intermediate Compound 9-c

In an argon atmosphere, in a 1 L flask, Intermediate Compound 9-b (35 g, 76 mmol) was added and dissolved in 500 mL of $CH_2Cl_2$, and the reaction solution was then cooled to about 0° C. $BBr_3$ (3.0 eq) was added slowly to the reaction solution, the temperature was slowly elevated to room temperature, and the reaction solution was then stirred for about 12 hours. After cooling, the reaction solution was poured into water (1 L) and extracted with $CH_2Cl_2$ several times to obtain organic layers. The organic layers were collected, dried over $MgSO_4$ and then filtered, and in the filtrate, the solvent was removed under reduced pressure to obtain a solid. The solid thus obtained was dissolved in a small amount of $CH_2Cl_2$, passed through a short silica gel film, and purified and separated to obtain Intermediate Compound 9-c (dark brown solid, 18 g, yield: 53%).

ESI-LCMS: $[M+H]^+$: $C_{30}H_{22}NO_3$. 443.1254.

$^1$H-NMR (400 MHz, $CDCl_3$): 7.99 (d, 1H), 7.56 (d, 1H), 7.43 (t, 1H), 7.31 (m, 7H), 7.12 (m, 6H), 6.73 (d, 1H), 6.62 (s, 1H), 6.50 (d, 2H).

4-4. Synthesis of Intermediate Compound 9-d

In an argon atmosphere, in a 1 L flask, Intermediate Compound 1-c (18 g, 40 mmol), 1-bromo-3-chloro-dibenzofuran (11.4 g, 40 mmol), tris-tert-butyl phosphine (2 mL, 4 mmol), and $Pd_2dba_3$ (1.9 g, 2 mmol) were added and dissolved in 250 mL of toluene, and the reaction solution was then stirred at about 100° C. for about 6 hours. After cooling, the reaction solution was extracted by adding water (1 L) and ethyl acetate (50 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate Compound 9-d (white solid, 21 g, yield: 81%).

ESI-LCMS: $[M+H]^+$: $C_{42}H_{27}ClNO_4$. 643.1537.

$^1$H-NMR (400 MHz, $CDCl_3$): 7.99 (d, 1H), 7.54 (d, 1H), 7.42 (m, 10H), 7.24 (m, 7H), 6.82 (s, 1H), 6.63 (d, 1H), 6.55 (s, 1H), 6.50 (d, 1H).

4-5. Synthesis of Intermediate Compound 9-e

In an argon atmosphere, in a 1 L flask, Intermediate Compound 9-d (20 g, 31 mmol), diphenylamine (5.2 g, 31 mmol), tris-(tert-butyl) phosphine (1.5 mL, 3 mmol), and $Pd_2dba_3$ (1.4 g, 1.5 mmol) were added and dissolved in 250 mL of toluene, and the reaction solution was then stirred at about 100° C. for about 6 hours. After cooling, the reaction solution was extracted by adding water (1 L) and ethyl acetate (50 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate Compound 9-e (white solid, 21 g, yield: 90%).

ESI-LCMS: $[M+H]^+$: $C_{54}H_{37}N_2O_4$. 776.2136.

$^1$H-NMR (400 MHz, $CDCl_3$): 7.99 (d, 1H), 7.72 (s, 1H), 7.51 (d, 1H), 7.42 (t, 1H), 7.33 (t, 1H), 7.22 (m, 14H), 7.01 (m, 12H), 6.73 (d, 2H), 6.63 (d, 1H), 6.55 (s, 3H).

4-6. Synthesis of Compound 9

In an argon atmosphere, in a 1 L flask, Intermediate Compound 9-e (20 g, 26 mmol) was dissolved in 400 mL of o-dichlorobenzene and cooled to about 0° C. in an ice water bath. $BBr_3$ (5 eq) was added dropwise slowly to the reaction solution, and the reaction solution was slowly heated to room temperature and then stirred for about 20 minutes. The reaction solution was heated to about 150° C. and then stirred for about 12 hours. After cooling, triethylamine (5 mL) was slowly added dropwise to stop the reaction, and the solvent was removed under reduced pressure to obtain a solid. The solid thus obtained was washed with MeOH, and then purified and separated by silica gel column chromatography utilizing $CH_2Cl_2$ and hexane as eluent to obtain Compound 9 (yellow solid, 1.83 g, yield: 9%).

ESI-LCMS: $[M+H]^+$: $C_{54}H_{31}B_2N_2O_4$. 792.1912.

$^1$H-NMR (400 MHz, $CDCl_3$): 10.33 (s, 1H), 9.88 (d, 2H), 7.99 (d, 1H), 7.75 (s, 1H), 7.54 (s, 1H), 7.43 (t, 1H), 7.33 (m, 13H), 7.22 (s, 1H), 7.12 (m, 6H), 7.04 (d, 2H), 6.87 (s, 1H), 6.65 (s, 1H).

5. Synthesis of Compound 21

Compound 21 according to an example may be synthesized by, for example, the acts shown in Reaction Scheme 5 below:

Reaction Scheme 5

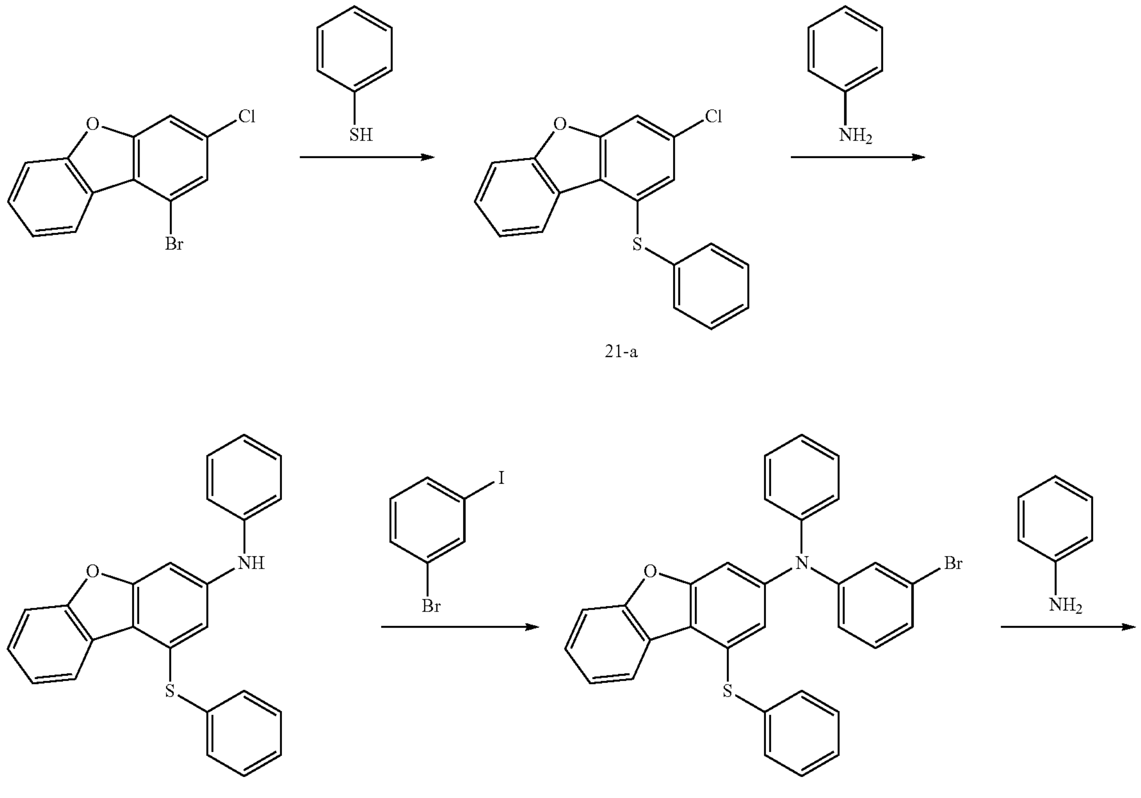

21-a 21-b 21-c

-continued
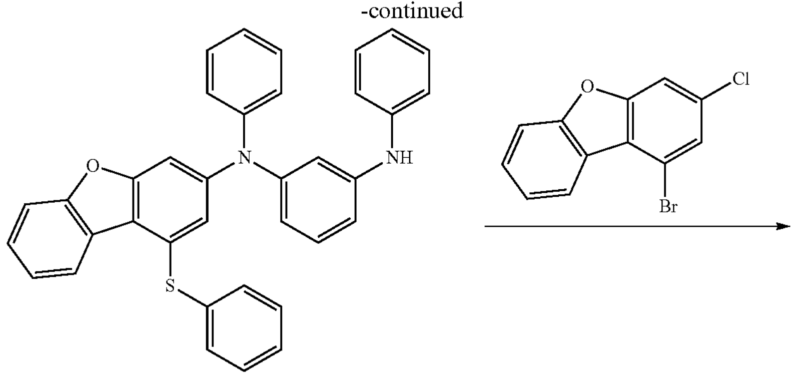
21-d
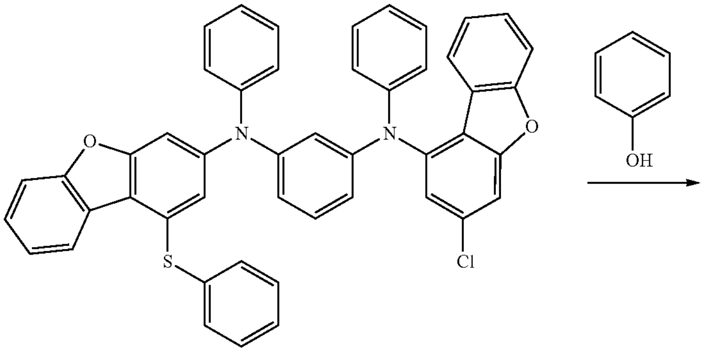
21-e
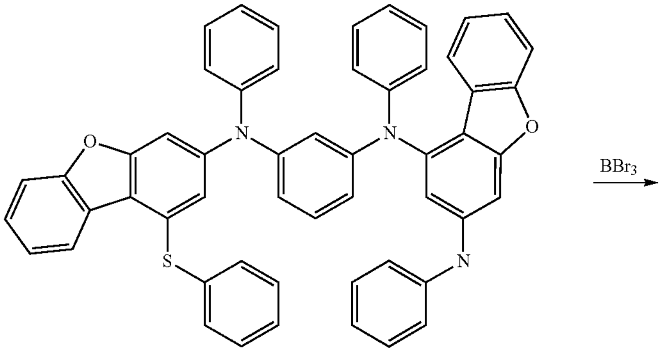
21-f
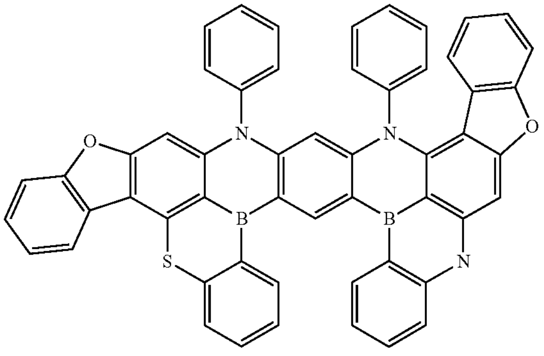
21

5-1. Synthesis of Intermediate Compound 21-a

In an argon atmosphere, in a 2 L flask, 1-bromo-3-chloro-dibenzofuran (50 g, 177 mmol), thiophenol (19.5 g, 177 mmol), and $K_2CO_3$ (73 g, 531 mmol) were added and dissolved in 700 mL of methylpyrrolidone (NMP), and the reaction solution was then stirred at about 200° C. for about 12 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate Compound 21-a (white solid, 46 g, yield: 84%).

ESI-LCMS: $[M+H]^+$: $C_{18}H_{12}ClOS$. 210.0107.

$^1$H-NMR (400 MHz, $CDCl_3$): 8.00 (d, 1H), 7.56 (d, 1H), 7.32 (m, 6H), 7.21 (s, 1H), 7.11 (s, 1H).

5-2. Synthesis of Intermediate Compound 21-b

In an argon atmosphere, in a 2 L flask, Intermediate Compound 21-a (45 g, 68 mmol), aniline (7.5 g, 81 mmol), tris-tert-butyl phosphine (6.2 mL, 6.8 mmol), and $Pd_2dba_3$ (3.11 g, 3.4 mmol) were added and dissolved in 800 mL of o-xylene, and the reaction solution was then stirred at about 140° C. for about 6 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate Compound 21-b (white solid, 18 g, yield: 72%).

ESI-LCMS: $[M+H]^+$: $C_{24}H_{17}ONS$. 367.1001.

$^1$H-NMR (400 MHz, $CDCl_3$): 8.00 (d, 1H), 7.77 (s, 1H), 7.58 (d, 1H), 7.43 (m, 8H), 7.05 (m, 3H), 6.85 (s, 1H).

5-3. Synthesis of Intermediate Compound 21-c

In an argon atmosphere, in a 1 L flask, Intermediate Compound 21-b (18 g, 49 mmol), 3-iodo-bromobenzene (13.9 g, 49 mmol), tris-tert-butyl phosphine (4.4 mL, 4.8 mmol), and $Pd_2dba_3$ (2.24 g, 2.4 mmol) were added and dissolved in 300 mL of toluene, and the reaction solution was then stirred at about 100° C. for about 6 hours. After cooling, the reaction solution was extracted by adding water (500 mL) and ethyl acetate (100 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate Compound 21-c (white solid, 21 g, yield: 84%).

ESI-LCMS: $[M+H]^+$: $C_{30}H_{21}OBrNS$. 521.0434.

$^1$H-NMR (400 MHz, $CDCl_3$): 8.00 (d, 1H), 7.76 (s, 1H), 7.56 (d, 1H), 7.37 (m, 11H), 7.03 (m, 5H), 6.75 (s, 1H).

5-4. Synthesis of Intermediate Compound 21-d

In an argon atmosphere, in a 1 L flask, Intermediate Compound 21-c (20 g, 49 mmol), 3-iodo-bromobenzene (4.6 g, 49 mmol), tris-tert-butyl phosphine (3.4 mL, 3.8 mmol), and $Pd_2dba_3$ (1.7 g, 1.9 mmol) were added and dissolved in 300 mL of toluene, and the reaction solution was then stirred at about 100° C. for about 6 hours. After cooling, the reaction solution was extracted by adding water (500 mL) and ethyl acetate (100 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate Compound 21-d (white solid, 16 g, yield: 79%).

ESI-LCMS: $[M+H]^+$: $C_{36}H_{260}N_2S$. 534.1664.

$^1$H-NMR (400 MHz, $CDCl_3$): 7.99 (d, 1H), 7.73 (s, 1H), 7.52 (d, 1H), 7.42 (m, 13H), 7.08 (m, 6H), 6.83 (s, 2H), 6.54 (d, 1H).

5-5. Synthesis of Intermediate Compound 21-e

In an argon atmosphere, in a 1 L flask, Intermediate Compound 1-d (16 g, 30 mmol), 1-bromo-3-chloro-dibenzofuran (8.4 g, 30 mmol), tris-tert-butyl phosphine (2.8 mL, 3.0 mmol), and $Pd_2dba_3$ (1.4 g, 1.5 mmol) were added and dissolved in 200 mL of toluene, and the reaction solution was then stirred at about 100° C. for about 6 hours. After cooling, the reaction solution was extracted by adding water (500 mL) and ethyl acetate (100 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate Compound 21-e (white solid, 15.6 g, yield: 71%).

ESI-LCMS: $[M+H]^+$: $C_{48}H_{32}O_2N_2SC$. 734.1728.

$^1$H-NMR (400 MHz, $CDCl_3$): 7.97 (d, 1H), 7.71 (s, 1H), 7.56 (d, 1H), 7.37 (m, 13H), 7.09 (s, 1H), 7.03 (m, 6H), 6.93 (s, 1H), 6.81 (s, 2H), 6.54 (d, 2H).

5-6. Synthesis of Intermediate Compound 21-f

In an argon atmosphere, in a 2 L flask, Intermediate Compound 21-e (15 g, 20 mmol), phenol (9.4 g, 20 mmol), and $K_2CO_3$ (8.3 g, 60 mmol) were added and dissolved in 200 mL of N-methylpyrrolidone (NMP), and the reaction solution was then stirred at about 200° C. for about 12 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate Compound 21-f (white solid, 12.6 g, yield: 80%).

ESI-LCMS: $[M+H]^+$: $C_{54}H_{37}O_3N_2S$. 792.2121.

$^1$H-NMR (400 MHz, $CDCl_3$): 8.00 (d, 1H), 7.77 (s, 1H), 7.56 (d, 1H), 7.38 (m, 17H), 7.00 (m, 11H), 6.83 (s, 2H), 6.67 (s, 1H).

5-7. Synthesis of Compound 21

In an argon atmosphere, in a 1 L flask, Intermediate Compound 21-f (12 g, 15 mmol) was dissolved in 250 mL of o-dichlorobenzene and cooled to about 0° C. in an ice water bath. $BBr_3$ (5 eq) was added dropwise slowly to the reaction solution, and the reaction solution was slowly heated to room temperature and then stirred for about 20 minutes. The reaction solution was heated to about 150° C. and then stirred for about 12 hours. After cooling, triethylamine (5 mL) was slowly added dropwise to stop the reaction, and the solvent was removed under reduced pressure to obtain a solid. The solid thus obtained was washed with MeOH, and then purified and separated by silica gel column chromatography utilizing $CH_2Cl_2$ and hexane as eluent to obtain Compound 21 (yellow solid, 1.1 g, yield: 9%).

ESI-LCMS: $[M+H]^+$: $C_{54}H_{30}B_2N_2O_3S$. 808.2299.

$^1H$-NMR (400 MHz, $CDCl_3$): 10.36 (s, 1H), 9.44 (d, 2H), 8.00 (d, 1H), 7.77 (s, 1H), 7.56 (d, 1H), 7.38 (m, 12H), 7.00 (m, 9H), 6.80 (s, 2H).

6. Synthesis of Compound 37

Compound 37 according to an example may be synthesized by, for example, the acts shown in Reaction Scheme 6 below:

Reaction Scheme 6

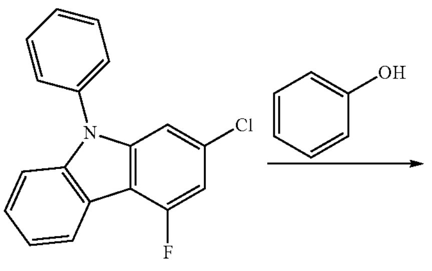

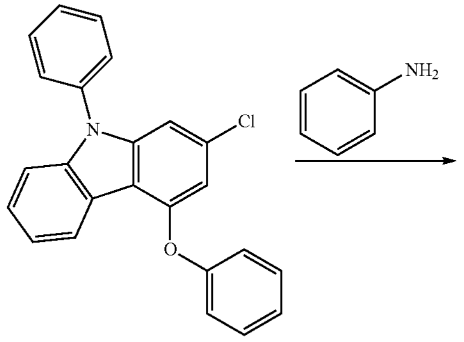

37-a

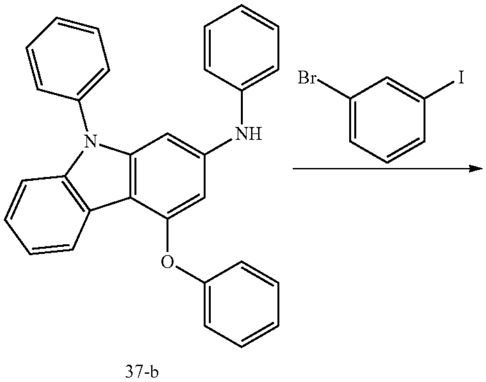

37-b

-continued

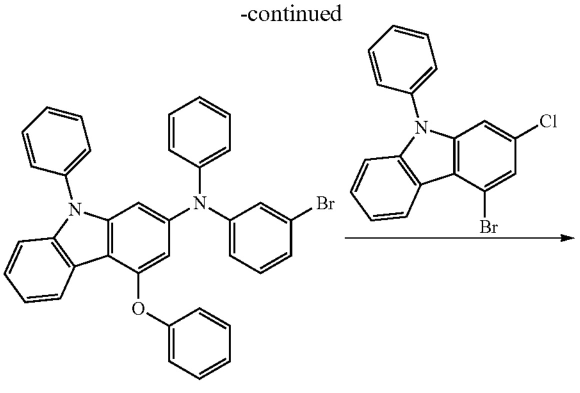

37-c

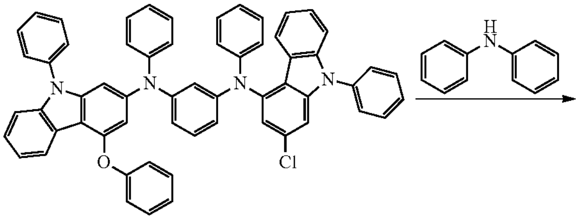

37-d

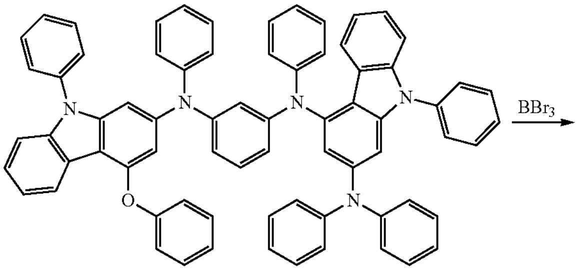

37-e

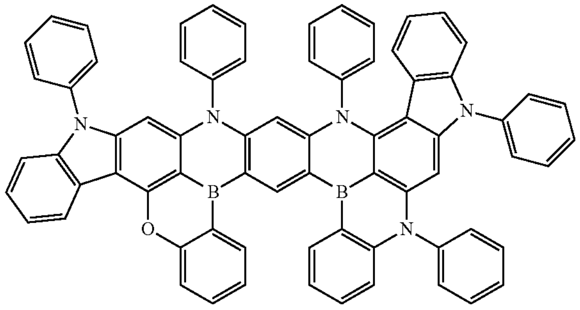

37

6-1. Synthesis of Intermediate Compound 37-a

In an argon atmosphere, in a 2 L flask, 2-Chloro-4-fluoro-9-phenyl-9H-carbazole (50 g, 169 mmol), phenol (32 g, 330 mmol), and $K_2CO_3$ (70 g, 507 mmol) were added and dissolved in 700 mL of N-methylpyrrolidone (NMP), and the reaction solution was then stirred at about 200° C. for about 12 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate Compound 37-a (white solid, 58 g, yield: 93%).

ESI-LCMS: $[M+H]^+$: $C_{24}H_{17}ClNO$. 369.0237.

$^1$H-NMR (400 MHz, $CDCl_3$): 8.56 (d, 1H), 7.94 (d, 1H), 7.50 (m, 8H), 7.12 (m, 5H), 6.78 (s, 1H).

6-2. Synthesis of Intermediate Compound 37-b

In an argon atmosphere, in a 2 L flask, Intermediate Compound 37-a (55 g, 149 mmol), aniline (14 g, 149 mmol), tris-tert-butyl phosphine (13 mL, 14.8 mmol), and $Pd_2dba_3$ (6.8 g, 7.4 mmol) were added and dissolved in 1000 mL of o-xylene, and the reaction solution was then stirred at about 140° C. for about 6 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate Compound 37-b (white solid, 52 g, yield: 82%).

ESI-LCMS: $[M+H]^+$: $C_{30}H_{23}N_2O$. 426.1616.

$^1$H-NMR (400 MHz, $CDCl_3$): 8.56 (d, 1H), 7.89 (d, 1H), 7.66 (m, 10H), 7.22 (m, 8H), 6.44 (s, 1H).

6-3. Synthesis of Intermediate Compound 37-c

In an argon atmosphere, in a 2 L flask, Intermediate Compound 37-b (50 g, 117 mmol), 3-bromo-iodobenzene (33 g, 117 mmol), tris-tert-butyl phosphine (10 mL, 11 mmol), and $Pd_2dba_3$ (5.3 g, 5.8 mmol) were added and dissolved in 500 mL of toluene, and the reaction solution was then stirred at about 100° C. for about 6 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate Compound 37-c (white solid, 44 g, yield: 65%).

ESI-LCMS: $[M+H]^+$: $C_{36}H_{26}BrN_2O$. 580.0937.

$^1$H-NMR (400 MHz, $CDCl_3$): 8.55 (d, 1H), 8.00 (d, 1H), 7.55 (m, 10H), 7.22 (s, 1H), 7.12 (m, 9H), 6.97 (s, 1H), 6.44 (s, 1H).

6-4. Synthesis of Intermediate Compound 37-d

In an argon atmosphere, in a 2 L flask, Intermediate Compound 37-c (42 g, 72 mmol), 2-chloro-9-phenyl-9H-carbazol-4-amine (21 g, 72 mmol), tris-tert-butyl phosphine (6.7 mL, 7.2 mmol), and $Pd_2dba_3$ (3.3 g, 3.6 mmol) were added and dissolved in 500 mL of toluene, and the reaction solution was then stirred at about 100° C. for about 6 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate Compound 37-d (white solid, 47 g, yield: 76%).

ESI-LCMS: $[M+H]^+$: $C_{60}H_{42}ClN_4O$. 868.2212.

$^1$H-NMR (400 MHz, $CDCl_3$): 8.55 (d, 1H), 8.23 (d, 1H), 7.97 (d, 1H), 7.54 (m, 18H), 7.12 (m, 15H), 6.83 (s, 1H), 6.81 (s, 1H), 6.69 (d, 1H), 6.44 (s, 1H).

6-5. Synthesis of Intermediate Compound 37-e

In an argon atmosphere, in a 2 L flask, Intermediate Compound 37-d (42 g, 48 mmol), diphenylamine (8.1 g, 48 mmol), tris-(tert-butyl) phosphine (4.5 mL, 4.8 mmol), and $Pd_2dba_3$ (2.2 g, 2.4 mmol) were added and dissolved in 500 mL of toluene, and the reaction solution was then stirred at about 100° C. for about 6 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate Compound 37-e (white solid, 30 g, yield: 63%).

ESI-LCMS: $[M+H]^+$: $C_{72}H_{52}N_5O$. 1001.4334.

$^1$H-NMR (400 MHz, $CDCl_3$): 8.55 (d, 1H), 8.23 (d, 1H), 7.97 (d, 1H), 7.54 (m, 10H), 7.32 (m, 14H), 7.23 (m, 12H), 7.12 (m, 8H), 6.92 (s, 1H), 6.83 (d, 1H), 6.64 (d, 1H), 6.42 (s, 1H).

6-6. Synthesis of Compound 37

In an argon atmosphere, in a 1 L flask, Intermediate Compound 37-e (25 g, 25 mmol) was dissolved in 400 mL of o-dichlorobenzene and cooled to about 0° C. in an ice water bath. $BBr_3$ (5 eq) was added dropwise slowly to the reaction solution, and the reaction solution was slowly heated to room temperature and then stirred for about 20 minutes. The reaction solution was heated to about 150° C. and then stirred for about 12 hours. After cooling, triethylamine (5 mL) was slowly added dropwise to stop the reaction, and the solvent was removed under reduced pressure to obtain a solid. The solid thus obtained was washed with MeOH, and then purified and separated by silica gel column chromatography utilizing $CH_2Cl_2$ and hexane as eluent to obtain Compound 37 (yellow solid, 1.77 g, yield: 7%).

ESI-LCMS: $[M+H]^+$: $C_{72}H_{52}N_5O$. 1001.2443.

$^1$H-NMR (400 MHz, $CDCl_3$): 10.56 (s, 1H), 10.33 (s, 2H), 8.65 (d, 1H), 8.22 (d, 1H), 7.87 (d, 1H), 7.54 (m, 12H), 7.26 (m, 16H), 7.12 (m, 9H), 6.88 (s, 1H).

7. Synthesis of Compound 47

Compound 47 according to an example may be synthesized by, for example, the acts shown in Reaction Scheme 7 below:

Reaction Scheme 7

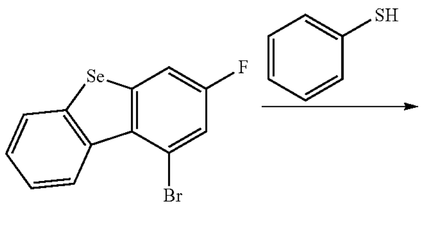

-continued

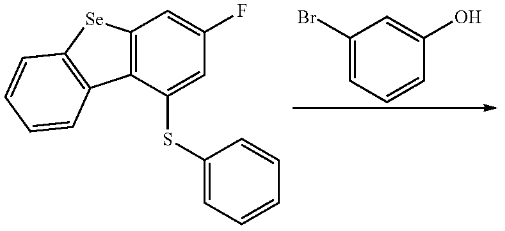

47-a

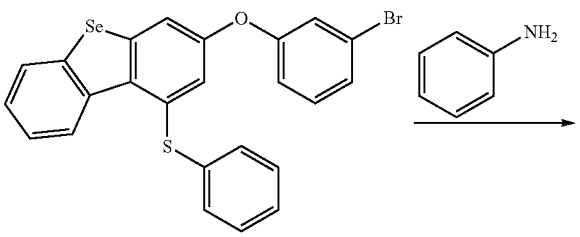

47-b

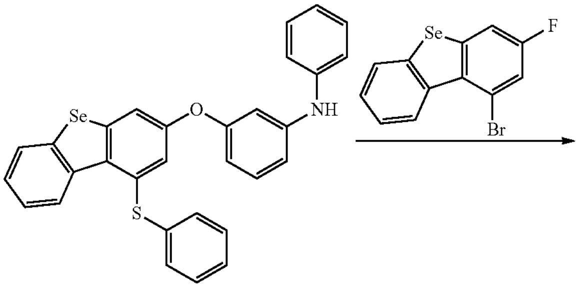

47-c

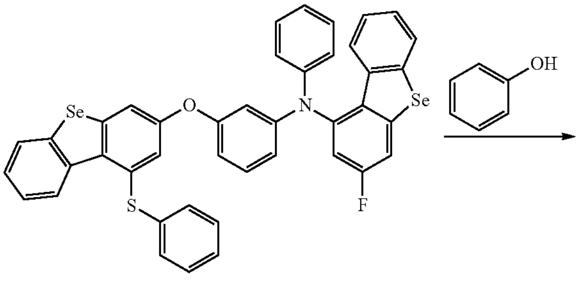

47-d

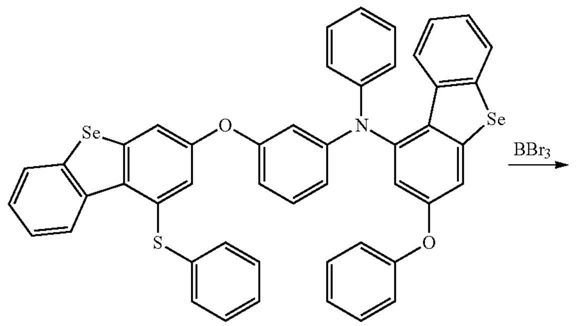

47-e

-continued

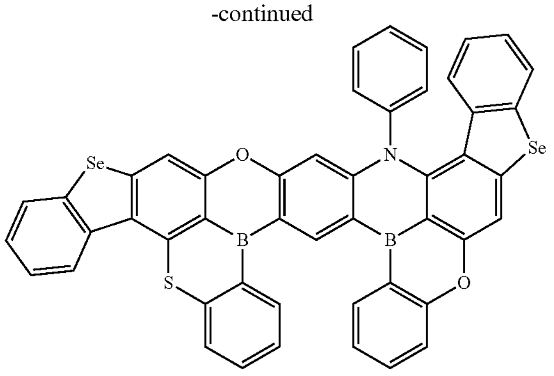

47

7-1. Synthesis of Intermediate Compound 47-a

In an argon atmosphere, in a 2 L flask, 1-bromo-3-fluoro-dibenzoselenophene (50 g, 152 mmol), thiophenol (16.8 g, 152 mmol), and $K_3PO_4$ (97 g, 456 mmol) were added and dissolved in 500 mL of DMSO, and the reaction solution was then stirred at about 200° C. for about 12 hours. After cooling, the reaction solution was poured into ice water (2 L), and the resulting solid was filtered. The obtained solid was dissolved by adding ethyl acetate (300 mL) and then washed with water several times to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate Compound 47-a (white solid, 48 g, yield: 87%).

ESI-LCMS: $[M+H]^+$: $C_{18}H_{12}FSSe$. 357.9612.

$^1H$-NMR (400 MHz, $CDCl_3$): 7.77 (d, 1H), 7.44 (m, 8H), 7.17 (d, 1H), 6.97 (d, 1H).

7-2. Synthesis of Intermediate Compound 47-b

In an argon atmosphere, in a 2 L flask, Intermediate Compound 47-a (48 g, 134 mmol), 3-bromophenol (23.3 g, 134 mmol), and $K_3PO_4$ (85 g, 402 mmol) were added and dissolved in 500 mL of DMSO, and the reaction solution was then stirred at about 200° C. for about 12 hours. After cooling, the reaction solution was poured into ice water (2 L), and the resulting solid was filtered. The obtained solid was dissolved by adding ethyl acetate (300 mL) and then washed with water several times to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate Compound 47-b (white solid, 48 g, yield: 87%).

ESI-LCMS: $[M+H]^+$: $C_{24}H_{15}SSeBrO$. 509.8808.

$^1H$-NMR (400 MHz, $CDCl_3$): 7.77 (d, 1H), 7.34 (m, 10H), 7.20 (d, 1H), 7.04 (d, 1H), 6.92 (s, 1H), 6.84 (s, 1H).

7-3. Synthesis of Intermediate Compound 47-c

In an argon atmosphere, in a 2 L flask, Intermediate Compound 47-b (45 g, 88 mmol), aniline (8.2 g, 88 mmol), tris-tert-butyl phosphine (4 mL, 8.8 mmol), and $Pd_2dba_3$ (4.04 g, 4.4 mmol) were added and dissolved in 500 mL of toluene, and the reaction solution was then stirred at about 100° C. for about 6 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate Compound 47-c (white solid, 33 g, yield: 72%).

ESI-LCMS: $[M+H]^+$: $C_{30}H_{22}SSeNO$. 523.0404.

$^1$H-NMR (400 MHz, $CDCl_3$): 7.77 (d, 1H), 7.40 (m, 10H), 7.17 (t, 1H), 7.06 (m, 3H), 6.86 (s, 2H), 6.43 (s, 1H).

7-4. Synthesis of Intermediate Compound 47-d

In an argon atmosphere, in a 2 L flask, Intermediate Compound 47-c (33 g, 63 mmol), 1-bromo-3-fluoro-dibenzoselenophene (21 g, 63 mmol), tris-tert-butyl phosphine (6 mL, 6.4 mmol), and $Pd_2dba_3$ (2.9 g, 3.2 mmol) were added and dissolved in 500 mL of toluene, and the reaction solution was then stirred at about 100° C. for about 6 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate Compound 47-d (white solid, 35 g, yield: 72%).

ESI-LCMS: $[M+H]^+$: $C_{42}H_{27}SSe_2NOF$. 771.0011.

$^1$H-NMR (400 MHz, $CDCl_3$): 7.76 (d, 2H), 7.42 (m, 11H), 7.24 (t, 3H), 7.04 (m, 3H), 6.92 (m, 5H), 6.43 (d, 1H).

7-5. Synthesis of Intermediate Compound 47-e

In an argon atmosphere, in a 2 L flask, Intermediate Compound 47-d (35 g, 45 mmol), phenol (4.3 g, 45 mmol), and $K_3PO_4$ (29 g, 135 mmol) were added and dissolved in 500 mL of DMSO, and the reaction solution was then stirred at about 200° C. for about 12 hours. After cooling, the reaction solution was poured into ice water (2 L), and the resulting solid was filtered. The obtained solid was dissolved by adding ethyl acetate (300 mL) and then washed with water several times to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate Compound 47-e (white solid, 24.7 g, yield: 65%).

ESI-LCMS: $[M+H]^+$: $C_{48}H_{32}SSe_2NO_2$. 845.0336.

$^1$H-NMR (400 MHz, $CDCl_3$): 7.76 (d, 2H), 7.44 (m, 13H), 7.24 (m, 4H), 7.00 (m, 5H), 6.84 (m, 4H), 6.43 (d, 1H).

7-6. Synthesis of Compound 47

In an argon atmosphere, in a 1 L flask, Intermediate Compound 47-e (24 g, 28 mmol) was dissolved in 400 mL of o-dichlorobenzene and cooled to about 0° C. in an ice water bath. $BBr_3$ (5 eq) was added dropwise slowly to the reaction solution, and the reaction solution was slowly heated to room temperature and then stirred for about 20 minutes. The reaction solution was heated to about 150° C. and then stirred for about 12 hours. After cooling, triethylamine (5 mL) was slowly added dropwise to stop the reaction, and the solvent was removed under reduced pressure to obtain a solid. The solid thus obtained was washed with MeOH, and then purified and separated by silica gel column chromatography utilizing $CH_2Cl_2$ and hexane as eluent to obtain Compound 47 (yellow solid, 2.2 g, yield: 9%).

ESI-LCMS: $[M+H]^+$: $C_{48}H_{25}NO_2SSe_2B_2$. 861.0111.

$^1$H-NMR (400 MHz, $CDCl_3$): 10.43 (s, 1H), 9.23 (s, 2H), 7.92 (d, 2H), 7.77 (d, 1H), 7.50 (m, 9H), 7.24 (m, 4H), 7.00 (m, 5H), 6.92 (s, 1H), 6.84 (d, 2H).

8. Synthesis of Compound 61

Compound 61 according to an example may be synthesized by, for example, the acts shown in Reaction Scheme 8 below:

Reaction Scheme 8

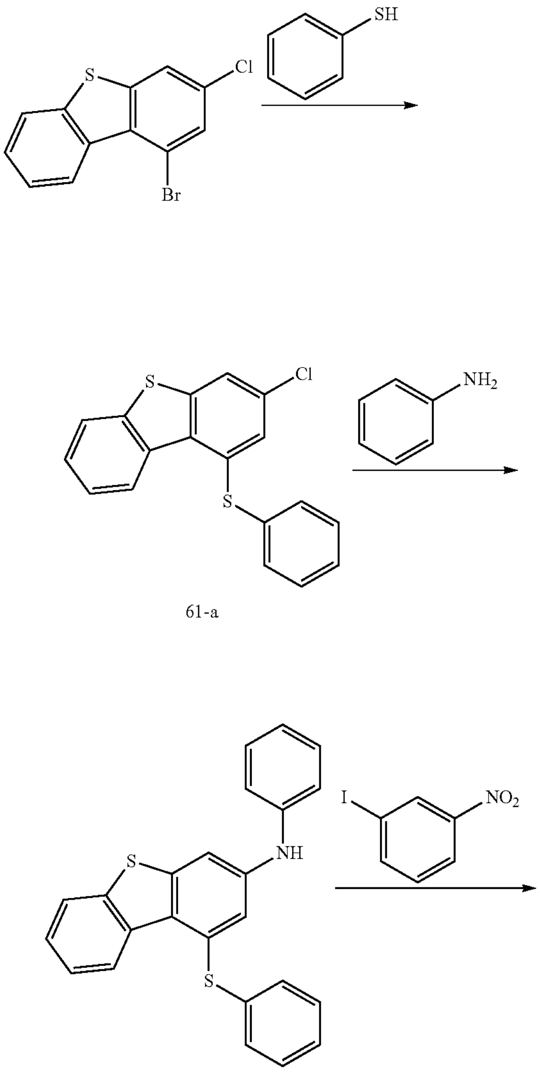

-continued

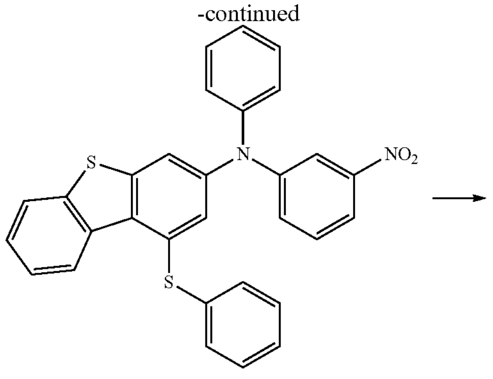

61-c

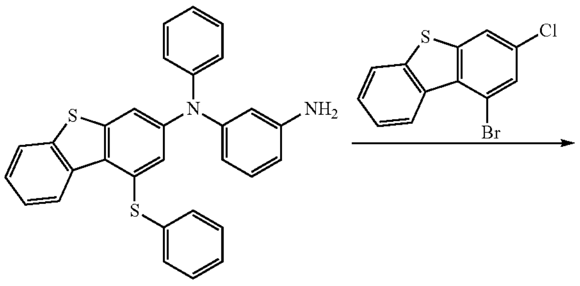

61-d

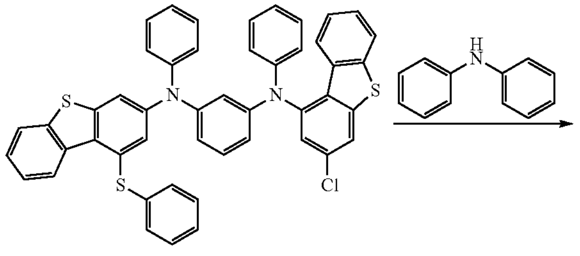

61-e

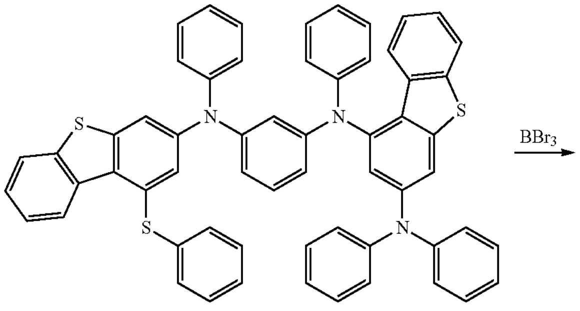

61-f

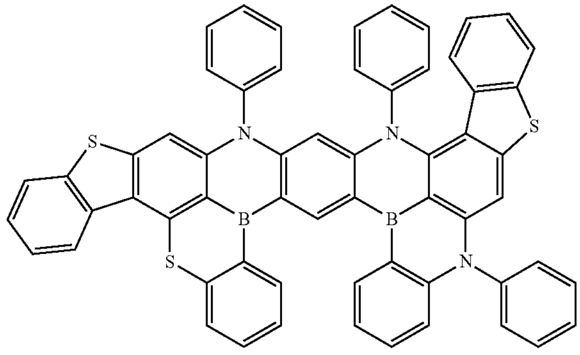

61

8-1. Synthesis of Intermediate Compound 61-a

In an argon atmosphere, in a 2 L flask, Intermediate Compound 1-bromo-3-chloro-dibenzothiophene (50 g, 168 mmol), thiophenol (18.5 g, 168 mmol), and $K_3PO_4$ (106 g, 500 mmol) were added and dissolved in 1000 mL of DMSO, and the reaction solution was then stirred at about 200° C. for about 12 hours. After cooling, the reaction solution was poured into ice water (2 L), and the resulting solid was filtered. The obtained solid was dissolved by adding ethyl acetate (300 mL) and then washed with water several times to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate Compound 61-a (white solid, 42.3 g, yield: 77%).

ESI-LCMS: $[M+H]^+$: $C_{18}H_{12}S_2C_1$. 326.0034.

$^1$H-NMR (400 MHz, $CDCl_3$): 8.45 (d, 1H), 7.98 (d, 1H), 7.88 (s, 1H), 7.44 (m, 7H).

8-2. Synthesis of Intermediate Compound 61-b

In an argon atmosphere, in a 2 L flask, Intermediate Compound 61-a (40 g, 122 mmol), aniline (11.3 g, 122 mmol), tris-tert-butyl phosphine (12 mL, 12.2 mmol), and $Pd_2dba_3$ (5.6 g, 6.1 mmol) were added and dissolved in 500 mL of o-xylene, and the reaction solution was then stirred at about 140° C. for about 6 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate Compound 61-b (white solid, 42 g, yield: 68%).

ESI-LCMS: $[M+H]^+$: $C_{24}H_{17}NS_2$. 383.0437.

$^1$H-NMR (400 MHz, $CDCl_3$): 8.45 (d, 1H), 7.93 (d, 1H), 7.56 (m, 9H), 7.38 (s, 1H), 7.02 (m, 4H).

8-3. Synthesis of Intermediate Compound 61-c

In an argon atmosphere, in a 2 L flask, Intermediate Compound 61-b (40 g, 104 mmol), 3-iodo-nitrobenzene (16 g, 104 mmol), tris-tert-butyl phosphine (4 mL, 8.8 mmol), and $Pd_2dba_3$ (4.0 g, 4.4 mmol) were added and dissolved in 500 mL of toluene, and the reaction solution was then stirred at about 100° C. for about 6 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate Compound 61-c (white solid, 33 g, yield: 63%).

ESI-LCMS: $[M+H]^+$: $C_{30}H_{21}N_2O_2S_2$. 504.0989.

$^1$H-NMR (400 MHz, $CDCl_3$): 8.45 (d, 1H), 8.12 (s, 1H), 7.93 (d, 1H), 7.76 (d, 1H), 7.56 (t, 1H), 7.49 (m, 9H), 7.24 (t, 2H), 7.08 (m, 3H).

8-4. Synthesis of Intermediate Compound 61-d

In an argon atmosphere, in a 2 L flask, Intermediate Compound 61-c (30 g, 59 mmol) and Zn powder (11 g, 3 eq)

were added and dissolved in 500 mL of acetic acid, and the reaction solution was then stirred at room temperature for about 6 hours. The reaction solution was poured into ice water (1 L), and the pH of the reaction solution was adjusted to neutral by utilizing a saturated solution of sodium bicarbonate. The mixed solution was extracted by adding ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate Compound 61-d (white solid, 15.1 g, yield: 64%).

ESI-LCMS: $[M+H]^+$: $C_{30}H_{23}S_2N_2$. 474.1101.

$^1$H-NMR (400 MHz, $CDCl_3$): 8.45 (d, 1H), 7.93 (d, 1H), 7.56 (t, 1H), 7.43 (m, 7H), 7.02 (m, 8H), 6.54 (m, 1H), 6.45 (s, 1H), 6.30 (d, 1H).

8-5. Synthesis of Intermediate Compound 61-e

In an argon atmosphere, in a 2 L flask, Intermediate Compound 61-d (15 g, 32 mmol), 1-bromo-3-chloro-dibenzothiophene (9.4 g, 32 mmol), tris-tert-butyl phosphine (2.8 mL, 3.0 mmol), and $Pd_2dba_3$ (1.44 g, 1.5 mmol) were added and dissolved in 250 mL of toluene, and the reaction solution was then stirred at about 100° C. for about 6 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate Compound 61-e (white solid, 17 g, yield: 71%).

ESI-LCMS: $[M+H]^+$: $C_{48}H_{32}S_3N_2Cl$. 766.1254.

$^1$H-NMR (400 MHz, $CDCl_3$): 8.43 (d, 2H), 7.95 (d, 2H), 7.80 (s, 1H), 7.49 (m, 9H), 7.38 (s, 1H), 7.24 (m, 5H), 7.02 (m, 8H), 6.83 (s, 1H), 6.42 (d, 2H).

8-6. Synthesis of Intermediate Compound 61-f

In an argon atmosphere, in a 2 L flask, Intermediate Compound 61-e (17 g, 22 mmol), diphenylamine (3.7 g, 22 mmol), tris-tert-butyl phosphine (2 mL, 2.2 mmol), and $Pd_2dba_3$ (1 g, 1.1 mmol) were added and dissolved in 200 mL of o-xylene, and the reaction solution was then stirred at about 140° C. for about 6 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate Compound 61-f (white solid, 13.6 g, yield: 69%).

ESI-LCMS: $[M+H]^+$: $C_{60}H_{42}S_3N_3$. 899.1994.

$^1$H-NMR (400 MHz, $CDCl_3$): 8.43 (d, 2H), 7.95 (d, 2H), 7.49 (m, 10H), 7.24 (m, 9H), 7.02 (m, 13H), 6.89 (s, 1H), 6.54 (d, 2H).

8-7. Synthesis of Compound 61

In an argon atmosphere, in a 1 L flask, Intermediate Compound 67-f (13 g, 14 mmol) was dissolved in 250 mL of o-dichlorobenzene and cooled to about 0° C. in an ice water bath. $BBr_3$ (5 eq) was added dropwise slowly to the reaction solution, and the reaction solution was slowly heated to room temperature and then stirred for about 20 minutes. The reaction solution was heated to about 150° C. and then stirred for about 12 hours. After cooling, triethylamine (5 mL) was slowly added dropwise to stop the reaction, and the solvent was removed under reduced pressure to obtain a solid. The solid thus obtained was washed with MeOH, and then purified and separated by silica gel column chromatography utilizing $CH_2Cl_2$ and hexane as eluent to obtain Intermediate Compound 67 (yellow solid, 1.1 g, yield: 8%).

ESI-LCMS: $[M+H]^+$: $C_{60}H_{35}N_3S_3B_2$. 915.2121.

$^1$H-NMR (400 MHz, $CDCl_3$): 10.47 (s, 1H), 9.43 (s, 2H), 7.93 (d, 2H), 7.77 (d, 1H), 7.38 (m, 8H), 7.23 (m, 9H), 7.02 (m, 11H), 6.84 (s, 1H).

9. Synthesis of Compound 71

Compound 71 according to an example may be synthesized by, for example, the acts shown in Reaction Scheme 9 below:

Reaction Scheme 9

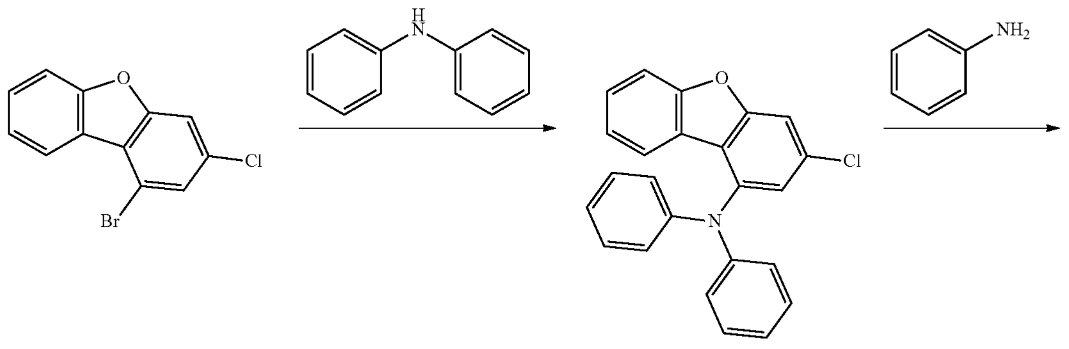

1-a

-continued
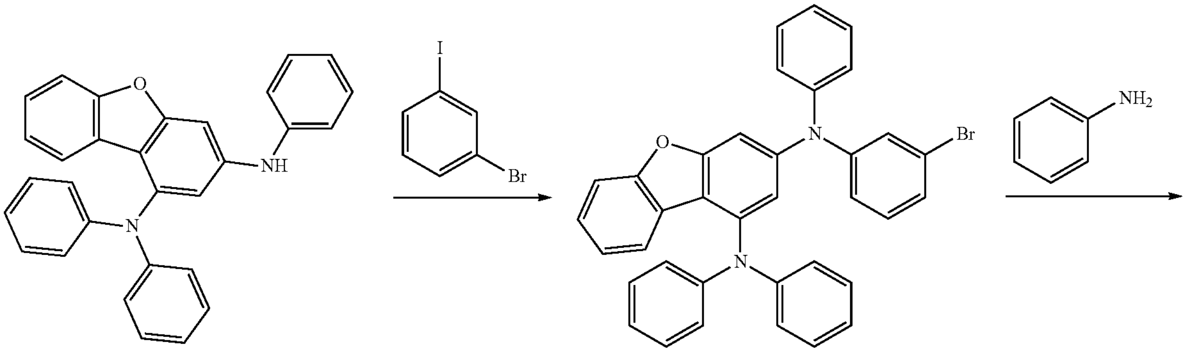
1-b 1-c
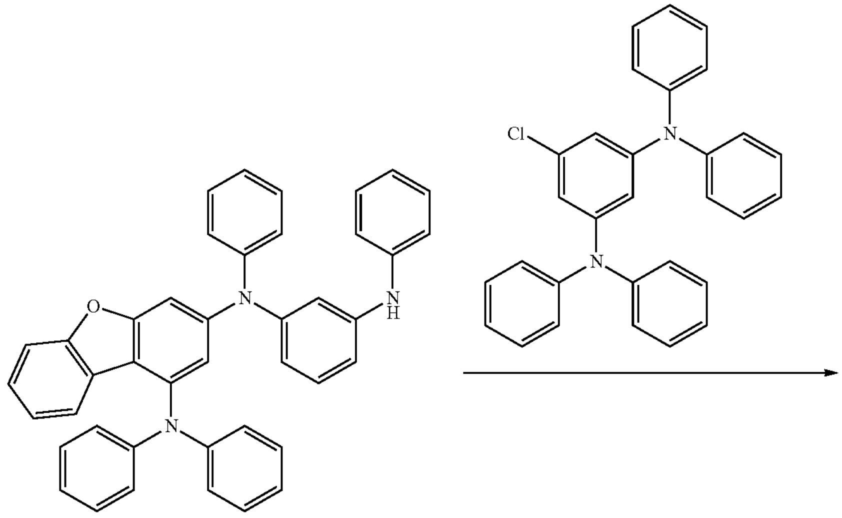
1-d
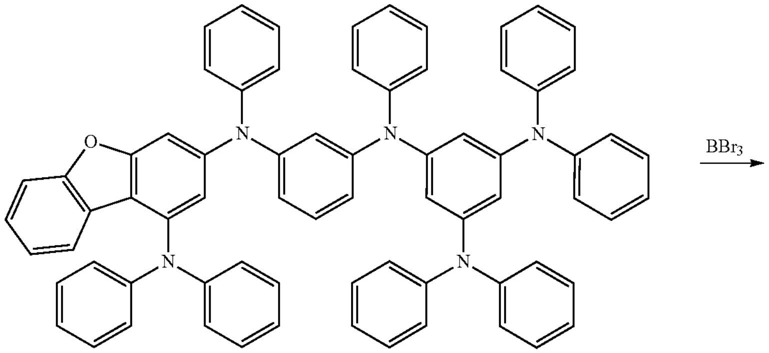
71-a

-continued

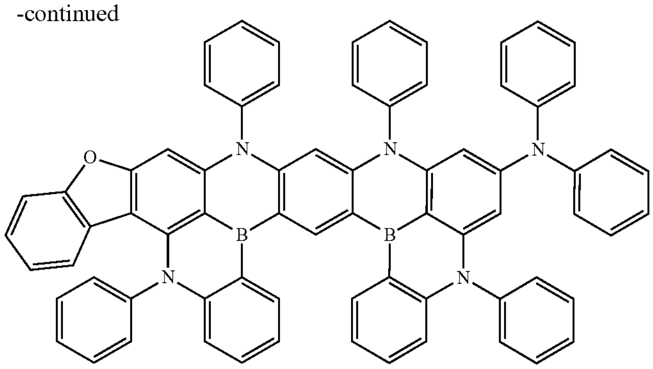

71

9-1. Synthesis of Intermediate Compound 71-a

In an argon atmosphere, in a 1 L flask, Intermediate Compound 1-d (20 g, 34 mmol), 5-chloro-$N^1$,$N^1$,$N^3$,$N^3$-tetraphenylbenzene-1,3-diamine (15 g, 34 mmol), tris-(tert-butyl)phosphine (1.6 mL, 3.2 mmol), and $Pd_2dba_3$ (1.54 g, 1.6 mmol) were added and dissolved in 300 mL of o-xylene, and the reaction solution was then stirred at about 140° C. for about 3 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate Compound 71-a (white solid, 26 g, yield: 73%).

ESI-LCMS: $[M+H]^+$: $C_{72}H_{53}N_5O$. 1003.3279.

$^1$H-NMR (400 MHz, $CDCl_3$): 8.00 (d, 1H), 7.63 (s, 1H), 7.42 (d, 1H), 7.34 (t, 1H), 7.13 (m, 16H), 7.07 (m, 24H), 6.93 (s, 1H), 6.88 (d, 1H), 6.84 (d, 2H), 6.53 (s, 1H).

9-2. Synthesis of Intermediate Compound 71

In an argon atmosphere, in a 1 L flask, Intermediate Compound 71-a (25 g, 25 mmol) was dissolved in 500 mL of o-dichlorobenzene and cooled to about 0° C. in an ice water bath. $BBr_3$ (2.4 mL, 5 eq) was added dropwise slowly to the reaction solution, and the reaction solution was slowly heated to room temperature and then stirred for about 20 minutes. The reaction solution was heated to about 150° C. and then stirred for about 12 hours. After cooling, triethylamine (5 mL) was slowly added dropwise to stop the reaction, and the solvent was removed under reduced pressure to obtain a solid. The solid thus obtained was washed with MeOH, and then purified and separated by silica gel column chromatography utilizing $CH_2Cl_2$ and hexane as eluent to obtain Intermediate Compound 71 (yellow solid, 3.3 g, yield: 13%).

ESI-LCMS: $[M+H]^+$: $C_{72}H_{48}B_2N_5O$. 1019.1968.

$^1$H-NMR (400 MHz, $CDCl_3$): 10.23 (s, 1H), 9.47 (d, 2H), 8.00 (d, 1H), 7.67 (d, 1H), 7.63 (s, 1H), 7.42 (t, 1H), 7.33 (m, 17H), 7.12 (m, 20H), 6.77 (s, 1H), 6.50 (s, 1H).

10. Synthesis of Compound 74

Compound 74 according to an example may be synthesized by, for example, the acts shown in Reaction Scheme 10 below:

Reaction Scheme 10

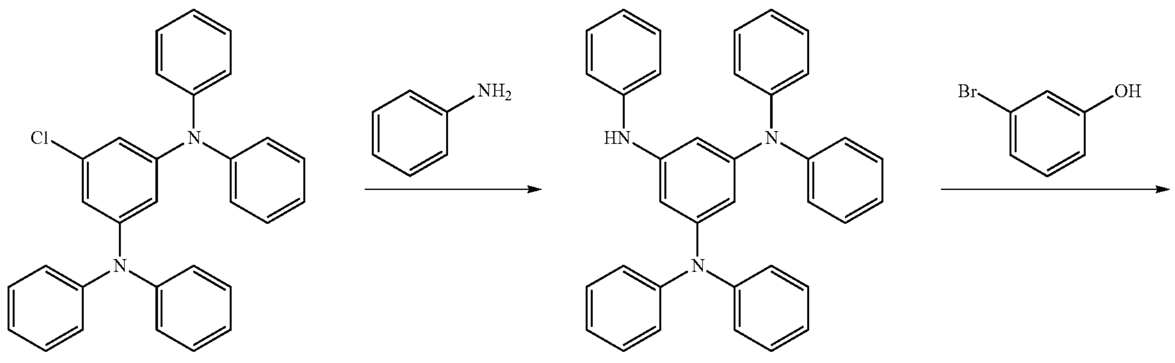

74-a

-continued

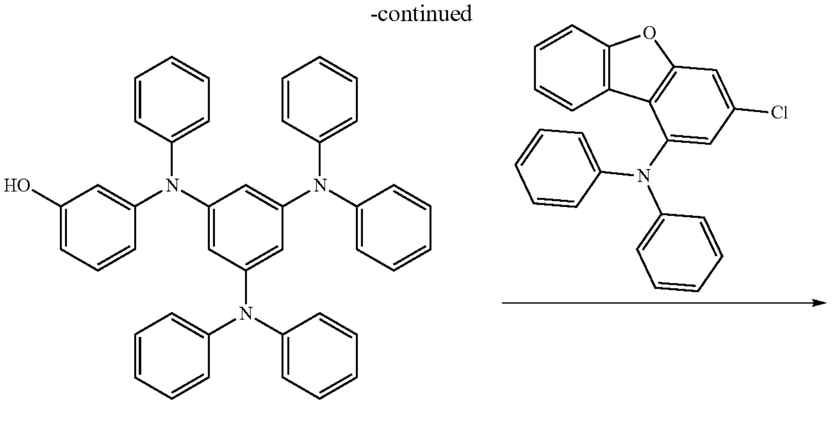

74-b

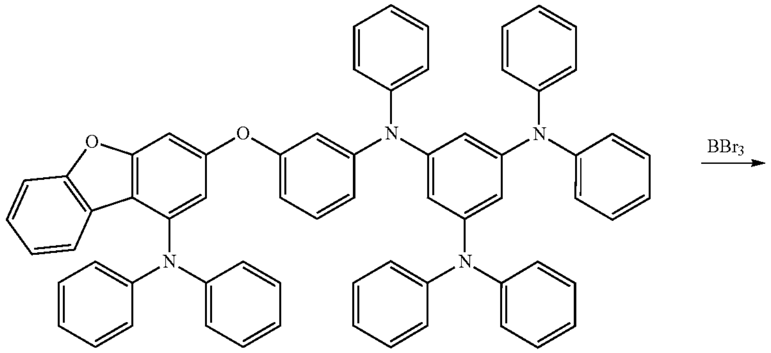

74-c

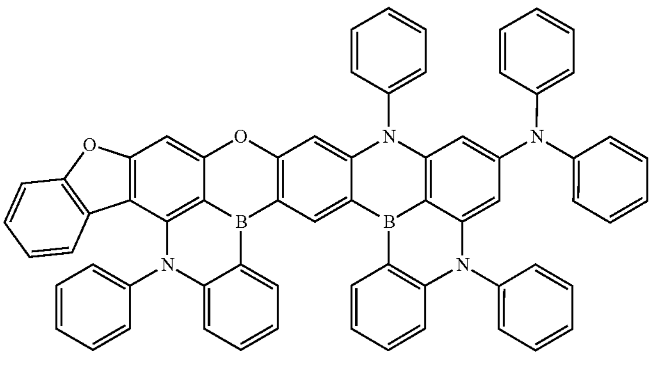

74

10-1. Synthesis of Intermediate Compound 74-a

In an argon atmosphere, in a 1 L flask, aniline (7.5 g, 80 mmol), 5-chloro-$N^1$,$N^1$,$N^3$,$N^3$-tetraphenylbenzene-1,3-diamine (30 g, 67 mmol), tris-(tert-butyl)phosphine (3.1 mL, 6.7 mmol), and $Pd_2dba_3$ (3.07 g, 3.3 mmol) were added and dissolved in 500 mL of o-xylene, and the reaction solution was then stirred at about 140° C. for about 3 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate Compound 74-a (white solid, 28 g, yield: 82%).

ESI-LCMS: $[M+H]^+$: $C_{36}H_{30}N_3$. 503.2137.

$^1$H-NMR (400 MHz, $CDCl_3$): 8.36 (s, 1H), 7.43 (m, 2H), 7.25 (m, 8H), 7.15 (m, 15H), 6.52 (s, 3H).

10-2. Synthesis of Intermediate Compound 74-b

In an argon atmosphere, in a 1 L flask, Intermediate Compound 74-a (28 g, 56 mmol), 3-bromophenol (9.6 g, 47 mmol), tris-(tert-butyl)phosphine (2.5 mL, 5.4 mmol), and $Pd_2dba_3$ (2.5 g, 2.7 mmol) were added and dissolved in 500 mL of toluene, and the reaction solution was then stirred at about 100° C. for about 5 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate Compound 74-b (white solid, 28 g, yield: 84%).

ESI-LCMS: $[M+H]^+$: $C_{42}H_{34}N_3O$. 595.2424.

$^1$H-NMR (400 MHz, $CDCl_3$): 7.22 (m, 12H), 7.16 (d, 10H), 7.11 (m, 6H), 6.82 (m, 3H), 6.49 (s, 1H).

10-3. Synthesis of Intermediate Compound 74-c

In an argon atmosphere, in a 1 L flask, Intermediate Compound 74-b (25 g, 42 mmol), Compound 1-a (15.5 g, 42 mmol), CuI (9.5 g, 50 mmol), and 1,10-phenanthroline (0.9 g, 5 mmol) were added and dissolved in 500 mL of DMF, and the reaction solution was then stirred at about 180° C. for about 12 hours. After cooling, the reaction solution was poured into water (1 L), and the resulting solid was filtered. The obtained solid was dissolved again with $CH_2Cl_2$ and then washed with water several times to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate Compound 74-c (white solid, 18 g, yield: 62%).

ESI-LCMS: $[M+H]^+$: $C_{66}H_{48}N_4O_2$. 929.1237.

$^1$H-NMR (400 MHz, $CDCl_3$): 7.99 (d, 1H), 7.56 (d, 1H), 7.43 (t, 1H), 7.32 (d, 1H), 7.12 (m, 16H), 7.08 (m, 10H), 7.11 (m, 22H), 6.93 (s, 1H), 6.88 (d, 1H), 6.63 (s, 1H), 6.42 (m, 4H).

10-4. Synthesis of Compound 74

In an argon atmosphere, in a 1 L flask, Intermediate Compound 74-c (15 g, 16 mmol) was dissolved in 300 mL of o-dichlorobenzene and cooled to about 0° C. in an ice water bath. $BBr_3$ (1.6 mL, 5 eq) was added dropwise slowly to the reaction solution, and the reaction solution was slowly heated to room temperature and then stirred for about 20 minutes. The reaction solution was heated to about 150° C. and then stirred for about 12 hours. After cooling, triethylamine (5 mL) was slowly added dropwise to stop the reaction, and the solvent was removed under reduced pressure to obtain a solid. The solid thus obtained was washed with MeOH, and then purified and separated by silica gel column chromatography utilizing $CH_2Cl_2$ and hexane as eluent to obtain Compound 74 (yellow solid, 1.8 g, yield: 12%).

ESI-LCMS: $[M+H]^+$: $C_{66}H_{43}B_2N_4O_2$. 944.2107.

$^1$H-NMR (400 MHz, $CDCl_3$): 10.42 (s, 1H), 9.56 (d, 2H), 7.89 (d, 1H), 7.72 (d, 1H), 7.55 (s, 1H), 7.43 (t, 1H), 7.33 (m, 17H), 7.12 (m, 17H), 6.87 (s, 1H), 6.49 (s, 2H).

11. Synthesis of Compound 81

Compound 81 according to an example may be synthesized by, for example, the acts shown in Reaction Scheme 11 below:

Reaction Scheme 11

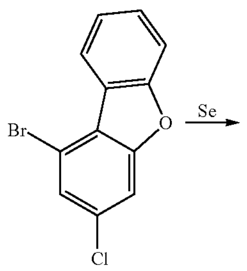

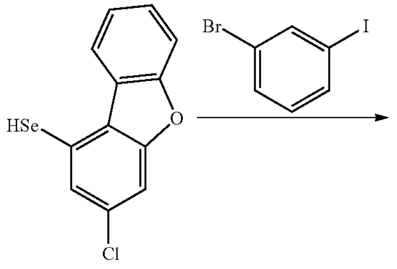

81-a

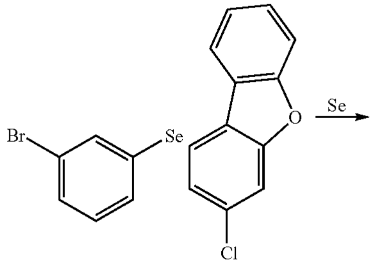

81-b

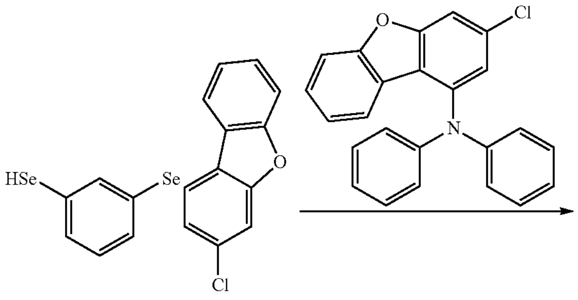

81-c

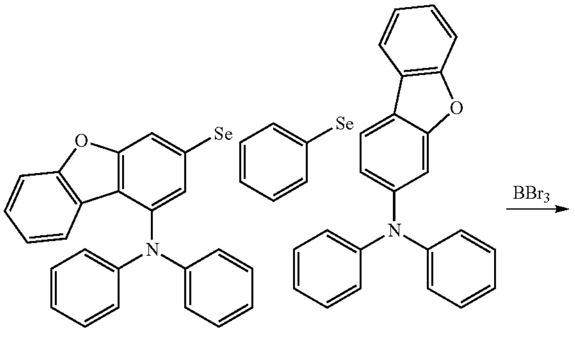

81-d

-continued

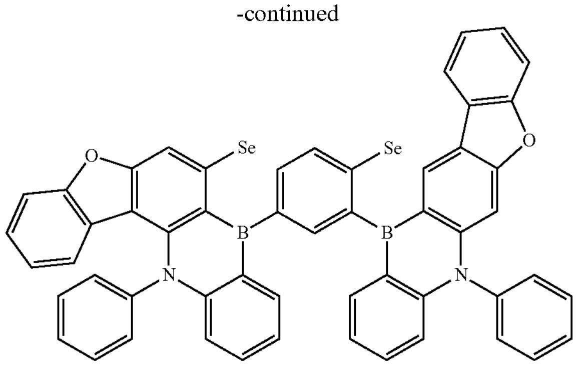

81

11-1. Synthesis of Intermediate Compound 81-a

In an argon atmosphere, in a 1 L flask, Mg (4.3 g, 177 mmol) was dissolved in 500 mL of anhydrous THF, and a solution in which Compound 1-bromo-3-chloro-dibenzofuran (50 g, 177 mmol) was dissolved in 300 mL of anhydrous THF was added dropwise slowly thereto at room temperature. Iodine (50 mg, cat.) was added to the reaction solution, and the temperature was then elevated to about 80° C. The reaction solution was stirred at the same temperature for about 30 minutes, and when the color of the reaction solution changed from brown to gray, the reaction solution was cooled to room temperature, and selenium powder (14 g, 177 mmol) was added portionwise thereto. The reaction solution was heated again to about 80° C. and then stirred for about 2 hours, and after cooling, 1 M HCl was added dropwise slowly thereto until the pH of the reaction solution became neutral. The reaction solution was extracted by utilizing ethyl acetate and water to obtain organic layers. The obtained organic layers were passed through celite filter to remove undissolved solids, and then the filtrate was concentrated. The solid thus obtained was purified and separated by silica gel column chromatography utilizing $CH_2Cl_2$ and hexane as eluent to obtain Intermediate Compound 81-a (yellow solid, 21 g, yield: 43%).

ESI-LCMS: $[M+H]^+$: $C_{12}H_8OSeCl$. 281.8907.

$^1$H-NMR (400 MHz, $CDCl_3$): 7.98 (d, 1H), 7.66 (s, 1H), 7.54 (d, 1H), 7.34 (m, 3H).

11-2. Synthesis of Intermediate Compound 81-b

In an argon atmosphere, in a 1 L flask, Intermediate Compound 81-a (21 g, 74 mmol), 1-bromo-3-iodobenzene (21 g, 74 mmol), CuI (14 g, 74 mmol), and picolinic acid (9.2 g, 74 mmol) were added and dissolved in 300 mL of DMF, and the reaction solution was then stirred at about 180° C. for about 12 hours. After cooling, the reaction solution was poured into water (1 L), and the resulting solid was filtered. The obtained solid was dissolved again with $CH_2Cl_2$ and then washed with water several times to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate Compound 81-b (white solid, 22 g, yield: 68%).

ESI-LCMS: $[M+H]^+$: $C_{18}H_{11}OSeBrCl$. 435.7767.

$^1$H-NMR (400 MHz, $CDCl_3$): 7.98 (d, 1H), 7.66 (d, 1H), 7.54 (m, 3H), 7.25 (m, 5H).

11-3. Synthesis of Intermediate Compound 81-c

In an argon atmosphere, in a 1 L flask, Mg (1.2 g, 50 mmol) was dissolved in 100 mL of anhydrous THF, and a solution in which Intermediate Compound 81-b (22 g, 50 mmol) was dissolved in 100 mL of anhydrous THF was added dropwise slowly thereto at room temperature. Iodine (50 mg, cat.) was added to the reaction solution, and the temperature was then elevated to about 80° C. The reaction solution was stirred at the same temperature for about 30 minutes, and when the color of the reaction solution changed from brown to gray, the reaction solution was cooled to room temperature, and selenium powder (4 g, 50 mmol) was added portionwise thereto. The reaction solution was heated again to about 80° C. and then stirred for about 2 hours, and after cooling, 1 M HCl was added dropwise slowly thereto until the pH of the reaction solution became neutral. The reaction solution was extracted by utilizing ethyl acetate and water to obtain organic layers. The obtained organic layers were passed through celite filter to remove undissolved solids, and then the filtrate was concentrated. The solid thus obtained was purified and separated by silica gel column chromatography utilizing $CH_2Cl_2$ and hexane as eluent to obtain Intermediate Compound 81-c (yellow solid, 9.4 g, yield: 45%).

ESI-LCMS: $[M+H]^+$: $C_{18}H_{11}OSe_2Cl$. 437.6632.

$^1$H-NMR (400 MHz, $CDCl_3$): 7.98 (d, 1H), 7.66 (s, 1H), 7.54 (d, 1H), 7.33 (m, 7H).

11-4. Synthesis of Intermediate Compound 81-d

In an argon atmosphere, in a 1 L flask, Intermediate Compound 81-c (9.0 g, 21 mmol), Compound 1-a (7.6 g, 74 mmol), CuI (4 g, 21 mmol), and picolinic acid (2.6 g, 21 mmol) were added and dissolved in 150 mL of DMF, and the reaction solution was then stirred at about 180° C. for about 12 hours. After cooling, the reaction solution was poured into water (1 L), and the resulting solid was filtered. The obtained solid was dissolved again with $CH_2Cl_2$ and then washed with water several times to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate Compound 81-d (white solid, 10.6 g, yield: 63%).

ESI-LCMS: $[M+H]^+$: $C_{54}H_{37}O_2Se_2N_2$. 904.1053.

$^1$H-NMR (400 MHz, $CDCl_3$): 8.03 (s, 1H), 7.96 (d, 2H), 7.54 (d, 2H), 7.25 (m, 17H), 7.14 (s, 2H), 7.06 (m, 12H).

11-5. Synthesis of Compound 81

In an argon atmosphere, in a 1 L flask, Intermediate Compound 81-d (10 g, 11 mmol) was dissolved in 250 mL of o-dichlorobenzene and cooled to about 0° C. in an ice water bath. $BBr_3$ (5 eq) was added dropwise slowly to the reaction solution, and the reaction solution was slowly heated to room temperature and then stirred for about 20 minutes. The reaction solution was heated to about 150° C.

and then stirred for about 12 hours. After cooling, triethylamine (5 mL) was slowly added dropwise to stop the reaction, and the solvent was removed under reduced pressure to obtain a solid. The solid thus obtained was washed with MeOH, and then purified and separated by silica gel column chromatography utilizing $CH_2Cl_2$ and hexane as eluent to obtain Compound 81 (yellow solid, 1.3 g, yield: 13%).

ESI-LCMS: $[M+H]^+$: $C_{54}H_{30}N_2O_2Se_2B_2$. 920.0543.

$^1$H-NMR (400 MHz, $CDCl_3$): 10.56 (s, 1H), 10.33 (s, 2H), 8.03 (s, 1H), 7.96 (d, 2H), 7.54 (d, 2H), 7.34 (m, 8H), 7.25 (m, 7H), 7.14 (s, 2H), 7.06 (m, 12H).

12. Synthesis of Compound 84

Compound 84 according to an example may be synthesized by, for example, the acts shown in Reaction Scheme 12 below:

Reaction Scheme 12

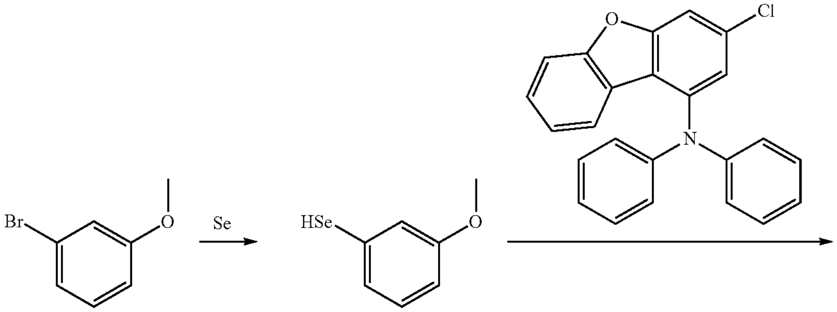

84-a

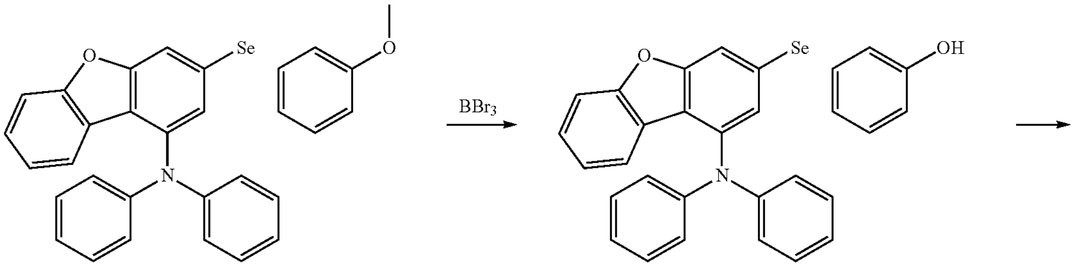

84-b 84-c

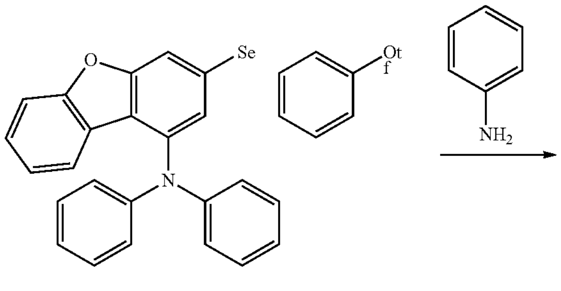

84-d

-continued

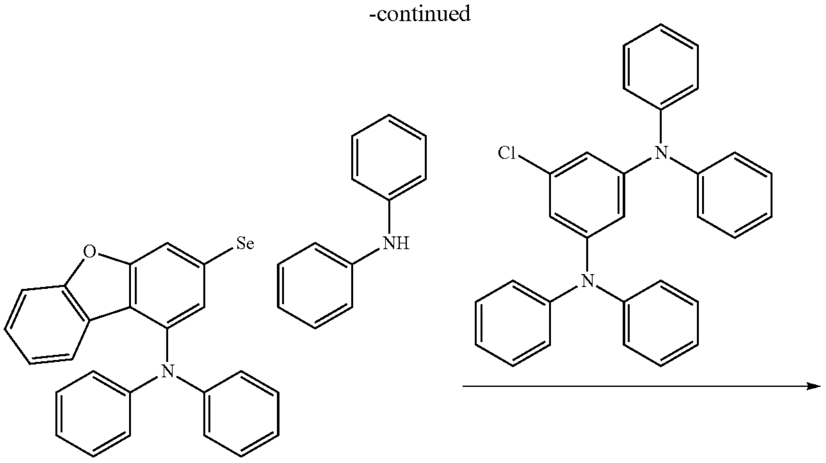

84-e

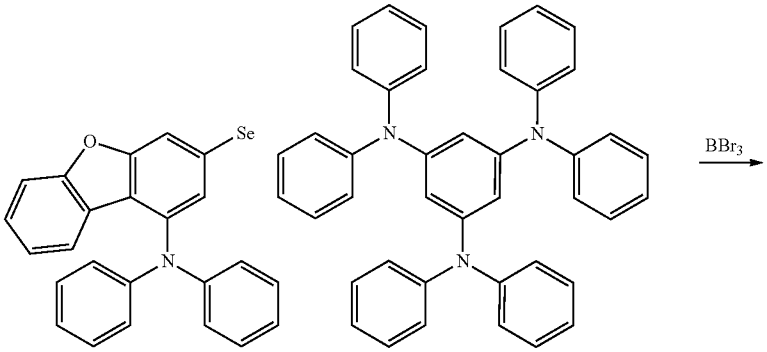

84-f

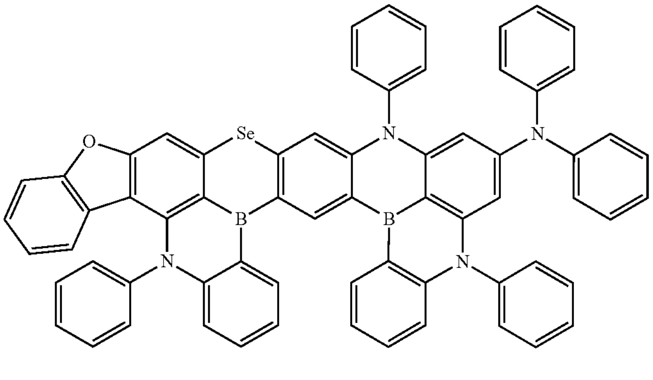

84

12-1. Synthesis of Intermediate Compound 84-a

In an argon atmosphere, in a 1 L flask, Mg (18.7 g, 455 mmol) was dissolved in 500 mL of anhydrous THF, and a solution in which Compound 3-bromo-methoxybenzene (50 g, 260 mmol) was dissolved in 300 mL of anhydrous THF was added dropwise slowly thereto at room temperature. Iodine (500 mg, cat.) was added to the reaction solution, and the temperature was then elevated to about 80° C. The reaction solution was stirred at the same temperature for about 30 minutes, and when the color of the reaction solution changed from brown to gray, the reaction solution was cooled to room temperature, and selenium powder (20 g, 260 mmol) was added portionwise thereto. The reaction solution was heated again to about 80° C. and then stirred for about 2 hours, and after cooling, 1 M HCl was added dropwise slowly thereto until the pH of the reaction solution became neutral. The reaction solution was extracted by utilizing ethyl acetate and water to obtain organic layers. The obtained organic layers were passed through celite filter to remove undissolved solids, and then the filtrate was concentrated. The solid thus obtained was purified and separated by silica gel column chromatography utilizing $CH_2Cl_2$ and hexane as eluent to obtain Intermediate Compound 84-a (white solid, 25 g, yield: 50%).

ESI-LCMS: $[M+H]^+$: $C_7H_9OSe$. 187.8843.

$^1$H-NMR (400 MHz, $CDCl_3$): 7.34 (t, 1H), 7.01 (d, 1H), 6.94 (d, 1H), 6.91 (s, 1H), 3.88 (s, 3H)

12-2. Synthesis of Intermediate Compound 84-b

In an argon atmosphere, in a 1 L flask, Intermediate Compound 84-a (25 g, 132 mmol), Compound 1-a (50 g, 132 mmol), CuI (12 g, 66 mmol), and picolinic acid (16.2 g, 132 mmol) were added and dissolved in 500 mL of DMF, and the reaction solution was then stirred at about 180° C. for about 12 hours. After cooling, the reaction solution was poured into water (1 L), and the resulting solid was filtered. The obtained solid was dissolved again with $CH_2Cl_2$ and then washed with water several times to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate Compound 84-b (white solid, 44 g, yield: 63%).

ESI-LCMS: $[M+H]^+$: $C_{31}H_{24}NO_2Se$. 521.0234.

$^1$H-NMR (400 MHz, $CDCl_3$): 7.99 (d, 1H), 7.56 (d, 1H), 7.43 (t, 1H), 7.41 (t, 1H), 7.32 (m, 4H), 7.29 (s, 1H), 7.12 (d, 1H), 7.01 (m, 10H), 3.87 (s, 3H).

12-3. Synthesis of Intermediate Compound 84-c

In an argon atmosphere, in a 1 L flask, Intermediate Compound 84-b (44 g, 85 mmol) was added and dissolved in 500 mL of $CH_2Cl_2$, and the reaction solution was then cooled to about 0° C. $BBr_3$ (3.0 eq) was added slowly to the reaction solution, the temperature was slowly elevated to room temperature, and the reaction solution was then stirred for about 12 hours. After cooling, the reaction solution was poured into water (1 L) and extracted with $CH_2Cl_2$ several times to obtain organic layers. The organic layers were collected, dried over $MgSO_4$ and then filtered, and in the filtrate, the solvent was removed under reduced pressure to obtain a solid. The solid thus obtained was dissolved in a small amount of $CH_2Cl_2$, passed through a short silica gel film, and purified and separated to obtain Intermediate Compound 84-c (dark brown solid, 27 g, yield: 62%).

ESI-LCMS: $[M+H]^+$: $C_{30}H_{22}NSeO_2$. 507.0112.

$^1$H-NMR (400 MHz, $CDCl_3$): 9.12 (br, 1H), 7.99 (d, 1H), 7.56 (d, 1H), 7.43 (t, 1H), 7.41 (t, 1H), 7.32 (m, 4H), 7.22 (s, 1H), 7.02 (d, 1H), 6.78 (m, 10H).

12-4. Synthesis of Intermediate Compound 84-d

In an argon atmosphere, in a 1 L flask, Intermediate Compound 84-c (27 g, 53 mmol) was added and dissolved in 500 mL of $CH_2Cl_2$, and the reaction solution was then cooled to about 0° C. Pyridine (12.6 g, 159 mmol) and triflate anhydride (22.5 g, 80 mmol) were sequentially added thereto, and the reaction solution was slowly heated to room temperature and then stirred for about 3 hours. After cooling, the reaction solution was poured into water (1 L) and extracted with $CH_2Cl_2$ several times to obtain organic layers. The organic layers were collected, dried over $MgSO_4$ and then filtered, and in the filtrate, the solvent was removed under reduced pressure to obtain a solid. The solid thus obtained was purified and separated by silica gel column chromatography utilizing $CH_2Cl_2$ and hexane as eluent to obtain Intermediate Compound 84-d (white solid, 28 g, yield: 84%).

ESI-LCMS: $[M+H]^+$: $C_{31}H_{21}NSeSF_3O_4$. 639.0232.

$^1$H-NMR (400 MHz, $CDCl_3$): 7.99 (d, 1H), 7.56 (d, 1H), 7.43 (t, 1H), 7.41 (t, 1H), 7.32 (m, 4H), 7.29 (s, 1H), 7.12 (d, 1H), 7.01 (m, 10H), 3.87 (s, 3H).

12-5. Synthesis of Intermediate Compound 84-e

In an argon atmosphere, in a 1 L flask, Intermediate Compound 84-d (28 g, 44 mmol), aniline (4.9 g, 53 mmol), tris-tert-butyl phosphine (4.0 mL, 4.4 mmol), and $Pd_2dba_3$ (2.0 g, 2.2 mmol) were added and dissolved in 400 mL of o-xylene, and the reaction solution was then stirred at about 140° C. for about 6 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate Compound 84-e (white solid, 19.4 g, yield: 64%).

ESI-LCMS: $[M+H]^+$: $C_{36}H_{26}N_2SeO$. 581.1554.

$^1$H-NMR (400 MHz, $CDCl_3$): 7.99 (d, 1H), 7.56 (d, 1H), 7.49 (t, 1H), 7.41 (t, 1H), 7.24 (m, 9H), 7.12 (m, 12H).

12-6. Synthesis of Intermediate Compound 84-f

In an argon atmosphere, in a 1 L flask, Intermediate Compound 84-e (19 g, 33 mmol), 5-chloro-$N^1$,$N^1$,$N^3$,$N^3$-tetraphenylbenzene-1,3-diamine (14.6 g, 33 mmol), tris-tert-butyl phosphine (3.0 mL, 3.2 mmol), and $Pd_2dba_3$ (1.5 g, 1.6 mmol) were added and dissolved in 300 mL of o-xylene, and the reaction solution was then stirred at about 140° C. for about 6 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate Compound 84-f (white solid, 27 g, yield: 85%).

ESI-LCMS: $[M+H]^+$: $C_{66}H_{48}N_4SeO$. 992.2727.

$^1$H-NMR (400 MHz, $CDCl_3$): 7.99 (d, 1H), 7.56 (d, 1H), 7.49 (t, 1H), 7.33 (m, 17H), 7.12 (m, 25H), 6.54 (s, 1H), 6.48 (s, 2H).

12-7. Synthesis of Compound 84

In an argon atmosphere, in a 1 L flask, Intermediate Compound 84-f (25 g, 25 mmol) was dissolved in 400 mL of o-dichlorobenzene and cooled to about 0° C. in an ice water bath. $BBr_3$ (5 eq) was added dropwise slowly to the reaction solution, and the reaction solution was slowly heated to room temperature and then stirred for about 20 minutes. The reaction solution was heated to about 150° C. and then stirred for about 12 hours. After cooling, triethylamine (5 mL) was slowly added dropwise to stop the reaction, and the solvent was removed under reduced pressure to obtain a solid. The solid thus obtained was washed with MeOH, and then purified and separated by silica gel column chromatography utilizing $CH_2Cl_2$ and hexane as eluent to obtain Compound 84 (yellow solid, 3.6 g, yield: 14%).

ESI-LCMS: $[M+H]^+$: $C_{66}H_{42}N_4OSeB_2$. 1008.2772.

$^1$H-NMR (400 MHz, $CDCl_3$): 10.46 (s, 1H), 10.22 (s, 2H), 7.99 (d, 1H), 7.54 (d, 1H), 7.42 (t, 1H), 7.33 (m, 17H), 7.12 (m, 18H), 6.52 (s, 1H).

13. Synthesis of Compound 111

Compound 111 according to an example may be synthesized by, for example, the acts shown in Reaction Scheme 13 below:

Reaction Scheme 13
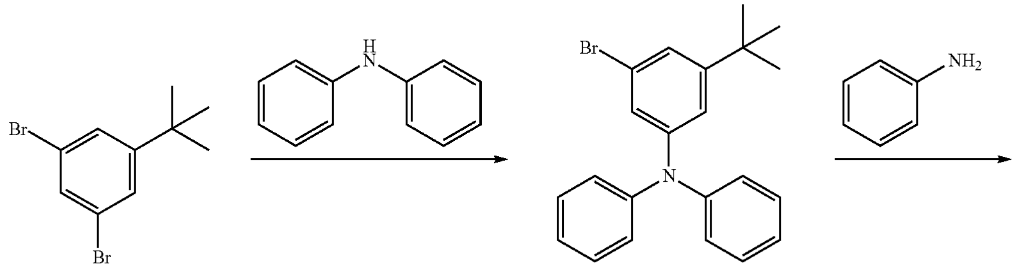
111-a
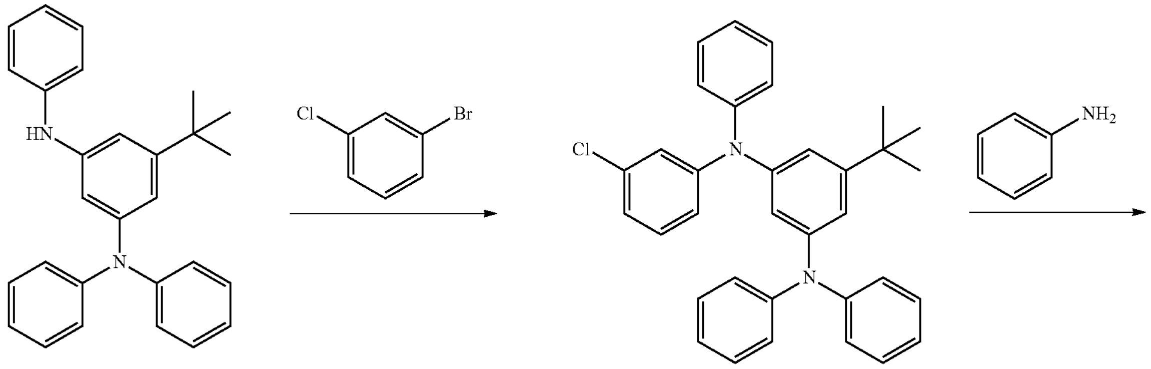
111-b 111-c
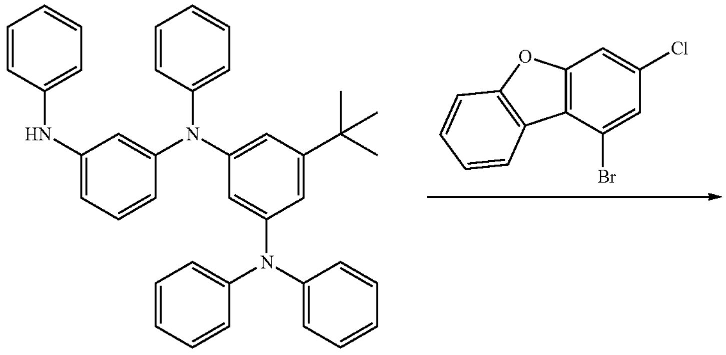
111-d
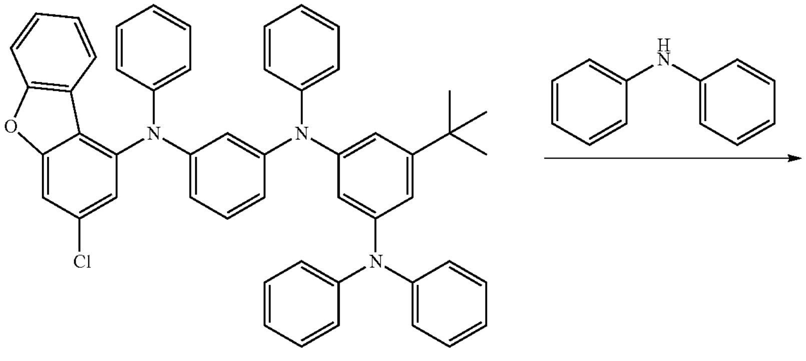
111-e -continued

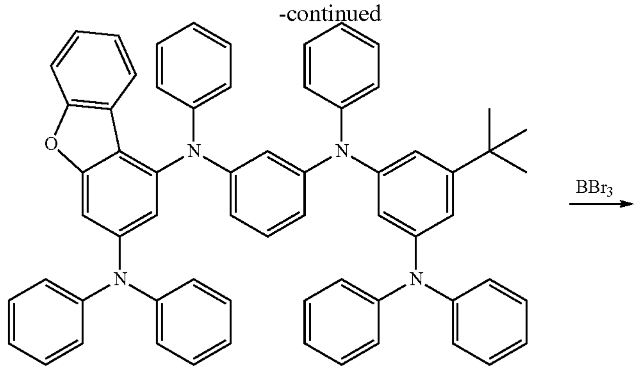

111-f

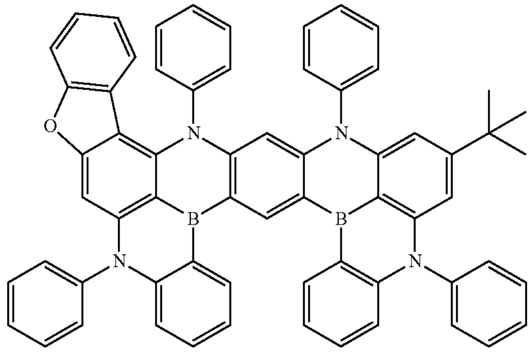

111

13-1. Synthesis of Intermediate Compound 111-a

In an argon atmosphere, in a 2 L flask, 1,3-dibromo-5-(tert-butyl)benzene (50 g, 170 mmol), diphenylamine (29 g, 170 mmol), BINAP (10.6 g, 17.0 mmol), and $Pd_2dba_3$ (7.8 g, 8.5 mmol) were added and dissolved in 1,000 mL of toluene, and the reaction solution was then stirred at about 90° C. for about 12 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate Compound 111-a (white solid, 40.1 g, yield: 63%).

ESI-LCMS: $[M+H]^+$: $C_{22}H_{23}NBr$. 379.1101.

$^1$H-NMR (400 MHz, $CDCl_3$): 7.34 (s, 1H), 7.24 (d, 4H), 7.19 (s, 1H), 7.09 (m, 6H), 7.01 (s, 1H), 1.32 (s, 9H).

13-2. Synthesis of Intermediate Compound 111-b

In an argon atmosphere, in a 2 L flask, Intermediate Compound 111-a (40 g, 105 mmol), aniline (13 g, 137 mmol), tris-tert-butyl phosphine (13 mL, 13.0 mmol), and $Pd_2dba_3$ (6.3 g, 6.8 mmol) were added and dissolved in 600 mL of toluene, and the reaction solution was then stirred at about 90° C. for about 6 hours. After cooling, the reaction solution was extracted by adding water (1 L) and ethyl acetate (300 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate Compound 111-b (white solid, 35 g, yield: 85%).

ESI-LCMS: $[M+H]^+$: $C_{28}H_{29}N_2$. 392.2056.

$^1$H-NMR (400 MHz, $CDCl_3$): 7.40 (t, 2H), 7.24 (t, 4H), 7.09 (m, 9H), 7.02 (s, 2H), 6.63 (s, 1H), 1.32 (s, 9H).

13-3. Synthesis of Intermediate Compound 111-c

In an argon atmosphere, in a 1 L flask, Intermediate Compound 111-b (35 g, 89 mmol), 3-bromo-bromobenzene (17 g, 89 mmol), tris-tert-butyl phosphine (8.0 mL, 8.8 mmol), and $Pd_2dba_3$ (4.0 g, 4.4 mmol) were added and dissolved in 400 mL of toluene, and the reaction solution was then stirred at about 90° C. for about 6 hours. After cooling, the reaction solution was extracted by adding water (500 mL) and ethyl acetate (200 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate Compound 111-c (white solid, 32.4 g, yield: 72%).

ESI-LCMS: $[M+H]^+$: $C_{34}H_{32}N_2C_1$. 502.1997.

$^1$H-NMR (400 MHz, $CDCl_3$): 7.40 (s, 1H), 7.24 (t, 6H), 7.09 (d, 6H), 7.02 (m, 3H), 6.99 (s, 2H), 6.63 (s, 1H), 1.32 (s, 9H).

13-4. Synthesis of Intermediate Compound 111-d

In an argon atmosphere, in a 1 L flask, Intermediate Compound 111-c (32 g, 64 mmol), aniline (7.7 g, 82 mmol), tris-tert-butyl phosphine (7.6 mL, 8.2 mmol), and $Pd_2dba_3$ (3.8 g, 4.1 mmol) were added and dissolved in 400 mL of o-xylene, and the reaction solution was then stirred at about 140° C. for about 6 hours. After cooling, the reaction solution was extracted by adding water (500 mL) and ethyl acetate (200 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate Compound 111-d (white solid, 28 g, yield: 72%).

ESI-LCMS: $[M+H]^+$: $C_{40}H_{38}N_3$. 559.3001.

$^1H$-NMR (400 MHz, $CDCl_3$): 7.40 (t, 2H), 7.29 (d, 2H), 7.24 (t, 6H), 7.09 (m, 12H), 7.02 (s, 2H), 6.83 (s, 1H), 6.73 (d, 1H), 6.63 (s, 1H), 1.32 (s, 9H).

13-5. Synthesis of Intermediate Compound 111-e

In an argon atmosphere, in a 1 L flask, Intermediate Compound 111-d (28 g, 50 mmol), 1-bromo-3-chloro-dibenzofuran (14.1 g, 50 mmol), tris-tert-butyl phosphine (4.6 mL, 5.0 mmol), and $Pd_2dba_3$ (2.3 g, 2.5 mmol) were added and dissolved in 400 mL of toluene, and the reaction solution was then stirred at about 100° C. for about 12 hours. After cooling, the reaction solution was extracted by adding water (500 mL) and ethyl acetate (200 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate Compound 111-e (white solid, 29 g, yield: 76%).

ESI-LCMS: $[M+H]^+$: $C_{52}H_{42}N_3C_{10}$. 759.2994.

$^1H$-NMR (400 MHz, $CDCl_3$): 7.98 (d, 1H), 7.54 (d, 1H), 7.39 (t, 1H), 7.31 (t, 1H), 7.29 (d, 8H), 7.11 (s, 1H), 7.09 (d, 8H), 7.00 (t, 4H), 6.99 (s, 1H), 6.83 (s, 1H), 6.73 (d, 2H), 6.63 (s, 1H), 1.32 (s, 9H).

13-6. Synthesis of Intermediate Compound 111-f

In an argon atmosphere, in a 1 L flask, Intermediate Compound 111-e (28 g, 37 mmol), diphenylamine (6.2 g, 37 mmol), tris-tert-butyl phosphine (3.4 mL, 3.6 mmol), and $Pd_2dba_3$ (1.7 g, 1.8 mmol) were added and dissolved in 400 mL of o-xylene, and the reaction solution was then stirred at about 140° C. for about 6 hours. After cooling, the reaction solution was extracted by adding water (500 mL) and ethyl acetate (200 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate Compound 111-f (white solid, 22 g, yield: 68%).

ESI-LCMS: $[M+H]^+$: $C_{64}H_{52}N_4O$. 892.4001.

$^1H$-NMR (400 MHz, $CDCl_3$): 7.98 (d, 1H), 7.69 (s, 1H), 7.54 (d, 1H), 7.39 (t, 2H), 7.27 (t, 1H), 7.29 (d, 8H), 7.08 (m, 18H), 6.99 (s, 1H), 6.83 (s, 1H), 6.73 (d, 2H), 6.63 (s, 1H), 1.32 (s, 9H).

13-7. Synthesis of Compound 111

In an argon atmosphere, in a 1 L flask, Intermediate Compound 111-f (22 g, 25 mmol) was dissolved in 400 mL of o-dichlorobenzene and cooled to about 0° C. in an ice water bath. $BBr_3$ (5 eq) was added dropwise slowly to the reaction solution, and the reaction solution was slowly heated to room temperature and then stirred for about 20 minutes. The reaction solution was heated to about 150° C. and then stirred for about 12 hours. After cooling, triethylamine (5 mL) was slowly added dropwise to stop the reaction, and the solvent was removed under reduced pressure to obtain a solid. The solid thus obtained was washed with MeOH, and then purified and separated by silica gel column chromatography utilizing $CH_2Cl_2$ and hexane as eluent to obtain Compound 111 (yellow solid, 2.6 g, yield: 12%).

ESI-LCMS: $[M+H]^+$: $C_{64}H_{46}N_{40}B_2$. 908.3698.

$^1H$-NMR (400 MHz, $CDCl_3$): 10.46 (s, 1H), 10.22 (s, 2H), 7.96 (d, 1H), 7.72 (s, 1H), 7.42 (d, 1H), 7.23 (t, 1H), 7.24 (d, 8H), 7.02 (m, 16H), 6.92 (s, 1H), 6.83 (s, 1H), 6.73 (d, 2H), 6.63 (s, 1H), 1.32 (s, 9H).

14. Synthesis of Compound 120

Compound 120 according to an example may be synthesized by, for example, the acts shown in Reaction Scheme 14 below:

Reaction Scheme 14

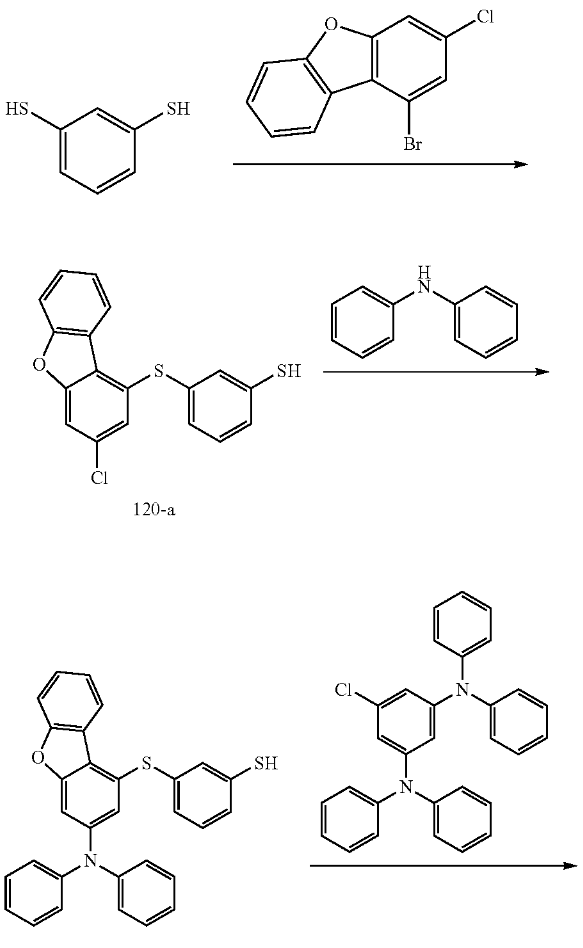

120-a 120-b

-continued

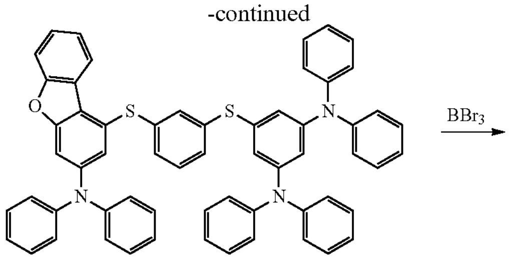

120-c

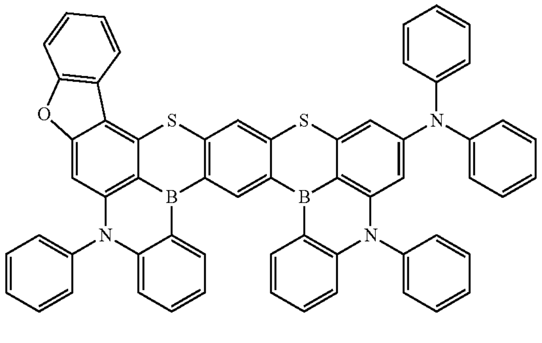

120

14.1 Synthesis of Intermediate Compound 120-a

In an argon atmosphere, in a 2 L flask, benzene-1,3-dithiol (50 g, 350 mmol), 1-bromo-3-chloro-dibenzofuran (49 g, 175 mmol), CuI (33 g, 175 mmol), and picolinic acid (22 g, 175 mmol) were added and dissolved in 800 mL of DMF, and the reaction solution was then stirred at about 180° C. for about 12 hours. After cooling, the reaction solution was poured into water (1 L), and the resulting solid was filtered. The obtained solid was dissolved again with $CH_2Cl_2$ and then washed with water several times to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate Compound 120-a (dark brown solid, 30 g, yield: 51%).

ESI-LCMS: $[M+H]^+$: $C_{18}H_{12}C_1S_2O$. 341.8783.

$^1$H-NMR (400 MHz, $CDCl_3$): 8.01 (d, 1H), 7.54 (d, 1H), 7.39 (t, 2H), 7.17 (m, 4H), 6.92 (m, 2H).

14-2. Synthesis of Intermediate Compound 120-b

In an argon atmosphere, in a 1 L flask, Intermediate Compound 120-a (30 g, 87 mmol), diphenylamine (14.8 g, 87 mmol), tris-tert-butyl phosphine (4.0 mL, 8.6 mmol), and $Pd_2dba_3$ (4.0 g, 4.3 mmol) were added and dissolved in 400 mL of o-xylene, and the reaction solution was then stirred at about 140° C. for about 6 hours. After cooling, the reaction solution was extracted by adding water (500 mL) and ethyl acetate (200 mL) to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate Compound 120-b (dark brown solid, 30 g, yield: 72%).

ESI-LCMS: $[M+H]^+$: $C_{30}H_{22}NOS_2$. 475.0938.

$^1$H-NMR (400 MHz, $CDCl_3$): 8.01 (d, 1H), 7.77 (s, 1H), 7.54 (d, 1H), 7.39 (m, 10H), 7.17 (m, 6H), 6.92 (m, 1H).

14-3. Synthesis of Intermediate Compound 120-c

In an argon atmosphere, in a 2 L flask, Intermediate Compound 120-b (28 g, 33 mmol), 5-chloro-$N^1$,$N^1$,$N^3$,$N^3$-tetraphenylbenzene-1,3-diamine (26.4 g, 59 mmol), CuI (11.2 g, 59 mmol), and $Pd_2dba_3$ (7.2 g, 59 mmol) were added and dissolved in 500 mL of DMF, and the reaction solution was then stirred at about 180° C. for about 12 hours. After cooling, the reaction solution was poured into water (1 L), and the resulting solid was filtered. The obtained solid was dissolved again with $CH_2Cl_2$ and then washed with water several times to collect organic layers, and the organic layers were dried over $MgSO_4$ and then filtered. In the filtrate, the solvent was removed under reduced pressure to obtain a solid. The solid thus obtained was purified and separated by silica gel column chromatography utilizing $CH_2Cl_2$ and hexane as eluent to obtain Intermediate Compound 120-c (white solid, 33 g, yield: 64%).

ESI-LCMS: $[M+H]^+$: $C_{60}H_{43}N_3S_2O$. 885.2738.

$^1$H-NMR (400 MHz, $CDCl_3$): 8.01 (d, 1H), 7.77 (s, 1H), 7.55 (d, 1H), 7.43 (t, 2H), 7.22 (m, 14H), 7.15 (m, 22H), 6.87 (s, 1H), 6.63 (s, 1H).

14-4. Synthesis of Compound 120

In an argon atmosphere, in a 1 L flask, Intermediate Compound 120-c (30 g, 34 mmol) was dissolved in 400 mL of o-dichlorobenzene and cooled to about 0° C. in an ice water bath. $BBr_3$ (5 eq) was added dropwise slowly to the reaction solution, and the reaction solution was slowly heated to room temperature and then stirred for about 20 minutes. The reaction solution was heated to about 150° C. and then stirred for about 12 hours. After cooling, triethylamine (5 mL) was slowly added dropwise to stop the reaction, and the solvent was removed under reduced pressure to obtain a solid. The solid thus obtained was washed with MeOH, and then purified and separated by silica gel column chromatography utilizing $CH_2Cl_2$ and hexane as eluent to obtain Compound 120 (yellow solid, 1.8 g, yield: 6%).

ESI-LCMS: $[M+H]^+$: $C_{60}H_{38}N_3S_2OB_2$. 885.2738.

$^1$H-NMR (400 MHz, $CDCl_3$): 10.22 (s, 1H), 9.53 (d, 2H), 8.01 (d, 1H), 7.77 (s, 1H), 7.55 (d, 1H), 7.43 (t, 2H), 7.21 (m, 12H), 7.11 (m, 22H), 6.87 (s, 1H), 6.63 (s, 1H).

2. Manufacture and Evaluation of Light Emitting Device (Manufacture of Light Emitting Device)

The light emitting device of an embodiment including the condensed cyclic compound of an example in an emission layer was manufactured as follows. Compound 1, Compound 2, Compound 3, Compound 9, Compound 21, Compound 37, Compound 47, Compound 61, Compound 71, Compound 74, Compound 81, Compound 84, Compound 111 and Compound 120 as described above were utilized as dopant materials of the emission layers to manufacture the light emitting devices of Examples 1 to Example 14, respectively.

Comparative Example Compounds C1 to C4 were utilized as dopant materials of the emission layers to manufacture the light emitting devices of Comparative Examples 1 to 4, respectively.

Example Compounds and Comparative Example Compounds utilized to manufacture the devices are shown below:
Example Compound
1
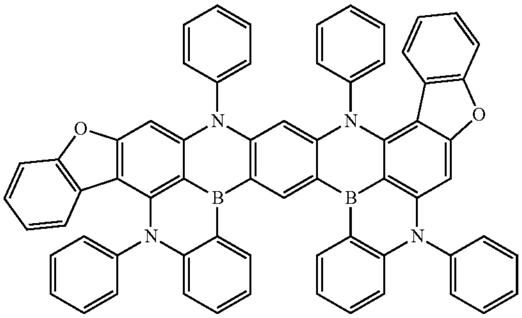
2
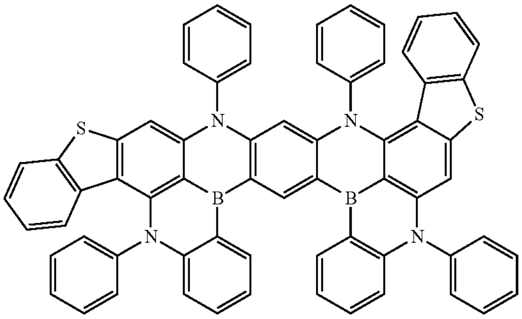
3
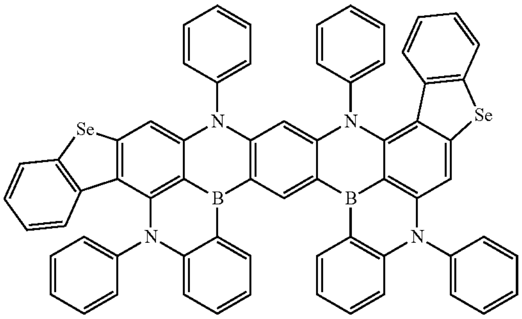
9
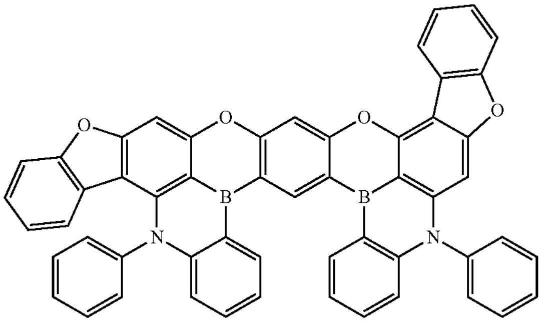
-continued
21
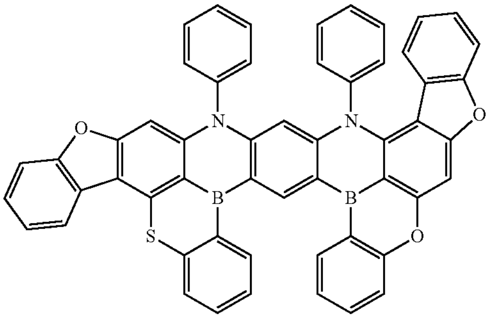
37
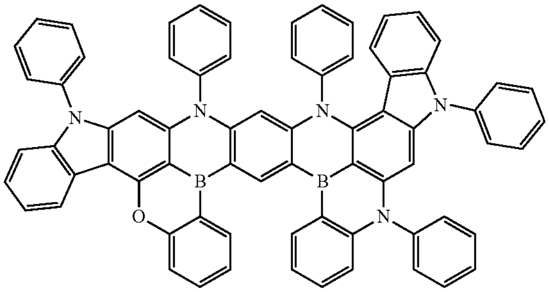
47
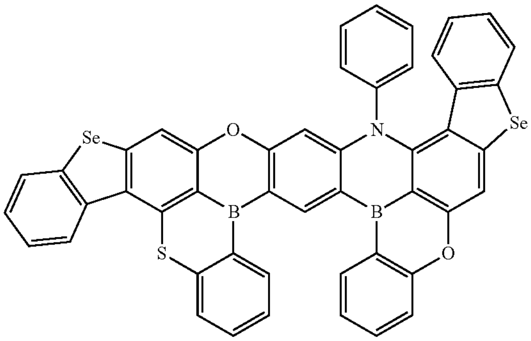
61
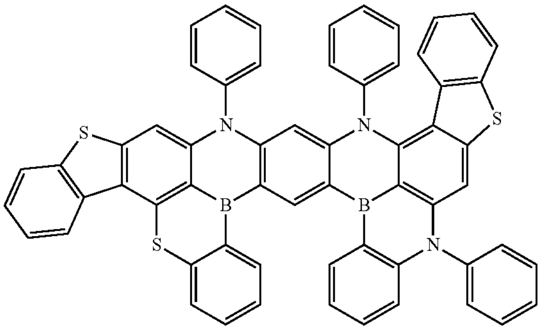

-continued
71
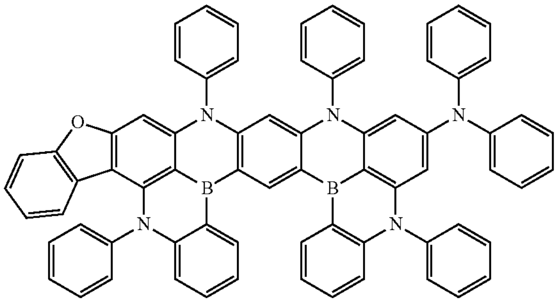
74
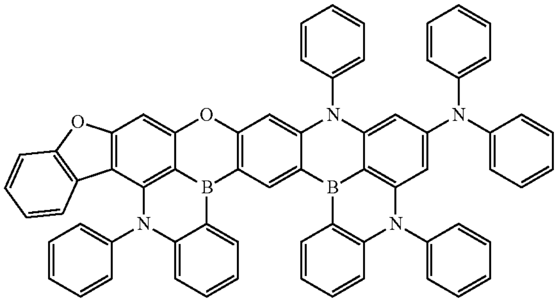
81
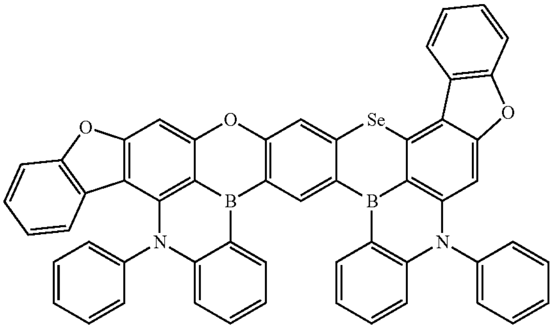
84
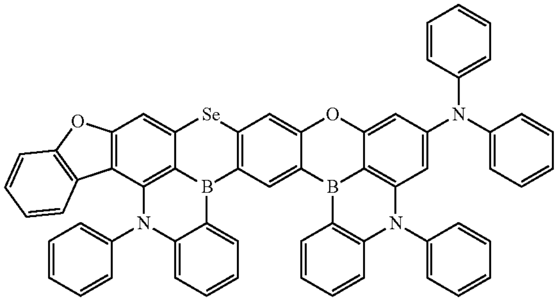
-continued
111
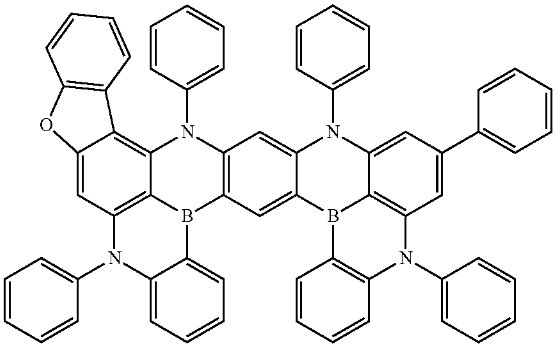
120
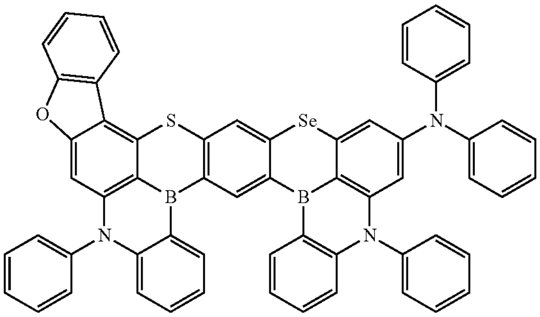
Comparative Example Compound
C1
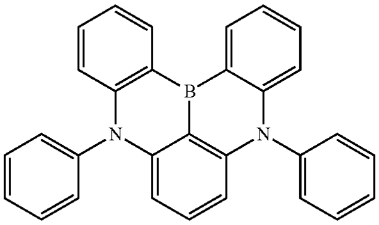
C2
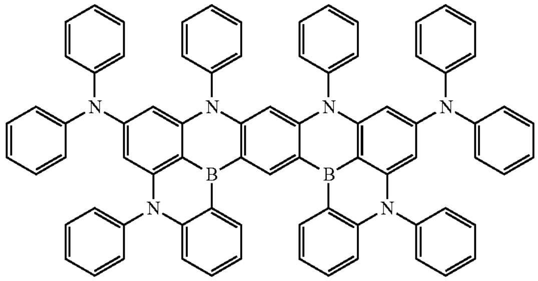
C3
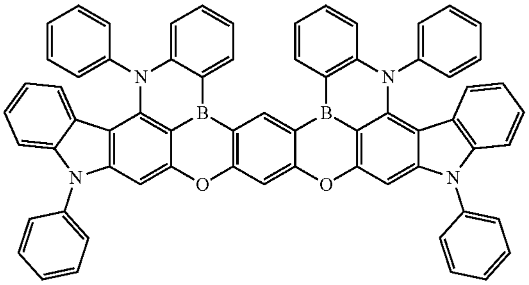

-continued
C4
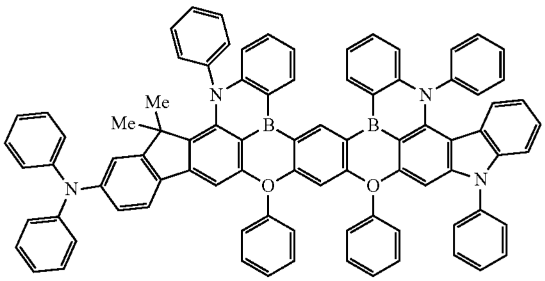
Other Compounds Utilized to Manufacture Devices
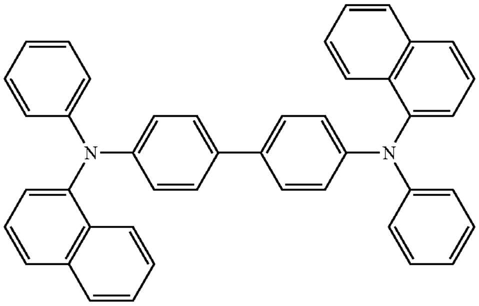
NPD
HT6
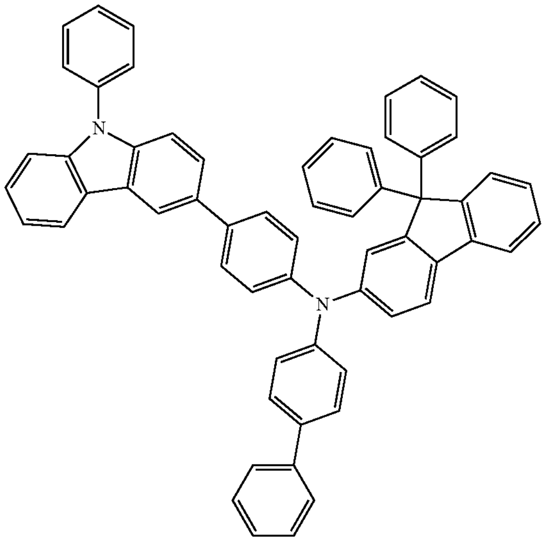
-continued
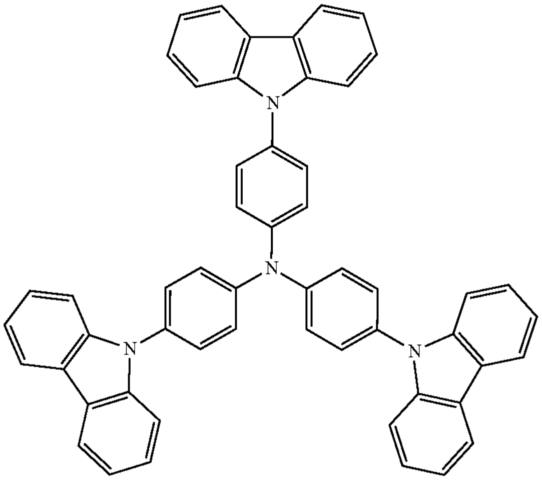
TCTA
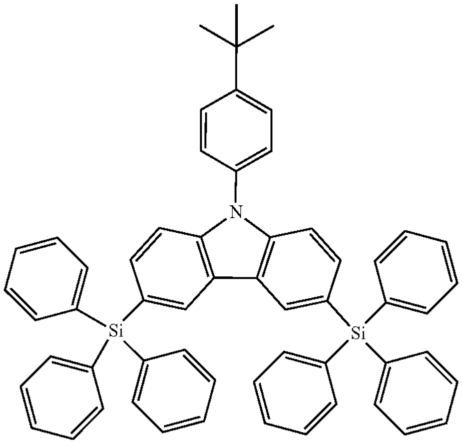
CzSi
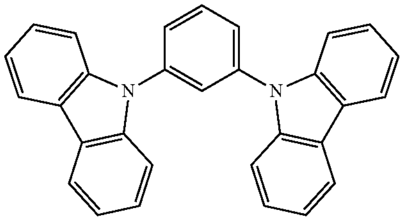
mCP
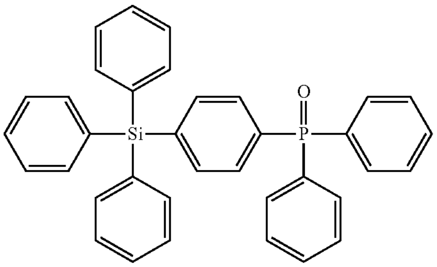
TSPO1

-continued

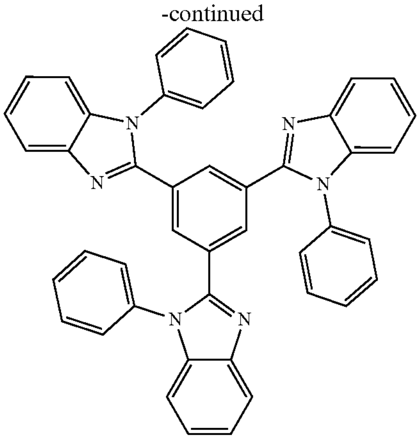

TPBi

P4

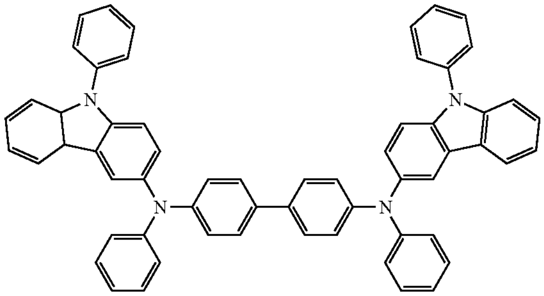

A glass substrate on which ITO had been patterned was washed, NPD was deposited to form a 300 Å-thick hole injection layer, and then HT6 was deposited to form a 200 Å-thick hole transport layer. CzSi was deposited in vacuum on the hole transport layer to form a 100 Å-thick emission-auxiliary layer.

Thereafter, mCP and Example Compounds or mCP and Comparative Example Compounds were co-deposited at a weight ratio of about 99:1 to form a 200 Å-thick emission layer.

Then, TSPO1 was deposited to form a 200 Å-thick electron transport layer, TPBi was deposited to form a 300 Å-thick buffer layer, and then LiF was deposited to form a 10 Å-thick electron injection layer.

Then, Al was provided to form a 3000 Å-thick second electrode. P4 was deposited in vacuum on the upper portion of the second electrode to form a 700 Å-thick capping layer.

Evaluation of Light Emitting Device Characteristics

Evaluation results of the light emitting devices of Examples 1 to 14 and Comparative Examples 1 to 4 are listed in Table 1. Driving voltage, luminous efficiency, and a relative device service life ratio of each of the manufactured light emitting devices are listed in comparison in Table 1. The evaluation results of the characteristics for Examples and Comparative Examples listed in Table 1 show the driving voltage and luminous efficiency values at a current density of 10 $mA/cm^2$. Also, the relative device service life ratio ($T^{95}$) shows, as a relative numerical value in comparison with Comparative Example 1, the deterioration time from an initial luminance (100%) to 95% luminance when the device was continuously operated at a current density of 10 $mA/cm^2$.

In one or more embodiments, the light emitting devices in Table 1 include Compound HT6 as a hole transport material.

HT6

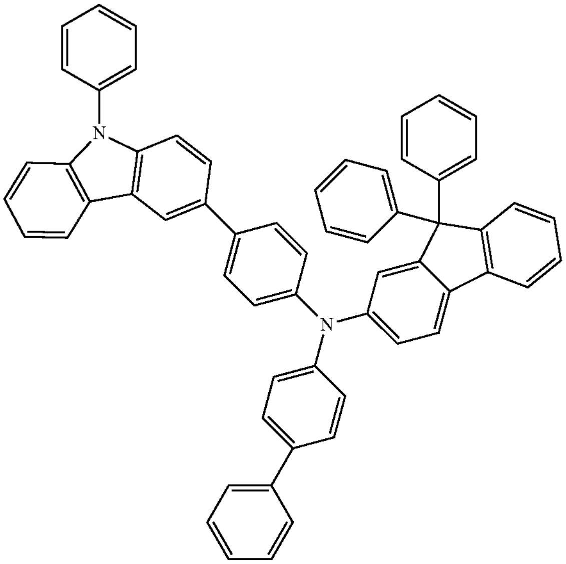

It was confirmed that the manufactured devices all show blue emission colors.

Current densities, driving voltages, and luminous efficiencies of the light emitting devices of Examples and Comparative Examples were measured in a dark room by utilizing 2400 Series Source Meter from Keithley Instruments, Inc., CS-200, Color and Luminance Meter from Konica Minolta, Inc., and PC Program LabVIEW 2.0 from Japan National Instrument, Inc., for the measurements.

TABLE 1

| Compound | Emission layer materials | Driving voltage (V) | Emitting efficiency (cd/A) | Relative device service life ratio ($T^{95}$) |
|---|---|---|---|---|
| Example 1 | Example Compound 1 | 4.2 | 28 | 4.65 |
| Example 2 | Example Compound 2 | 4.2 | 30.1 | 4.05 |
| Example 3 | Example Compound 3 | 4.1 | 32.2 | 3.45 |
| Example 4 | Example Compound 9 | 4.4 | 26.1 | 3.99 |
| Example 5 | Example Compound 21 | 4.2 | 27.7 | 3.63 |
| Example 6 | Example Compound 37 | 4.6 | 25.5 | 2.17 |
| Example 7 | Example Compound 47 | 4.5 | 29.4 | 3.04 |
| Example 8 | Example Compound 61 | 4.4 | 31.1 | 3.49 |
| Example 9 | Example Compound 71 | 4.3 | 26.7 | 4.17 |
| Example 10 | Example Compound 74 | 4.6 | 26.5 | 4.35 |
| Example 11 | Example Compound 81 | 4.4 | 27.1 | 3.77 |
| Example 12 | Example Compound 84 | 4.6 | 27.4 | 3.55 |
| Example 13 | Example Compound 111 | 4.5 | 25.5 | 4.01 |
| Example 14 | Example Compound 120 | 4.7 | 28.4 | 3.47 |
| Comparative Example 1 | Comparative Example Compound C1 | 4.8 | 15.7 | 1 |

TABLE 1-continued

| Compound | Emission layer materials | Driving voltage (V) | Emitting efficiency (cd/A) | Relative device service life ratio ($T^{95}$) |
|---|---|---|---|---|
| Comparative Example 2 | Comparative Example Compound C2 | 4.7 | 20.8 | 2.61 |
| Comparative Example 3 | Comparative Example Compound C3 | 4.9 | 22.4 | 1.61 |
| Comparative Example 4 | Comparative Example Compound C4 | 5.1 | 16.1 | 0.52 |

Referring to the results of Table 1, it may be seen that Examples of the light emitting devices utilizing the condensed cyclic compounds according to examples of the present disclosure as dopant materials exhibit low driving voltage, excellent device efficiency, and improved device service life characteristics. That is, referring to Table 1, the device driving voltage values of Examples 1 to 14 are equal to or less than those of Comparative Examples 1 to 4. The luminous efficiencies of the light emitting devices of Examples 1 to 14 are higher than those of Comparative Examples 1 to 4. It may be confirmed that the average value of the relative device service life ratio ($T^{95}$) of the light emitting devices of Examples 1 to 14 is higher than those of Comparative Examples 1 to 4.

Thus, Examples 1 to 14 show results of improving overall of the driving voltages, the luminous efficiencies and the device service lives compared to Comparative Examples 1 to 4.

The compounds of Examples 1 to 14 may each include the condensed dibenzoheterole group instead of a C—N bonding having relatively low bonding energy compared to each of Comparative Example Compounds $C_1$ to $C_4$. Thus, the compounds of Examples 1 to 14 may each have improved stability of the molecule, excellent thermal stability, and may have increased multiple resonance effects. In addition, the emission quantum efficiency of the molecule may be improved to accelerate reverse intersystem crossing. The light emitting devices of Examples 1 to 14 include the compounds of Examples 1 to 14, respectively, in the emission layers to have improved luminous efficiencies, and may have improved service lives due to excellent device stabilities.

The light emitting device of an embodiment may include the condensed cyclic compound of an embodiment, thereby exhibiting high efficiency and long service life characteristics.

Expressions such as “at least one of” or “at least one selected from” when preceding a list of elements, modify the entire list of elements and do not modify the individual elements of the list. Further, the use of “may” when describing embodiments of the present disclosure refers to “one or more embodiments of the present disclosure.”

Although the subject matter of the present disclosure has been described with reference to a preferred embodiment of the present disclosure, it will be understood that the present disclosure should not be limited to these example embodiments but various suitable changes and modifications can be made by those skilled in the art without departing from the spirit and scope of the present disclosure.

Accordingly, the technical scope of the present disclosure is not intended to be limited to the contents set forth in the detailed description of the specification, but is intended to be defined by the appended claims, and equivalents thereof.

What is claimed is:

1. A light emitting device comprising:

a first electrode;

a second electrode on the first electrode; and an emission layer between the first electrode and the second electrode and comprising a condensed cyclic compound represented by Formula 1, wherein each of the first electrode and the second electrode independently comprises Ag, Mg, Cu, Al, Pt, Pd, Au, Ni, Nd, Ir, Cr, Li, Ca, LiF/Ca, LiF/Al, Mo, Ti, W, In, Sn, Zn, a compound of two or more thereof, a mixture of two or more thereof, or an oxide thereof:

Formula 1

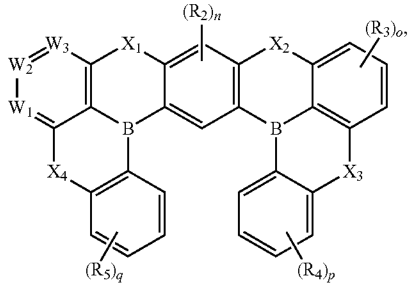

wherein, in Formula 1, $X_1$ to $X_4$ are each independently, O, S, Se, $CR_6R_7$, or $NR_8$, a substituent represented by Formula 2 is connected to adjacent two groups selected from among $W_1$, $W_2$, and $W_3$, the adjacent two groups selected from among $W_1$, $W_2$, and $W_3$ are each a carbon atom, and a remaining group thereof is $CR_1$, $R_1$ to $R_8$ are each independently a hydrogen atom, an oxygen atom, a sulfur atom, a selenium atom, a deuterium atom, a halogen atom, a cyano group, a nitro group, a substituted or unsubstituted silyl group, a substituted or unsubstituted amine group, a substituted or unsubstituted alkyl group having 1 to 30 carbon atoms, a substituted or unsubstituted alkoxy group having 1 to 30 carbon atoms, a substituted or unsubstituted aryloxy group having 1 to 30 carbon atoms, a substituted or unsubstituted aryl group having 6 to 30 ring-forming carbon atoms, a substituted or unsubstituted heteroaryl group having 2 to 30 ring-forming carbon atoms, or a substituted or unsubstituted aliphatic heterocyclic group having 2 to 30 ring-forming carbon atoms, and/or are bonded to an adjacent group to form a ring, n is an integer of 0 to 2, o is an integer of 0 to 3, and p and q are each independently an integer of 0 to 4, Formula 2

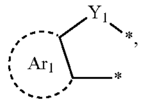

and wherein, in Formula 2, $Y_1$ is O, S, Se, $CR_{1a}R_{2a}$, or $NR_{3a}$, $Ar_1$ is a substituted or unsubstituted aromatic hydrocarbon ring having 6 to 30 ring-forming carbon atoms, or a substituted or unsubstituted aromatic heterocyclic ring having 2 to 30 ring-forming carbon atoms, $R_{1a}$, $R_{2a}$, and $R_{3a}$ are each independently a hydrogen atom, an oxygen atom, a sulfur atom, a selenium atom, a deuterium atom, a halogen atom, a cyano group, a nitro group, a substituted or unsubstituted silyl group, a substituted or unsubstituted amine group, a substituted or unsubstituted alkyl group having 1 to 30 carbon atoms, a substituted or unsubstituted alkoxy group having 1 to 30 carbon atoms, a substituted or unsubstituted aryl group having 6 to 30 ring-forming carbon atoms, or a substituted or unsubstituted heteroaryl group having 2 to 30 ring-forming carbon atoms, and/or are bonded to an adjacent group to form a ring, and —* is a position connected to the adjacent two groups selected from among $W_1$ to $W_3$ in Formula 1, wherein when o is 2 or 3, and two adjacent $R_3$ groups are bonded to form a heteroaryl group, then the condensed cyclic compound represented by Formula 1 is represented by Formula 5:

Formula 5

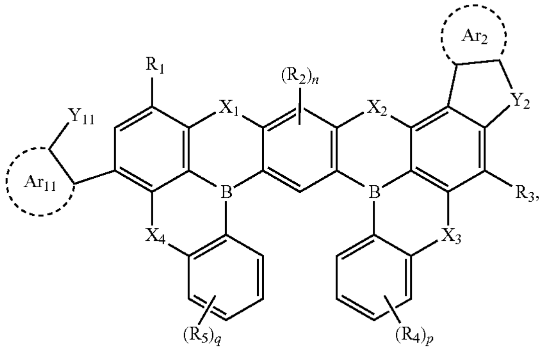

wherein, in Formula 5, $Ar_2$ is a substituted or unsubstituted aromatic hydrocarbon ring having 6 to 30 ring-forming carbon atoms, or a substituted or unsubstituted aromatic heterocyclic ring having 2 to 30 ring-forming carbon atoms, $Y_{11}$ is the same as $Y_1$ of Formula 1, and $Ar_{11}$ is the same as $Ar_1$ of Formula 1

$Y_2$ is O, S, Se, $CR_{12}R_{13}$, or $NR_{14}$, $R_{12}$ to $R_{14}$ are each independently a hydrogen atom, a deuterium atom, a halogen atom, a cyano group, a nitro group, a substituted or unsubstituted silyl group, a substituted or unsubstituted amine group, a substituted or unsubstituted alkyl group having 1 to 30 carbon atoms, a substituted or unsubstituted alkoxy group having 1 to 30 carbon atoms, a substituted or unsubstituted aryl group having 6 to 30 ring-forming carbon atoms, or a substituted or unsubstituted heteroaryl group having 2 to 30 ring-forming carbon atoms, and/or is bonded to an adjacent group to form a ring, and $X_1$ to $X_4$, $R_1$ to $R_5$, and n, p, and q are the same as defined in connection with Formula 1, and wherein, in Formula 5, when $X_1$ to $X_4$ are each independently O, S, Se, or $NR_8$, $Ar_{11}$ and $Ar_2$ are each a benzene ring, and $Y_{11}$ is $NR_{3a}$, then $Y_2$ is O, S, Se, or $CR_{12}R_{13}$, and in Formula 5, when $X_1$ to $X_4$ are each independently O, S, Se, or $NR_8$, $Ar_{11}$ and $Ar_2$ are each a benzene ring, and $Y_2$ is $NR_{14}$, then $Y_{11}$ is O, S, Se, or $CR_{1a}R_{2a}$.

2. The light emitting device of claim 1, wherein the condensed cyclic compound represented by Formula 1 is represented by Formula 3a or Formula 3b:

Formula 3a

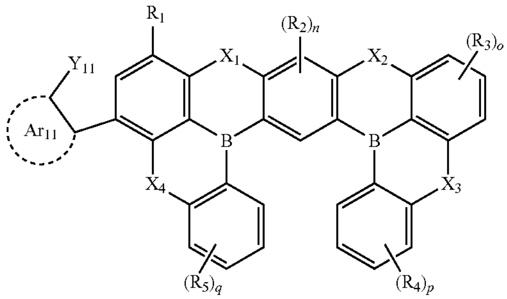

Formula 3b

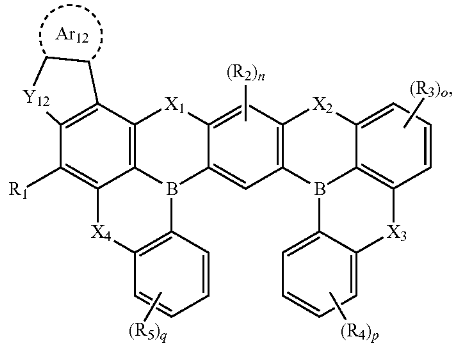

and wherein, in Formula 3a and Formula 3b, $Y_{11}$ and $Y_{12}$ are each independently O, S, Se, $CR_{1b}R_{2b}$, or $NR_{3b}$, $Ar_{11}$ and $Ar_{12}$ are each independently a substituted or unsubstituted aromatic hydrocarbon ring having 6 to 30 ring-forming carbon atoms, or a substituted or unsubstituted aromatic heterocyclic ring having 2 to 30 ring-forming carbon atoms, $R_{1b}$ to $R_{3b}$ are each independently a hydrogen atom, an oxygen atom, a sulfur atom, a selenium atom, a deuterium atom, a halogen atom, a cyano group, a nitro group, a substituted or unsubstituted silyl group, a substituted or unsubstituted amine group, a substituted or unsubstituted alkyl group having 1 to 30 carbon atoms, a substituted or unsubstituted alkoxy group having 1 to 30 carbon atoms, a substituted or unsubstituted aryl group having 6 to 30 ring-forming carbon atoms, or a substituted or unsubstituted heteroaryl group having 2 to 30 ring-forming carbon atoms, and/or are bonded to an adjacent group to form a ring, and $X_1$ to $X_4$, $R_1$ to $R_5$, and n to q are the same as defined in connection with Formula 1 and Formula 2.

3. The light emitting device of claim 2, wherein the condensed cyclic compound represented by Formula 1 is represented by Formula 4a or Formula 4b:

Formula 4a

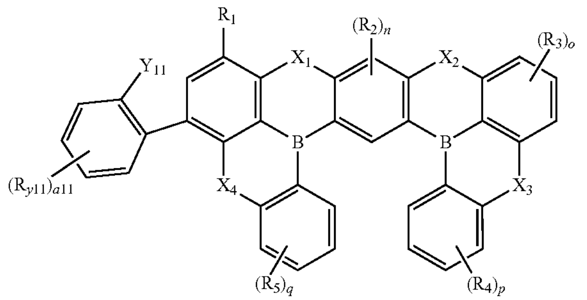

Formula 4b

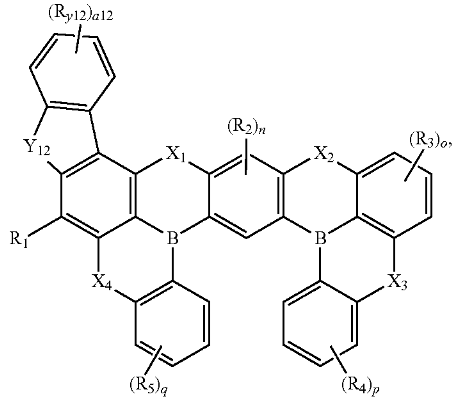

and wherein, in Formula 4a and Formula 4b, $R_{y11}$ and $R_{y12}$ are each independently a hydrogen atom, a deuterium atom, a halogen atom, a cyano group, a nitro group, a substituted or unsubstituted silyl group, a substituted or unsubstituted amine group, a substituted or unsubstituted alkyl group having 1 to 30 carbon atoms, a substituted or unsubstituted alkoxy group having 1 to 30 carbon atoms, a substituted or unsubstituted aryloxy group having 1 to 30 carbon atoms, a substituted or unsubstituted aryl group having 6 to 30 ring-forming carbon atoms, a substituted or unsubstituted heteroaryl group having 2 to 30 ring-forming carbon atoms, and/or are bonded to an adjacent group to form a ring, a11 and a12 are each independently an integer of 0 to 4, and $X_1$ to $X_4$, $Y_{11}$, $Y_{12}$, $R_1$ to $R_5$, and n to q are the same as defined in connection with Formula 1, Formula 2, Formula 3a, and Formula 3b.

4. The light emitting device of claim 2, wherein the condensed cyclic compound represented by Formula 1 is represented by Formula 5.

5. The light emitting device of claim 4, wherein $Ar_2$ is an unsubstituted benzene ring.

6. The light emitting device of claim 2, wherein the condensed cyclic compound represented by Formula 1 is represented by Formula 6a or Formula 6b:

Formula 6a

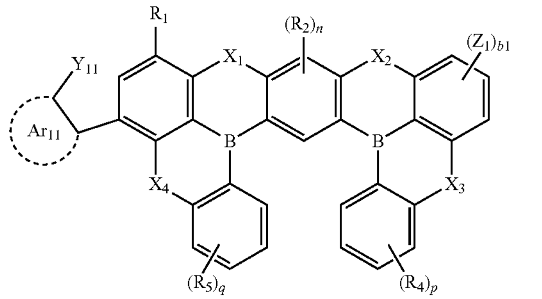

Formula 6b

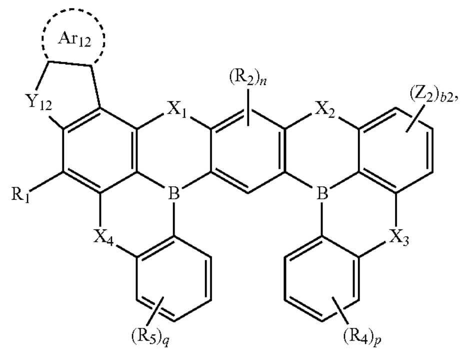

and wherein, in Formula 6a and Formula 6b, $Z_1$ and $Z_2$ are each independently a hydrogen atom, a deuterium atom, a halogen atom, a cyano group, a nitro group, a substituted or unsubstituted silyl group, a substituted or unsubstituted amine group, a substituted or unsubstituted alkyl group having 1 to 30 carbon atoms, a substituted or unsubstituted alkoxy group having 1 to 30 carbon atoms, a substituted or unsubstituted aryloxy group having 1 to 30 carbon atoms, a substituted or unsubstituted aryl group having 6 to 30 ring-forming carbon atoms, a substituted or unsubstituted heteroaryl group having 2 to 30 ring-forming carbon atoms, or a substituted or unsubstituted aliphatic heterocyclic group having 2 to 30 ring-forming carbon atoms, $b_1$ and $b_2$ are each independently an integer of 0 to 3, and $X_1$ to $X_4$, $Y_{11}$, $Y_{12}$, $R_1$, $R_2$, $R_4$, $R_5$, $Ar_{11}$, $Ar_{12}$, n, p, and q are the same as defined in connection with Formula 1, Formula 2, Formula 3a, and Formula 3b.

7. The light emitting device of claim 6, wherein at least one of $Ar_{11}$ or $Ar_{12}$ is a substituted or unsubstituted benzene ring.

8. The light emitting device of claim 1, wherein $R_2$ is a hydrogen atom.

9. The light emitting device of claim 1, wherein the emission layer is to emit thermally activated delayed fluorescence.

10. The light emitting device of claim 1, wherein the emission layer comprises a host and a dopant, and the dopant comprises the condensed cyclic compound.

11. The light emitting device of claim 1, further comprising a capping layer on the second electrode, wherein the capping layer has a refractive index of about 1.6 or more.

12. The light emitting device of claim 1, wherein the emission layer is to emit blue light having a center wavelength of about 450 nm to about 470 nm.

13. The light emitting device of claim 1, wherein the emission layer comprises at least one selected from among compounds of Compound Group 1:
Compound Group 1
1
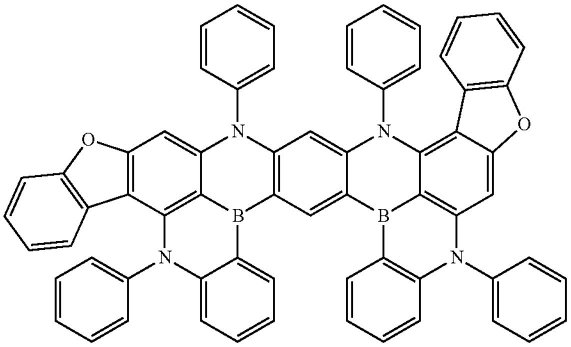
2
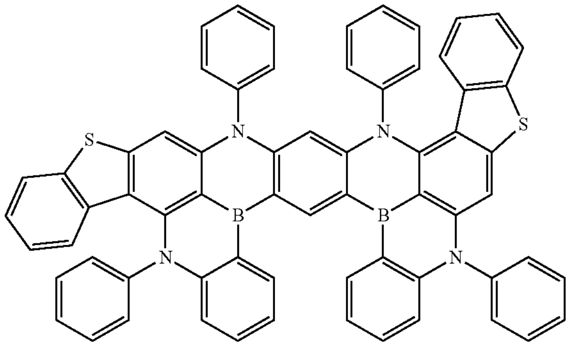
3
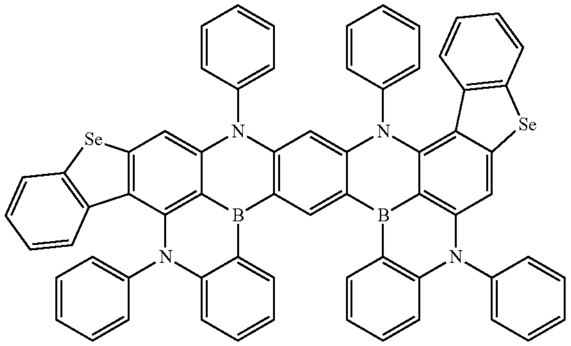
4
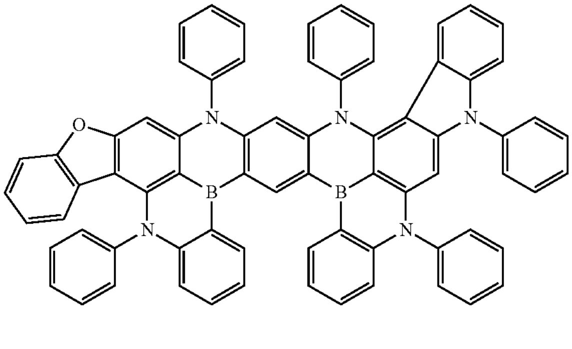
-continued
5
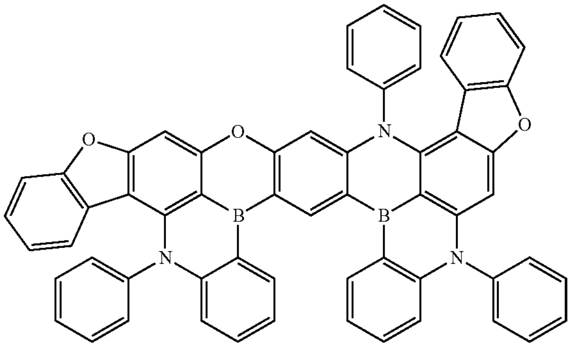
6
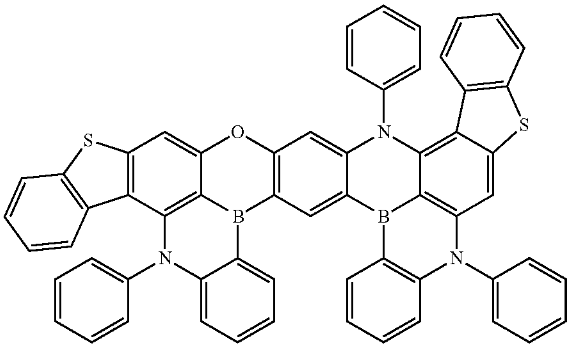
7
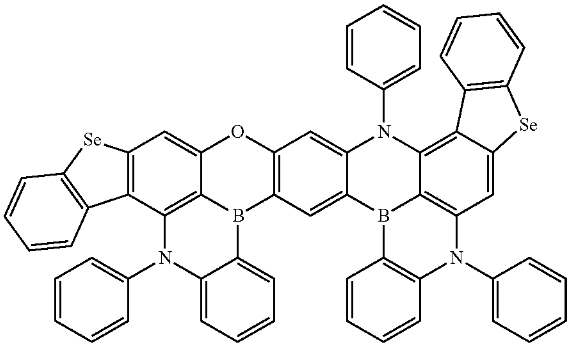
8
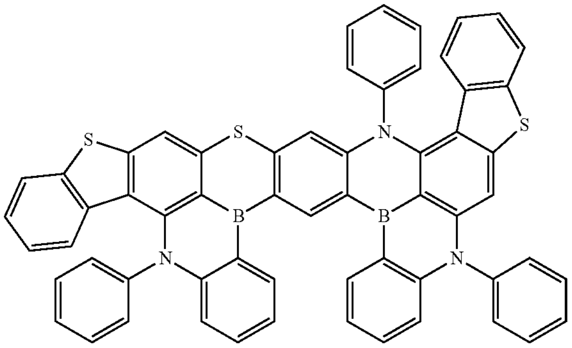

-continued
9
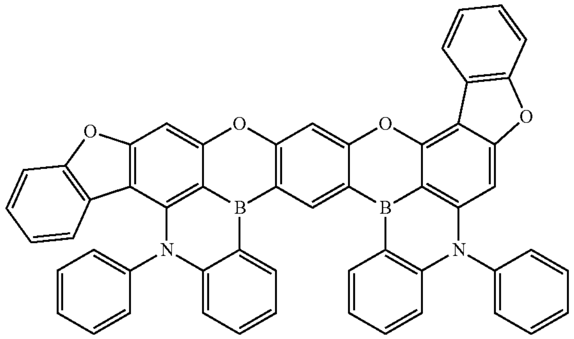
10
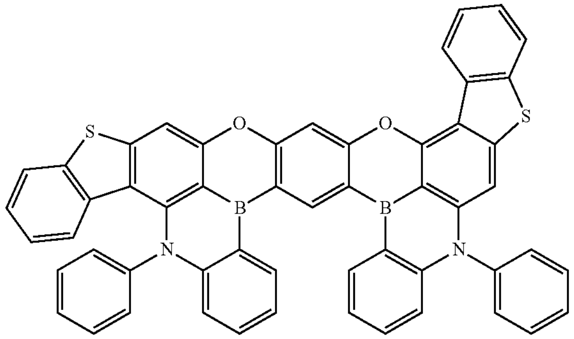
11
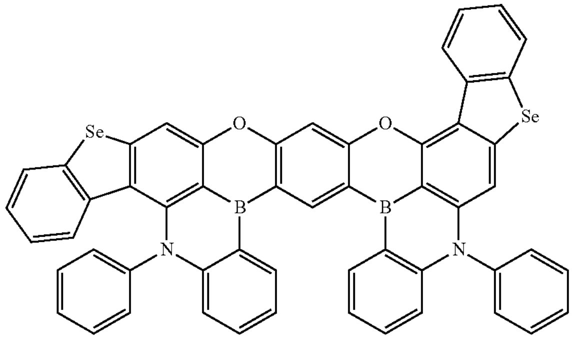
12
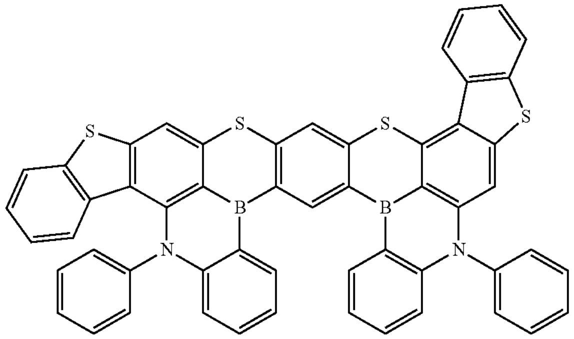
-continued
13
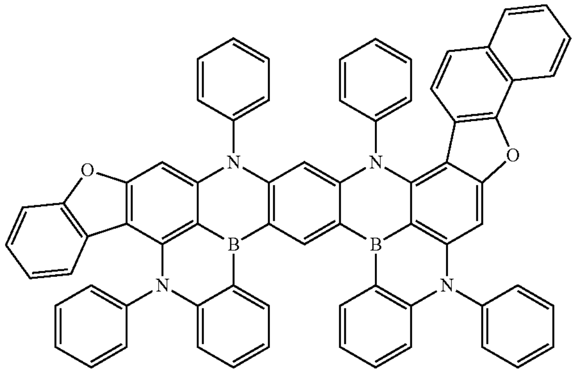
14
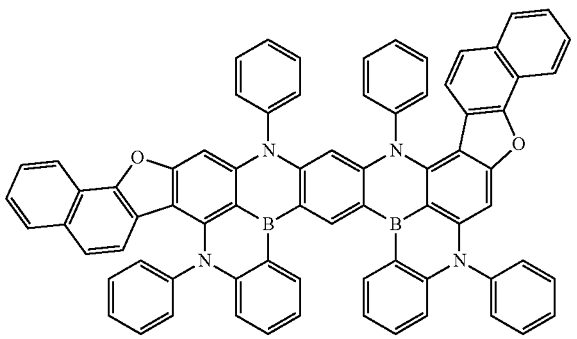
15
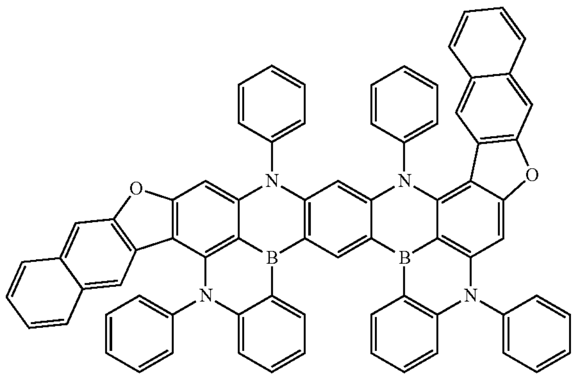
16
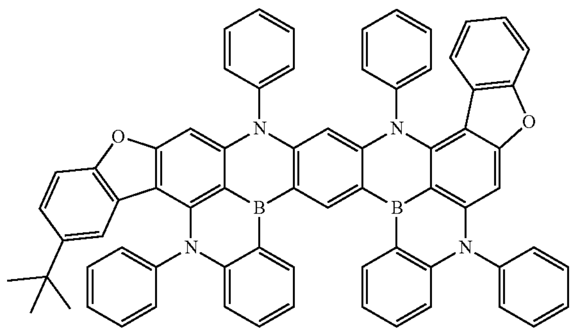

-continued
17
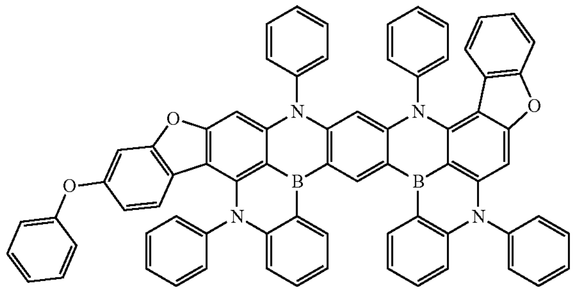
18
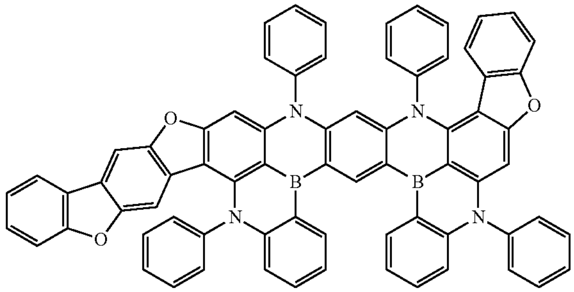
19
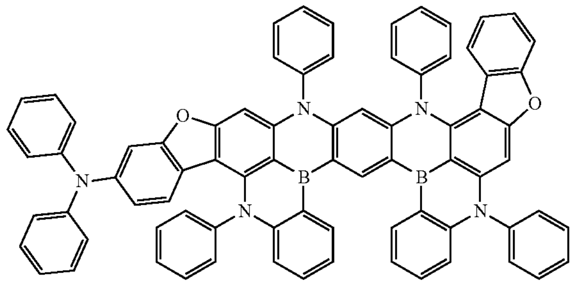
20
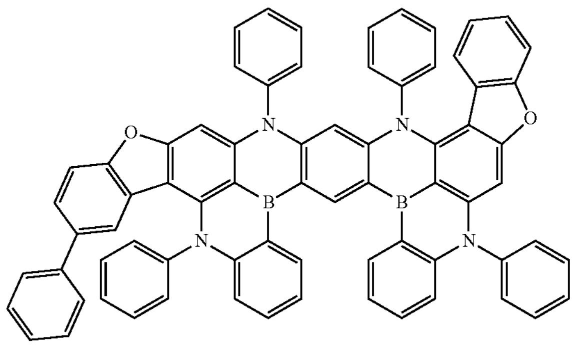
-continued
21
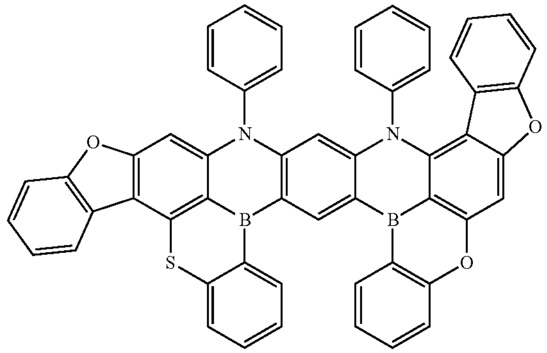
22
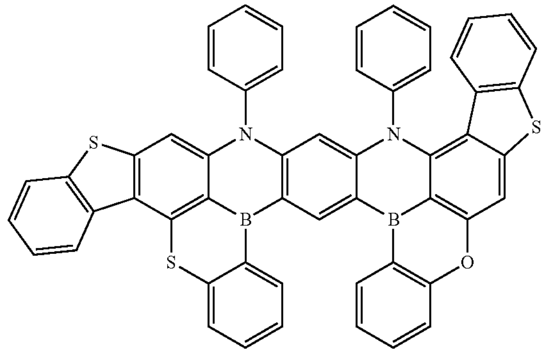
23
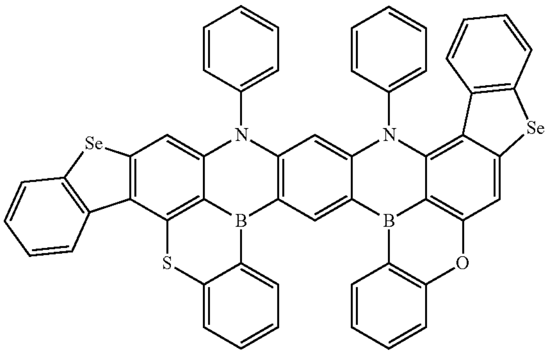
24
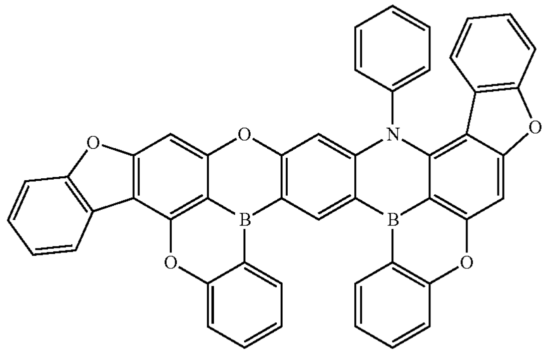

-continued
25
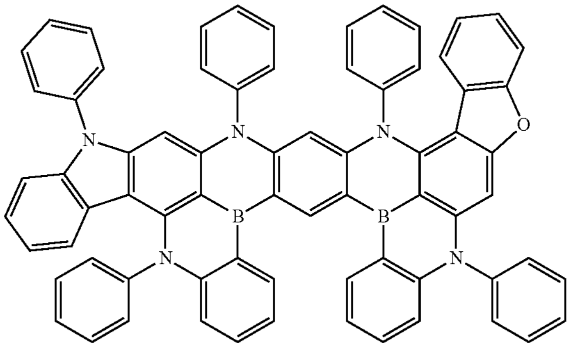
26
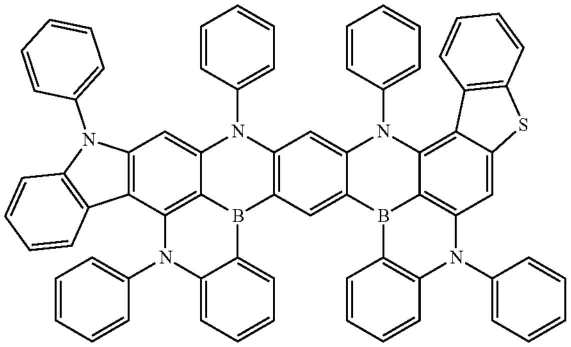
27
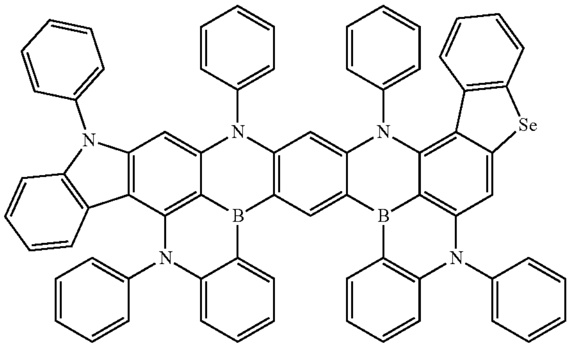
29
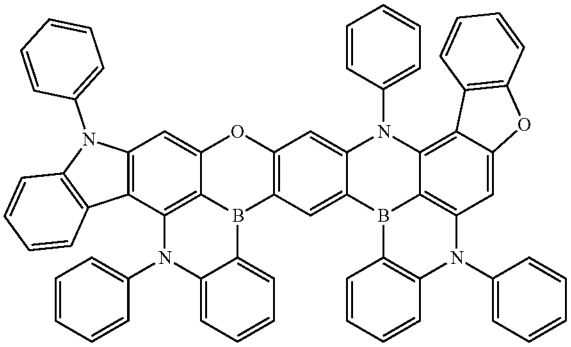
-continued
30
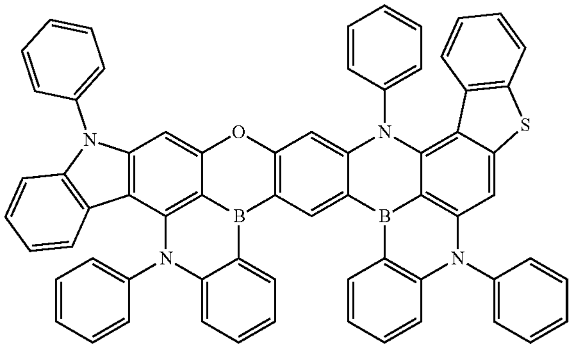
31
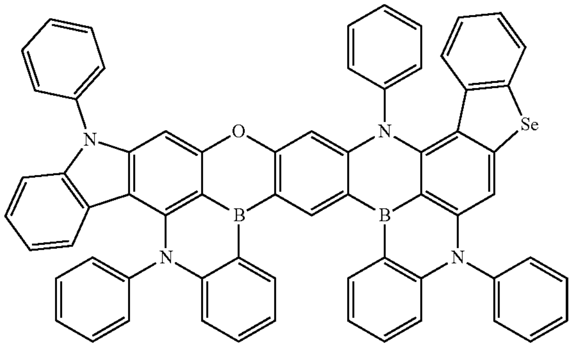
33
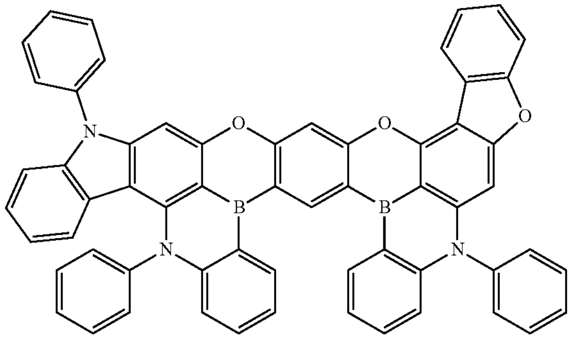
34
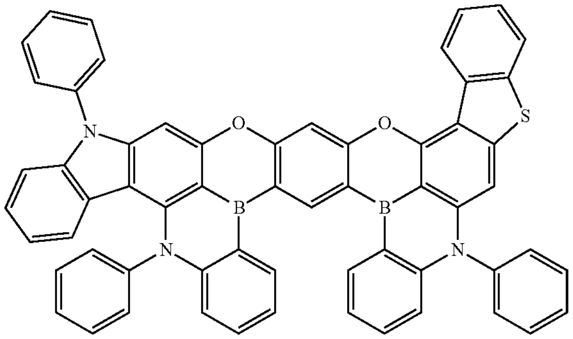

-continued
35
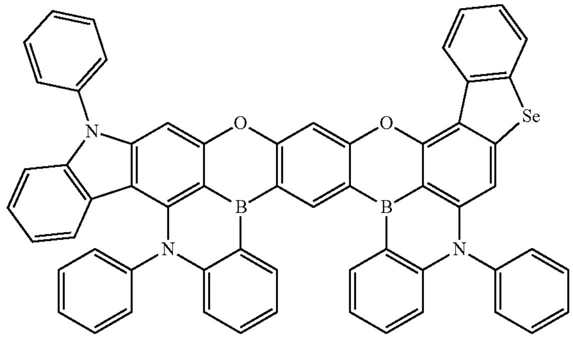
43
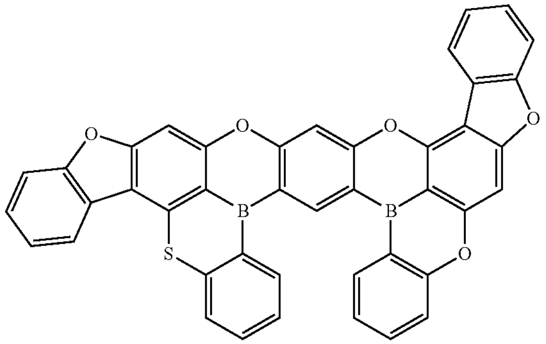
44
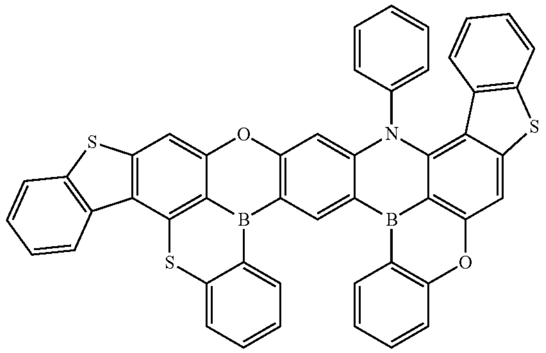
45
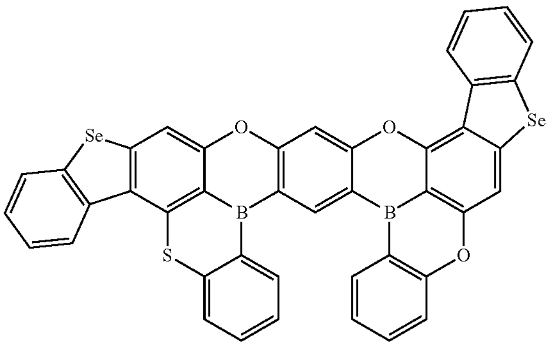
-continued
46
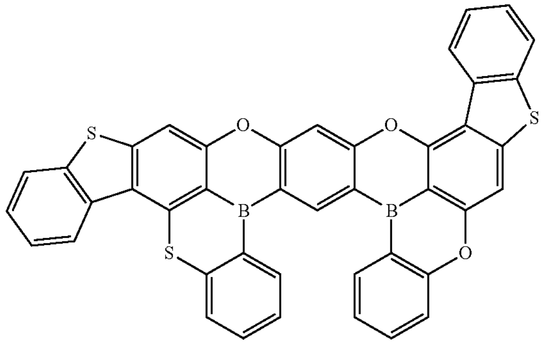
47
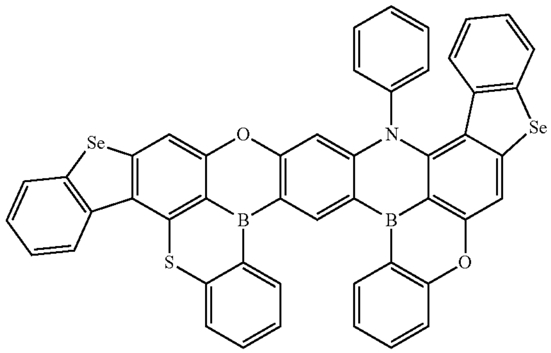
48
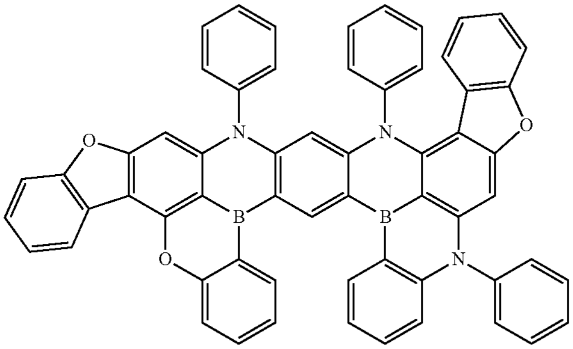
49
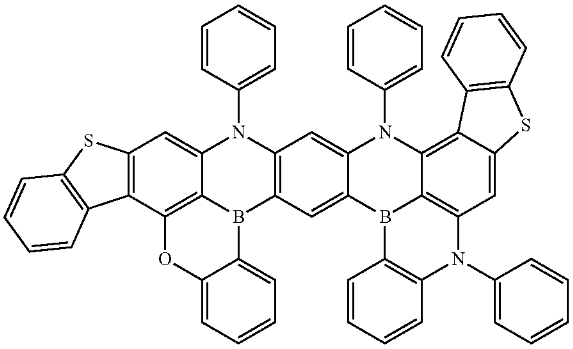

-continued
50
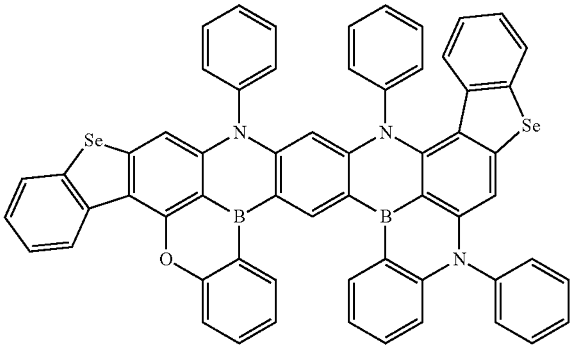
51
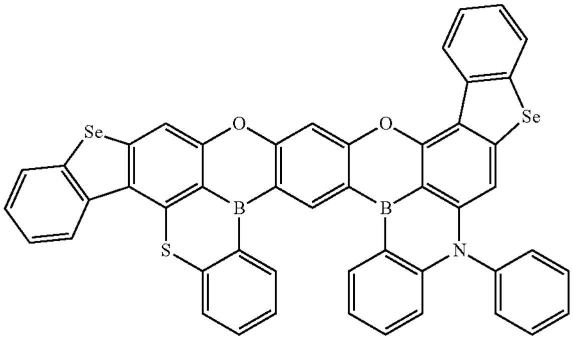
52
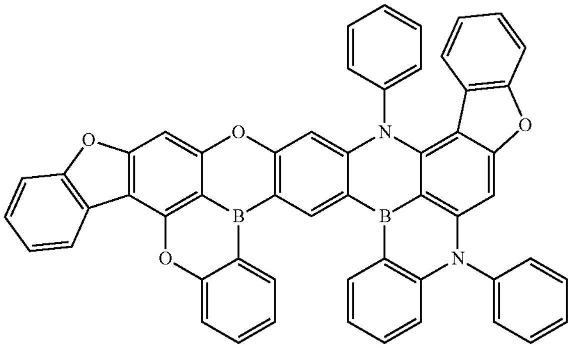
53
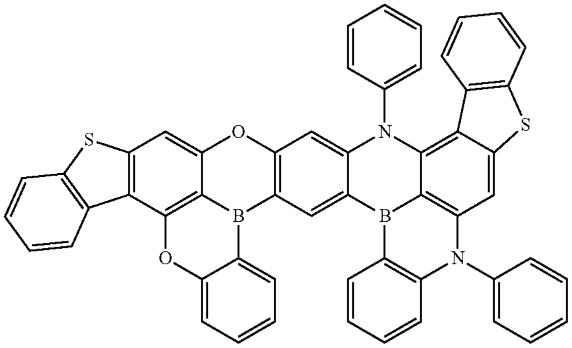
-continued
54
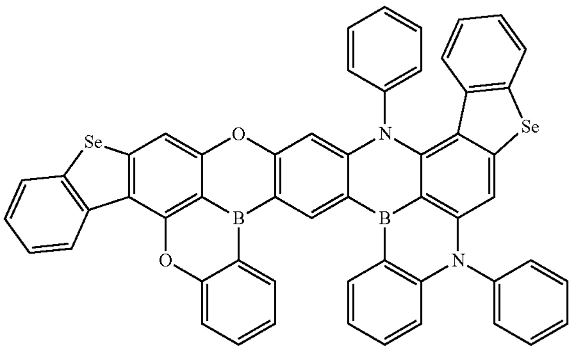
55
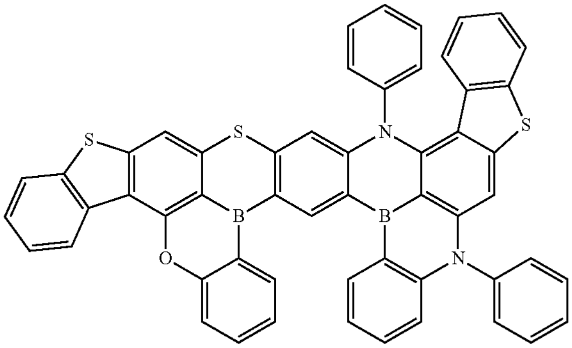
56
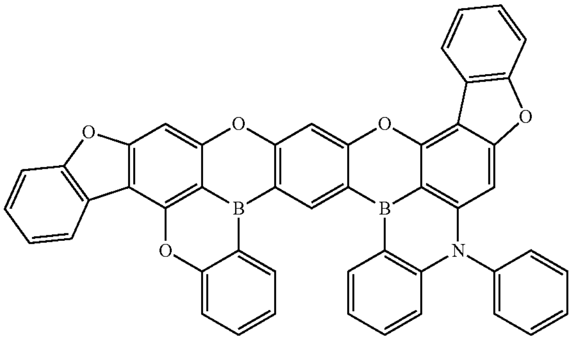
57
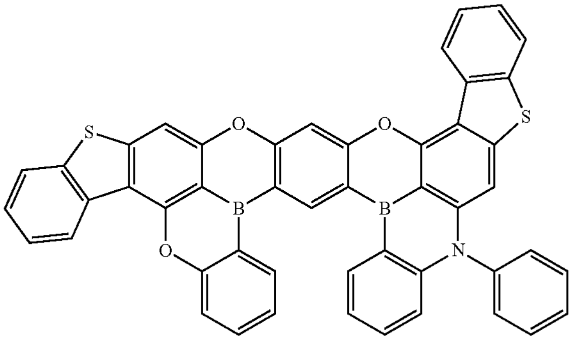

-continued
58
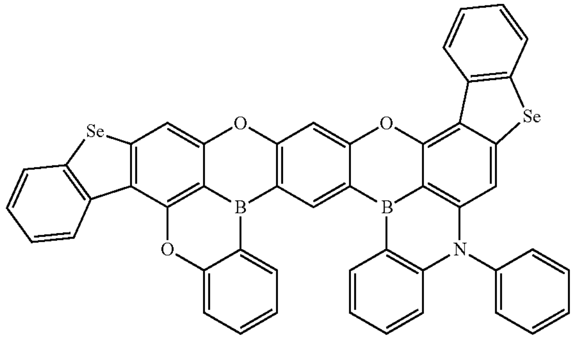
59
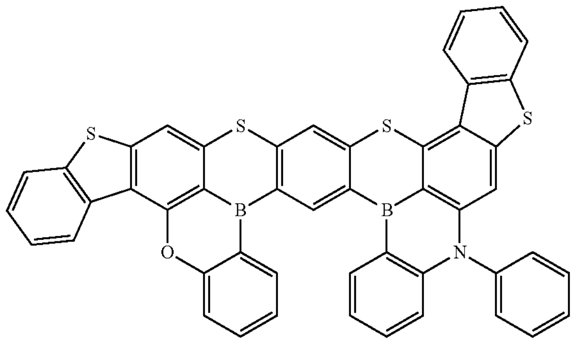
60
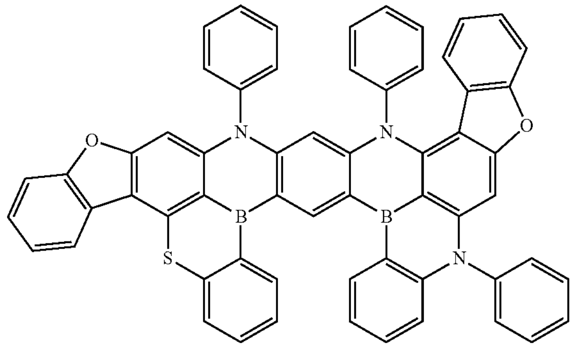
61
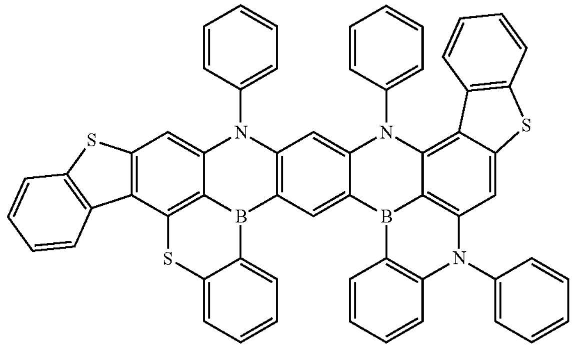
-continued
62
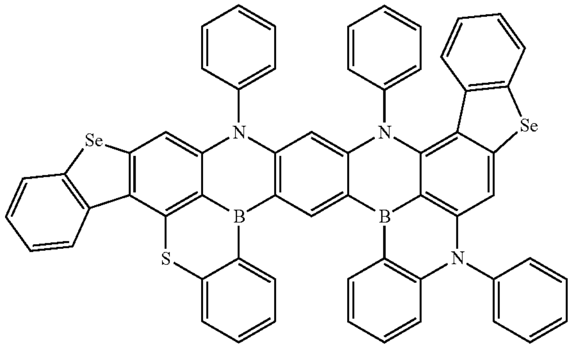
63
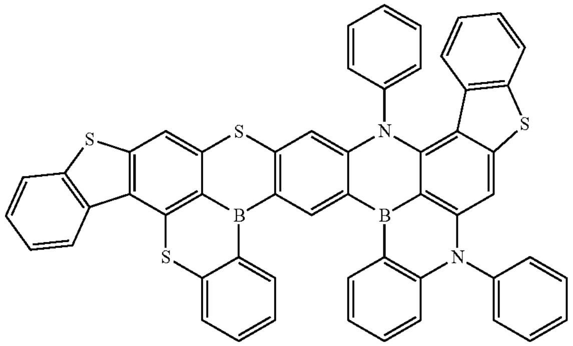
64
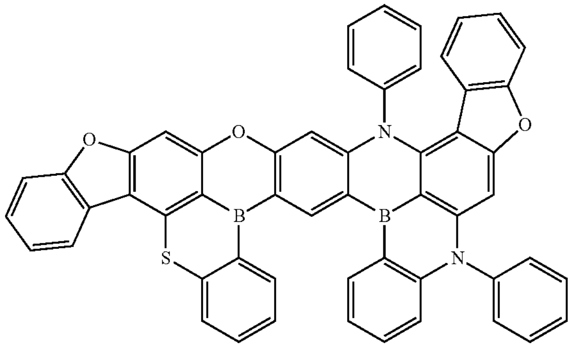
65
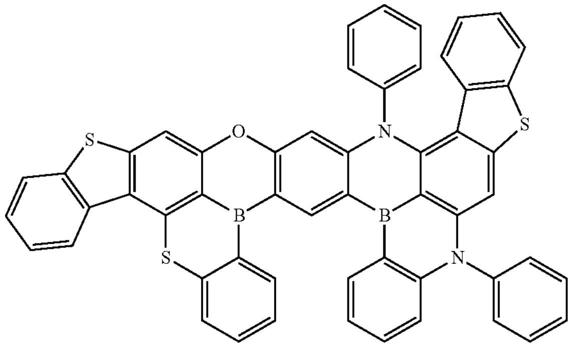

-continued
66
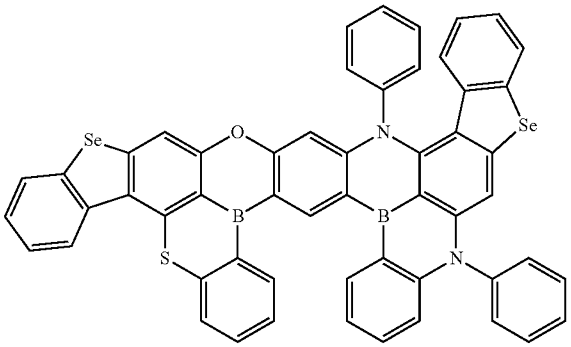
67
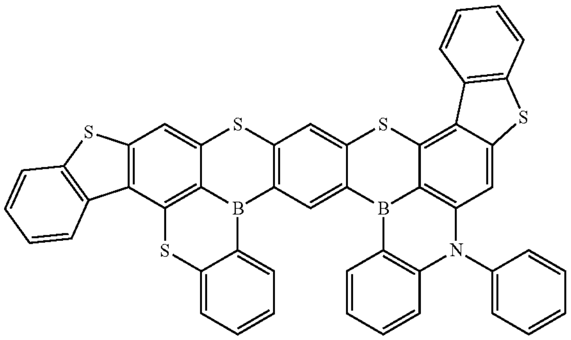
68
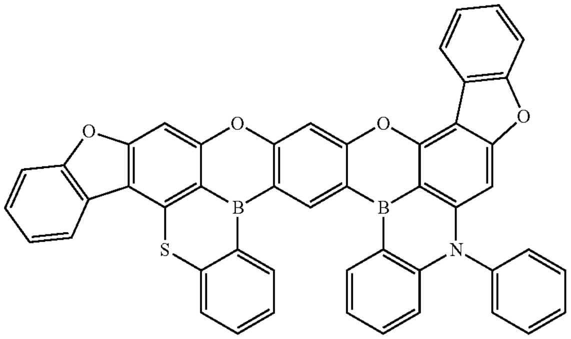
69
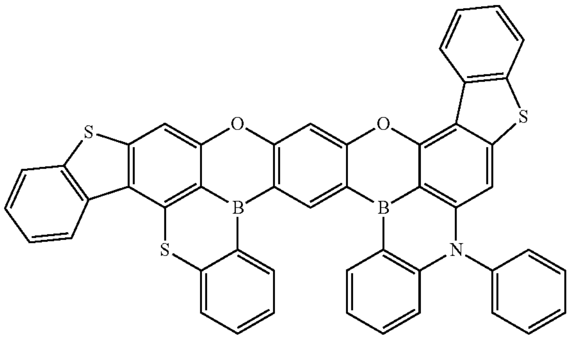
-continued
70
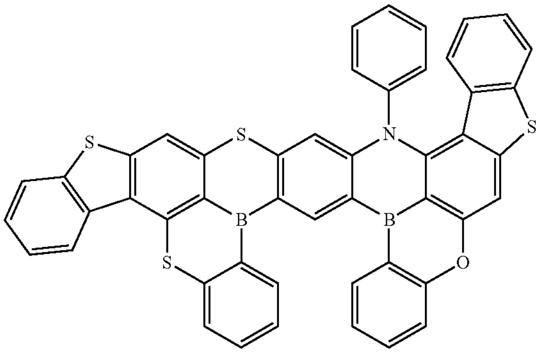
71
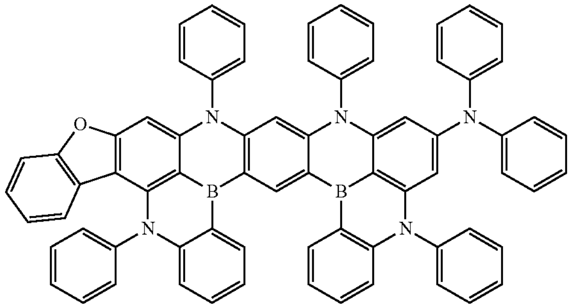
72
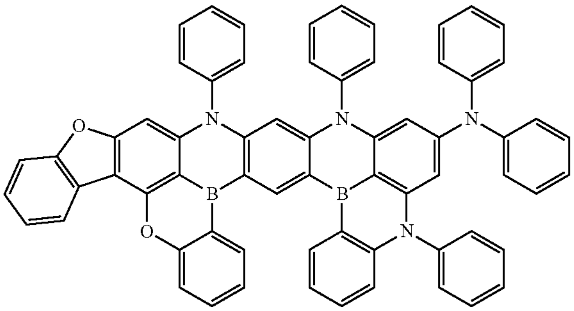
73
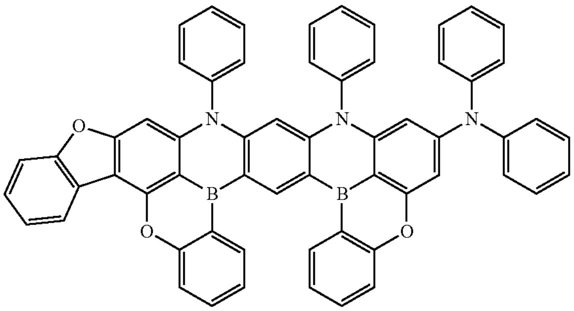

-continued
74
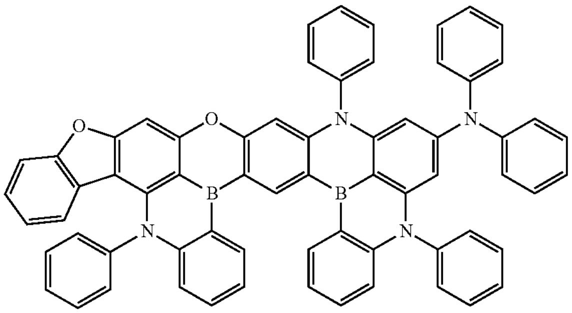
75
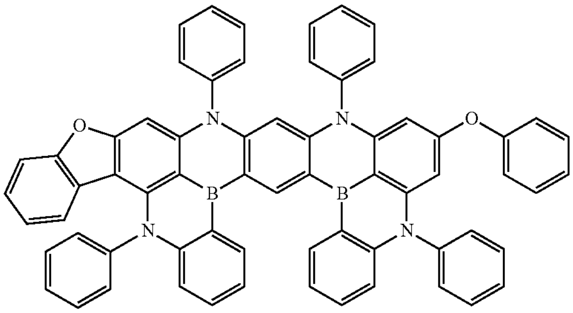
76
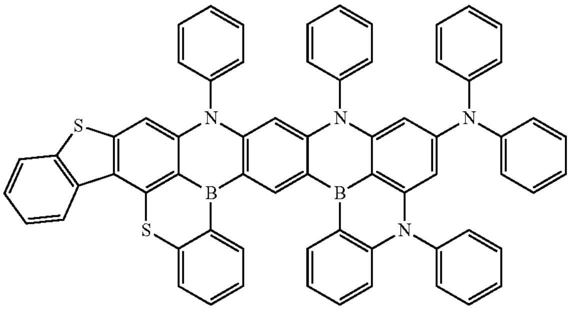
77
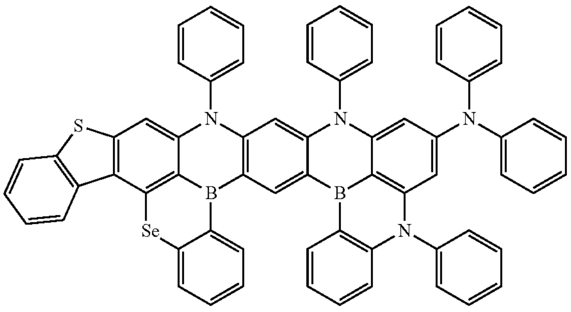
-continued
78
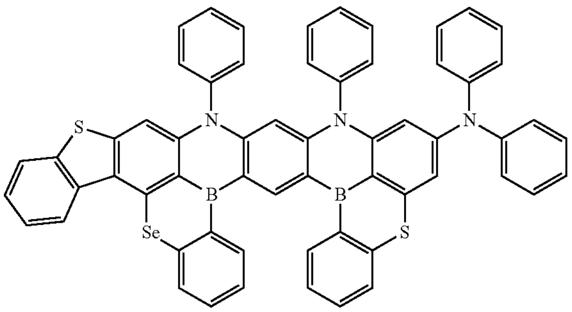
79
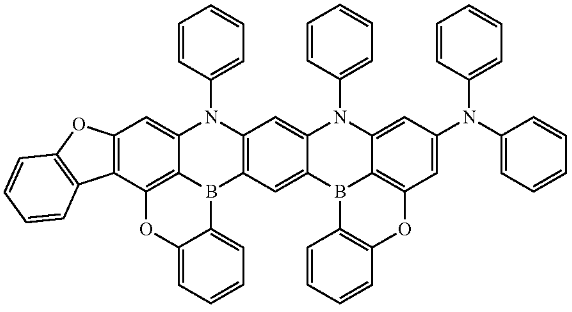
80
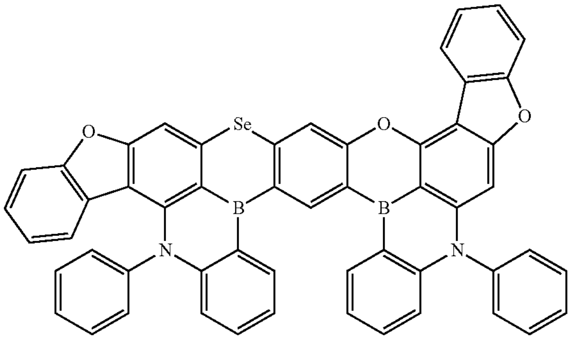
81
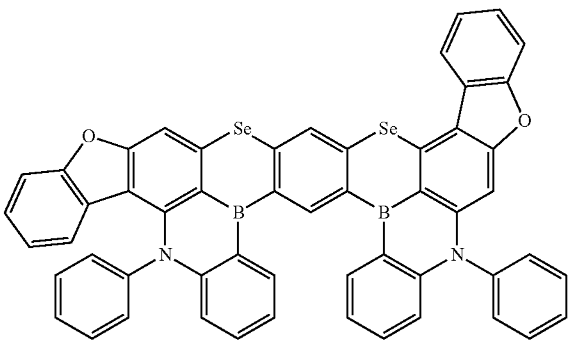

82
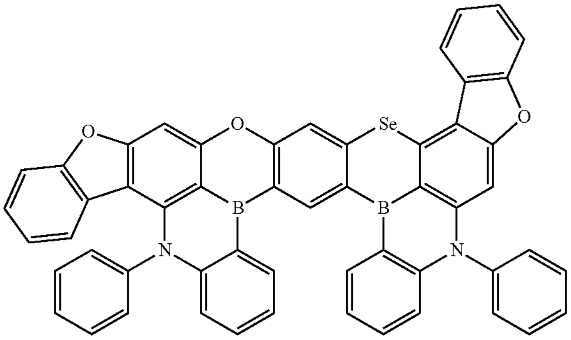
83
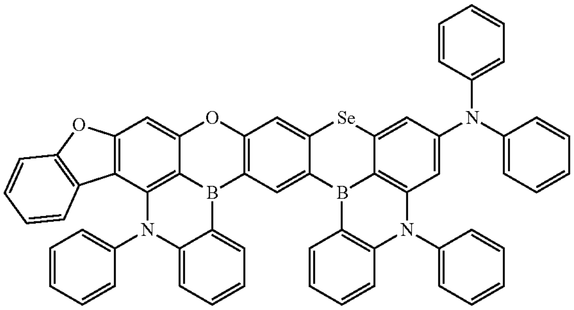
84
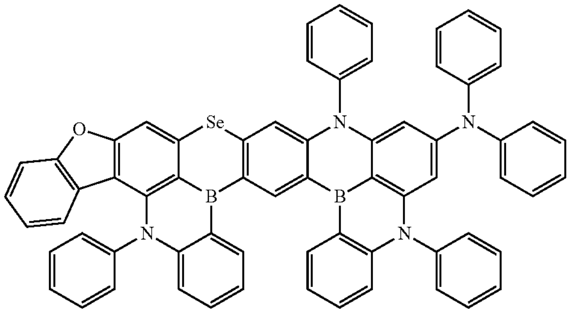
85
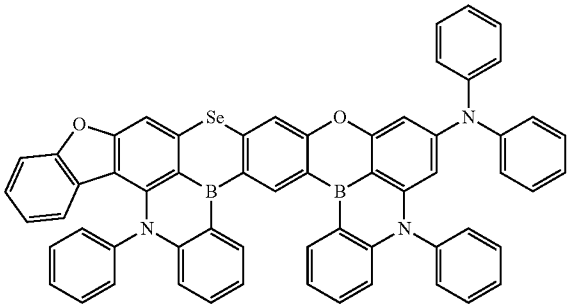
86
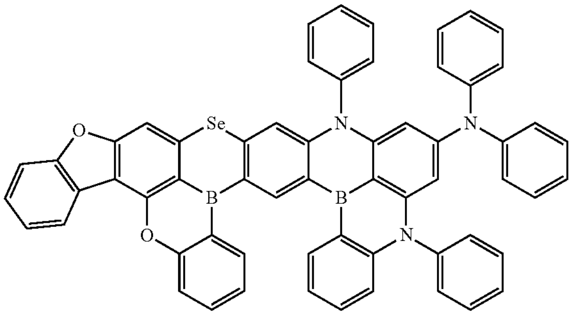
87
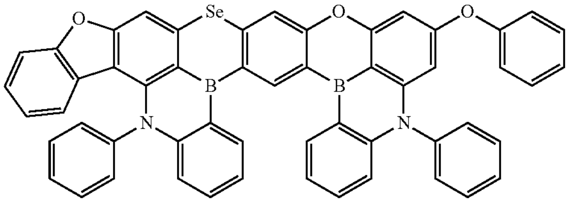
88
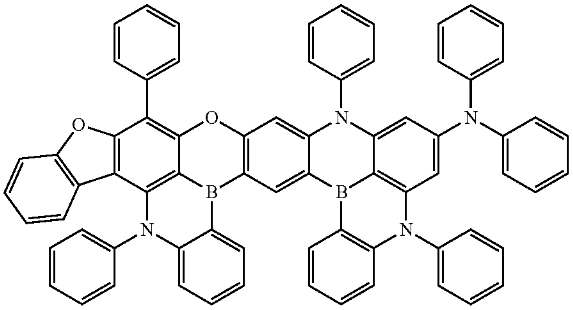
89
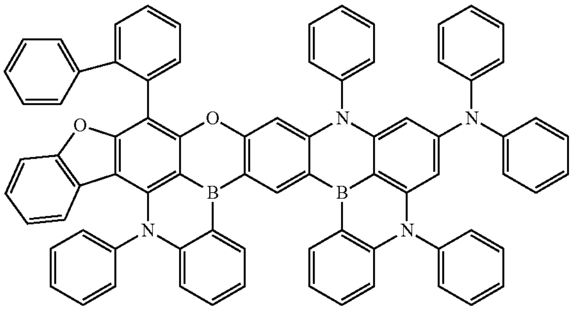
90
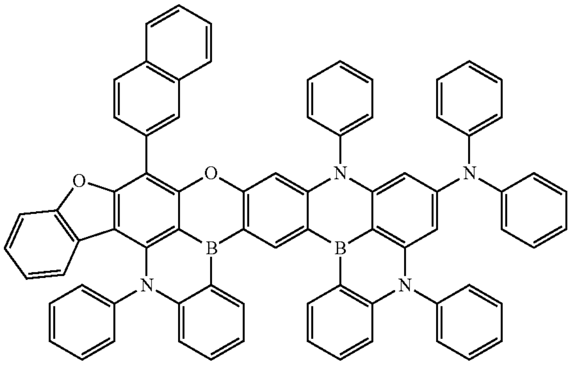

-continued
91
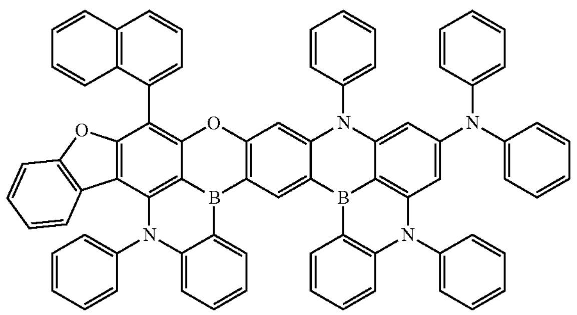
92
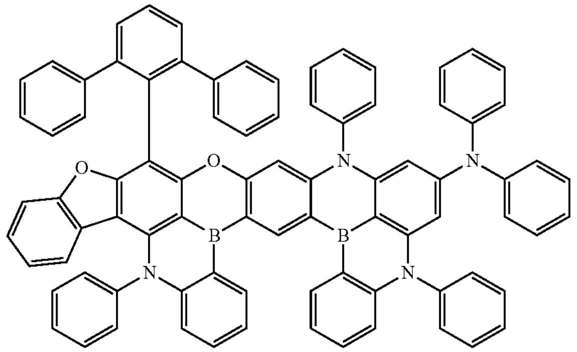
93
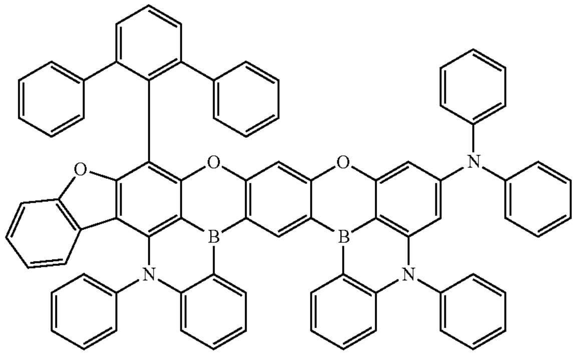
94
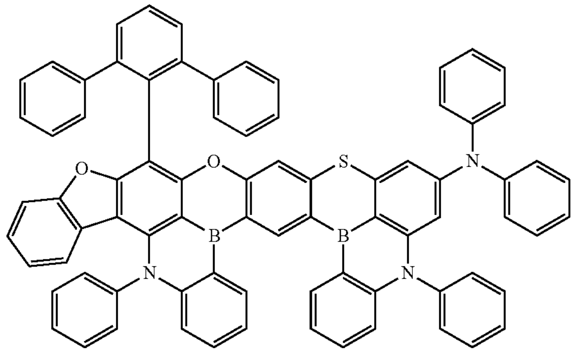
-continued
95
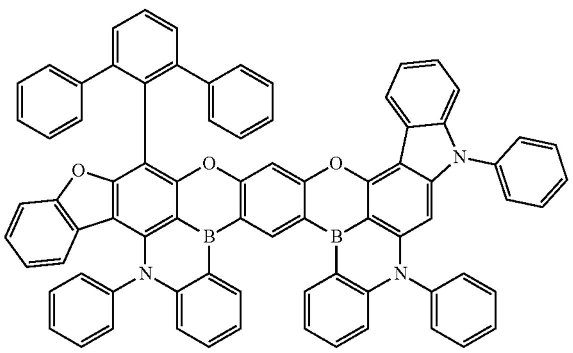
96
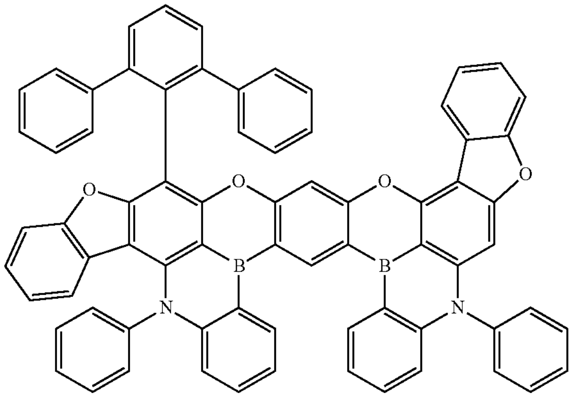
97
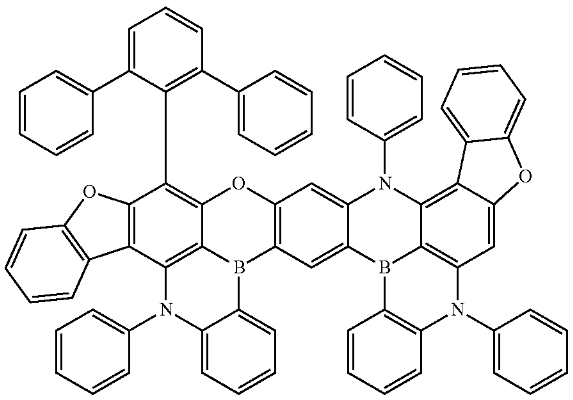
98
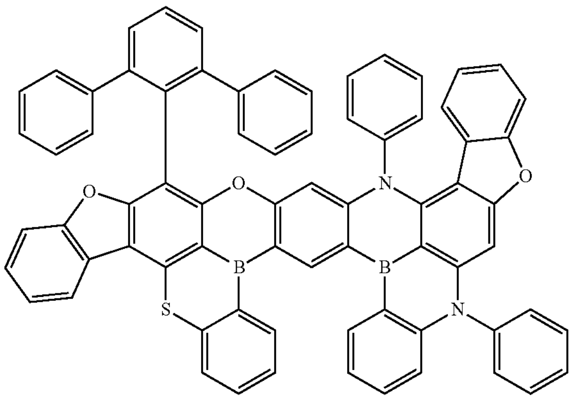

-continued
99
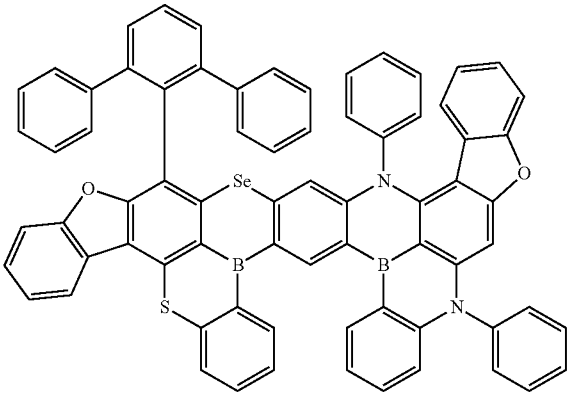
100
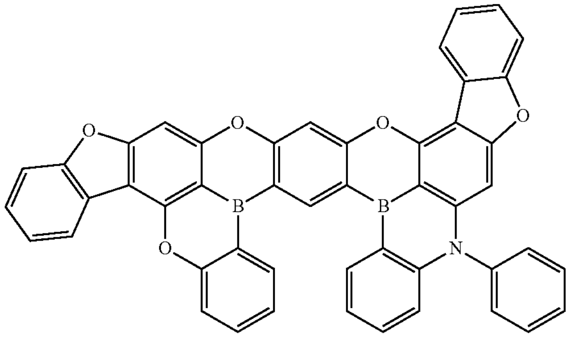
101
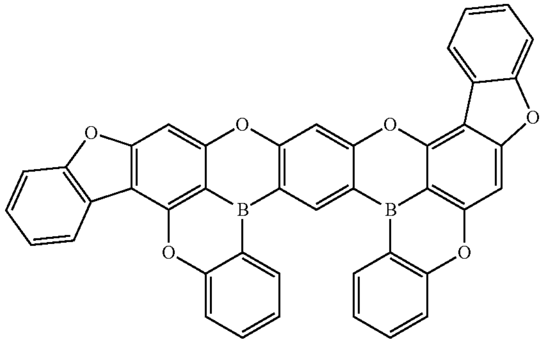
102
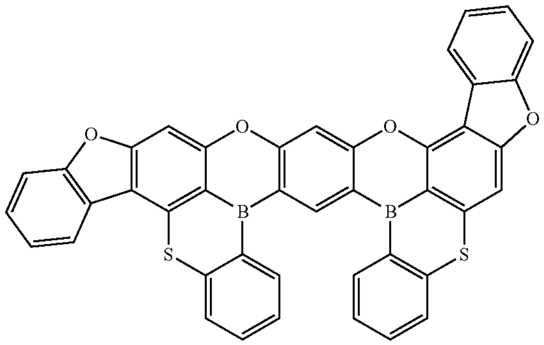
-continued
103
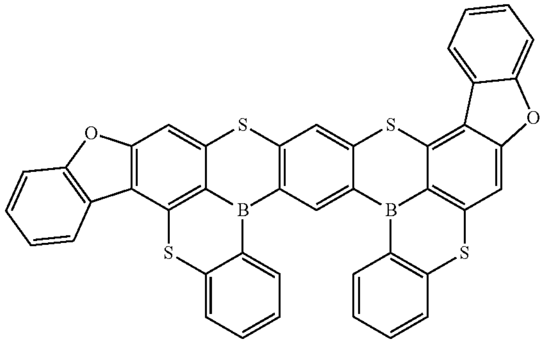
104
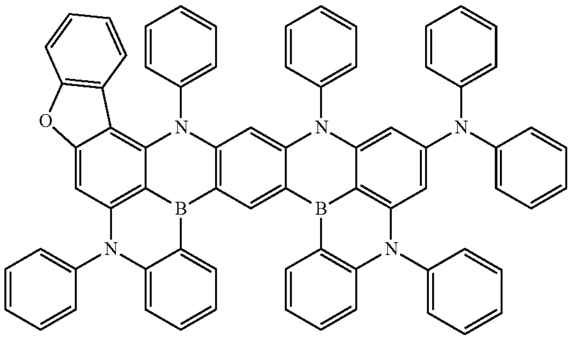
105
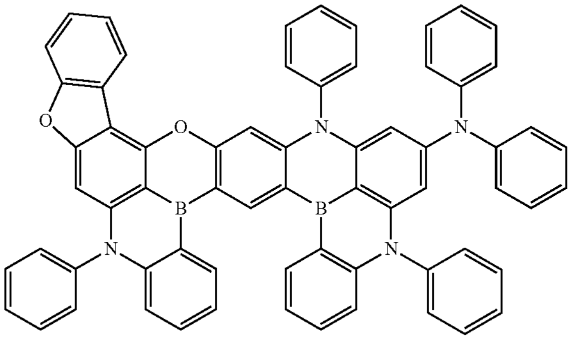
106
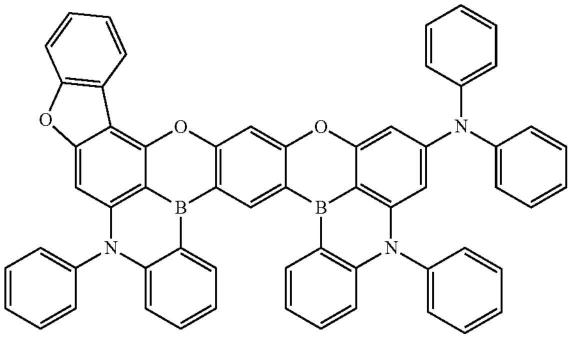

-continued
107
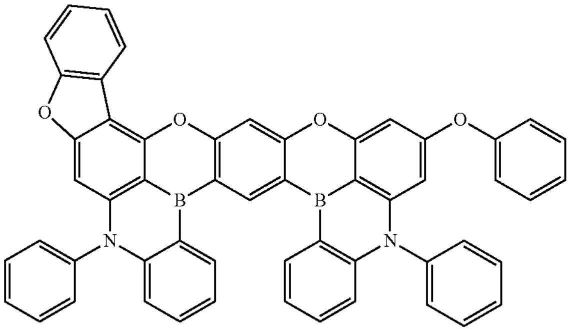
108
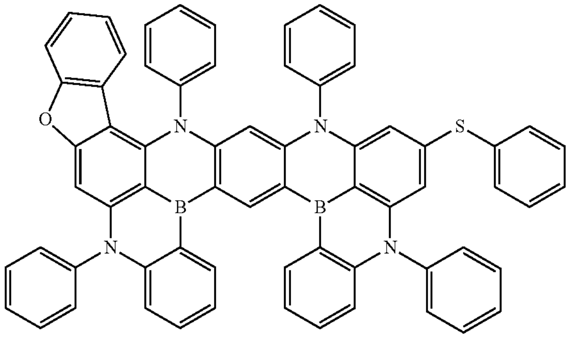
109
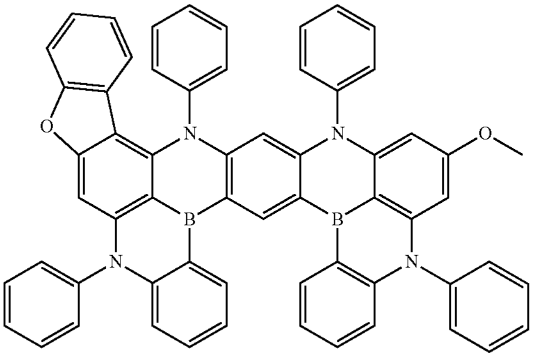
110
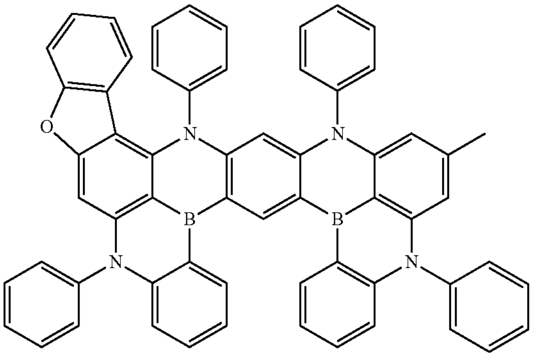
-continued
111
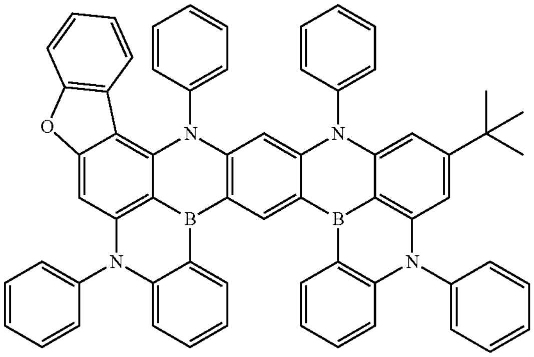
112
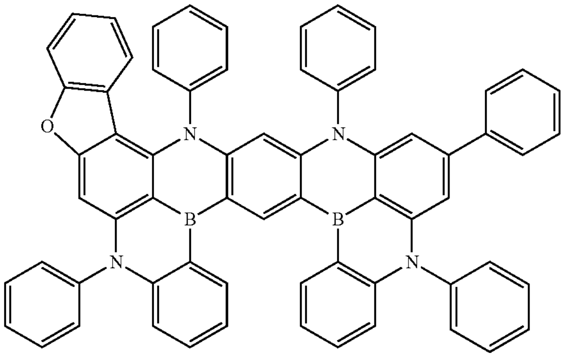
113
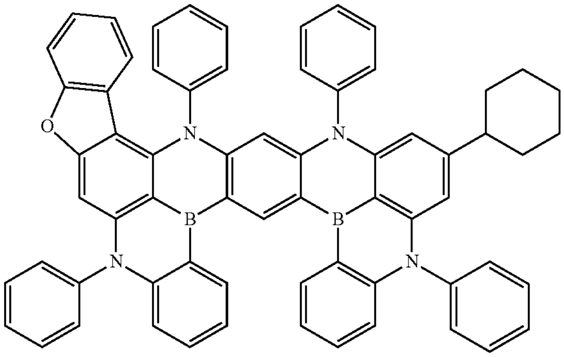
114
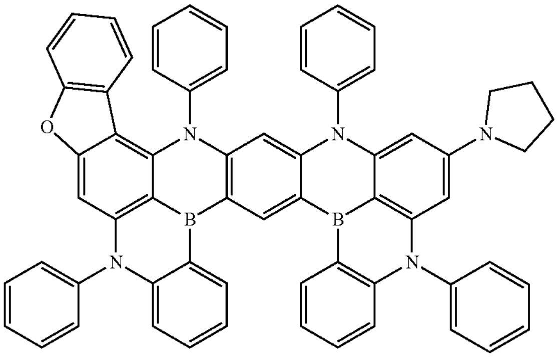

-continued
115
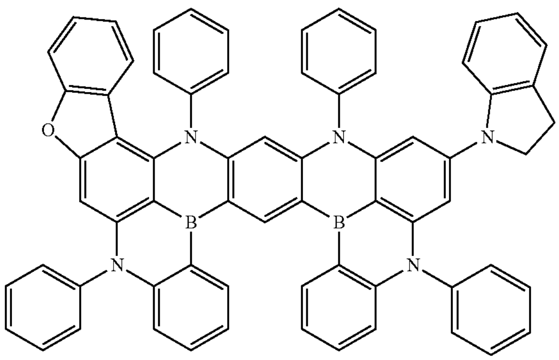
116
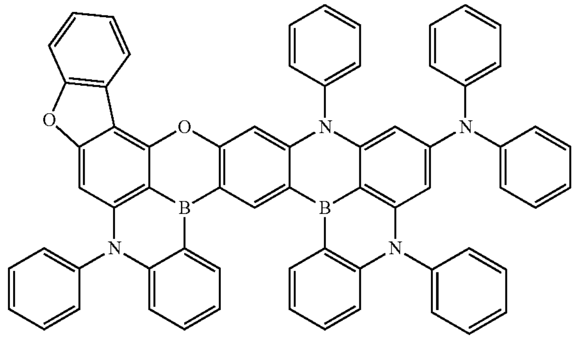
117
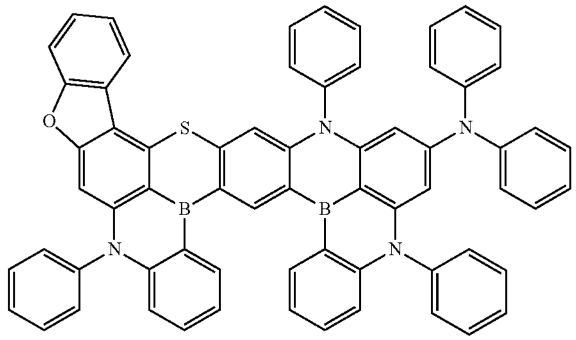
118
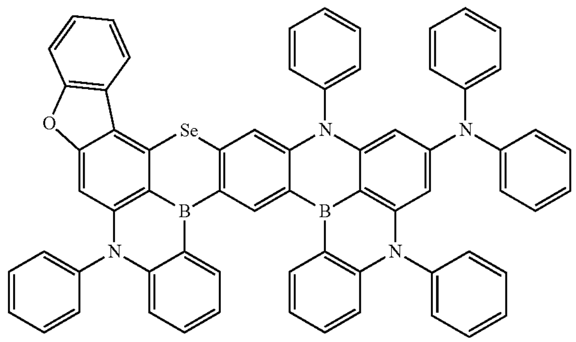
-continued
119
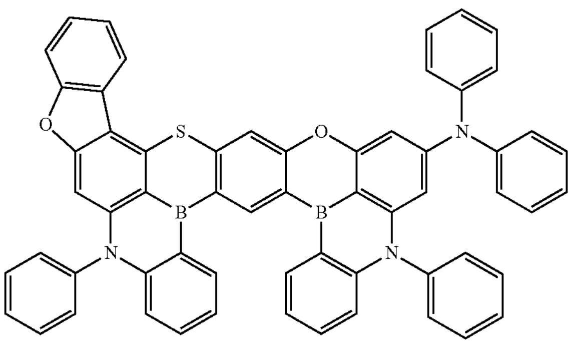
120
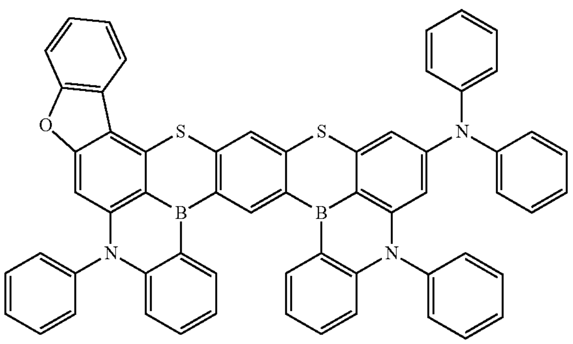
121
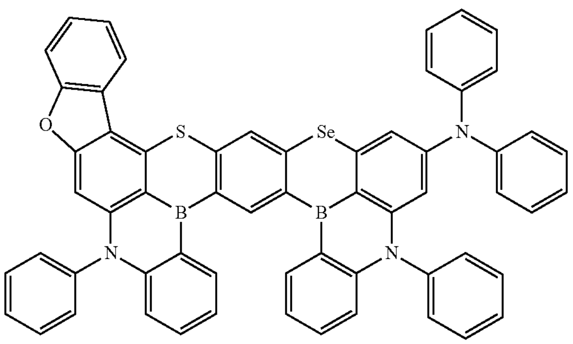
122
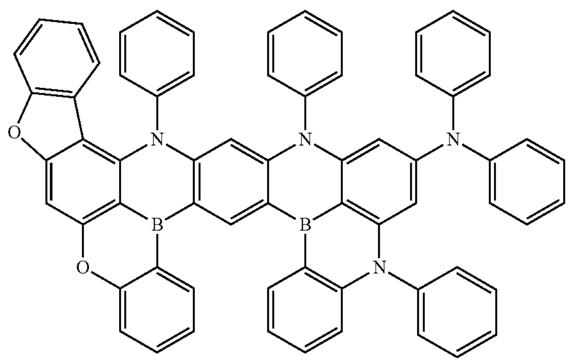

-continued

123

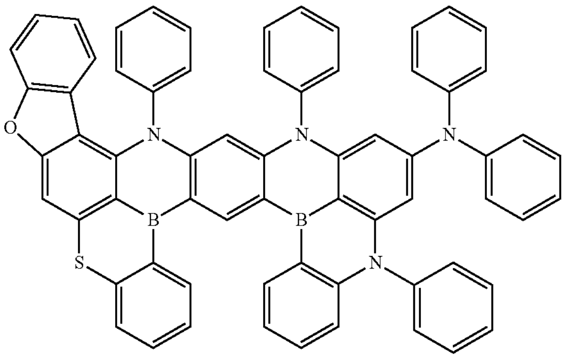

124

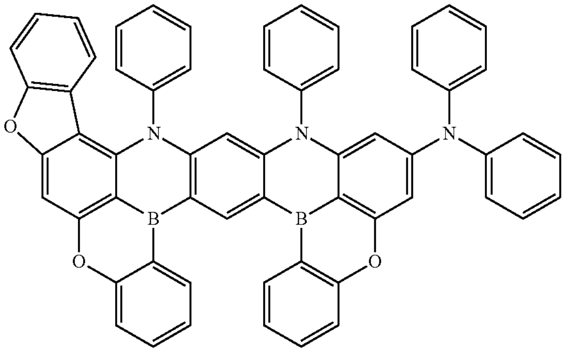

125

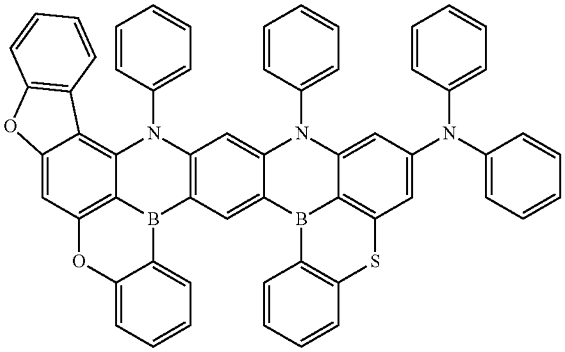

126

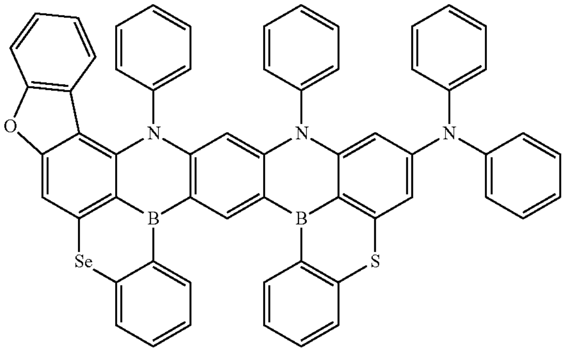

-continued

127

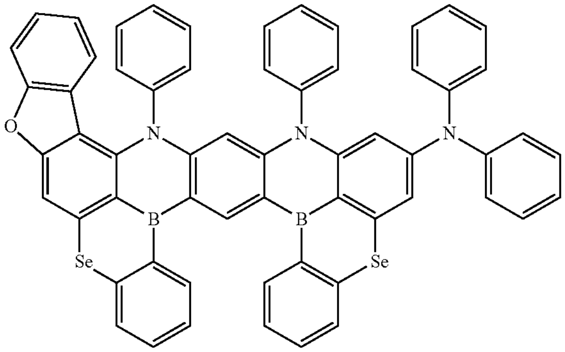

128

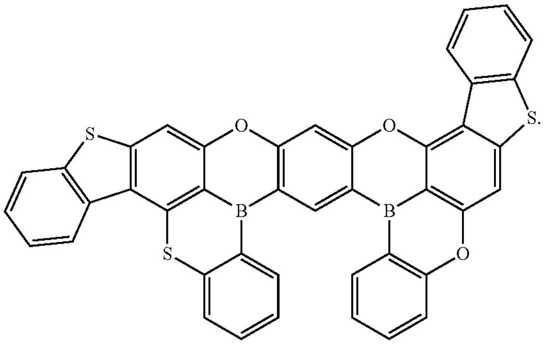

14. A light emitting device comprising:

a first electrode;

a second electrode on the first electrode; and a plurality of organic layers between the first electrode and the second electrode, wherein at least one organic layer selected from among the plurality of organic layers comprises a condensed cyclic compound represented by Formula A, Formula B, or Formula C:

Formula A

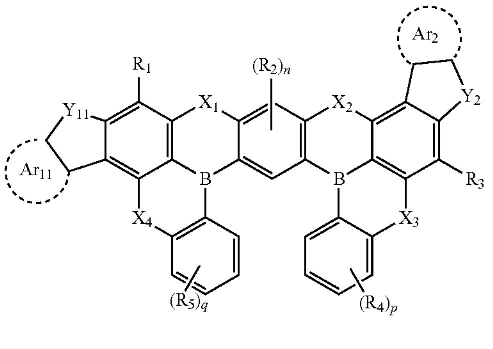

-continued

Formula B

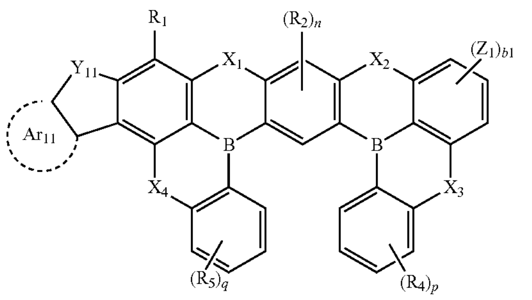

Formula C

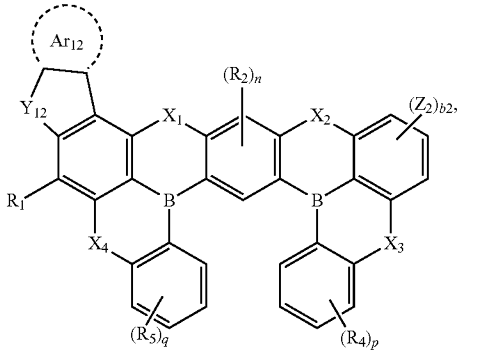

wherein, in Formula A, Formula B, and Formula C, $X_1$ to $X_4$ are each independently, O, S, Se, $CR_6R_7$, or $NR_8$, $Y_{11}$ and $Y_{12}$ are each independently O, S, Se, $CR_{1b}R_{2b}$, or $NR_{3b}$, $Y_2$ is O, S, Se, $CR_{12}R_{13}$, or $NR_{14}$, $Ar_2$ is a substituted or unsubstituted aromatic hydrocarbon ring having 6 to 30 ring-forming carbon atoms, or a substituted or unsubstituted aromatic heterocyclic ring having 2 to 30 ring-forming carbon atoms, $Ar_{11}$ and $Ar_{12}$ are each independently a substituted or unsubstituted aromatic hydrocarbon ring having 6 to 30 ring-forming carbon atoms, or a substituted or unsubstituted aromatic heterocyclic ring having 2 to 30 ring-forming carbon atoms, $R_1$ to $R_8$, $R_{12}$ to $R_{14}$, $R_{1b}$, $R_{2b}$, and $R_{3b}$ are each independently a hydrogen atom, a deuterium atom, a halogen atom, a cyano group, a nitro group, a substituted or unsubstituted silyl group, a substituted or unsubstituted amine group, a substituted or unsubstituted alkyl group having 1 to 30 carbon atoms, a substituted or unsubstituted alkoxy group having 1 to 30 carbon atoms, a substituted or unsubstituted aryl group having 6 to 30 ring-forming carbon atoms, or a substituted or unsubstituted heteroaryl group having 2 to 30 ring-forming carbon atoms, and/or are bonded to an adjacent group to form a ring, n is an integer of 0 to 2, p and q are each independently an integer of 0 to 4, $Z_1$ and $Z_2$ are each independently a hydrogen atom, a deuterium atom, a halogen atom, a cyano group, a nitro group, a substituted or unsubstituted silyl group, a substituted or unsubstituted amine group, a substituted or unsubstituted alkyl group having 1 to 30 carbon atoms, a substituted or unsubstituted alkoxy group having 1 to 30 carbon atoms, a substituted or unsubstituted aryloxy group having 1 to 30 carbon atoms, a substituted or unsubstituted aryl group having 6 to 30 ring-forming carbon atoms, a substituted or unsubstituted heteroaryl group having 2 to 30 ring-forming carbon atoms, or a substituted or unsubstituted aliphatic heterocyclic group having 2 to 30 ring-forming carbon atoms, and $b_1$ and $b_2$ are each independently an integer of 0 to 3, and wherein, in Formula A, when $X_1$ to $X_4$ are each independently, O, S, Se, or $NR_8$, $Ar_{11}$ and $Ar_2$ are each a benzene ring, and $Y_{11}$ is $NR_{3b}$, then $Y_2$ is O, S, Se, or $CR_{12}R_{13}$, and in Formula A, when $X_1$ to $X_4$ are each independently, O, S, Se, or $NR_8$, $Ar_{11}$ and $Ar_2$ are each a benzene ring, and $Y_2$ is $NR_{14}$, then $Y_{11}$ is O, S, Se, or $CR_{1b}R_{2b}$.

15. The light emitting device of claim 14, wherein $Ar_{11}$ is a substituted or unsubstituted benzene ring.

16. The light emitting device of claim 14, wherein $Ar_{12}$ is an unsubstituted naphthalene ring or an unsubstituted benzene ring.

17. The light emitting device of claim 14, wherein $R_2$ to $R_5$ are each independently a hydrogen atom.

18. The light emitting device of claim 14, wherein:

the organic layers comprise a hole transport region, an emission layer, and an electron transport region, sequentially stacked on the first electrode; and the emission layer comprises the condensed cyclic compound represented by Formula A, Formula B, or Formula C.

19. The light emitting device of claim 18, wherein the emission layer comprises a host and a dopant, and the dopant comprises the condensed cyclic compound represented by Formula A, Formula B, or Formula C.

20. The light emitting device of claim 18, wherein the emission layer comprises at least one selected from among the condensed cyclic compounds of Compound Group 1 below:

Compound Group 1

1

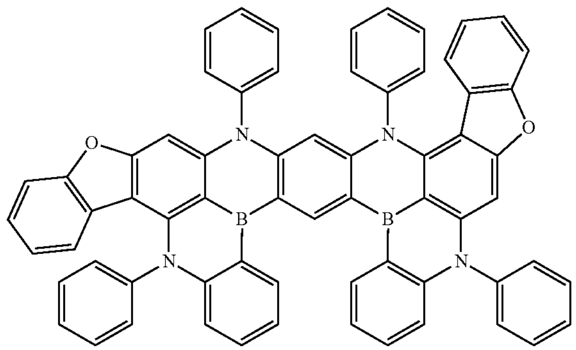

-continued
2
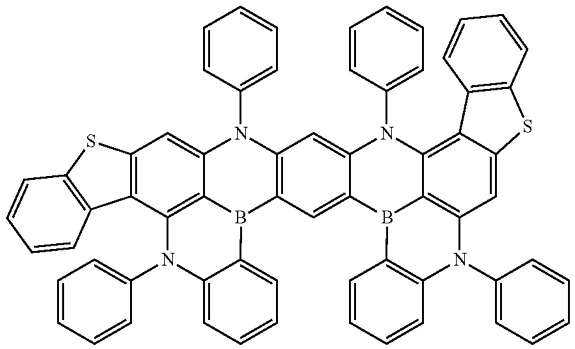
3
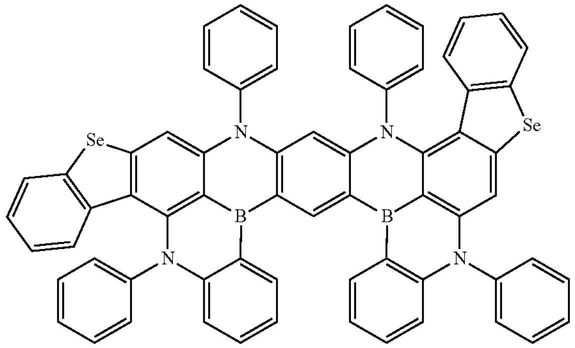
4
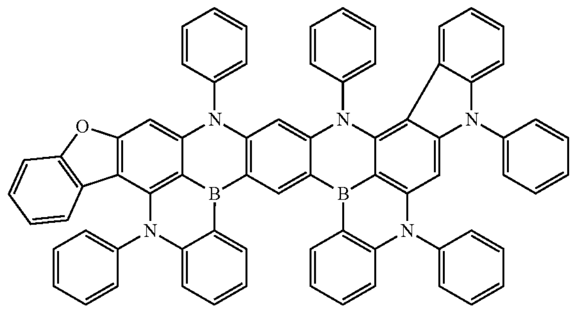
5
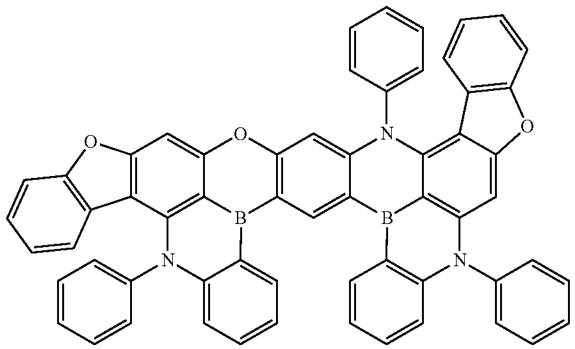
-continued
6
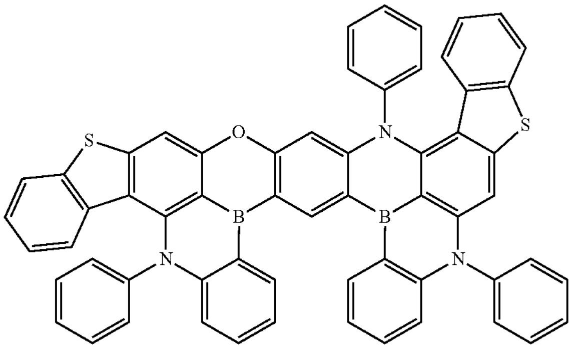
7
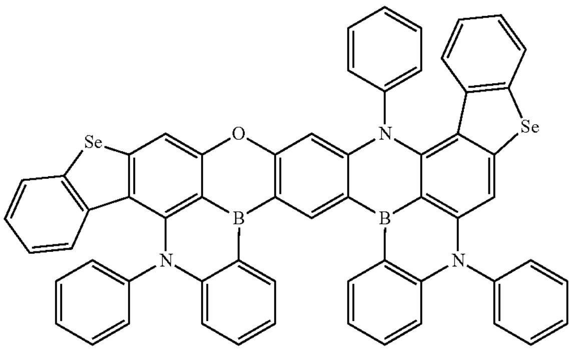
8
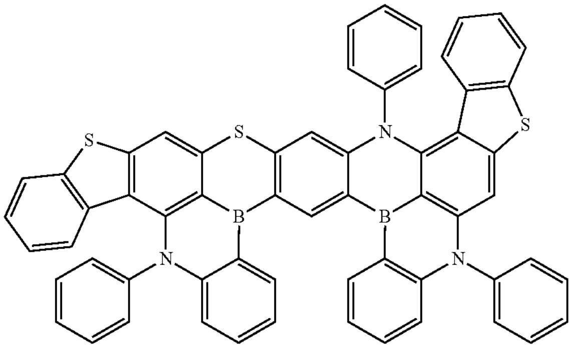
9
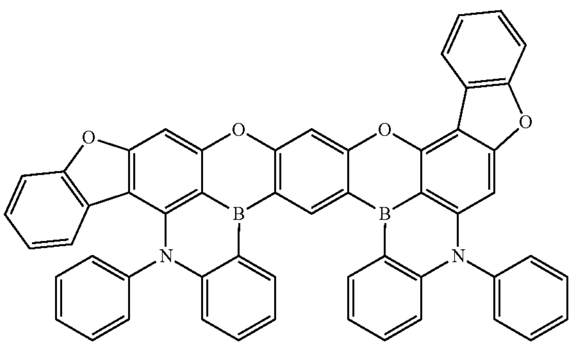

-continued
10
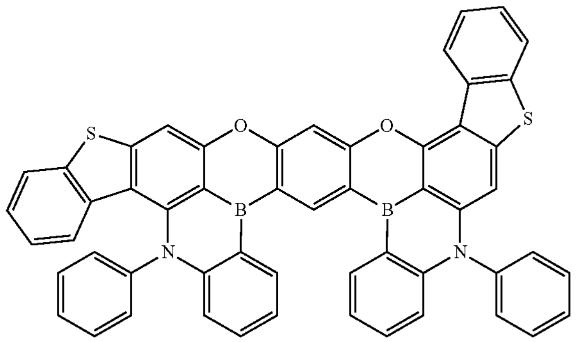
11
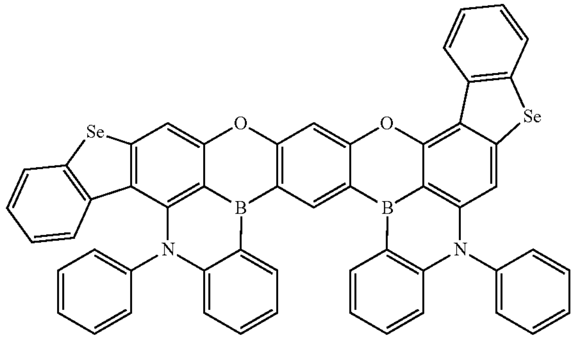
12
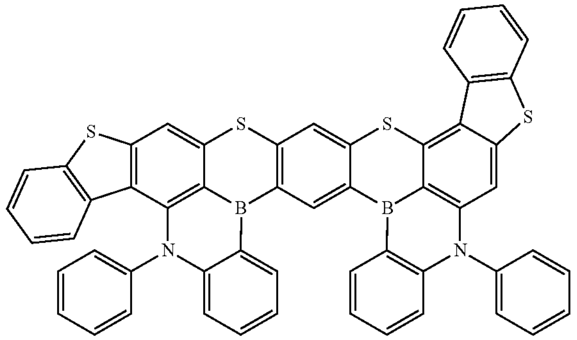
13
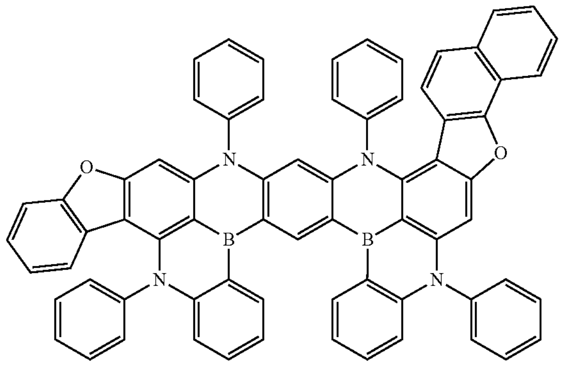
-continued
14
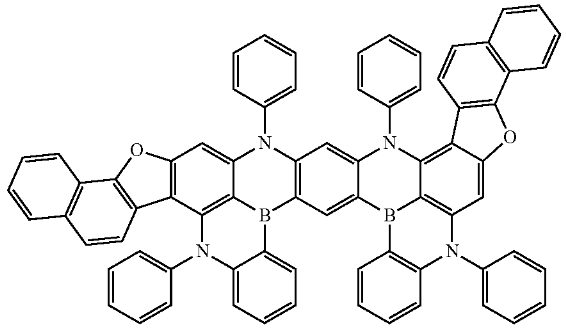
15
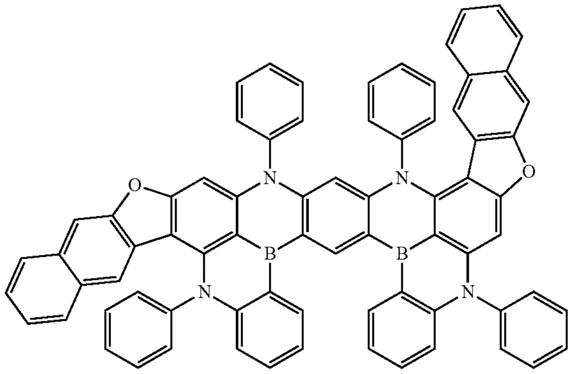
16
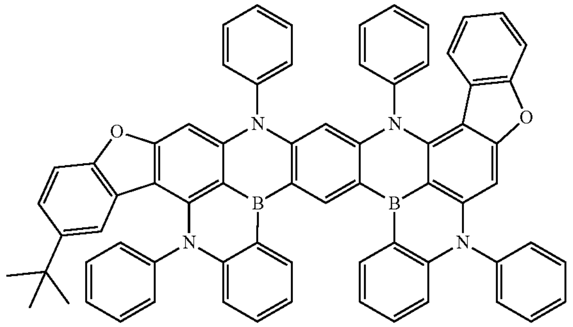
17
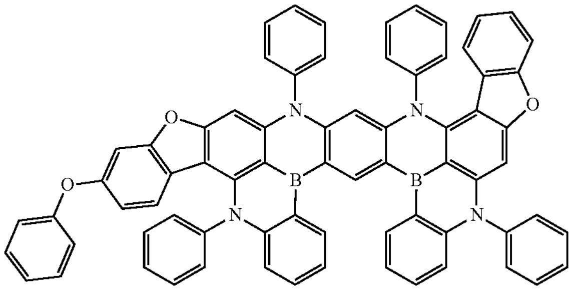

-continued
18
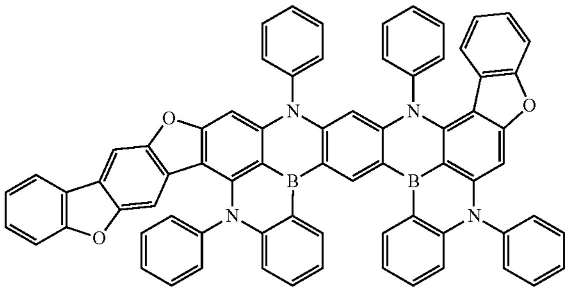
19
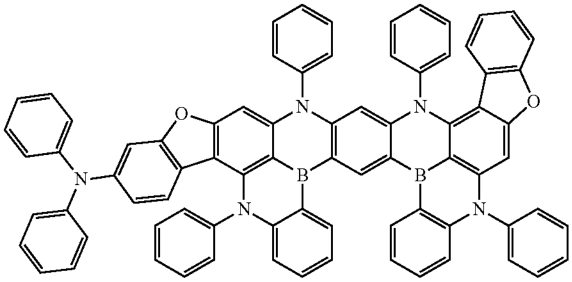
20
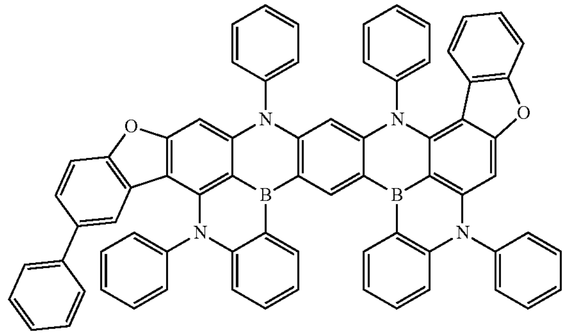
21
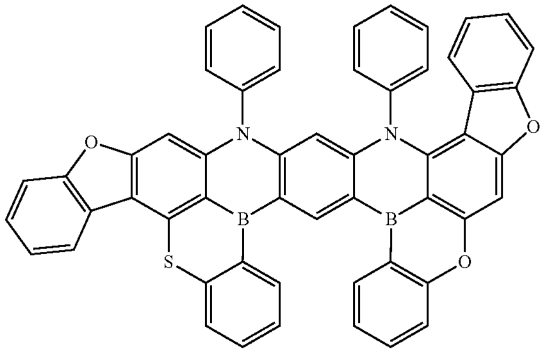
-continued
22
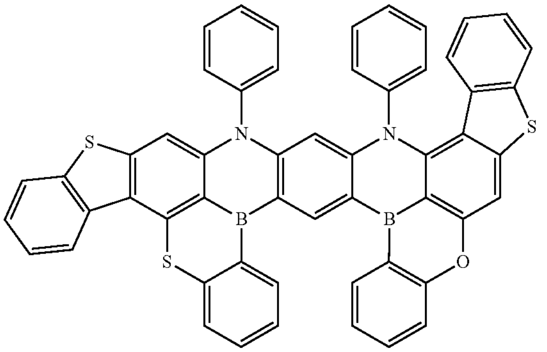
23
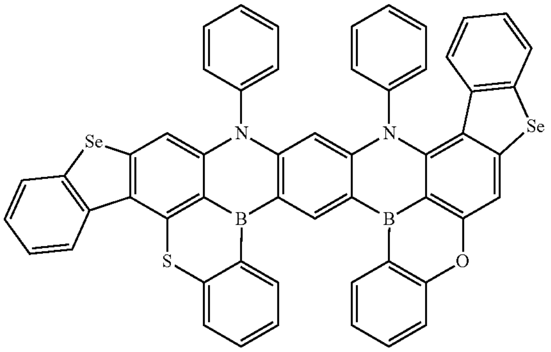
24
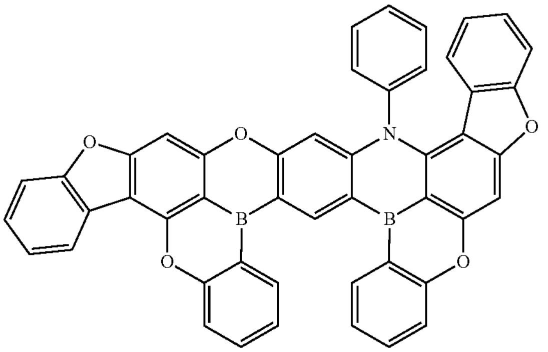
25
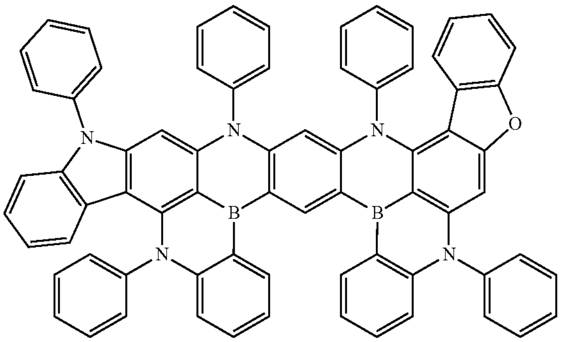

26
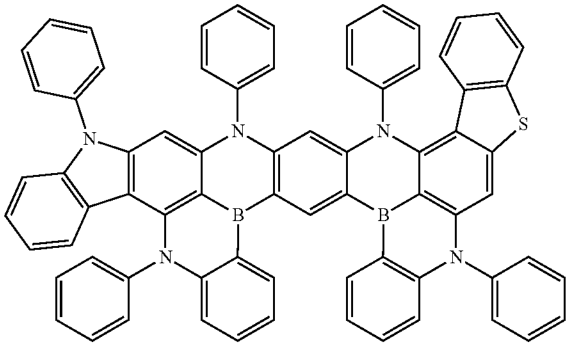
27
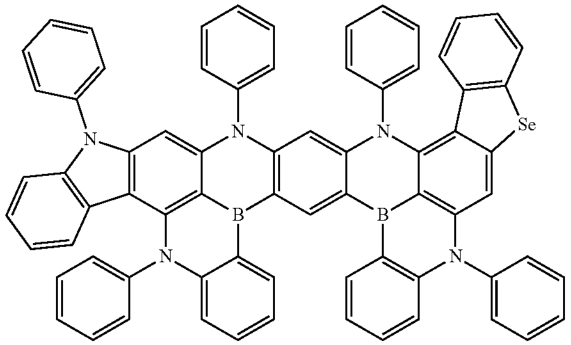
29
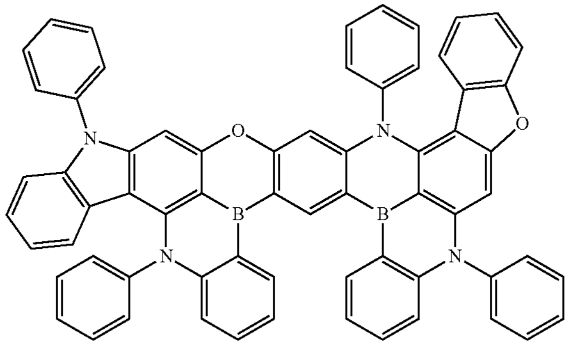
30
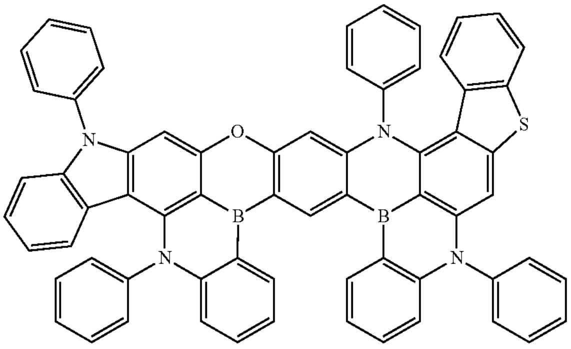
31
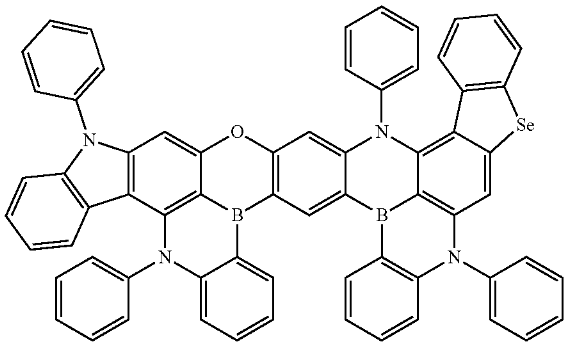
33
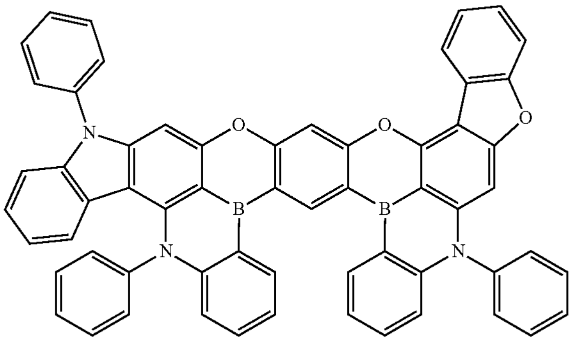
34
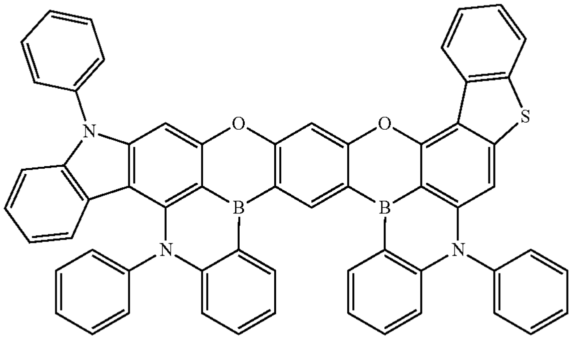
35
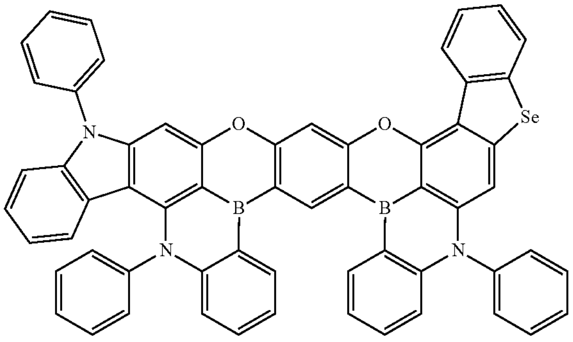

-continued
43
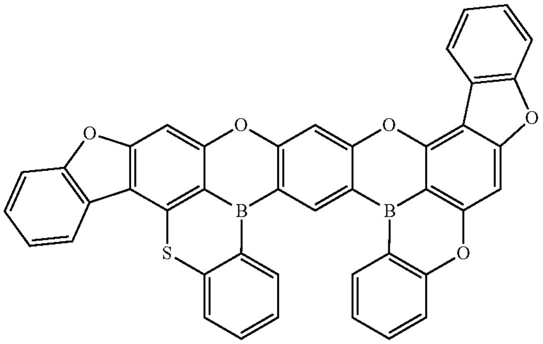
44
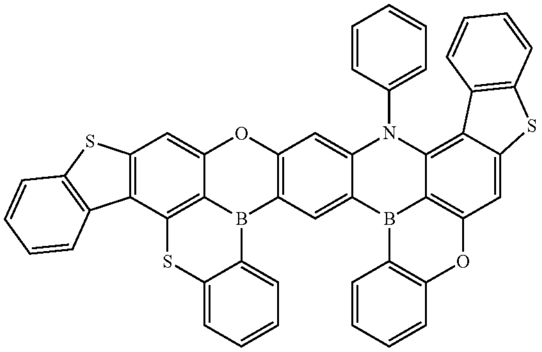
45
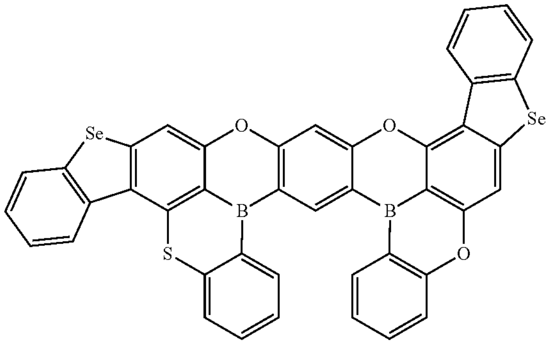
46
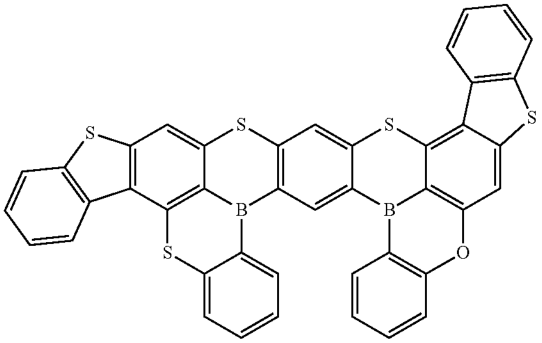
-continued
47
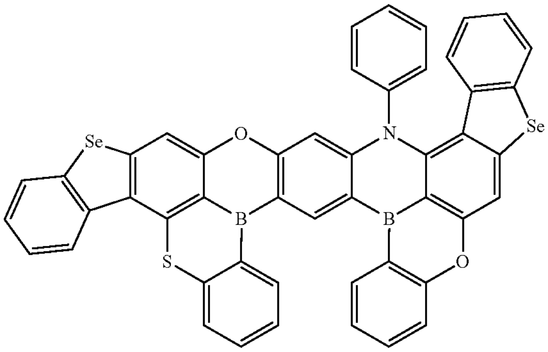
48
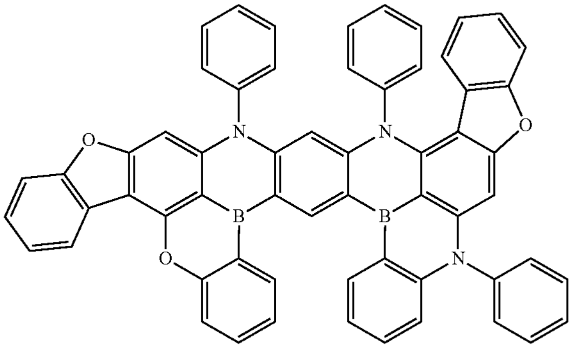
49
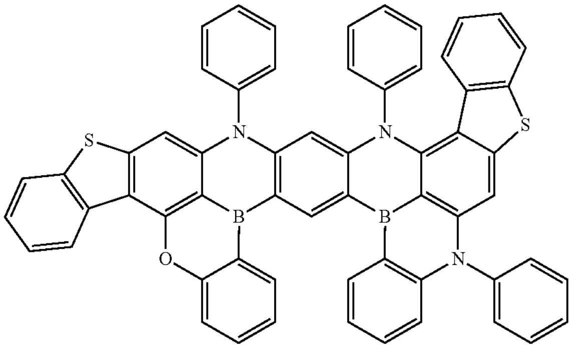
50
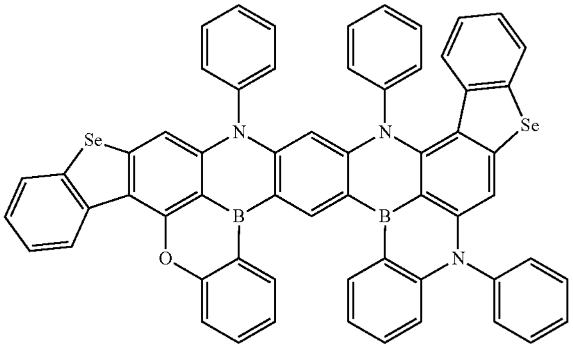

-continued
51
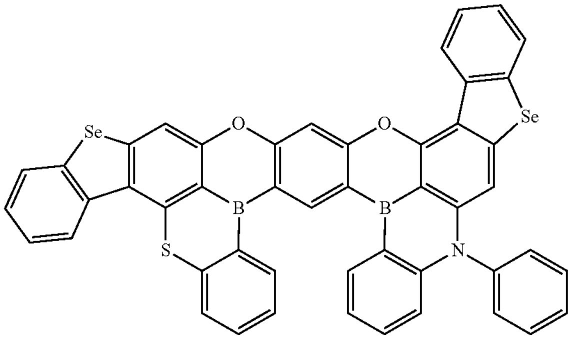
52
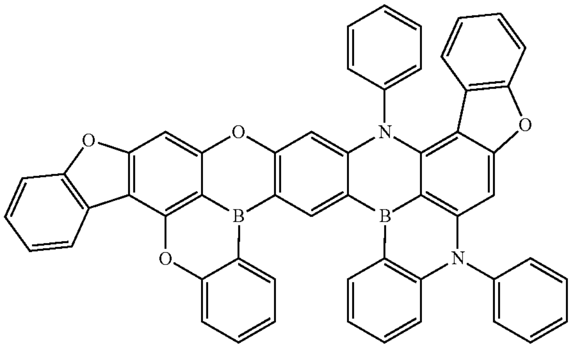
53
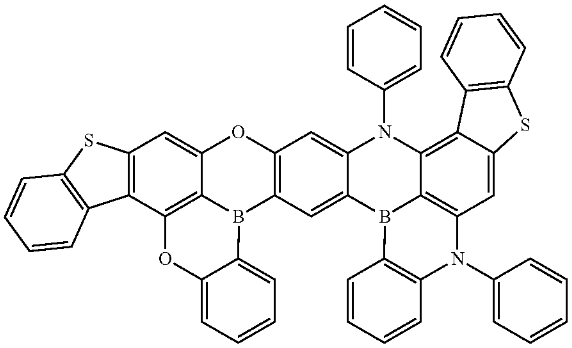
54
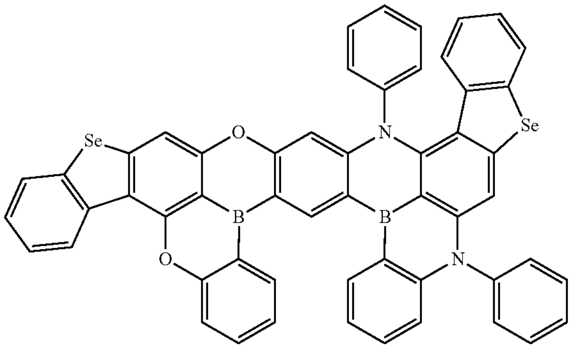
-continued
55
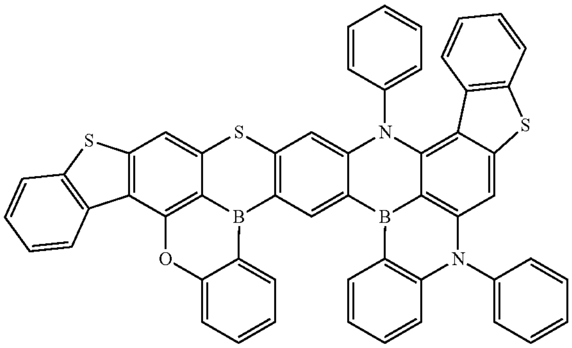
56
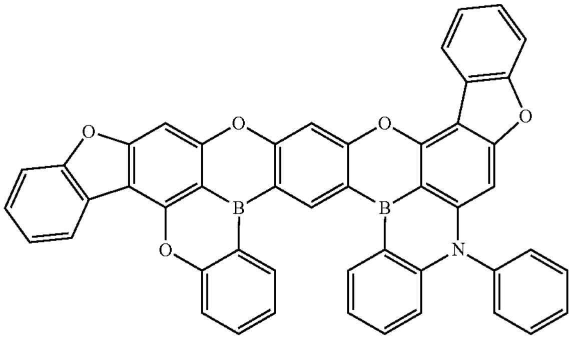
57
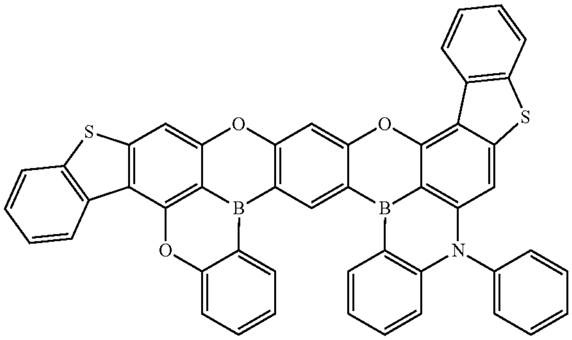
58
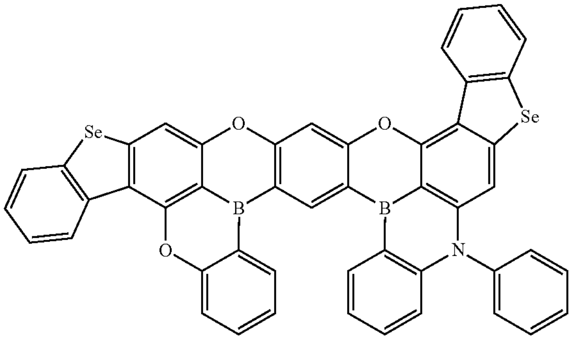

-continued
59
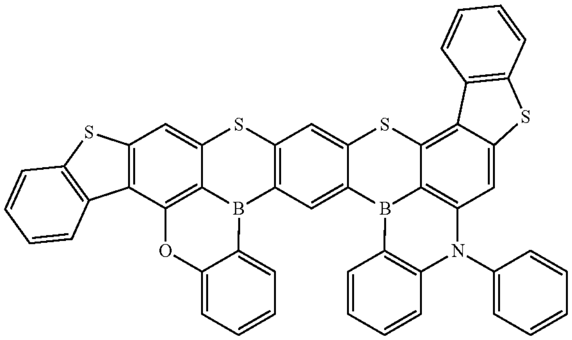
60
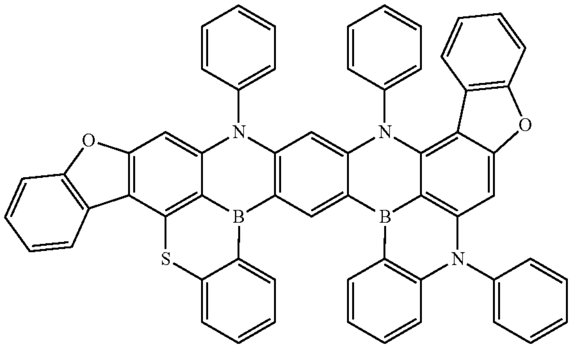
61
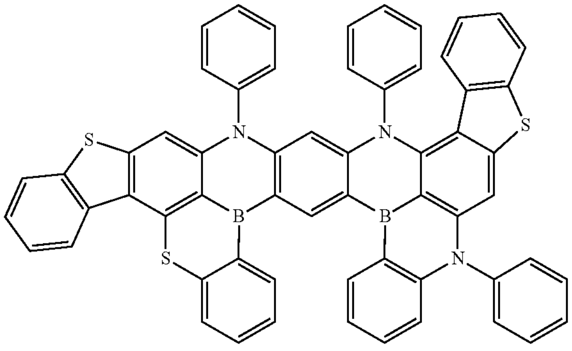
62
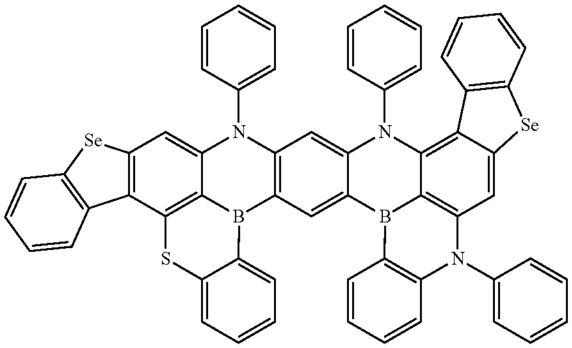
-continued
63
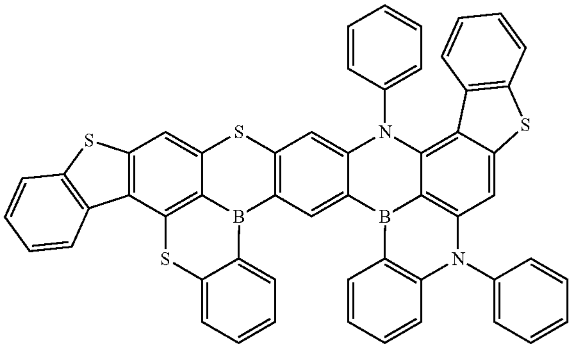
64
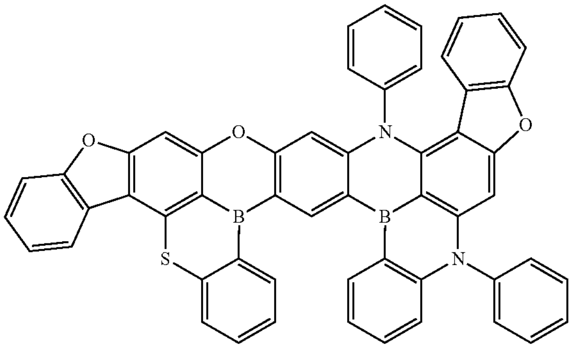
65
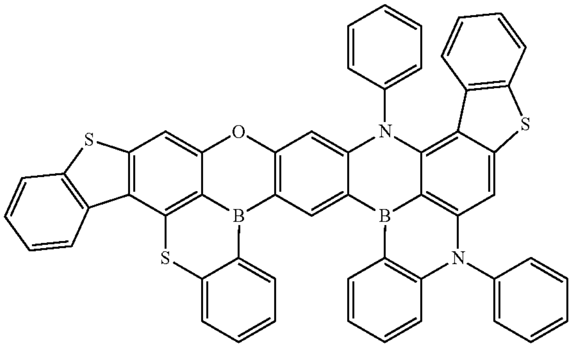
66
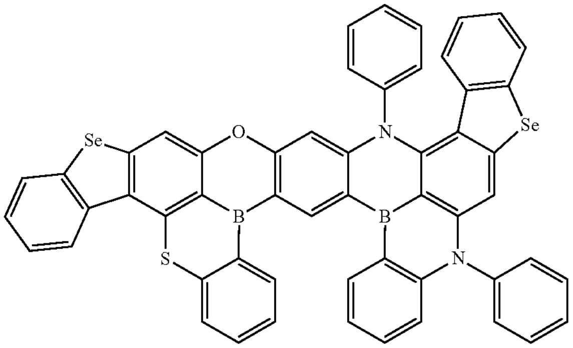

-continued
67
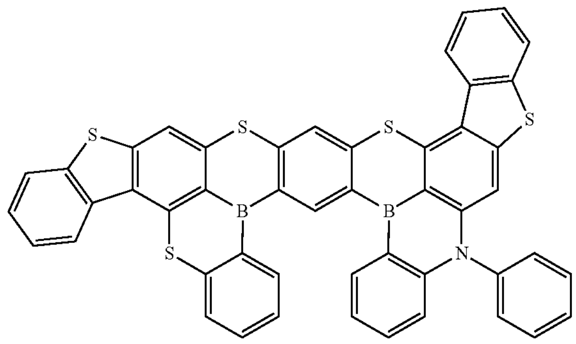
68
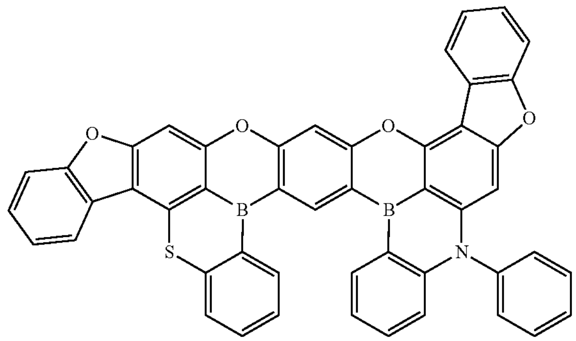
69
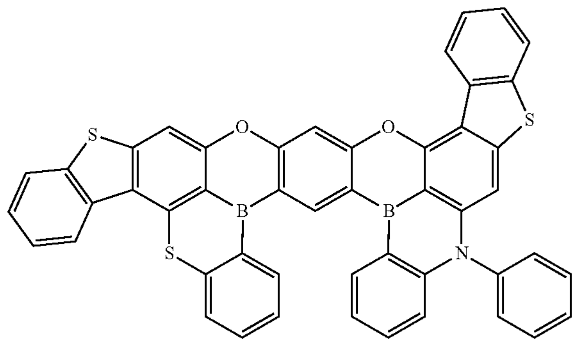
70
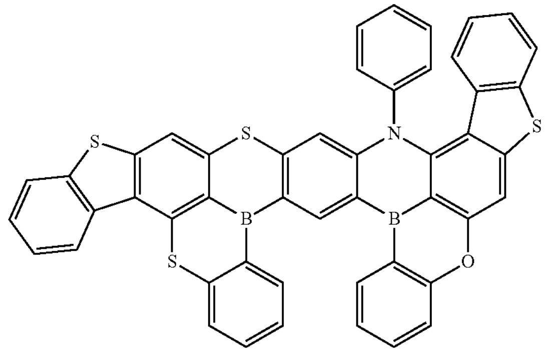
-continued
71
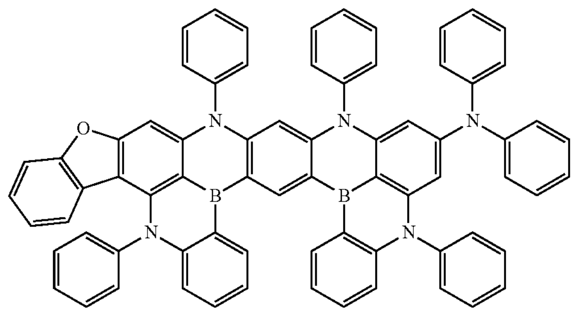
72
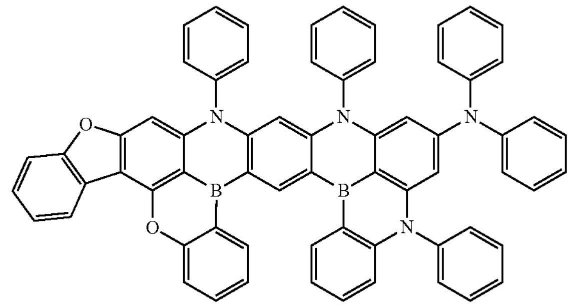
73
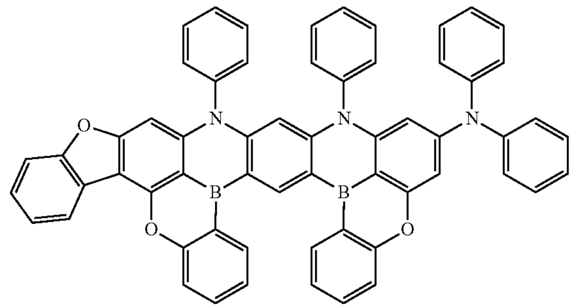
74
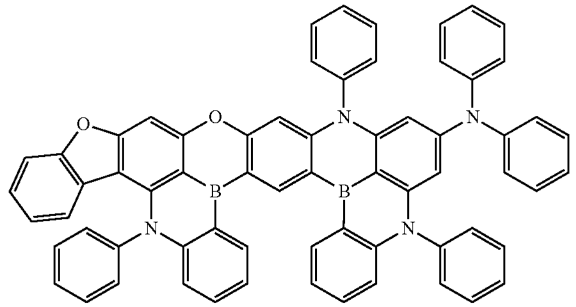

-continued
75
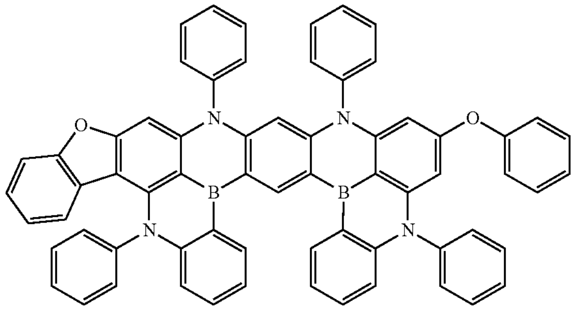
76
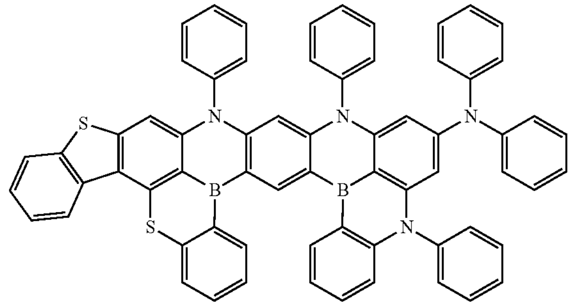
77
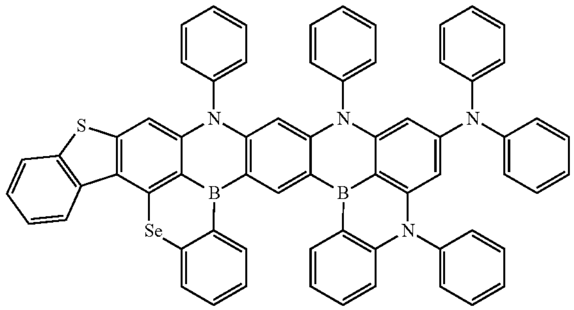
78
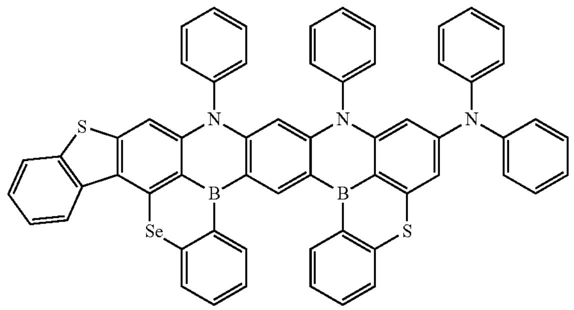
-continued
79
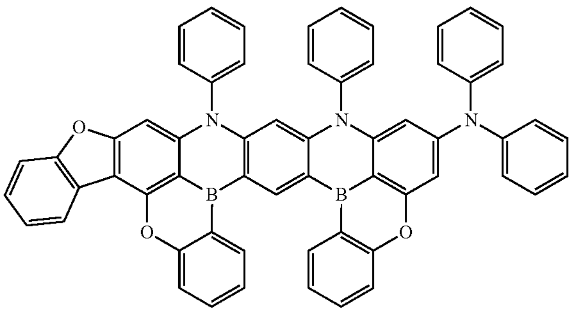
80
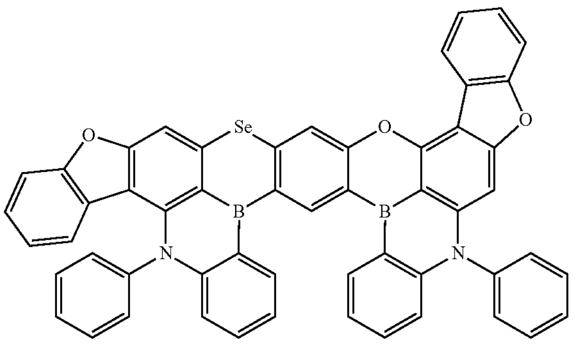
81
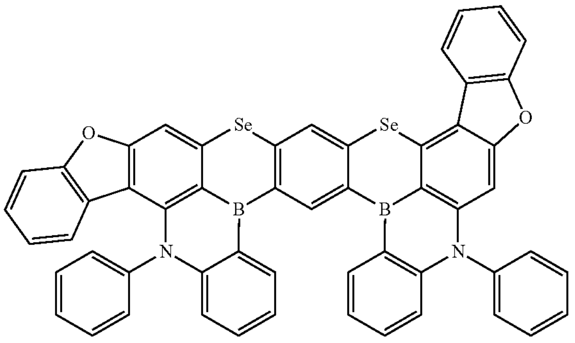
82
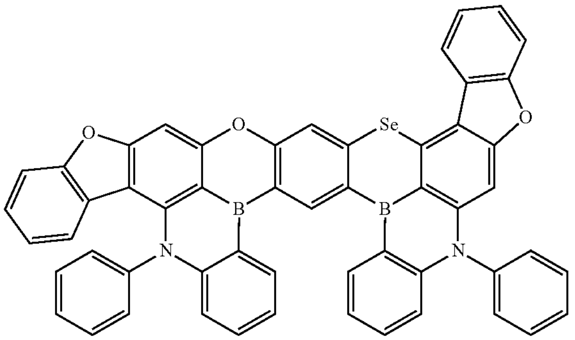

-continued
83
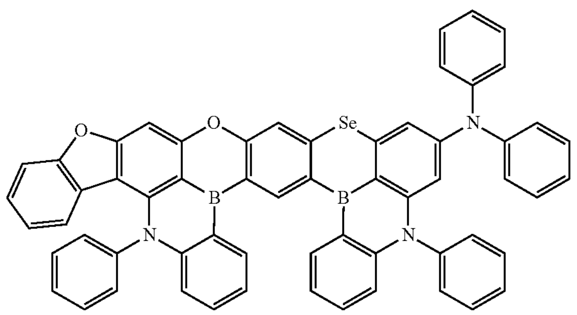
84
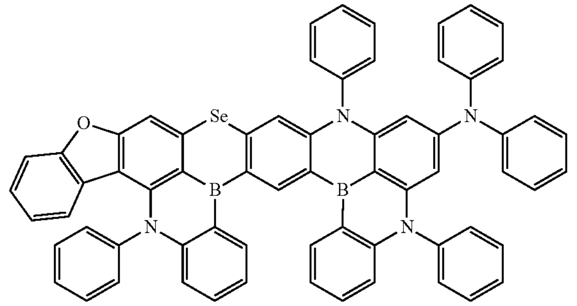
85
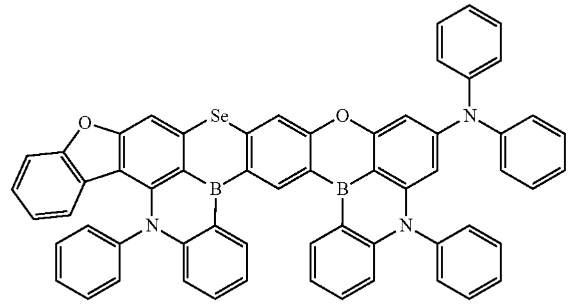
86
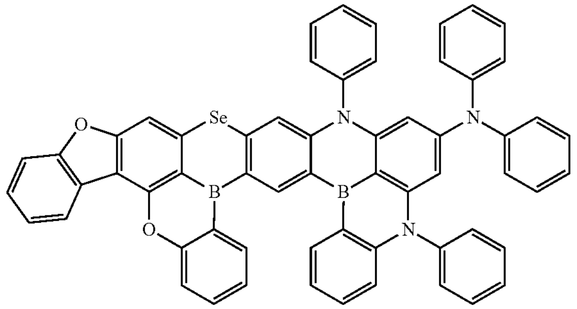
87
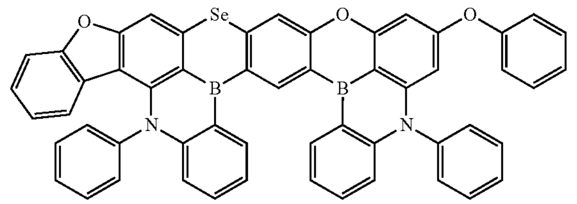
-continued
88
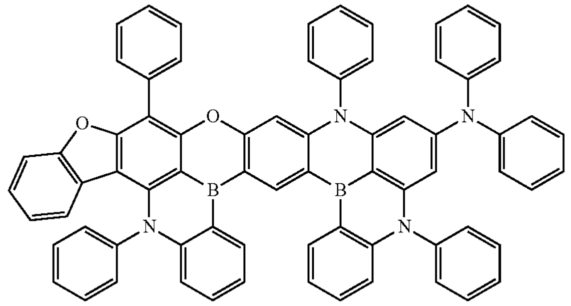
89
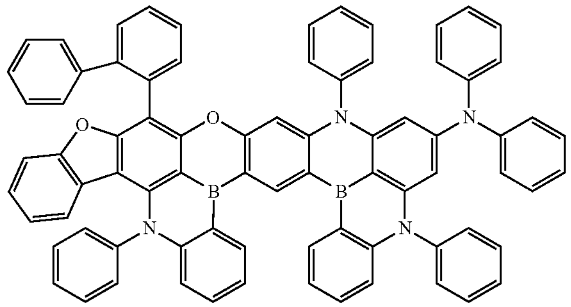
90
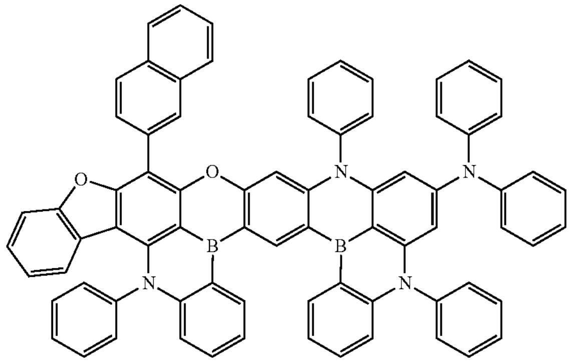
91
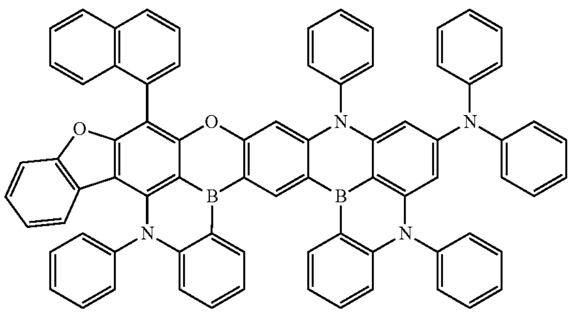

-continued
92
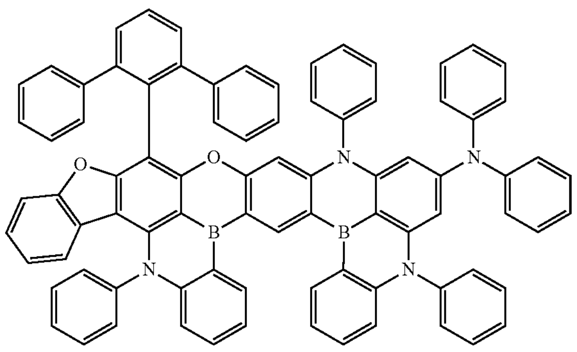
93
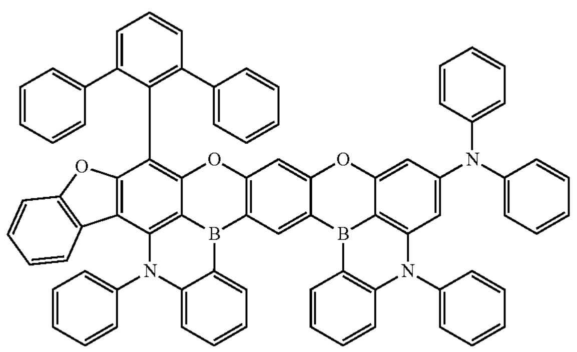
94
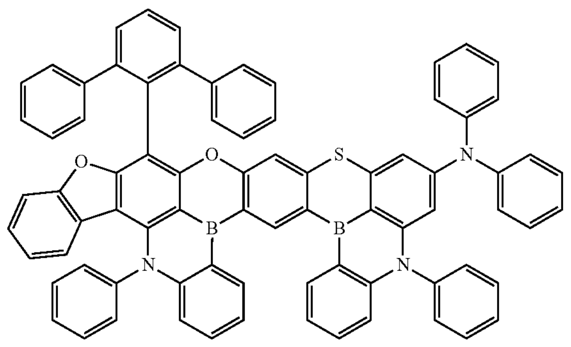
95
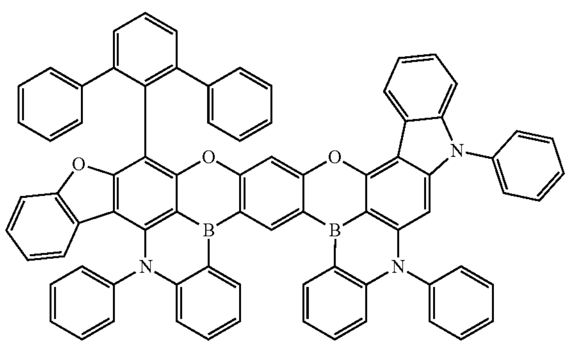
-continued
96
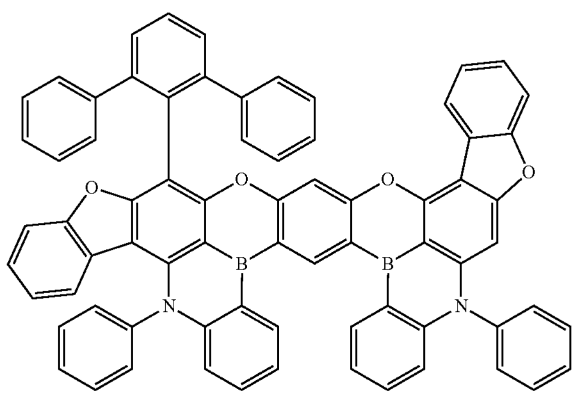
97
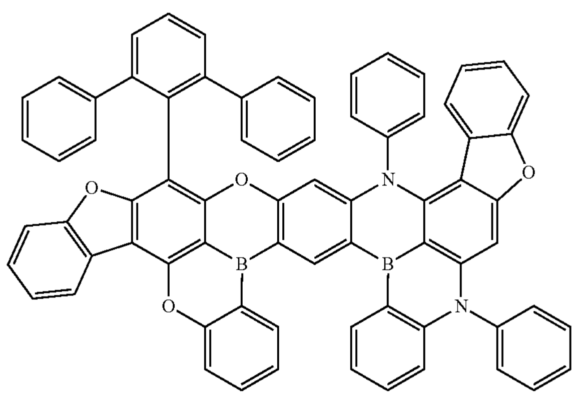
98
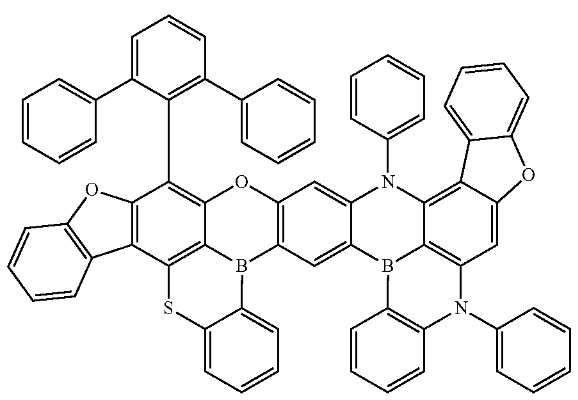
99
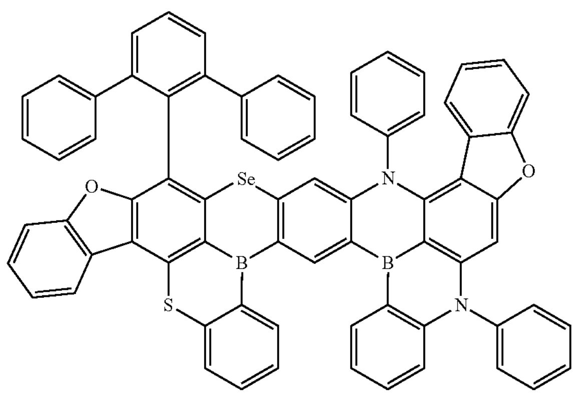

-continued
100
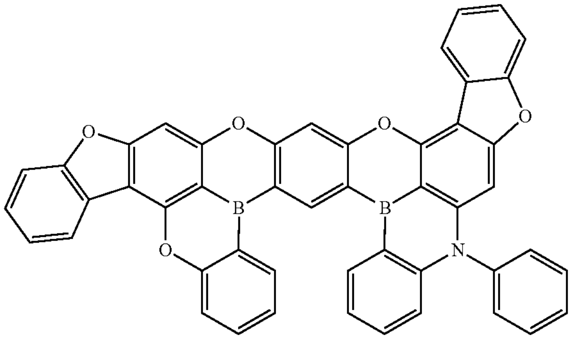
101
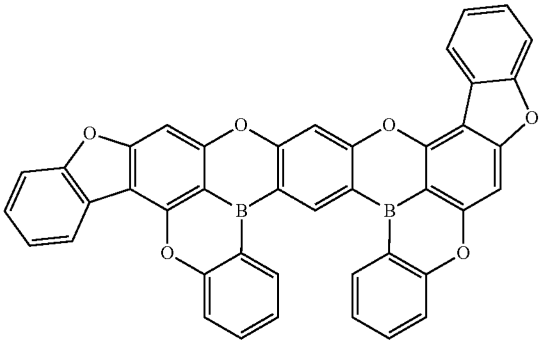
102
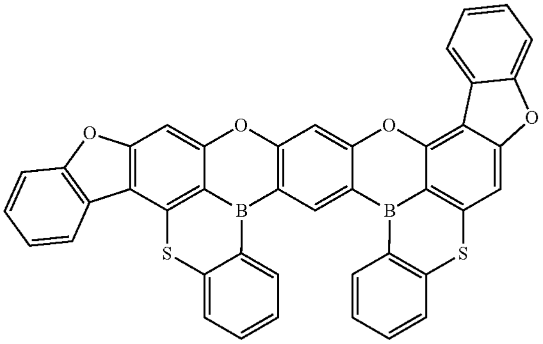
103
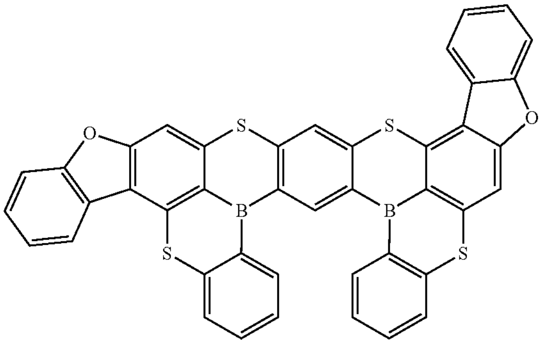
-continued
104
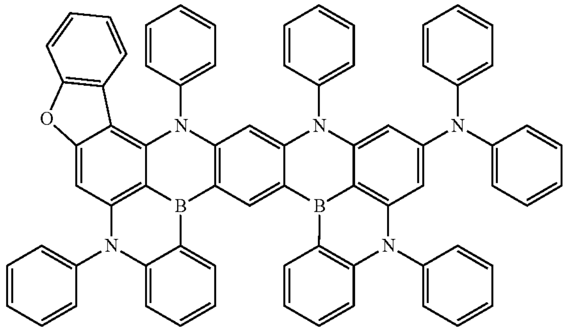
105
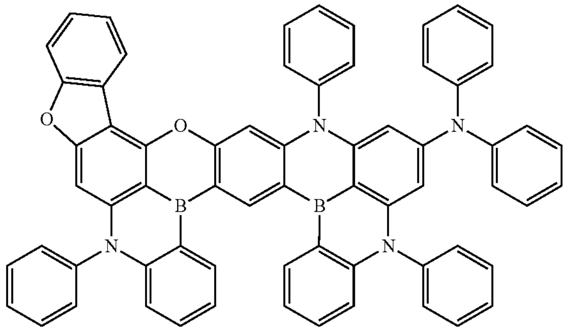
106
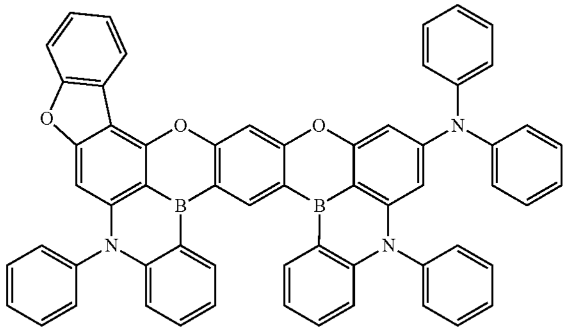
107
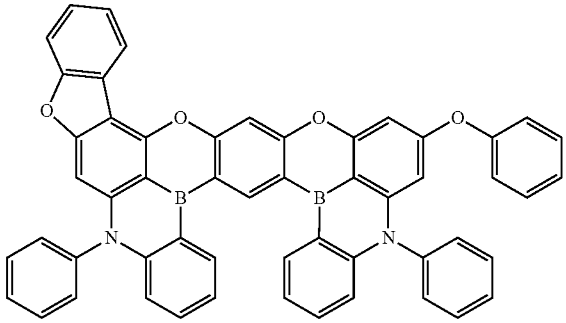

-continued
108
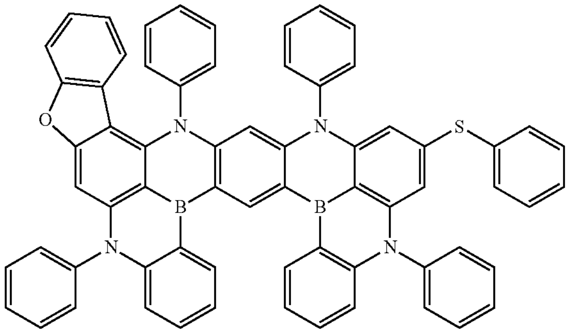
109
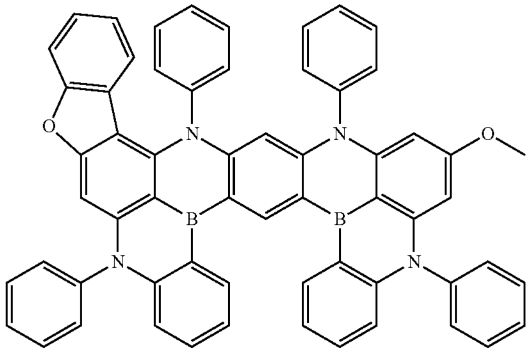
110
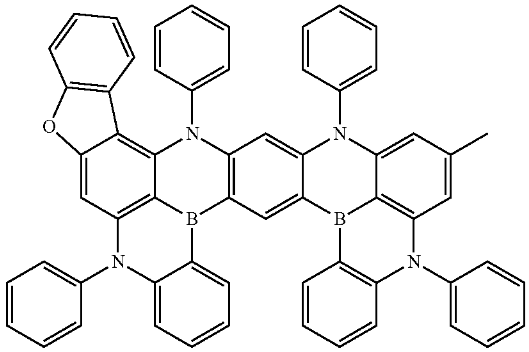
111
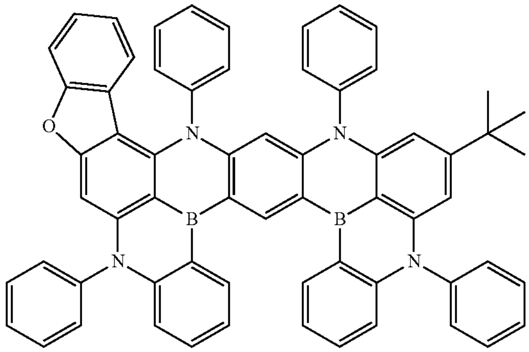
-continued
112
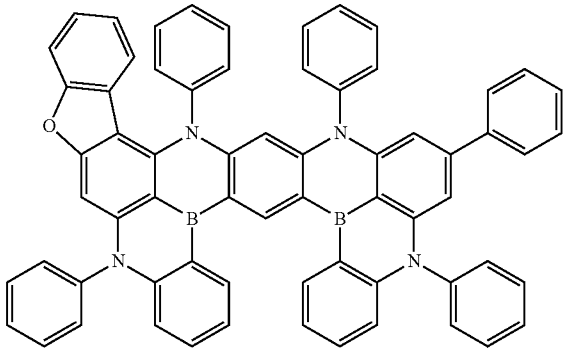
113
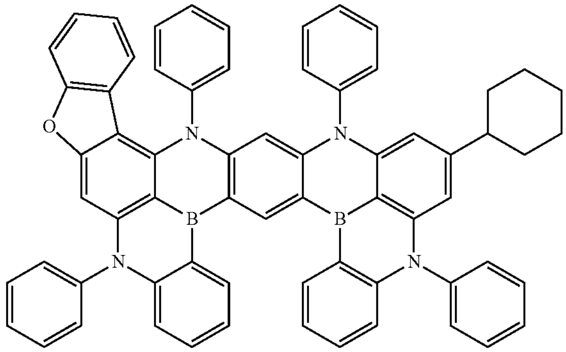
114
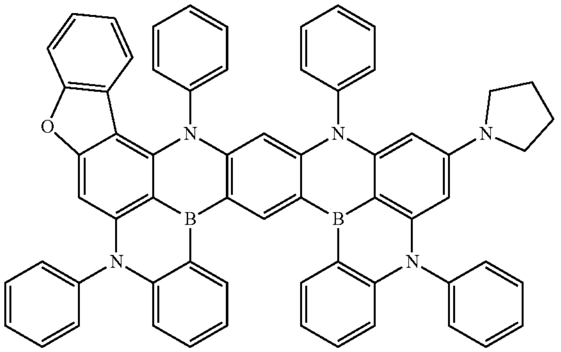
115
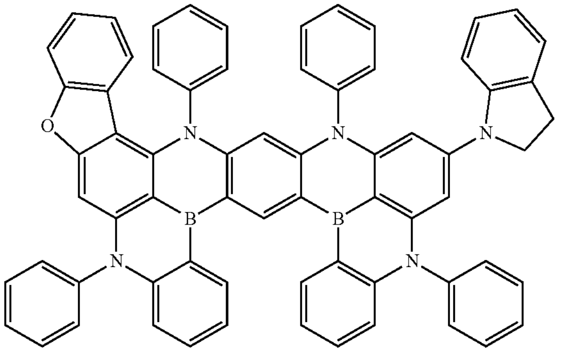

-continued
116
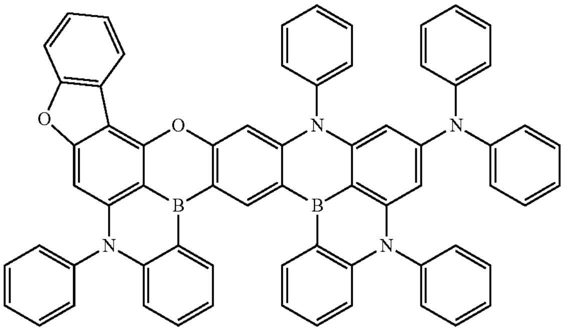
117
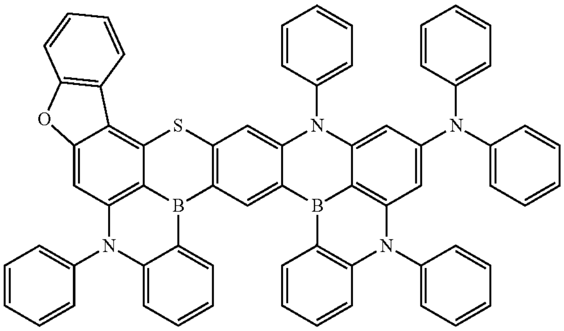
118
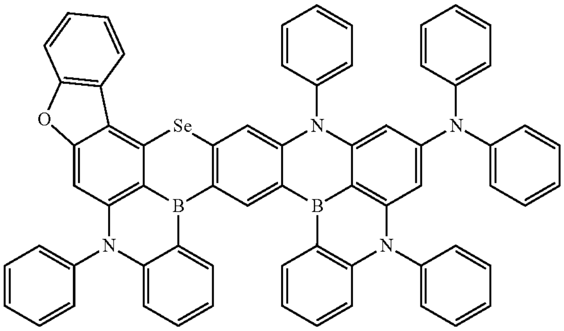
119
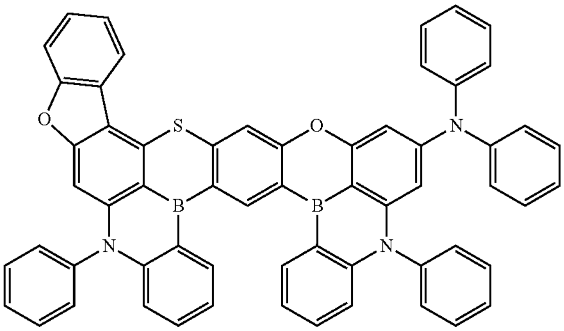
-continued
120
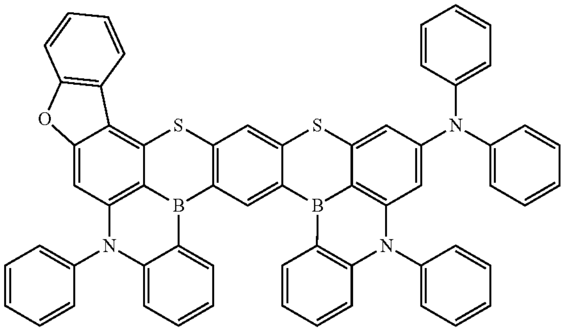
121
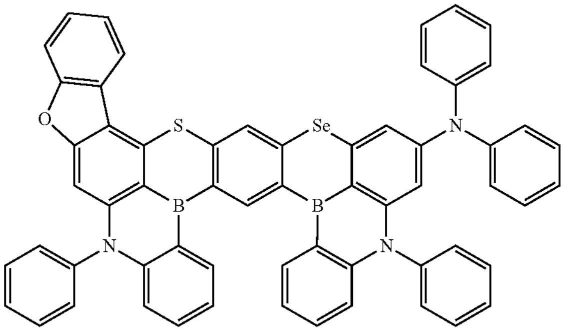
122
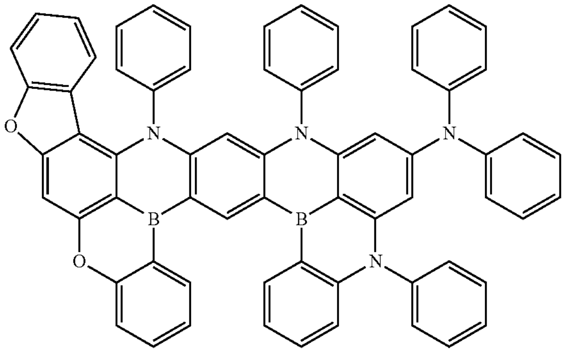
123
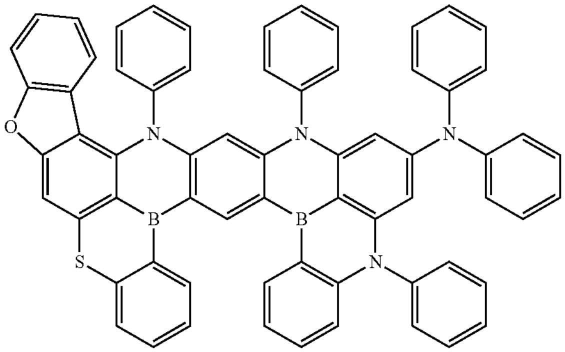

-continued

124

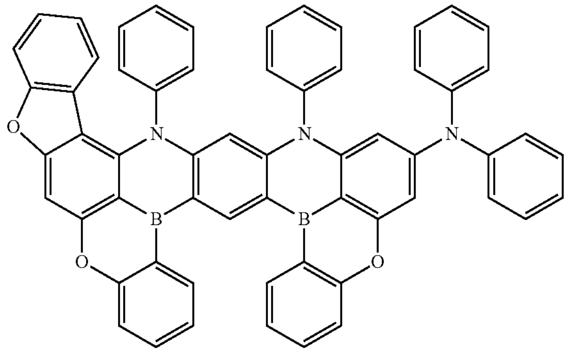

125

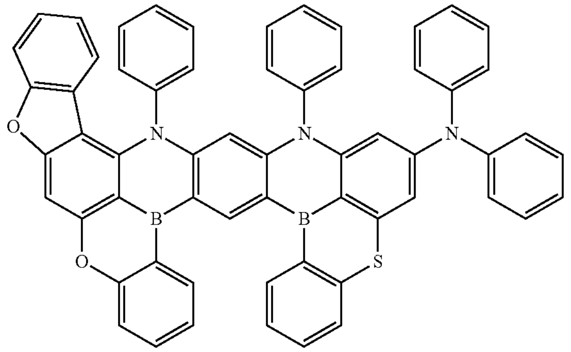

126

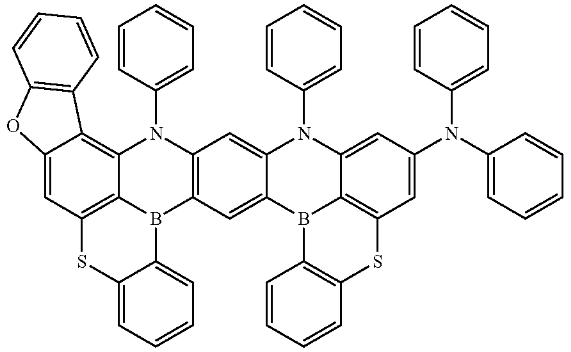

127

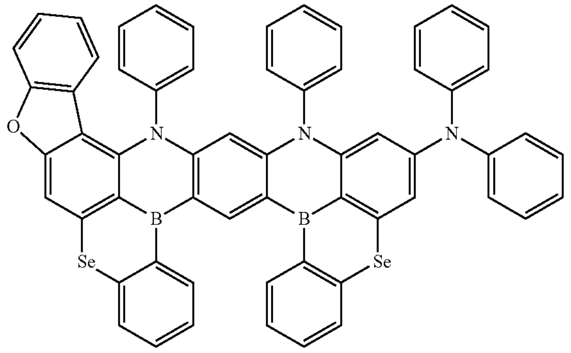

-continued

128

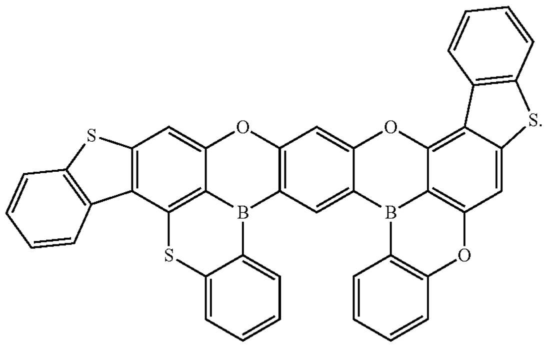

21. A display apparatus including a light emitting device, wherein the light emitting device comprising:

a first electrode;

a second electrode on the first electrode; and an emission layer between the first electrode and the second electrode and comprising a condensed cyclic compound represented by Formula 1, wherein each of the first electrode and the second electrode independently comprises Ag, Mg, Cu, Al, Pt, Pd, Au, Ni, Nd, Ir, Cr, Li, Ca, LiF/Ca, LiF/AI, Mo, Ti, W, In, Sn, Zn, a compound of two or more thereof, a mixture of two or more thereof, or an oxide thereof:

Formula 1

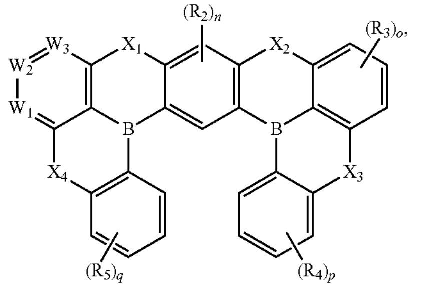

wherein, in Formula 1, $X_1$ to $X_4$ are each independently, O, S, Se, $CR_6R_7$, or $NR_8$, a substituent represented by Formula 2 is connected to adjacent two groups selected from among $W_1$, $W_2$, and $W_3$, the adjacent two groups selected from among $W_1$, $W_2$, and $W_3$ are each a carbon atom, and a remaining group thereof is $CR_1$, $R_1$ to $R_8$ are each independently a hydrogen atom, an oxygen atom, a sulfur atom, a selenium atom, a deuterium atom, a halogen atom, a cyano group, a nitro group, a substituted or unsubstituted silyl group, a substituted or unsubstituted amine group, a substituted or unsubstituted alkyl group having 1 to 30 carbon atoms, a substituted or unsubstituted alkoxy group having 1 to 30 carbon atoms, a substituted or unsubstituted aryloxy group having 1 to 30 carbon atoms, a substituted or unsubstituted aryl group having 6 to 30 ring-forming carbon atoms, a substituted or unsubstituted heteroaryl group having 2 to 30 ring-forming carbon atoms, or a substituted or unsubstituted aliphatic heterocyclic group having 2 to 30 ring-forming carbon atoms, and/or are bonded to an adjacent group to form a ring, n is an integer of 0 to 2, o is an integer of 0 to 3, and p and q are each independently an integer of 0 to 4, Formula 2

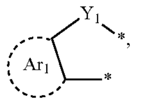

and wherein, in Formula 2, $Y_1$ is O, S, Se, $CR_{1a}R_{2a}$, or $NR_{3a}$, $Ar_1$ is a substituted or unsubstituted aromatic hydrocarbon ring having 6 to 30 ring-forming carbon atoms, or a substituted or unsubstituted aromatic heterocyclic ring having 2 to 30 ring-forming carbon atoms, $R_{1a}$, $R_{2a}$, and $R_{3a}$ are each independently a hydrogen atom, an oxygen atom, a sulfur atom, a selenium atom, a deuterium atom, a halogen atom, a cyano group, a nitro group, a substituted or unsubstituted silyl group, a substituted or unsubstituted amine group, a substituted or unsubstituted alkyl group having 1 to 30 carbon atoms, a substituted or unsubstituted alkoxy group having 1 to 30 carbon atoms, a substituted or unsubstituted aryl group having 6 to 30 ring-forming carbon atoms, or a substituted or unsubstituted heteroaryl group having 2 to 30 ring-forming carbon atoms, and/or are bonded to an adjacent group to form a ring, and

* is a position connected to the adjacent two groups selected from among $W_1$ to $W_3$ in Formula 1, wherein when o is 2 or 3, and two adjacent $R_3$ groups are bonded to form a heteroaryl group, then the condensed cyclic compound represented by Formula 1 is represented by Formula 5:

Formula 5

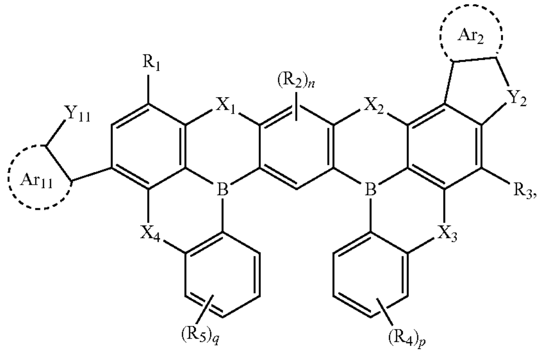

wherein, in Formula 5, $Ar_2$ is a substituted or unsubstituted aromatic hydrocarbon ring having 6 to 30 ring-forming carbon atoms, or a substituted or unsubstituted aromatic heterocyclic ring having 2 to 30 ring-forming carbon atoms, $Y_{11}$ is the same as $Y_1$ of Formula 1, and $Ar_{11}$ is the same as $Ar_1$ of Formula 1, $Y_2$ is O, S, Se, $CR_{12}R_{13}$, or $NR_{14}$, $R_{12}$ to $R_{14}$ are each independently a hydrogen atom, a deuterium atom, a halogen atom, a cyano group, a nitro group, a substituted or unsubstituted silyl group, a substituted or unsubstituted amine group, a substituted or unsubstituted alkyl group having 1 to 30 carbon atoms, a substituted or unsubstituted alkoxy group having 1 to 30 carbon atoms, a substituted or unsubstituted aryl group having 6 to 30 ring-forming carbon atoms, or a substituted or unsubstituted heteroaryl group having 2 to 30 ring-forming carbon atoms, and/or is bonded to an adjacent group to form a ring, and $X_1$ to $X_4$, $R_1$ to $R_5$, and n, p, and q are the same as defined in connection with Formula 1, and wherein, in Formula 5, when $X_1$ to $X_4$ are each independently O, S, Se, or $NR_8$, $Ar_{11}$ and $Ar_2$ are each a benzene ring, and $Y_{11}$ is $NR_{3a}$, then $Y_2$ is O, S, Se, or $CR_{12}R_{13}$, and in Formula 5, when $X_1$ to $X_4$ are each independently O, S, Se, or $NR_8$, $Ar_{11}$ and $Ar_2$ are each a benzene ring, and $Y_2$ is $NR_{14}$, then $Y_{11}$ is O, S, Se, or $CR_{1a}R_{2a}$.

* * * * *